US011128261B2

(12) United States Patent
Ranta et al.

(10) Patent No.: US 11,128,261 B2
(45) Date of Patent: Sep. 21, 2021

(54) CONSTANT VDS1 BIAS CONTROL FOR STACKED TRANSISTOR CONFIGURATION

(71) Applicant: pSemi Corporation, San Diego, CA (US)

(72) Inventors: Tero Tapio Ranta, San Diego, CA (US); Christopher C. Murphy, Lake Zurich, IL (US); Jeffrey A. Dykstra, Woodstock, IL (US)

(73) Assignee: pSemi Corporation, San Diego, CA (US)

( * ) Notice: Subject to any disclaimer, the term of this patent is extended or adjusted under 35 U.S.C. 154(b) by 1 day.

(21) Appl. No.: 16/264,106

(22) Filed: Jan. 31, 2019

(65) Prior Publication Data
US 2020/0007088 A1    Jan. 2, 2020

Related U.S. Application Data

(63) Continuation-in-part of application No. 15/279,274, filed on Sep. 28, 2016, now Pat. No. 10,243,519,
(Continued)

(51) Int. Cl.
*H03F 3/04* (2006.01)
*H03F 1/22* (2006.01)
(Continued)

(52) U.S. Cl.
CPC ............ *H03F 1/22* (2013.01); *H03F 1/0227* (2013.01); *H03F 1/223* (2013.01); *H03F 1/301* (2013.01);
(Continued)

(58) Field of Classification Search
CPC ... H03F 1/22; H03F 1/56; H03F 3/195; H03F 3/16; H03F 1/0261; H03F 2200/102;
(Continued)

(56) References Cited

U.S. PATENT DOCUMENTS 5,119,042 A    6/1992 Crampton
5,126,688 A    6/1992 Nakanishi
(Continued)

FOREIGN PATENT DOCUMENTS

WO    WO2009/108391    9/2009

OTHER PUBLICATIONS

Nguyen, Khiem D., Office Action received from the USPTO dated Sep. 11, 2014 for U.S. Appl. No. 13/829,946, 9 pgs.
(Continued)

*Primary Examiner* — Khanh V Nguyen
*Assistant Examiner* — Khiem D Nguyen
(74) *Attorney, Agent, or Firm* — Jaquez Land Greenhaus & McFarland LLP; Alessandro Steinfl, Esq.

(57) ABSTRACT

Various methods and circuital arrangements for biasing one or more gates of stacked transistors of an amplifier are presented, where the amplifier can have a varying supply voltage. According to one aspect, the gate of the input transistor of the amplifier is biased with a fixed voltage whereas the gates of the other transistors of the amplifier are biased with variable voltages that are linear functions of the varying supply voltage. According to another aspect, the linear functions are such that the variable voltages coincide with the fixed voltage at a value of the varying supply voltage for which the input transistor is at the edge of triode. According to another aspect, biasing of the stacked transistors is such that, while the supply voltage varies, the drain-to-source voltage of the input transistor is maintained to a fixed value whereas the drain-to-source voltages of all other transistors are equal to one another.

18 Claims, 126 Drawing Sheets

Related U.S. Application Data which is a continuation-in-part of application No. 14/626,833, filed on Feb. 19, 2015, now Pat. No. 9,716,477, which is a continuation-in-part of application No. 13/829,946, filed on Mar. 14, 2013, now Pat. No. 9,413,298.

(60) Provisional application No. 61/747,009, filed on Dec. 28, 2012, provisional application No. 61/747,016, filed on Dec. 28, 2012, provisional application No. 61/747,025, filed on Dec. 28, 2012, provisional application No. 61/747,034, filed on Dec. 28, 2012.

(51) Int. Cl.

| | | |
|---|---|---|
| *H03F 3/16* | (2006.01) | |
| *H03F 3/195* | (2006.01) | |
| *H03F 1/56* | (2006.01) | |
| *H03F 3/213* | (2006.01) | |
| *H03F 1/32* | (2006.01) | |
| *H03F 1/30* | (2006.01) | |
| *H03F 1/02* | (2006.01) | |
| *H03F 3/193* | (2006.01) | |

(52) U.S. Cl.
CPC ......... *H03F 1/3205* (2013.01); *H03F 1/3247* (2013.01); *H03F 1/56* (2013.01); *H03F 3/16* (2013.01); *H03F 3/193* (2013.01); *H03F 3/195* (2013.01); *H03F 3/213* (2013.01); *H03F 1/302* (2013.01); *H03F 2200/18* (2013.01)

(58) Field of Classification Search
CPC .......... H03F 3/245; H03F 1/301; H03F 1/223; H03F 2200/18; H03F 2200/451
USPC .......................... 330/127, 126, 296–297, 311
See application file for complete search history.

(56) References Cited

U.S. PATENT DOCUMENTS

| | | | |
|---|---|---|---|
| 5,251,330 A | 10/1993 | Chiba et al. | |
| 5,420,536 A | 5/1995 | Faulkner et al. | |
| 5,610,555 A | 3/1997 | Funahashi et al. | |
| 5,635,872 A | 6/1997 | Zimmerman | |
| 6,137,367 A | 10/2000 | Ezzedine et al. | |
| 6,342,810 B1 | 1/2002 | Wright et al. | |
| 6,342,816 B1 | 1/2002 | Gradzki | |
| 6,639,815 B1 | 10/2003 | Gucyski | |
| 6,725,021 B1 | 4/2004 | Anderson et al. | |
| 6,804,502 B2 | 10/2004 | Burgener et al. | |
| 6,844,776 B2 | 1/2005 | Schell et al. | |
| 7,043,213 B2 | 5/2006 | Robinson et al. | |
| 7,135,919 B2 | 11/2006 | Chen | |
| 7,202,744 B1 | 4/2007 | Manganaro | |
| 7,248,120 B2 | 7/2007 | Burgener et al. | |
| 7,440,733 B2 | 10/2008 | Maslennikov et al. | |
| 7,602,243 B2 | 10/2009 | Murao | |
| 7,605,651 B2 | 10/2009 | Ripley et al. | |
| 7,684,514 B2 | 3/2010 | Saito et al. | |
| 7,714,660 B2 | 5/2010 | Lesso et al. | |
| 7,714,664 B2 | 5/2010 | Kanaya et al. | |
| 7,737,790 B1 | 6/2010 | Chen et al. | |
| 7,739,522 B2 | 6/2010 | Festo et al. | |
| 7,782,134 B2 | 8/2010 | Drogi et al. | |
| 7,783,269 B2 | 8/2010 | Vinayak et al. | |
| 7,795,968 B1 | 9/2010 | Li et al. | |
| 7,910,993 B2 | 3/2011 | Brindle et al. | |
| 8,129,787 B2 | 3/2012 | Brindle et al. | |
| 8,310,313 B2 | 11/2012 | Guo et al. | |
| 8,344,806 B1 | 1/2013 | Franck | |
| 8,390,381 B2 | 3/2013 | Shen | |
| 8,432,224 B1 | 4/2013 | Woo et al. | |
| 8,493,142 B2 | 7/2013 | Tadano | |
| 8,558,614 B2 | 10/2013 | Masuda et al. | |
| 8,779,860 B2 | 7/2014 | Jeon | |
| 9,160,292 B2 | 10/2015 | Olson et al. | |
| 9,160,376 B1 | 10/2015 | Scuderi | |
| 9,219,445 B2 | 12/2015 | Nobbe et al. | |
| 9,287,829 B2 | 3/2016 | Nobbe et al. | |
| 9,413,298 B2 | 8/2016 | Nobbe et al. | |
| 9,543,901 B2 | 1/2017 | Nobbe et al. | |
| 9,667,195 B2 | 5/2017 | Nobbe et al. | |
| 9,716,477 B2 | 7/2017 | Wagh et al. | |
| 9,729,107 B2 | 8/2017 | Nobbe et al. | |
| 9,837,965 B1 | 12/2017 | Wagh et al. | |
| 9,941,843 B2 | 4/2018 | Nobbe et al. | |
| 9,960,736 B2 | 5/2018 | Nobbe et al. | |
| 9,973,145 B2 | 5/2018 | Nobbe et al. | |
| 10,158,328 B2 | 12/2018 | Nobbe et al. | |
| 10,243,519 B2 | 3/2019 | Dykstra et al. | |
| 2002/0030475 A1 | 3/2002 | D'Angelo | |
| 2006/0119435 A1 | 6/2006 | Oh et al. | |
| 2006/0209984 A1 | 9/2006 | Kenington | |
| 2006/0226910 A1 | 10/2006 | Tanoi | |
| 2006/0245517 A1 | 11/2006 | Ikedo et al. | |
| 2008/0297128 A1 | 12/2008 | Xu et al. | |
| 2009/0278610 A1 | 11/2009 | Murji | |
| 2010/0039094 A1 | 2/2010 | Nagata et al. | |
| 2010/0085120 A1 | 4/2010 | Marbell et al. | |
| 2010/0244951 A1 | 9/2010 | Smith | |
| 2011/0002080 A1 | 1/2011 | Ranta | |
| 2011/0043284 A1 | 2/2011 | Zhao | |
| 2011/0070848 A1 | 3/2011 | Ramachandra Reddy | |
| 2011/0098011 A1 | 4/2011 | Camp, Jr. et al. | |
| 2011/0181360 A1 | 7/2011 | Li et al. | |
| 2012/0169398 A1 | 7/2012 | Brindle et al. | |
| 2012/0267719 A1 | 10/2012 | Brindle et al. | |
| 2012/0313701 A1 | 12/2012 | Khlat et al. | |
| 2013/0222075 A1 | 8/2013 | Reedy et al. | |
| 2013/0229235 A1 | 9/2013 | Ohnishi | |
| 2014/0184334 A1 | 7/2014 | Nobbe et al. | |
| 2014/0184335 A1 | 7/2014 | Nobbe et al. | |
| 2014/0184336 A1 | 7/2014 | Nobbe et al. | |
| 2014/0184337 A1 | 7/2014 | Nobbe et al. | |
| 2014/0210558 A1 | 7/2014 | Matsumoto | |
| 2014/0266456 A1 | 9/2014 | Vice et al. | |
| 2015/0097624 A1 | 4/2015 | Olson et al. | |
| 2015/0244322 A1 | 8/2015 | Hur et al. | |
| 2015/0270806 A1 | 9/2015 | Wagh et al. | |
| 2016/0099686 A1 | 4/2016 | Perreault et al. | |
| 2016/0164468 A1 | 6/2016 | Nobbe et al. | |
| 2016/0164469 A1 | 6/2016 | Nobbe et al. | |
| 2016/0190989 A1 | 6/2016 | Nobbe et al. | |
| 2016/0241199 A1 | 8/2016 | Nobbe et al. | |
| 2017/0133989 A1 | 5/2017 | Dykstra et al. | |
| 2017/0359029 A1 | 12/2017 | Nobbe et al. | |
| 2020/0111756 A1 | 4/2020 | Smith et al. | |

OTHER PUBLICATIONS

Nguyen, Khiem D., Office Action received from the USPTO dated Feb. 23, 2015 for U.S. Appl. No. 13/829,946, 25 pgs.

Nguyen, Khiem D., Office Action received from the USPTO dated Jul. 30, 2015 for U.S. Appl. No. 13/829,946, 11 pgs.

Nguyen, Khiem D., Notice of Allowance received from the USPTO dated Dec. 21, 2015 for U.S. Appl. No. 13/829,946, 11 pgs.

Nguyen, Khiem D., Notice of Allowance received from the USPTO dated Mar. 11, 2016 for U.S. Appl. No. 13/829,946, 7 pgs.

Nobbe, et al., Response filed in the USPTO dated Dec. 11, 2014 for U.S. Appl. No. 13/829,946, 2 pgs.

Nobbe, et al., Response filed in the USPTO dated May 22, 2015 for U.S. Appl. No. 13/829,946, 23 pgs.

Nobbe, et al., Response filed in the USPTO dated Sep. 9, 2015 for U.S. Appl. No. 13/829,946, 14pgs.

Hassan, et al., "A Combined Series-Parallel Hybrid Envelope Amplifier for Envelope Tracking Mobile Terminal RF Power Amplifier Applications", IEEE Journal of Solid-State Circuits, vol. 47, No. 5, May 2012, 14 pgs.

Asbeck, et al., "Design Options for High Efficiency Linear Handset Power Amplifiers" 2009 IEEE, 4 pgs.

(56) References Cited

OTHER PUBLICATIONS

Asbeck, et al., "CMOS Handset Power Amplifiers: Directions for the Future", Custom Integrated Circuits Conference (CICC), Sep. 2012 IEEE, 6 pgs.
Hassan, et al., "An Envelope-Tracking CMOS-SOS Power Amplifier with 50% Overall PAE and 29.3 dBm Output Power for LTE Applications." Compound Semiconductor Integrated Circuit Symposium (CSICS), Oct. 2012, 4 pgs.
Kavousian, et al. "A Digitally Modulated Polar CMOS PA with 20MHz Signal BW." IEEE International Solid-States Circuits Conference, Feb. 12, 2007, Session 4, RF Building Blocks, 4.1, 3 pgs.
Li, et al., "Design of High Efficiency Monolithic Power Amplifier with Envelope-Tracking and Transistor Resizing for Broadband Wireless Applications", IEEE Journal of Solid-State Circuits, vol. 47, No. 9, Sep. 2012, 12 pgs.
Nujira Ltd. "Envelope Tracking: unlocking the potential of CMOS Pas in 4G Smartphones." White Paper, Feb. 2013, 9 pgs.
Kim, et al. "Push the Envelope." IEEE Microwave Magazine, IMS Special Issue, May 2013, pp. 68-81.
Ahmed, et al., "DTX: A Revolutionary Digital Transmitter Technology to Provide Multi-Mode/Multi-Band Capability", Proceeding of the SDR 04 Technical Conference and Product Exposition, 2004, 5 pgs.
Sahu, et al. "A High Efficiency WCDMA RF Power Amplifier with Adaptive, Dual-Mode Buck-Boost Supply and Bias-Current Control." IEEE—Manuscript revised on Sep. 1, 2006, 3 pgs.
Asbeck, et al. "Si IC Development for High Efficiency Envelope Tracking Power Amplifiers" IEEE Microwave Magazine, 2012, pp. 1-4.
Kim, et al. "Efficiently Amplified." IEEE Microwave Magazine, Aug. 2010, pp. 87-100.
McCune, et al. "Microwave Bytes." IEEE Microwave Magazine, Jun. 2012, pp. 34-56.
Wimpenny, et al. Envelope Tracking GaAs HBT PA performance characterization under high load mismatch conditions, IEEE, 2012, pp. 37-40.
Lai. P.W. and Long, S.I. "A 5GHz CMOS Low Phase Noise Transformer Power Combining VCO." IEEE Radio Frequency Integrated Circuits (RFIC) Symposium, Jun. 2006, pp. 1-4.
Geynet, L. et al. "Fully-Integrated Multi-Standard VCOs with switched LC tank and Power Controlled by Body Voltage in 130nm CMOS/SOI" IEEE Radio Frequency Integrated Circuits (RFIC) Symposium, Jun. 2006, pp. 1-4.
Nguyen, Patricia T., Office Action received from the USPTO dated Nov. 14, 2014 for U.S. Appl. No. 13/830,680, 16 pgs.
Nguyen, Patricia T., Office Action received from the USPTO dated Dec. 1, 2014 for U.S. Appl. No. 13/830,070, 18 pgs.
Nguyen, Patricia T., Office Action received from the USPTO dated Dec. 9, 2014 for U.S. Appl. No. 13/830,555, 18 pgs.
Mottola, Steven J., Office Action received from the USPTO dated Jan. 29, 2015 for U.S. Appl. No. 14/049,165, 21 pgs.
Nobbe, et al., Amendment filed in the USPTO dated Feb. 16, 2015 for U.S. Appl. No. 13/830,680, 25 pgs.
Nobbe, et al., Response filed in the USPTO dated Feb. 26, 2015 for U.S. Appl. No. 13/830,070, 13 pgs.
Nobbe, et al., Response filed in the USPTO dated Mar. 9, 2015 for U.S. Appl. No. 13/830,555, 15 pgs.
Nguyen, Patricia T., Notice of Allowance received from the USPTO dated Mar. 18, 2015 for U.S. Appl. No. 13/830,680, 11 pgs.
Olson, et al., Response filed in the USPTO dated Apr. 28, 2015 for U.S. Appl. No. 14/049,165, 21 pgs.
Nguyen, Patricia T., Notice of Allowance received from the USPTO dated Apr. 29, 2015 for U.S. Appl. No. 13/830,070, 17 pgs.
Mottola, Steven J., Notice of Allowance received from the USPTO dated May 29, 2015 for U.S. Appl. No. 14/049,165, 9 pgs.
Ezzeddine, et al., "The High Voltage/High Power FET (HiVP1)", 2003 IEEE Radio Frequency Integrated Circuits Symposium, pp. 215-218.
Nguyen, Patricia T., Office Action received from the USPTO dated Aug. 27, 2015 for U.S. Appl. No. 13/830,680, 14 pgs.
Nguyen, Patricia T., Notice of Allowance received from the USPTO dated Sep. 14, 2015 for U.S. Appl. No. 13/830,070, 15 pgs.
Nobbe, et al., Response filed in the USPTO dated Oct. 27, 2015 for U.S. Appl. No. 13/830,680, 16 pgs.
Nguyen, Patricia T., Notice of Allowance received from the USPTO dated Nov. 20, 2015 for U.S. Appl. No. 13/830,555, 41 pgs.
Nguyen, Patricia T., Office Action received from the USPTO dated Jan. 29, 2016 for U.S. Appl. No. 13/830,680, 5 pgs.
Nobbe, et al., Comments on Examiner's Statement of Reasons for Allowance filed in the USPTO dated Jun. 13, 2016 for U.S. Appl. No. 13/829,946, 5 pgs.
Nguyen, Khiem D., Office Action received from the USPTO dated Apr. 21, 2016 for U.S. Appl. No. 14/626,833, 51 pgs.
Nguyen, Khiem D., Office Action received from the USPTO dated Oct. 20, 2016 for U.S. Appl. No. 14/626,833, 13 pgs.
Nguyen, Khiem D., Applicant-Initiated Interview Summary received from the USPTO dated Dec. 15, 2016 for U.S. Appl. No. 14/626,833, 3 pgs.
Nguyen, Khiem D., Notice of Allowance received from the USPTO dated May 23, 2017 for U.S. Appl. No. 14/626,833, 27 pgs.
Wagh, et al., Response filed in the USPTO dated Jun. 20, 2016 for U.S. Appl. No. 14/626,833, 33 pgs.
Wagh, et al., Response filed in the USPTO dated Jan. 20, 2017 for U.S. Appl. No. 14/626,833, 28 pgs.
Bult, et al., "The CMOS Gain-Boosting Technique", Philips Research Laboratories, Eindhoven, The Netherlands, J.H. Huijsing, et al., Analog Circuit Design, 1993, 26 pgs.
Nobbe, et al., Response filed in the USPTO dated Mar. 23, 2016 for U.S. Appl. No. 13/830,680, 15 pgs.
Nguyen, Patricia T., Office Action received from the USPTO dated Jun. 2, 2016 for U.S. Appl. No. 13/830,680, 18 pgs.
Nguyen, Patricia T., Notice of Allowance received from the USPTO dated Aug. 16, 2016 for U.S. Appl. No. 14/858,772, 16 pgs.
Nobbe, et al., Response filed in the USPTO dated Aug. 22, 2016 for U.S. Appl. No. 13/830,680, 13 pgs.
Nguyen, Patricia T., Office Action received from the USPTO dated Oct. 28, 2016 for U.S. Appl. No. 14/821,501, 17 pgs.
Nguyen, Patricia T., Notice of Allowance received from the USPTO dated Nov. 4, 2016 for U.S. Appl. No. 13/830,680, 11 pgs.
Nobbe, et al., Response filed in the USPTO dated Jan. 24, 2017 for U.S. Appl. No. 14/821,501, 23 pgs.
Nguyen, Khiem D., Office Action received from the USPTO dated Jan. 27, 2017 for U.S. Appl. No. 14/958,848, 9 pgs.
Nguyen, Khiem D., Office Action received from the USPTO dated Mar. 23, 2017 for U.S. Appl. No. 15/040,952, 9 pgs.
Nobbe, et al., Response filed in the USPTO dated Mar. 24, 2017 for U.S. Appl. No. 14/958,848, 11 pgs.
Nobbe, et al., Response filed in the USPTO dated Apr. 14, 2017 for U.S. Appl. No. 15/040,952, 8 pgs.
Nguyen, Khiem D., Office Action received from the USPTO dated Jun. 28, 2017 for U.S. Appl. No. 15/279,274, 11 pgs.
Nguyen, Khiem D., Office Action received from the USPTO dated Oct. 19, 2017 for U.S. Appl. No. 15/279,274, 28 pgs.
Nguyen, Khiem D., Office Action received from the USPTO dated May 3, 2018 for U.S. Appl. No. 15/279,274, 33 pgs.
Nguyen, Khiem D., Notice of Allowance received from the USPTO dated Nov. 2, 2018 for U.S. Appl. No. 15/279,274, 13 pgs.
Dykstra, et al., Response filed in the USPTO dated Jul. 12, 2017 for U.S. Appl. No. 15/279,274, 4 pgs.
Dykstra, et al., Response filed in the USPTO dated Nov. 17, 2017 for U.S. Appl. No. 15/279,274, 21 pgs.
Dykstra, et al., Response filed in the USPTO dated Aug. 2, 2018 for U.S. Appl. No. 15/279,274, 17 pgs.
Nguyen, Patricia T., Office Action received from the USPTO dated May 18, 2017 for U.S. Appl. No. 15/046267, 6 pgs.
Nguyen, Patricia T., Notice of Allowane received from the USPTO dated Mar. 26, 2017 for U.S. Appl. No. 14/821,501, 19 pgs.
Nguyen, Khiem D., Office Action received from the USPTO dated Jun. 29, 2017 for U.S. Appl. No. 15/040,952, 41 pgs.
Nguyen, Khiem D., Office Action received from the USPTO dated Jun. 30, 2017 for U.S. Appl. No. 14/958,848, 53 pgs.
Nobbe, et al., Response to Restriction Requirement filed in the USPTO dated Jul. 17, 2017 for U.S. Appl. No. 15/046,267, 10 pgs.

(56) References Cited

OTHER PUBLICATIONS

Nobbe, et al., Response filed in the USPTO dated Jul. 20, 2017 for U.S. Appl. No. 14/958,848, 17 pgs.
Nobbe, et al., Preliminary Amendment filed in the USPTO dated Sep. 5, 2017 for U.S. Appl. No. 15/618,452, 11 pgs.
Nobbe, et al., Response filed in the USPTO dated Sep. 7, 2017 for U.S. Appl. No. 15/040,952, 12 pgs.
Nguyen, Patricia T., Office Action received from the USPTO dated Oct. 5, 2017 for U.S. Appl. No. 15/046,267, 43 pgs.
Nobbe,et al., Response filed in the USPTO dated Oct. 17, 2017 for U.S. Appl. No. 15/046,267, 17 pgs.
Nguyen, Khiem D., Final Office Action received from the USPTO dated Nov. 17, 2017 for U.S. Appl. No. 14/958,848, 22 pgs.
Nguyen, Khiem D., Notice of Allowance received from the USPTO dated Dec. 20, 2017 for U.S. Appl. No. 15/040,952, 15 pgs.
Nguyen, Khiem D., Applicant-Initiated Interview Summary received from the USPTO dated Dec. 29, 2017 for U.S. Appl. No. 14/958,848, 6 pgs.
Peregrine Semiconductor Corporation, Response filed in the USPTO dated Jan. 23, 2018 for U.S. Appl. No. 14/958,848, 18 pgs.
Nguyen, Patricia T., Notice of Allowance received from the USPTO dated Feb. 9, 2018 for U.S. Appl. No. 15/046,267, 11 pgs.
Nguyen, Khiem D., Notice of Allowance received from the USPTO dated Mar. 9, 2018 for U.S. Appl. No. 14/958,848, 12 pgs.
Nguyen, Patricia T., Notice of Allowance received from the USPTO dated Jun. 19, 2018 for U.S. Appl. No. 15/618,452, 26 pgs.
Nguyen, Patricia T., Notice of Allowance received from the USPTO dated Oct. 5, 2018 for U.S. Appl. No. 15/618,452, 16 pgs.
Nobbe, et al., Response filed in the USPTO dated Jan. 17, 2018 for U.S. Appl. No. 14/958,848, 18 pgs.
Dykstra, et al., Response filed in the USPTO dated Nov. 24, 2017 for U.S. Appl. No. 15/279,274, 19 pgs.

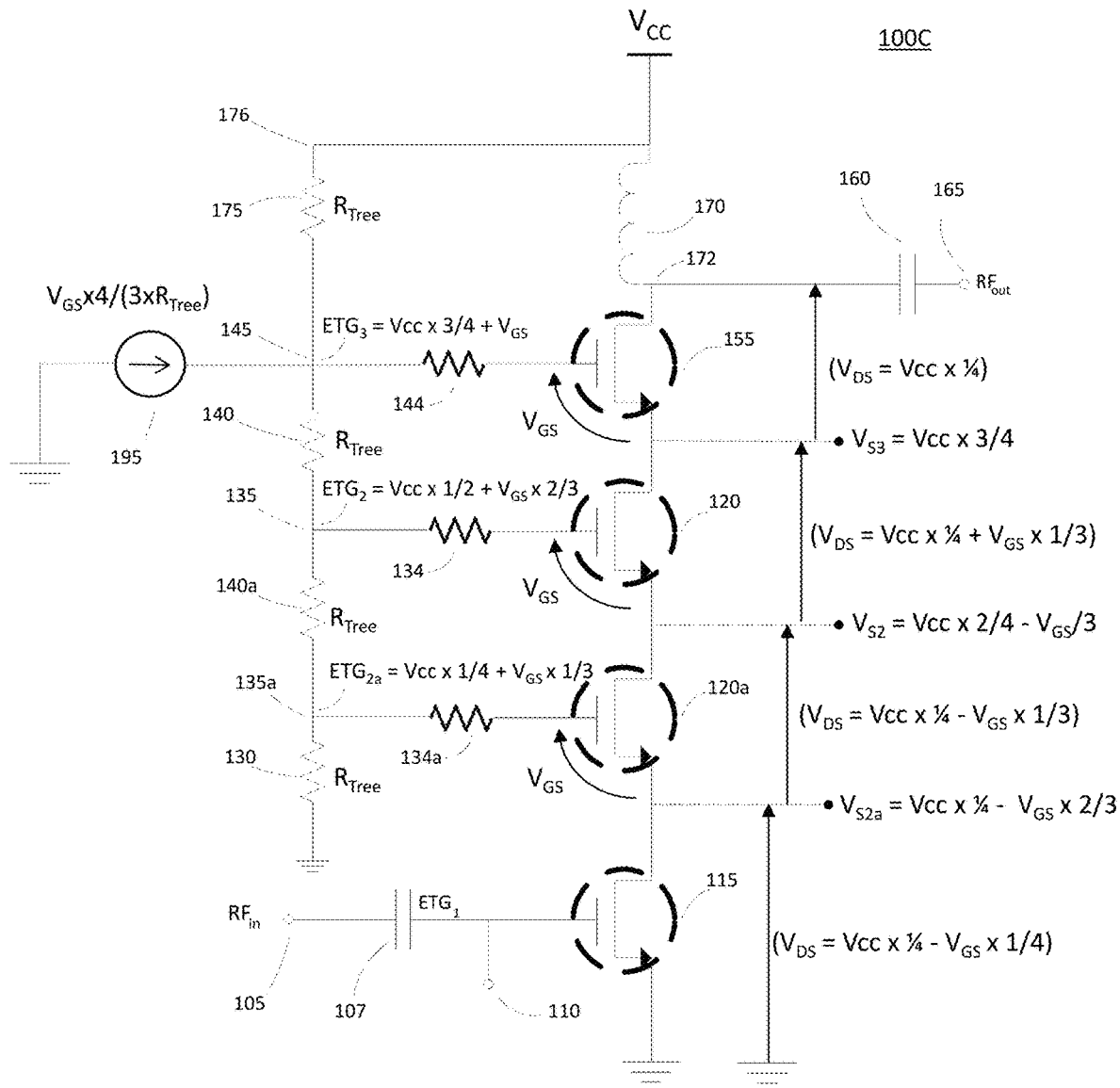
FIG. 4E1

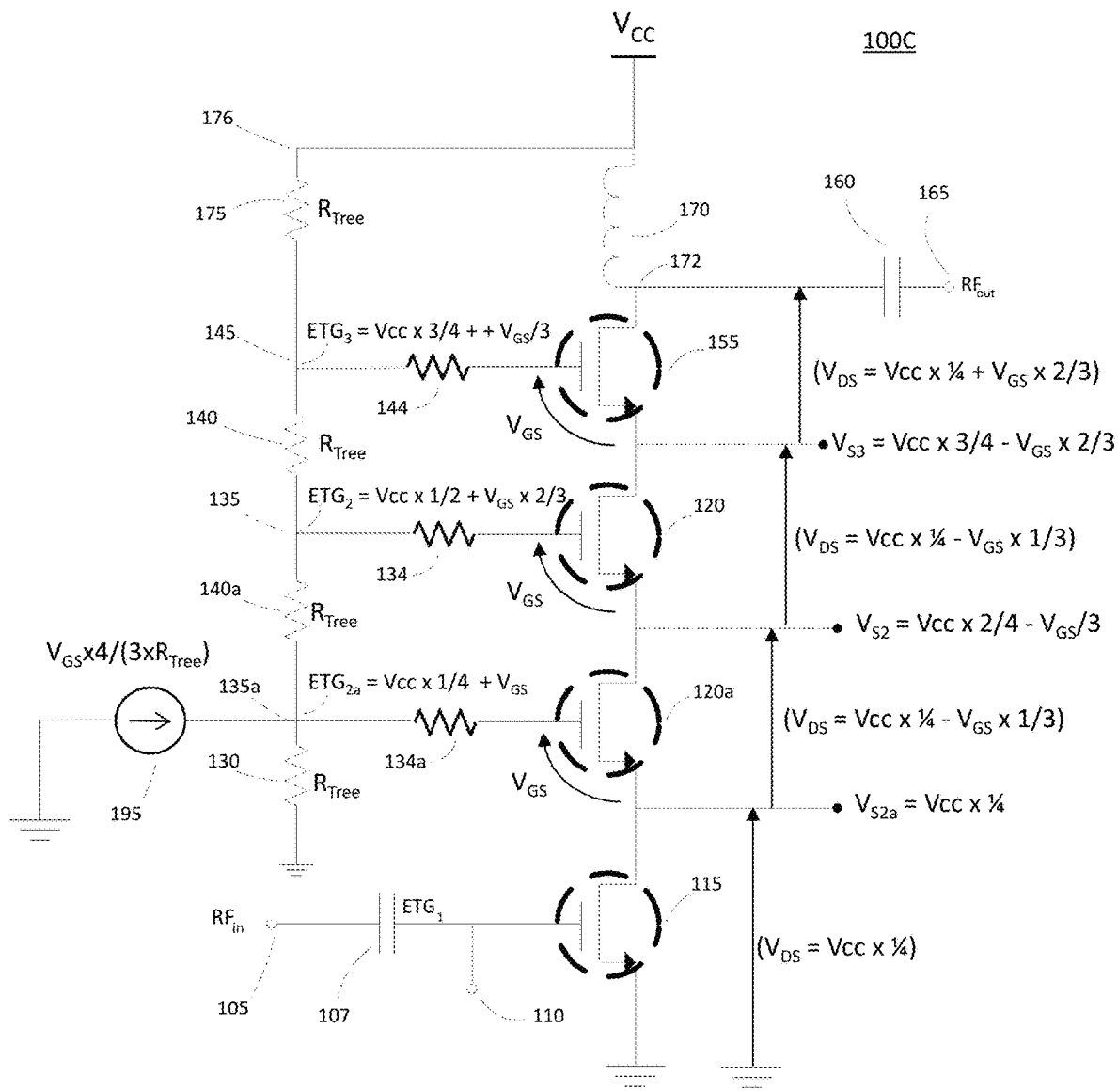
FIG. 4E2

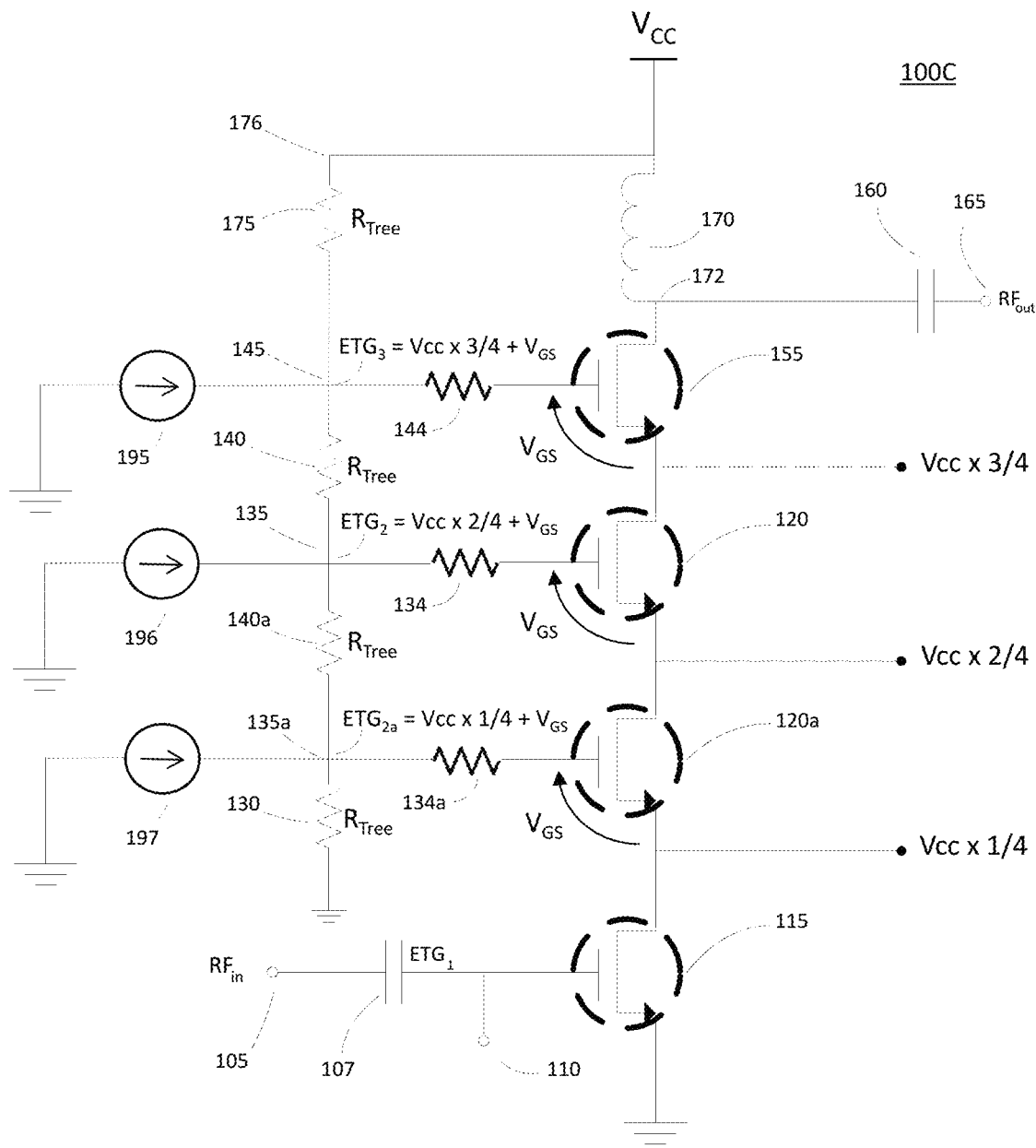
FIG. 4G1

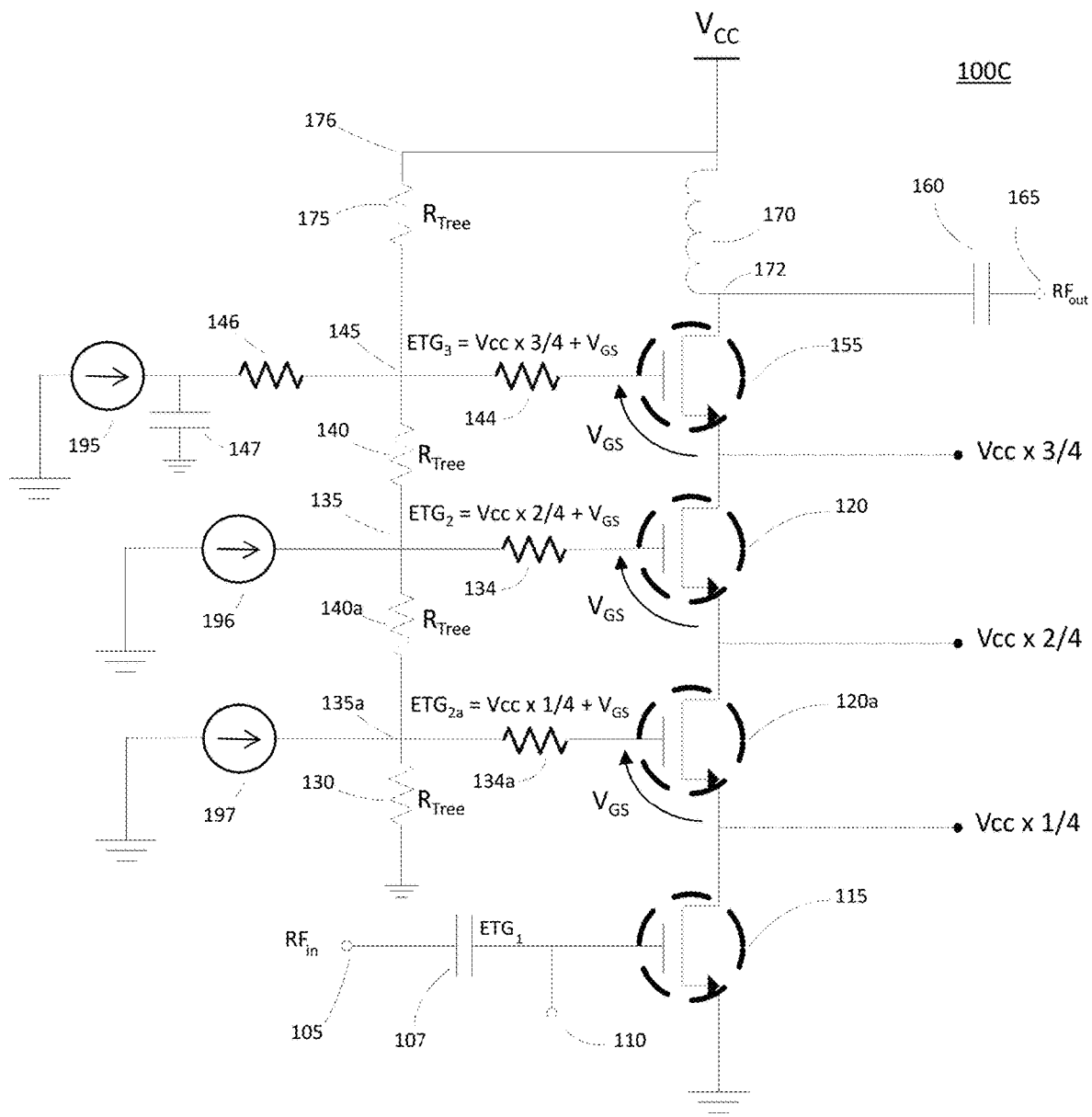
FIG. 4G2

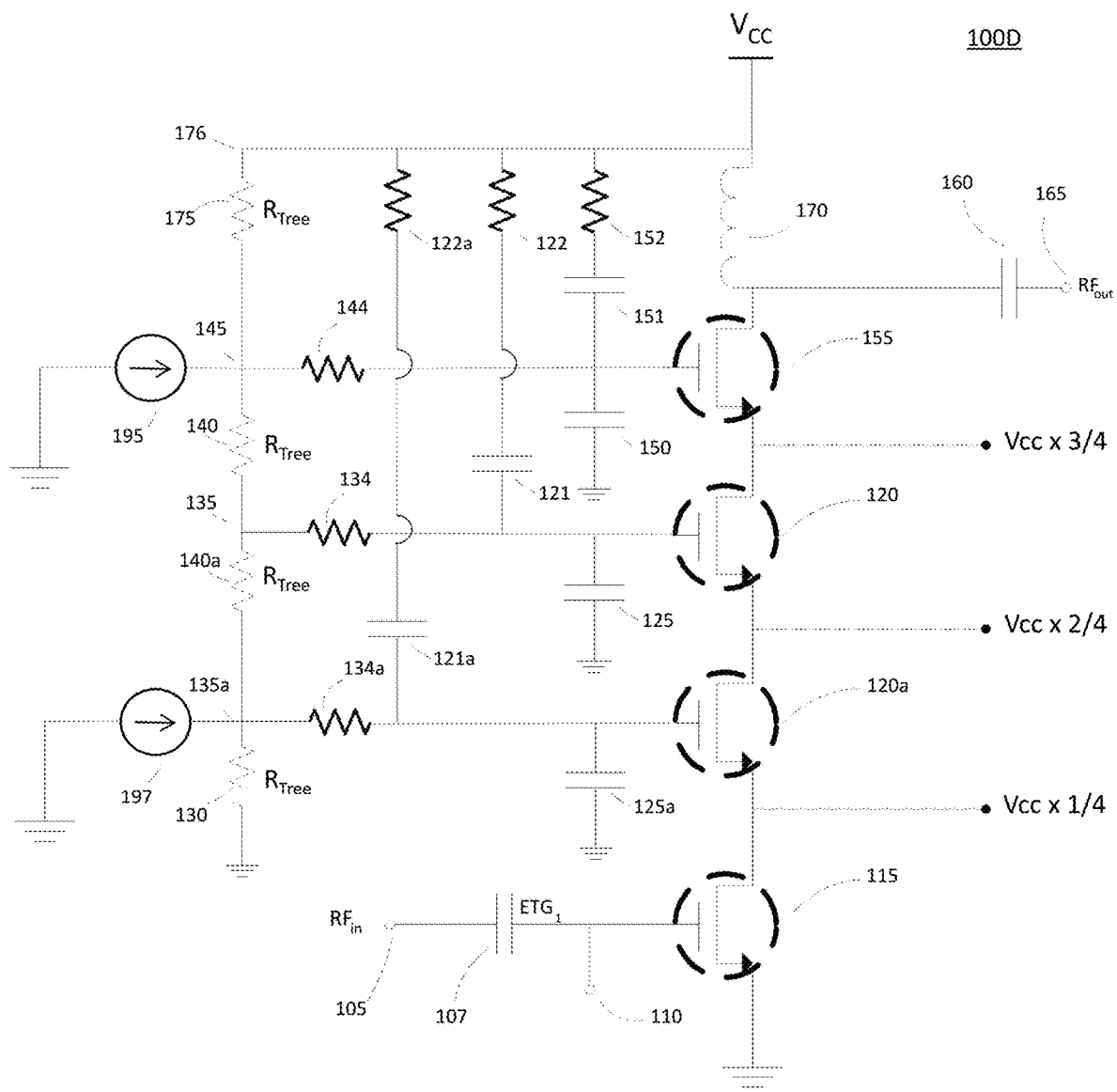
FIG. 4H1

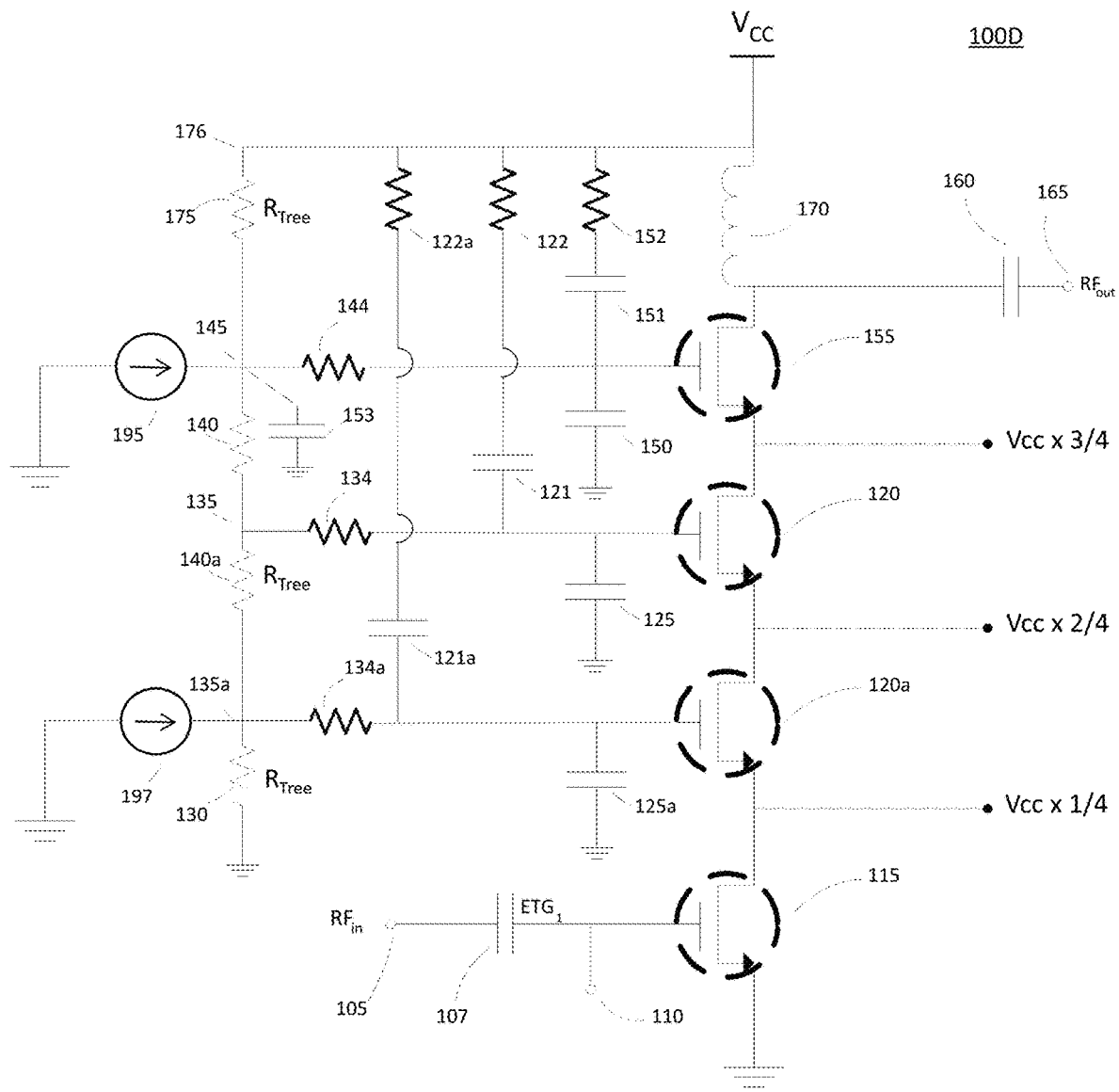
FIG. 4H2

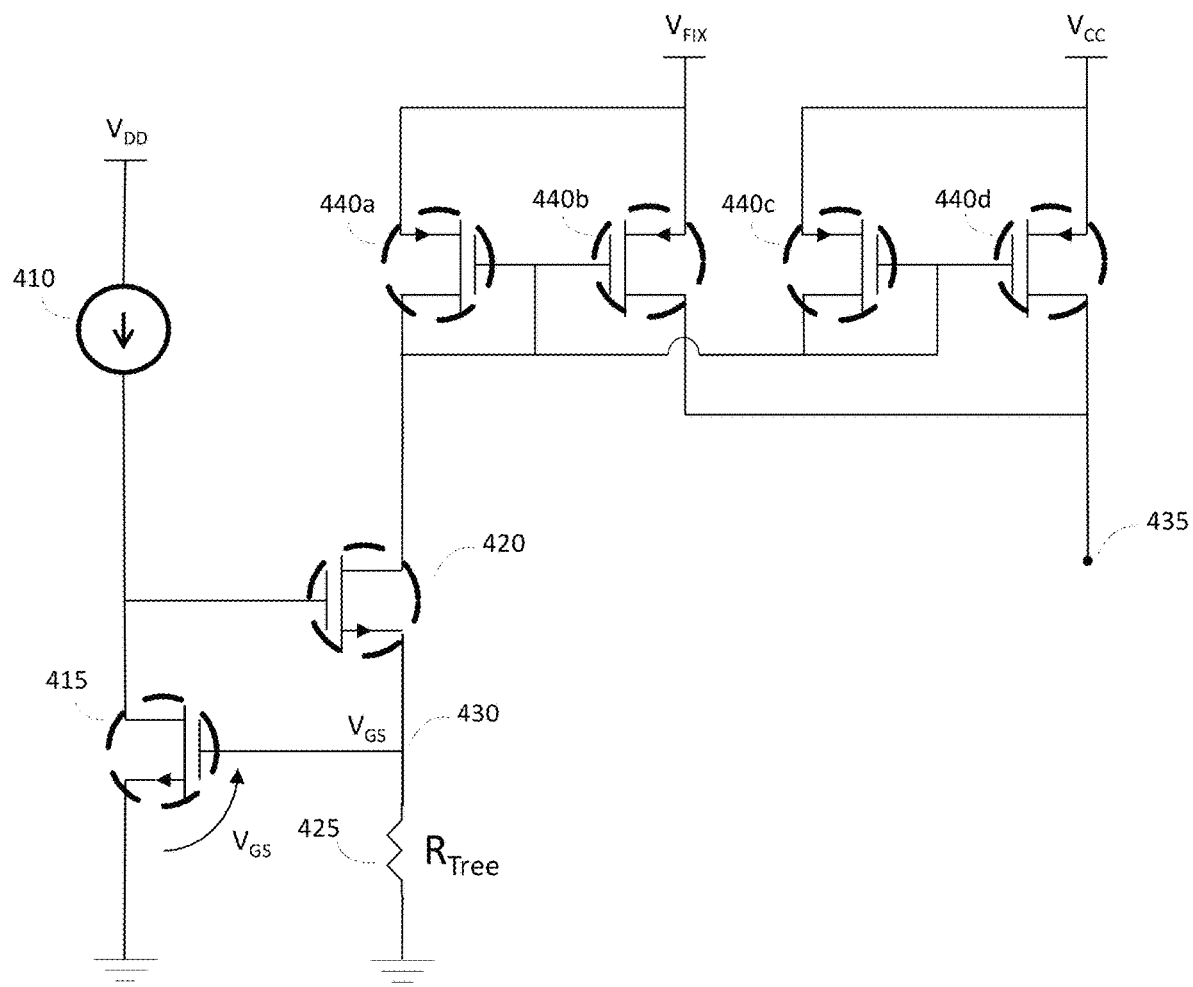
FIG. 4L1

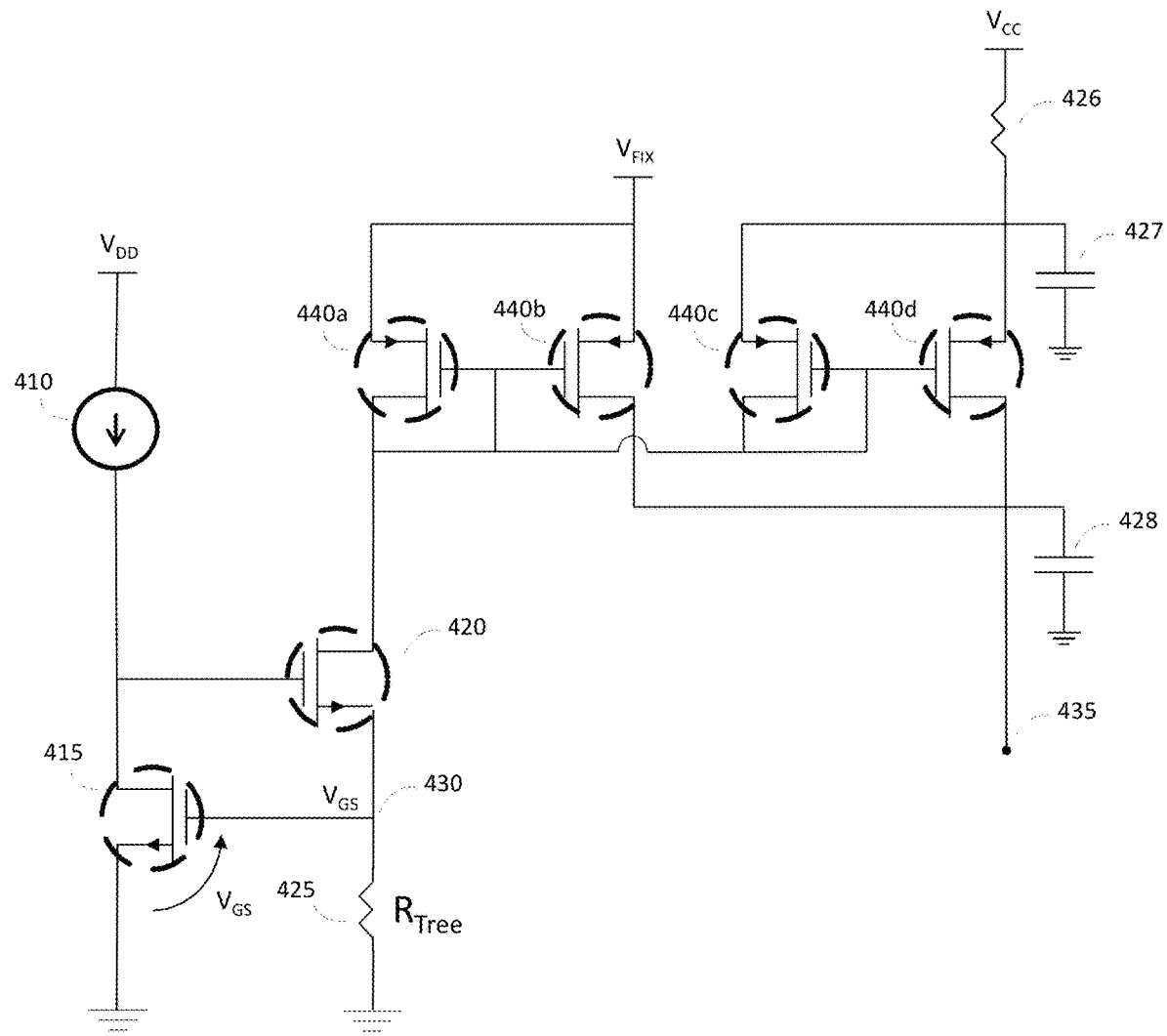
FIG. 4L2

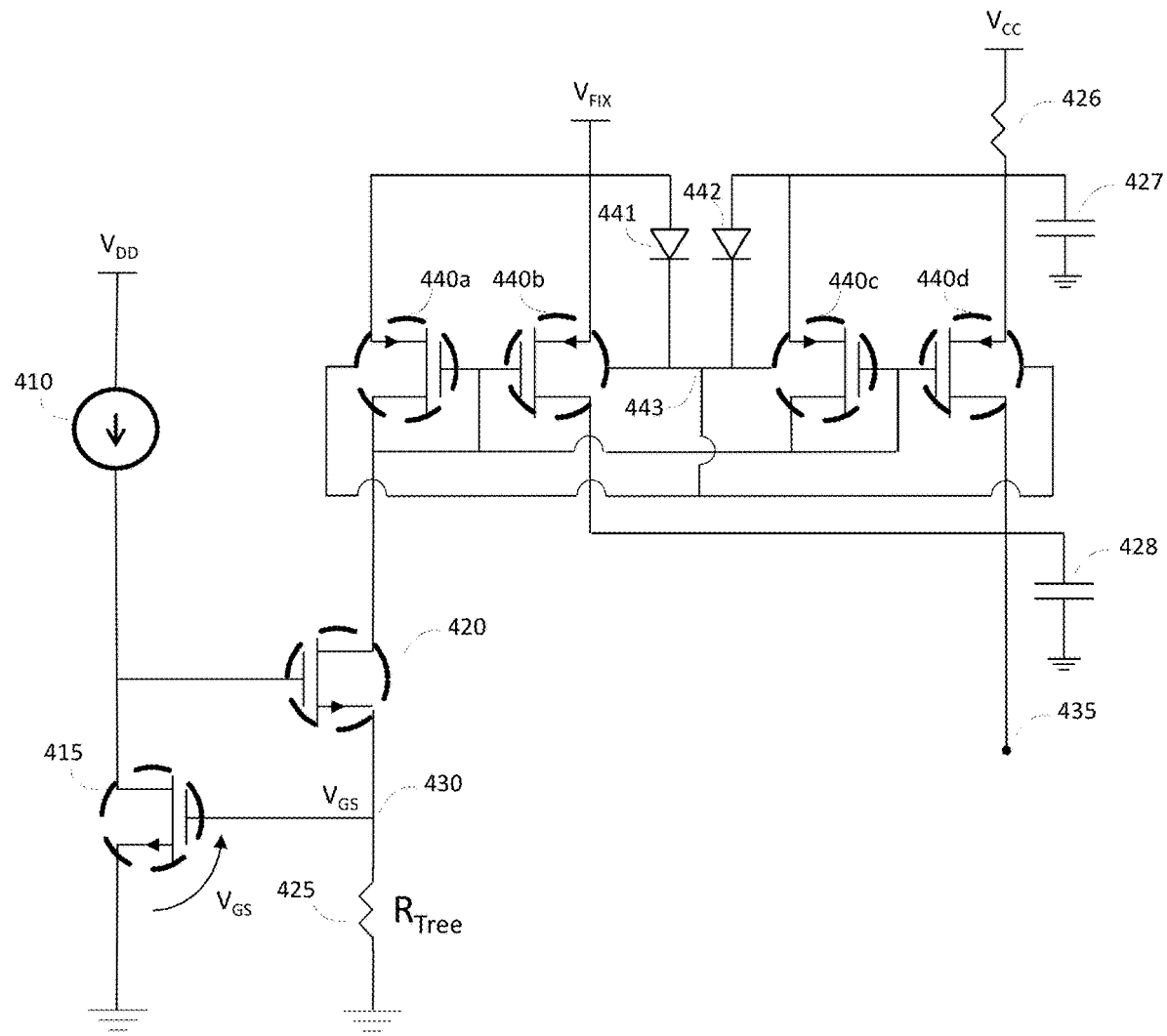
FIG. 4L3

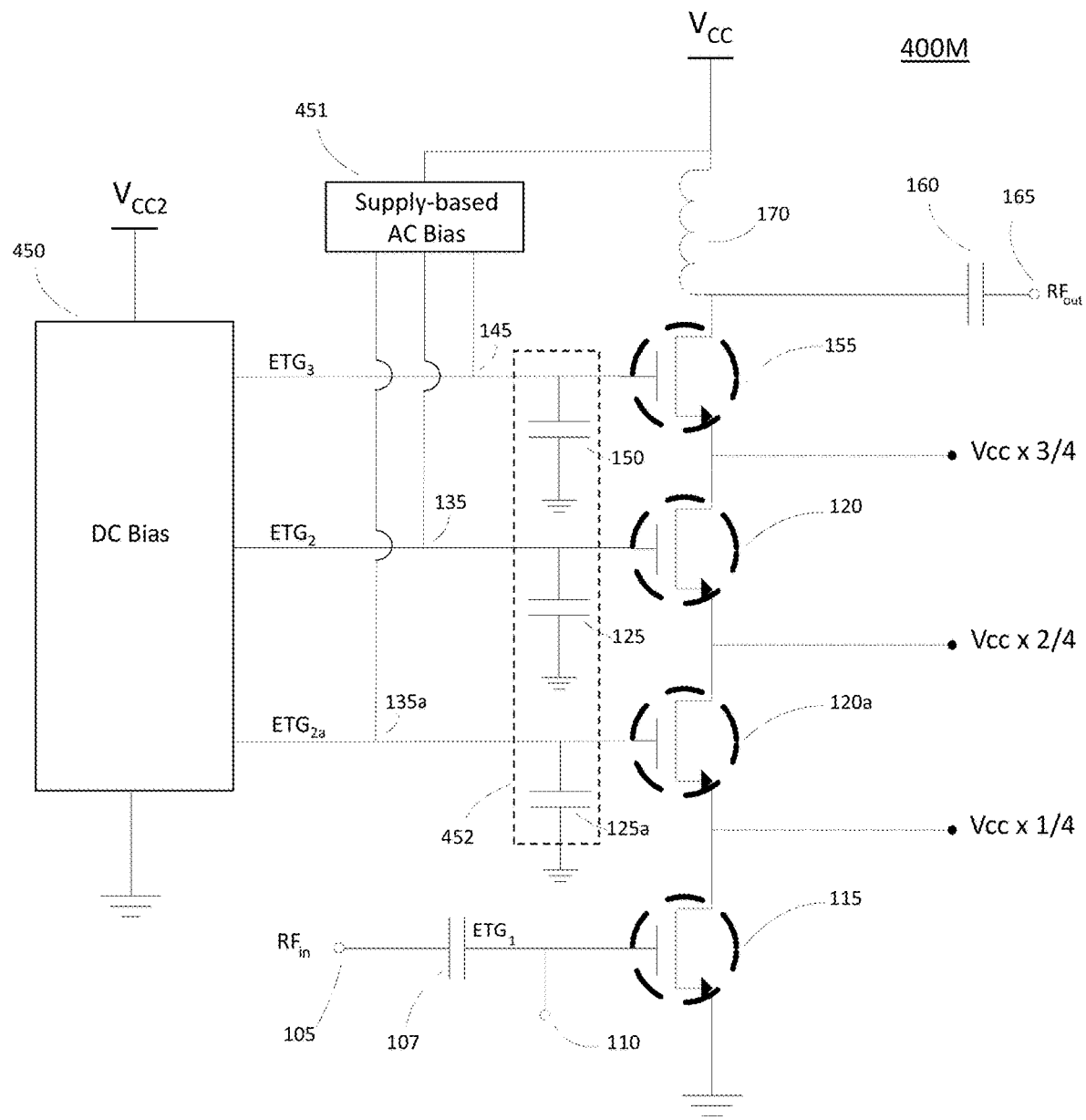
FIG. 4M1

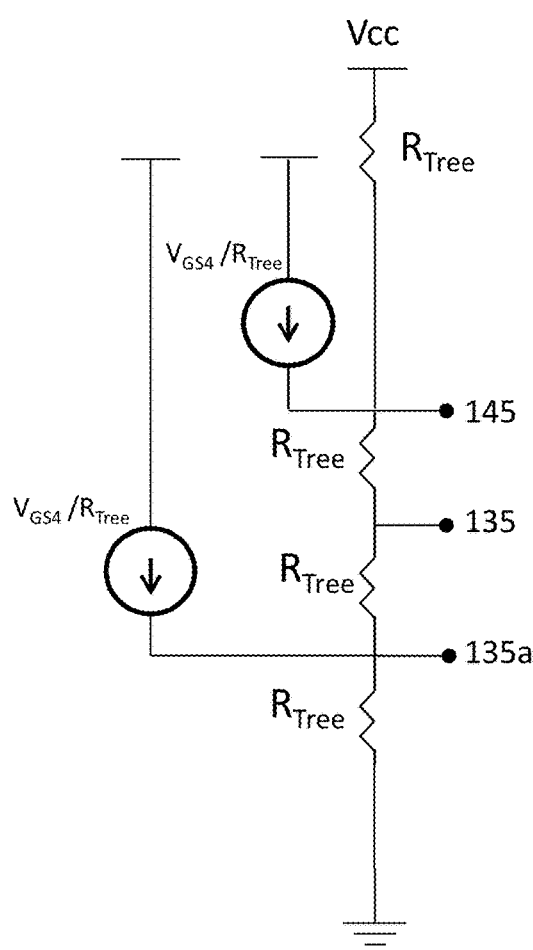
FIG. 4M2
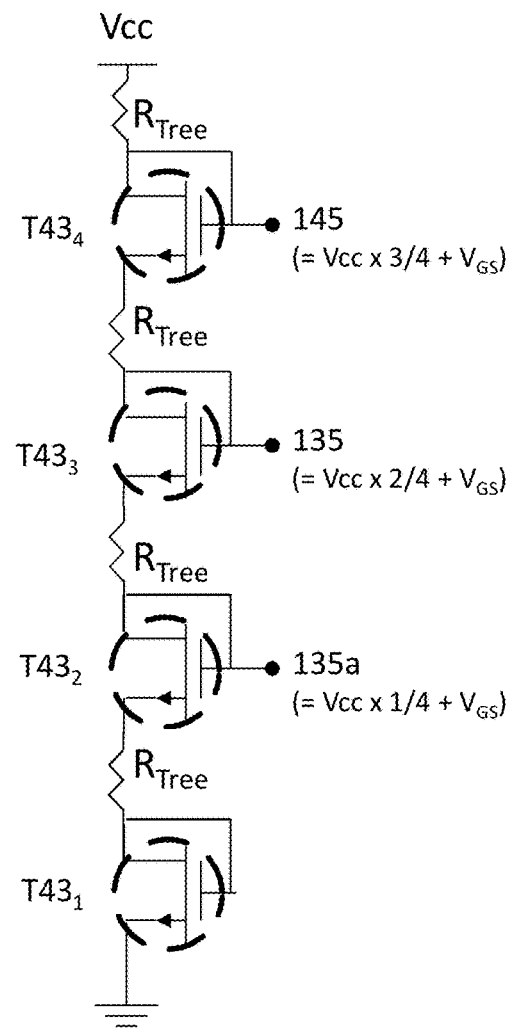
FIG. 4M3

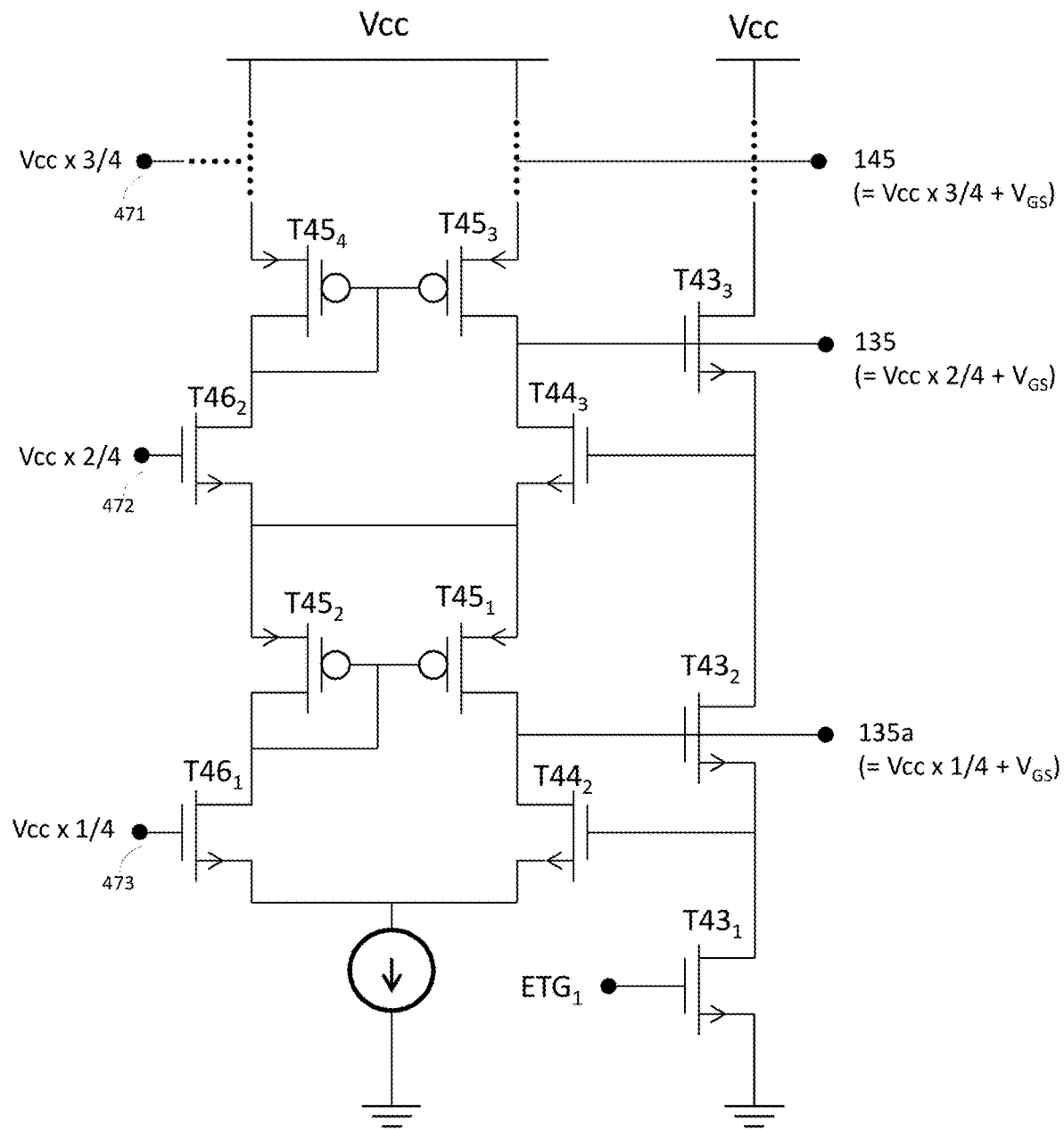
FIG. 4M4

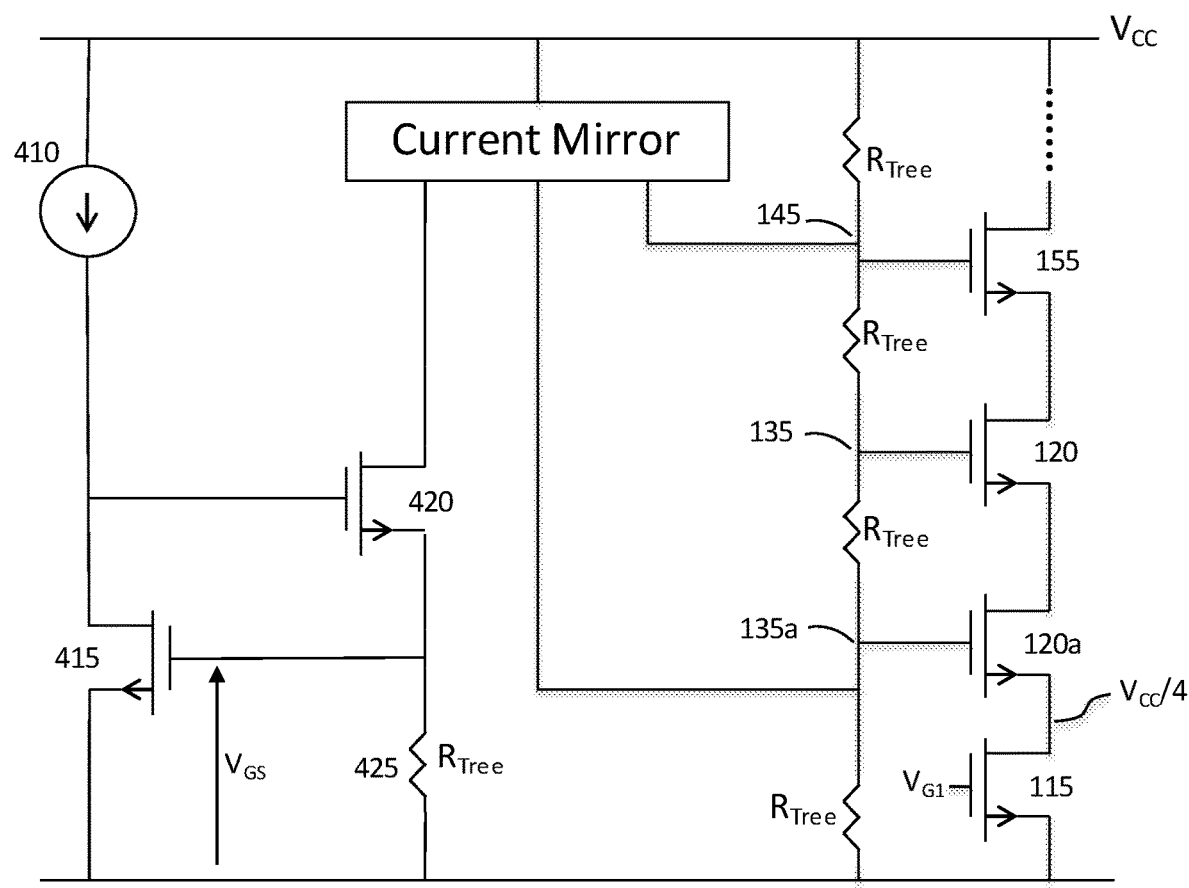
FIG. 4N1

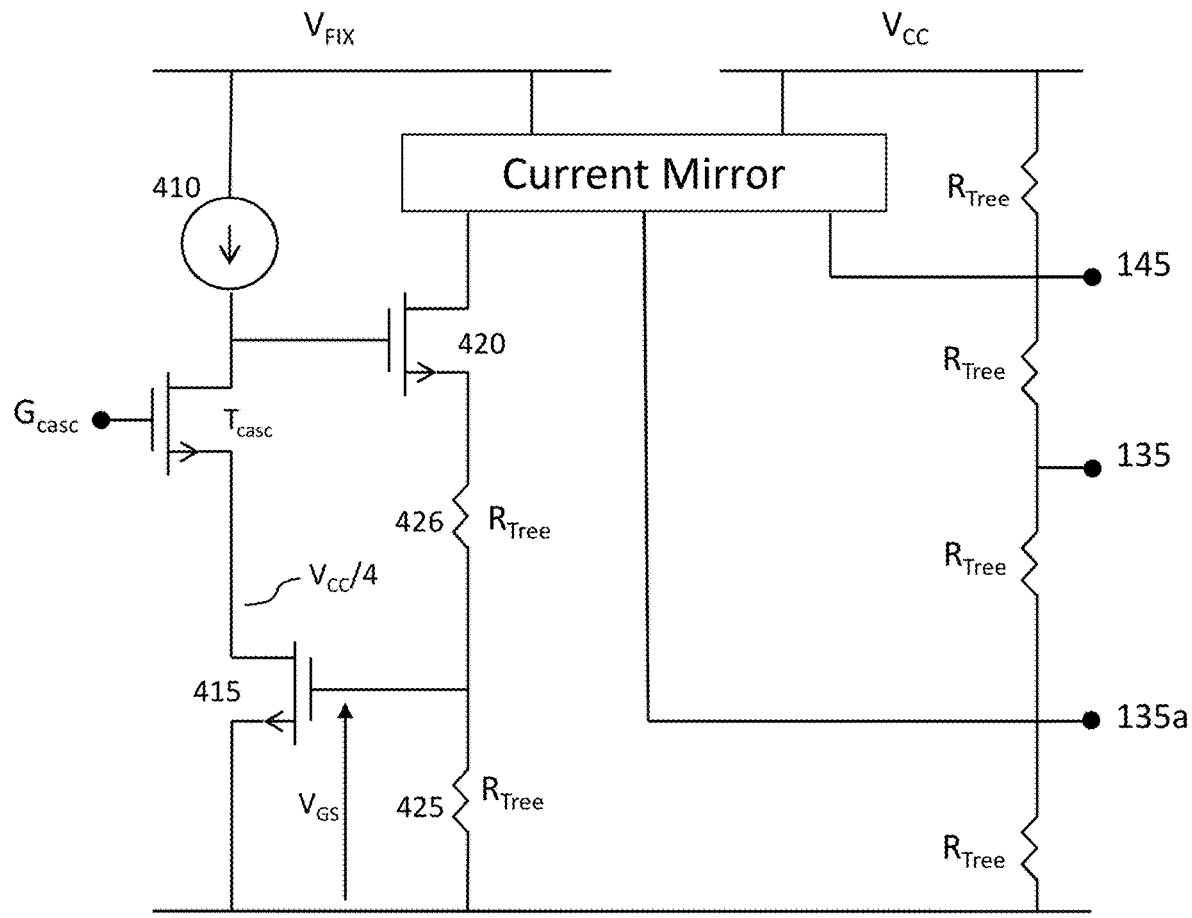
FIG. 4N2

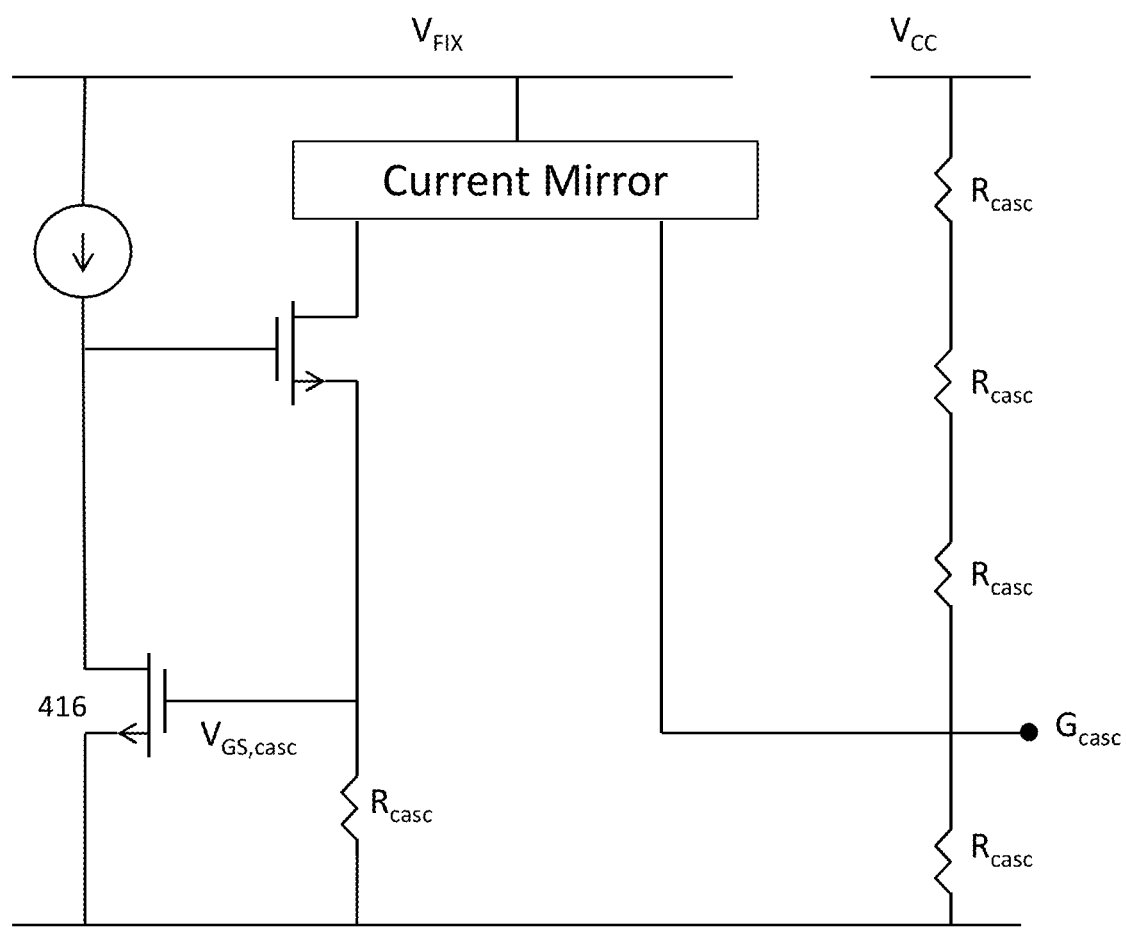
FIG. 4N3

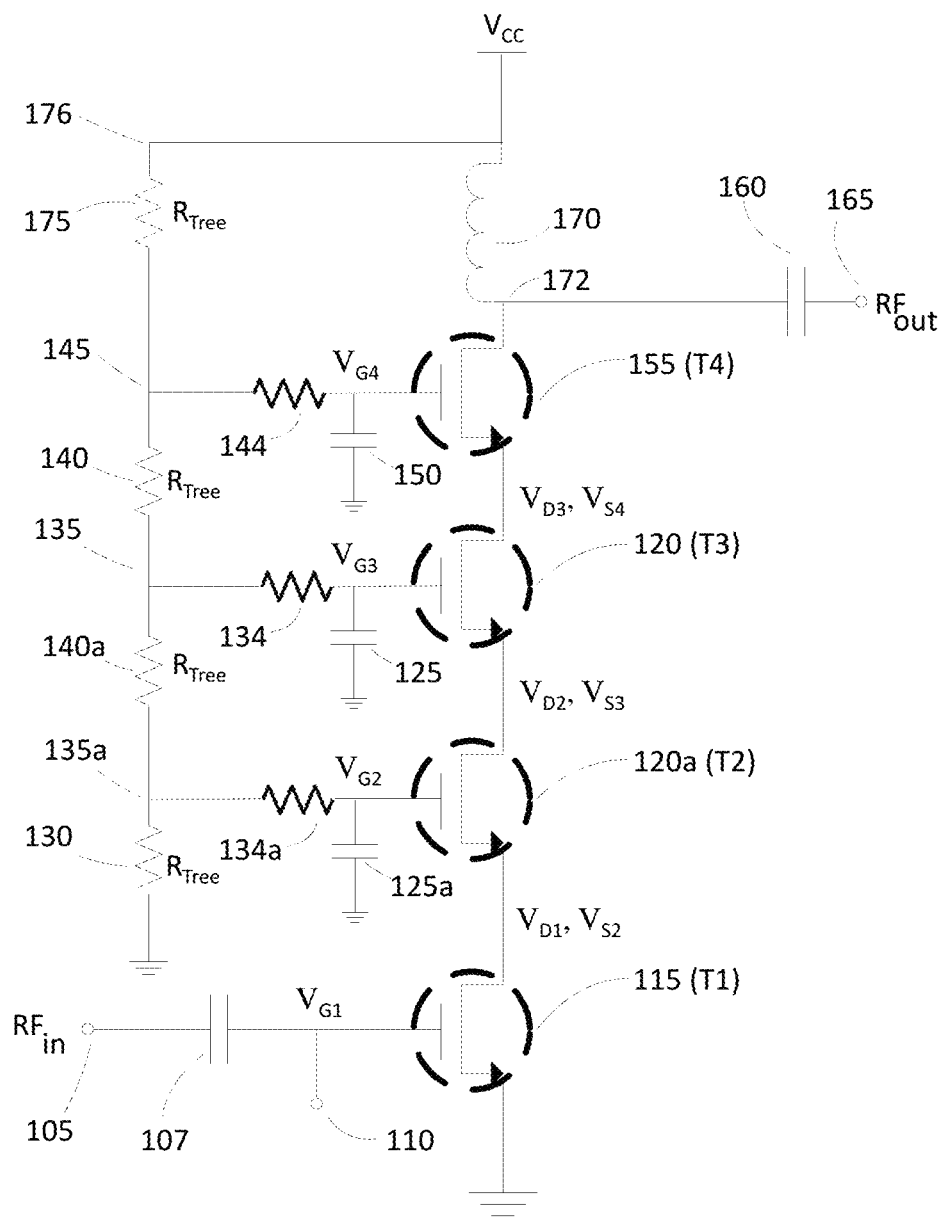
FIG. 12B1

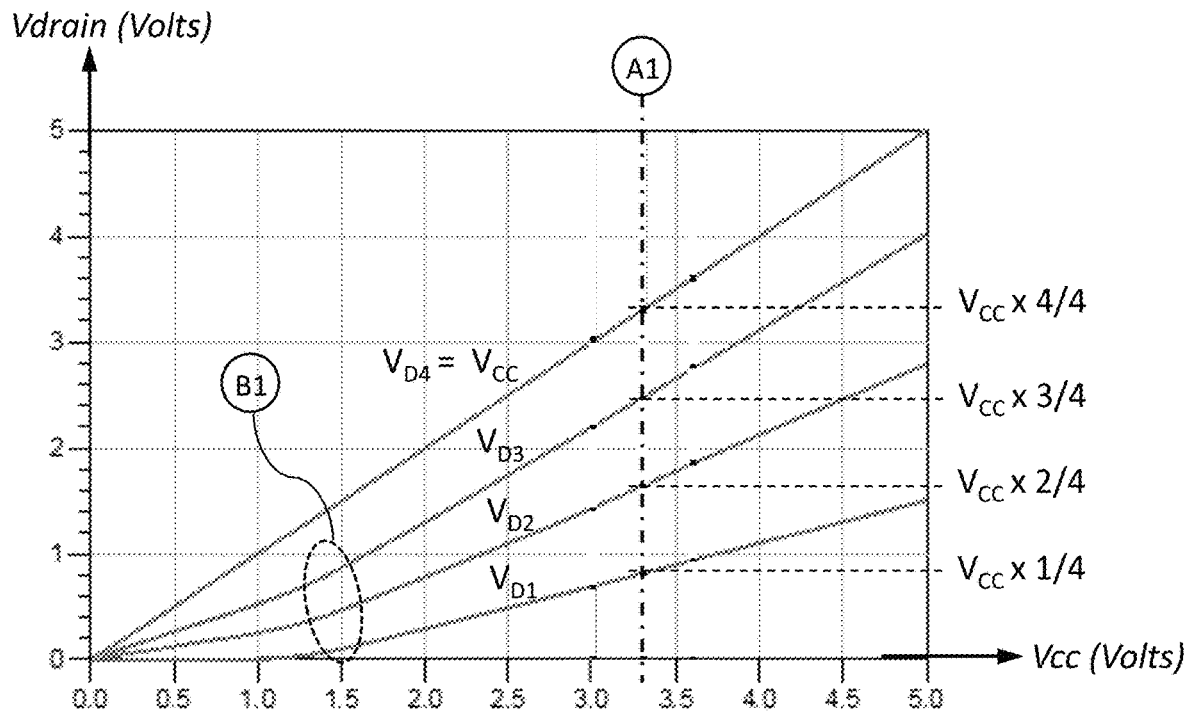
FIG. 12B2
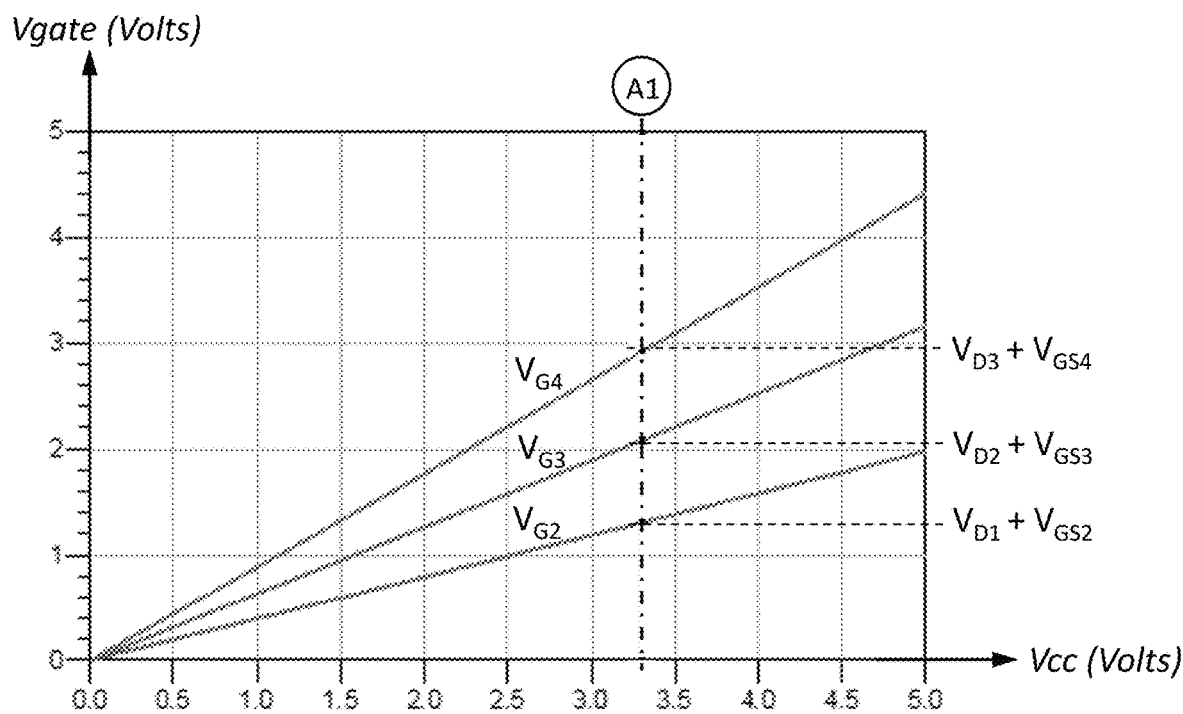
FIG. 12B3

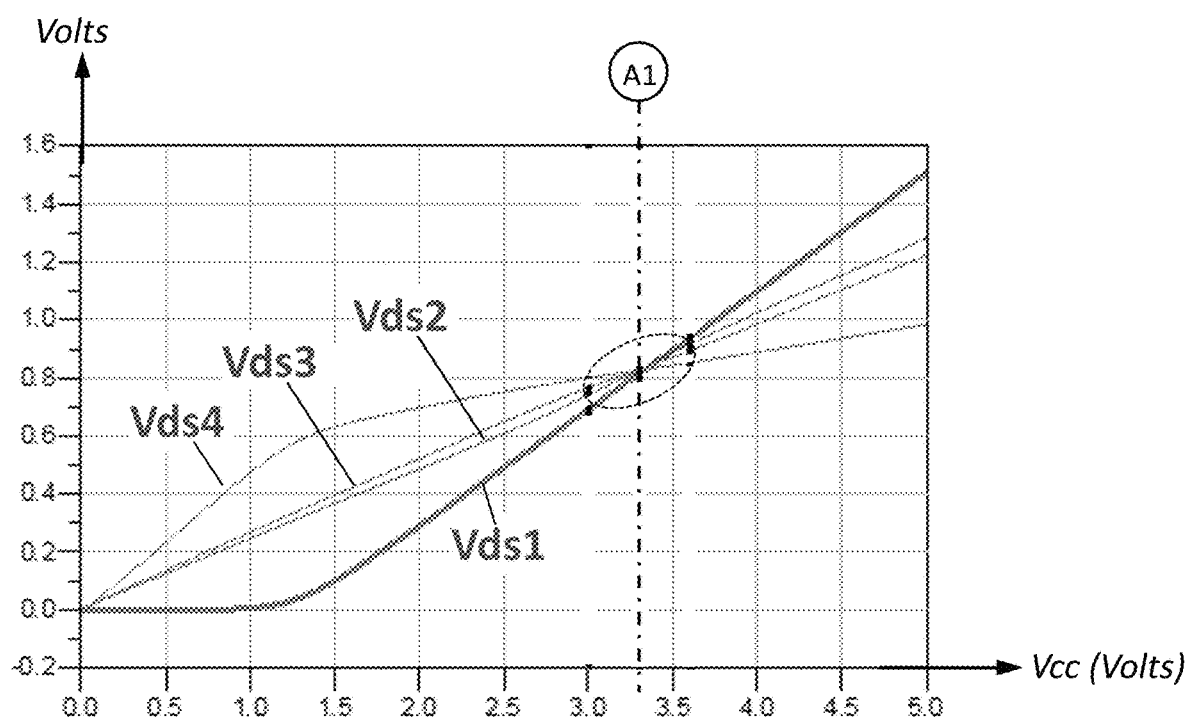
FIG. 12B4

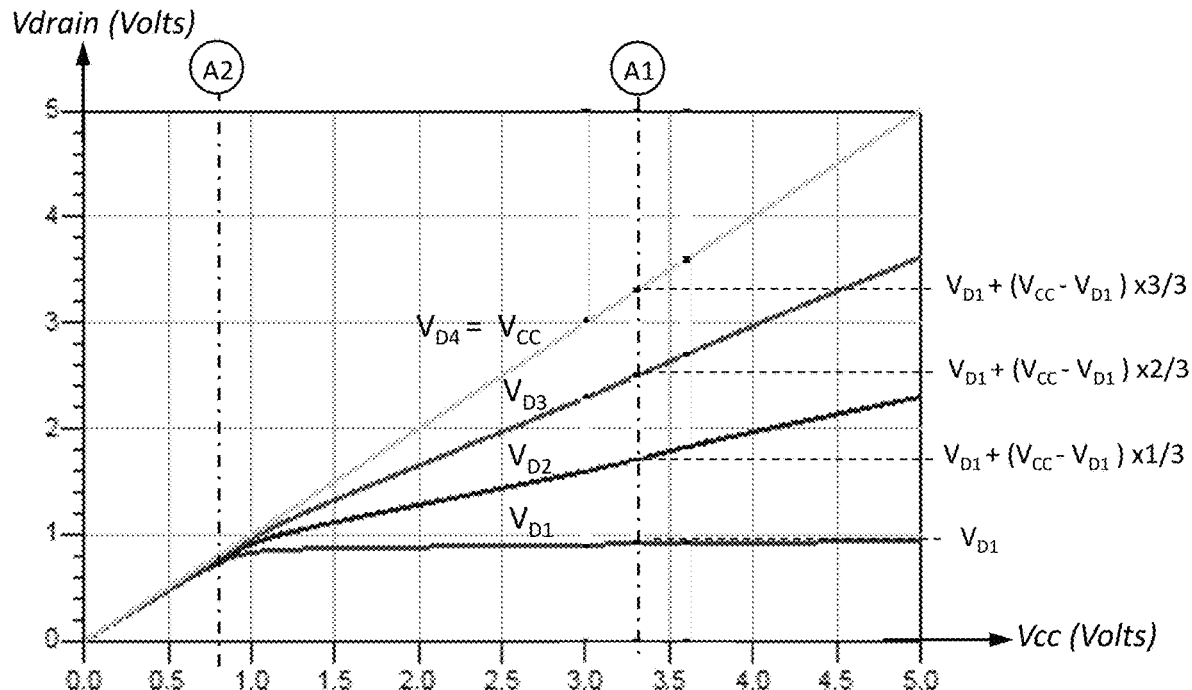
FIG. 12D1
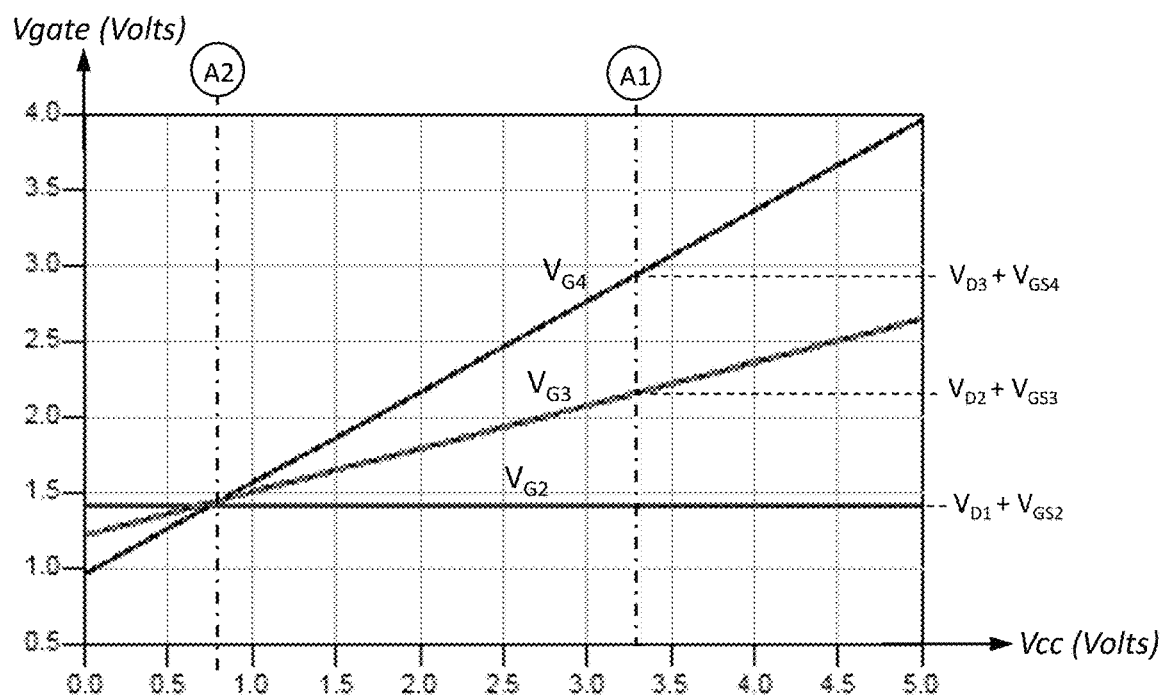
FIG. 12D2

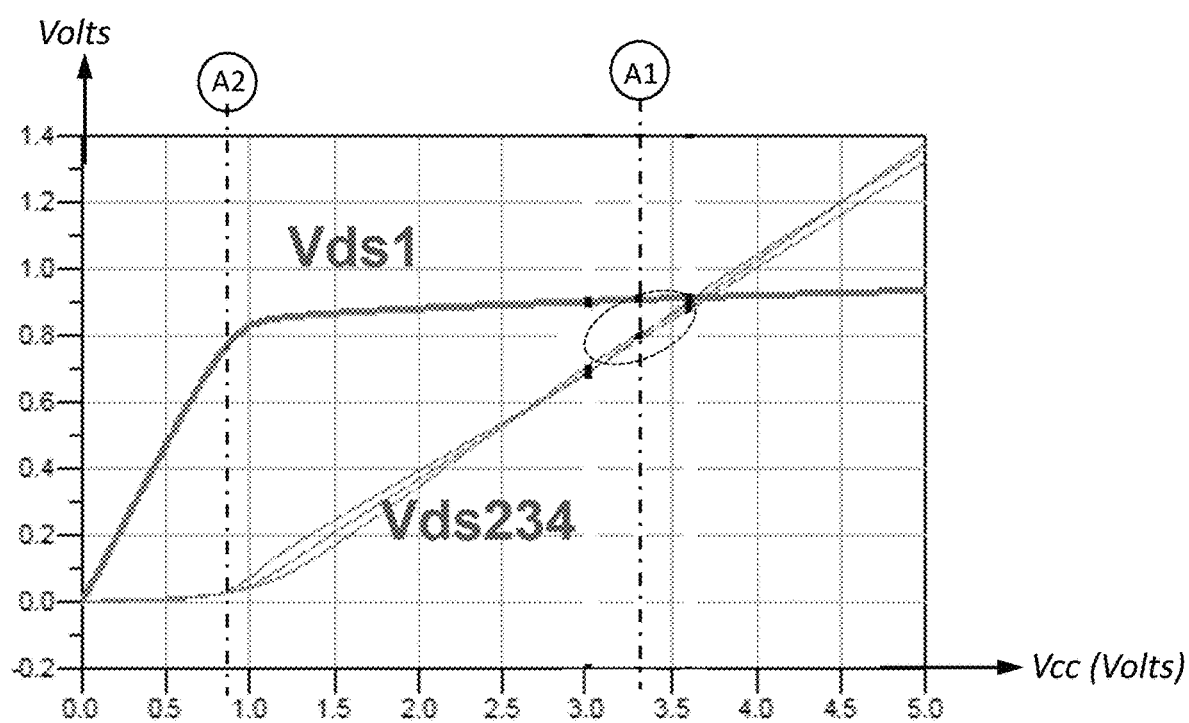
FIG. 12D3

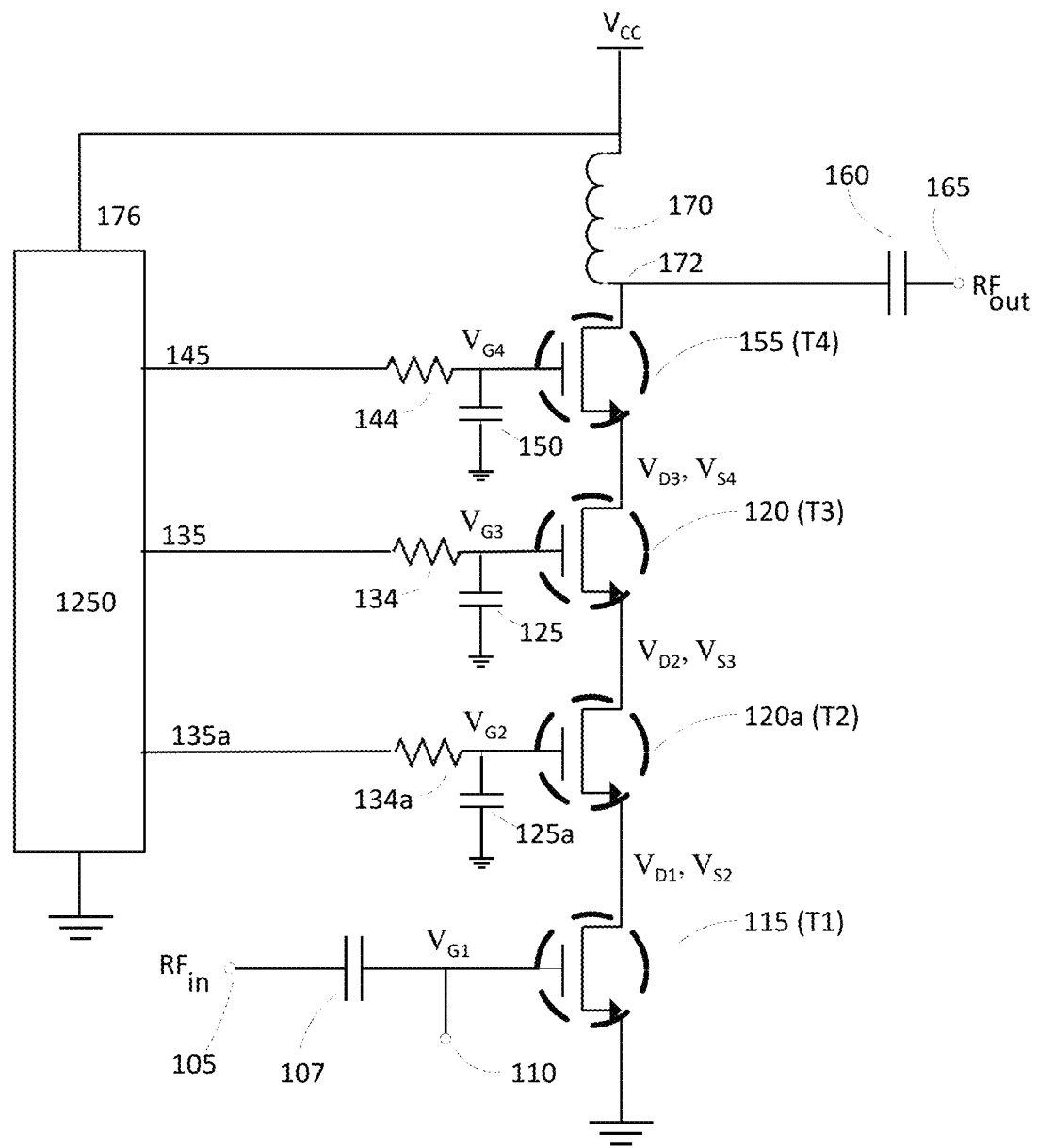
FIG. 12D4

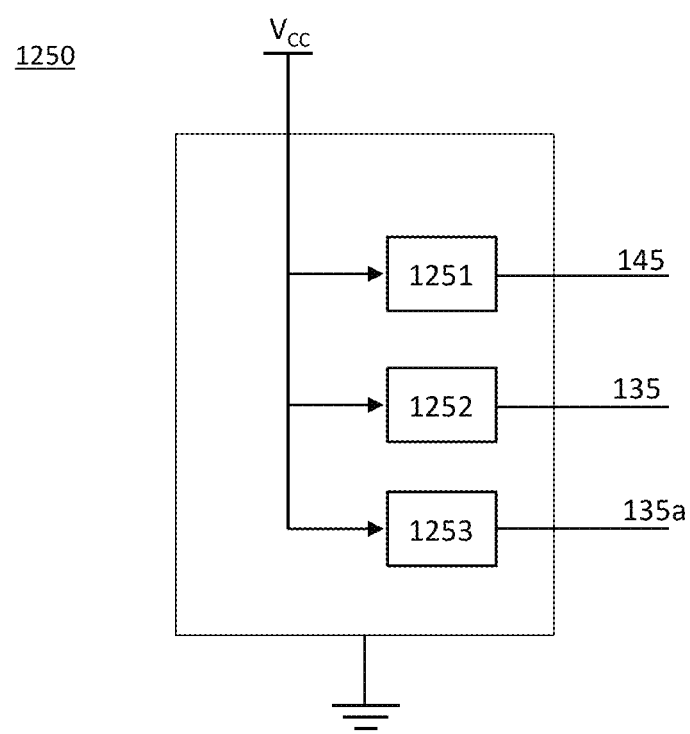
FIG. 12D5

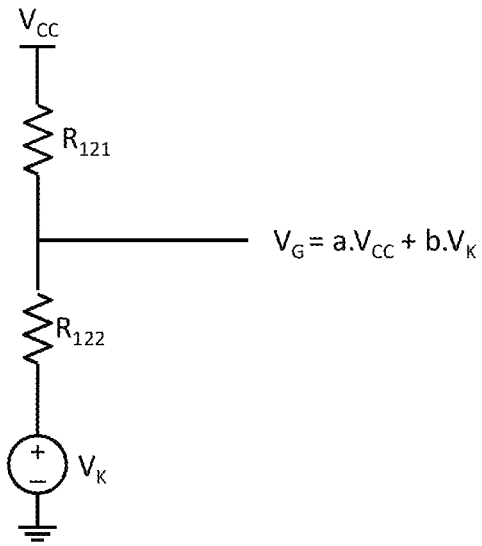
*FIG. 12D6*
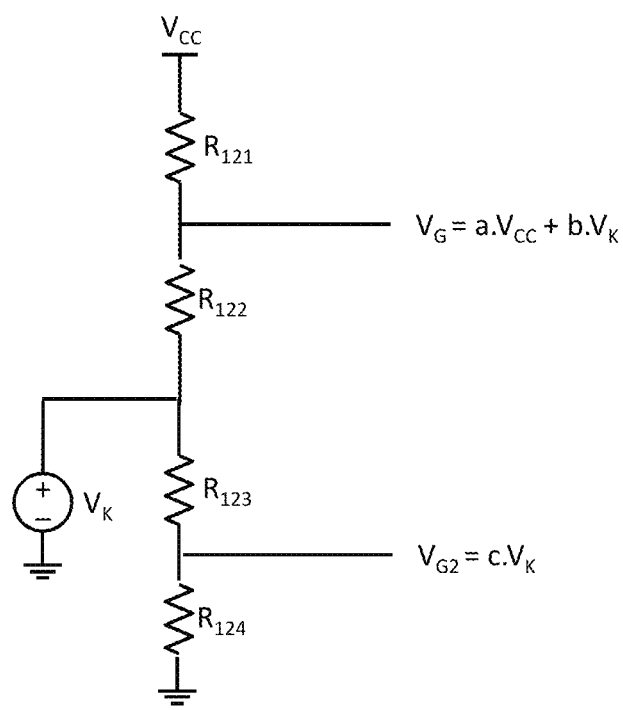
*FIG. 12D7*

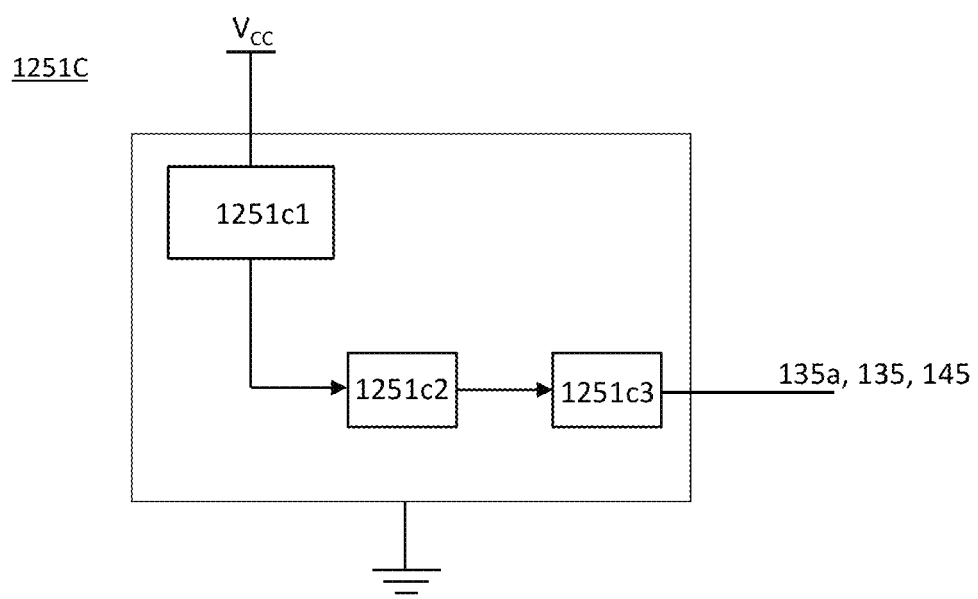
FIG. 12D8

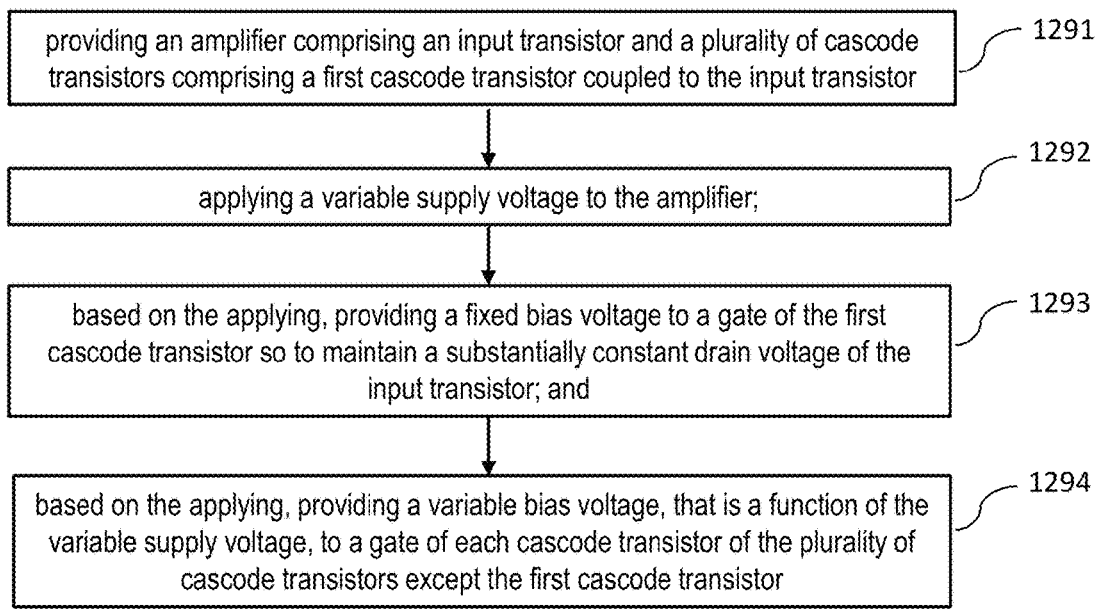
FIG. 12D9

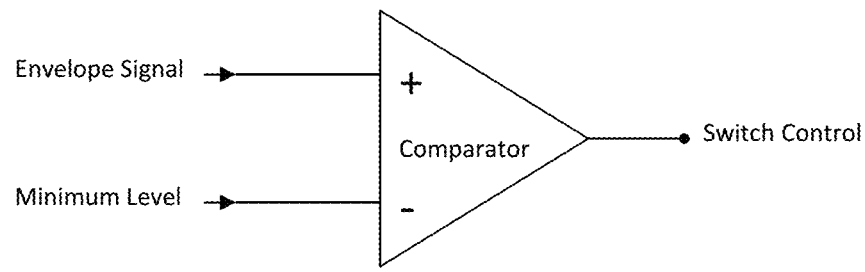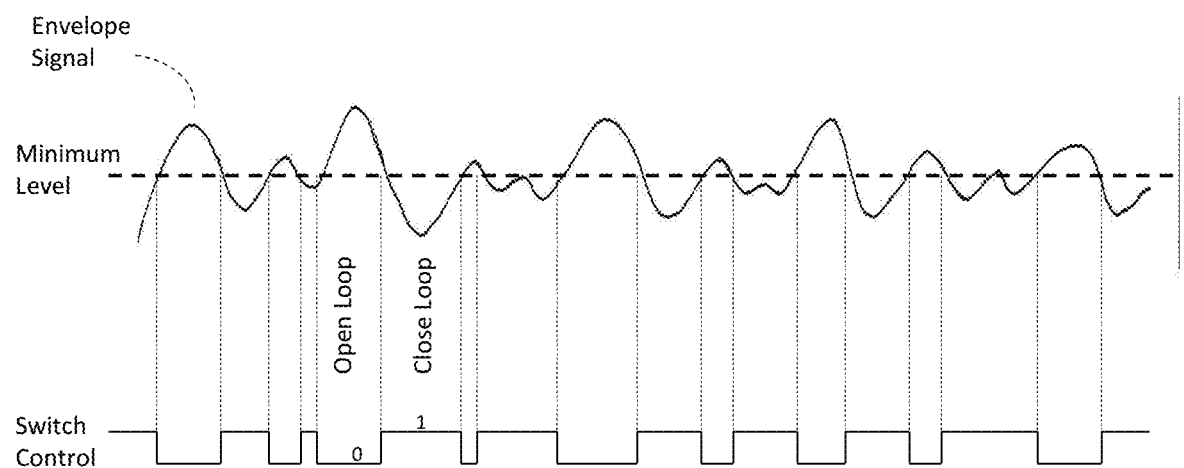
FIG. 28

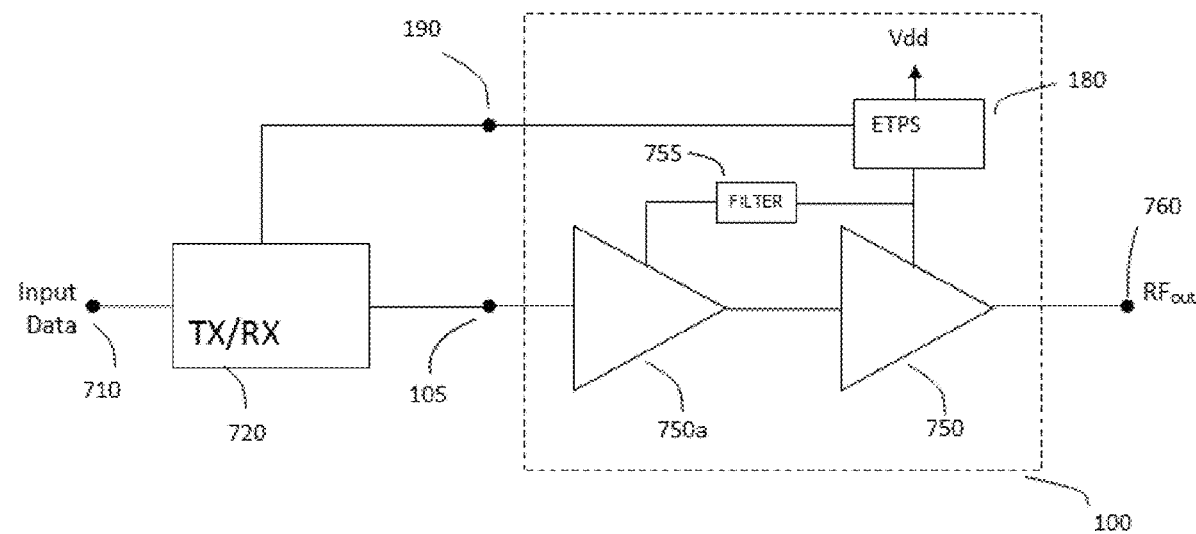
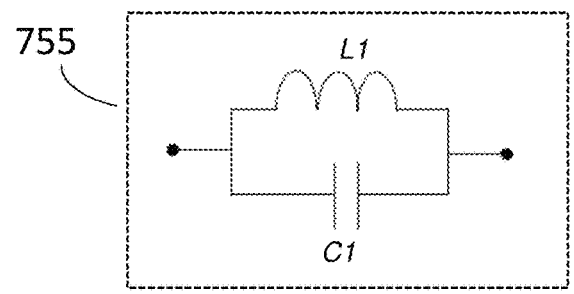
FIG. 69B

CONSTANT VDS1 BIAS CONTROL FOR STACKED TRANSISTOR CONFIGURATION

CROSS REFERENCE TO RELATED APPLICATIONS—CLAIMS OF PRIORITY

The present application is a continuation in part of U.S. application Ser. No. 15/279,274 filed on Sep. 28, 2016, now U.S. Pat. No. 10,243,519, issued Mar. 26, 2019, which in turn is a continuation in part of U.S. application Ser. No. 14/626,833 filed on Feb. 19, 2015, now U.S. Pat. No. 9,716,477 issued Jul. 25, 2017 which in turn is a continuation in part of U.S. patent application Ser. No. 13/829,946 filed on Mar. 14, 2013, now U.S. Pat. No. 9,413,298 issued Aug. 9, 2016 which in turn claims priority to: U.S. provisional application No. 61/747,009 filed on Dec. 28, 2012, U.S. provisional application No. 61/747,016 filed on Dec. 28, 2012, U.S. provisional application No. 61/747,025 filed on Dec. 28, 2012, and U.S. provisional application No. 61/747,034 filed on Dec. 28, 2012; and the disclosures of all of the above cited patents and applications are hereby incorporated herein by reference in their entireties.

The present application may be related to U.S. Pat. No. 9,219,445, issued Dec. 22, 2015, entitled "Optimization Methods for Amplifier with Variable Supply Power", the disclosure of which is incorporated herein by reference in its entirety. The present application may also be related to U.S. Pat. No. 9,667,195, issued May 30, 2017, entitled "Amplifiers Operating in Envelope Tracking Mode or Non-Envelope Tracking Mode", the disclosure of which is incorporated herein by reference in its entirety. The present application may also be related to U.S. Pat. No. 9,287,829, issued Mar. 15, 2016, entitled "Control Systems and Methods for Power Amplifiers Operating in Envelope Tracking Mode", the disclosure of which is incorporated herein by reference in its entirety.

BACKGROUND

1. Field

The present application relates to amplifiers. In particular the present application relates to gate biasing for an amplifier comprising stacked transistors which can operate from a variable supply voltage, such as, for example, in an envelope tracking mode where the variable supply voltage can vary dynamically as a function of an envelope signal, or in any application where the output power of the amplifier is based on a control voltage that varies the variable supply voltage.

2. Description of Related Art

Although nonlinear amplifiers can exhibit higher efficiency than linear amplifiers, until recently nonlinear power amplifiers were undesirable for use with RF signals produced by linear modulation schemes. A technique known as "envelope tracking" (ET) was developed that allows use of linear amplifiers to approach the efficiency of non-linear power amplifiers with RF signals produced by linear modulation schemes (e.g. where it is important to maintain relative variation within an envelope of an RF signal). By dynamically adjusting a DC bias voltage at a drain terminal of an output transistor of a power amplifier in a manner that roughly follows a time varying envelope of the RF signal, a signal produced by a linear modulation scheme can be amplified by a power amplifier without undesirable envelope distortion. Effectively, the technique of envelope tracking shifts a burden of linearity away from the power amplifier to an ETPS (envelope tracking power supply) that is connected to the drain terminal of the output transistor of the nonlinear power amplifier. Same technique of varying the DC bias voltage can be used in applications other than envelope tracking, where the DC bias voltage at the drain terminal of the output transistor follows a control voltage that dictates, for example, a requested output power of the amplifier.

SUMMARY

According to a first aspect of the present disclosure, a circuital arrangement is presented, the circuital arrangement comprising: i) an amplifier comprising: stacked transistors having a plurality of bias terminals comprising a plurality of gate terminals of the stacked transistors and a drain terminal of an output transistor of the stacked transistors; an input port coupled to an input transistor of the stacked transistors; an output port coupled to the drain terminal of the output transistor; and a reference terminal coupling the input transistor to a reference potential, wherein: the stacked transistors comprise two subsets of transistors arranged in series, a first subset comprising the input transistor connected between the reference potential at the reference terminal and a second subset, the second subset comprising a plurality of transistors connected in series with each other, a last transistor of the plurality of transistors being the output transistor and a first transistor of the plurality of transistors connected in series with the input transistor, the second subset connected between the first subset and a variable supply voltage provided to the output transistor; and ii) a gate bias circuit, wherein: for a varying voltage of the variable supply voltage, the gate bias circuit provides: a) a fixed bias voltage to a gate of the first transistor so to maintain a substantially constant drain voltage of the input transistor, and b) a respective variable bias voltage, that is a function of the variable supply voltage, to a gate of each transistor of the second subset except the first transistor so to maintain a drain-to-source voltage of each transistor of the second subset that is substantially equal to a drain-to-source voltage of any other transistor of the second subset.

According to a second aspect of the present disclosure, a circuital arrangement is presented, the circuital arrangement comprising: an amplifier comprising an input transistor and a plurality of cascode transistors comprising a first cascode transistor coupled to the input transistor; and a biasing circuit configured to generate, based on a varying supply voltage to the amplifier, a fixed gate bias voltage for the first cascode and a plurality of variable gate bias voltages for remaining transistors of the plurality of cascode transistors so to control the input transistor to maintain operation in saturation region while the plurality of cascode transistors operate with varying bias voltages.

According to a fourth aspect of the present disclosure, a method for biasing an amplifier is presented, the method comprising: providing an amplifier comprising an input transistor and a plurality of cascode transistors comprising a first cascode transistor coupled to the input transistor; applying a variable supply voltage to the amplifier; based on the applying, providing a fixed bias voltage to a gate of the first cascode transistor so to maintain a substantially constant drain voltage of the input transistor; and based on the applying, providing a variable bias voltage, that is a function of the variable supply voltage, to a gate of each cascode transistor of the plurality of cascode transistors except the first cascode transistor.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 4E1, 4E2, 4F, 4G1 and 4G2 show exemplary DC gate biasing circuital configurations to provide the DC gate biasing represented in FIG. 4D.

FIG. 4H1 shows an exemplary DC and AC gate biasing circuital configuration according to an embodiment of the present disclosure for an amplifier comprising a stack of four transistors.

FIG. 4H2 shows the configuration depicted in FIG. 4H1 with the addition of a dynamic supply filtering capacitor coupled at a node feeding a DC biasing signal.

FIGS. 4L1, 4L2 and 4L3 show exemplary current generating circuits configured to automatically select one of two current mirror circuits to output a current, based on a difference in supply voltage provided to each of the two current mirror circuits.

FIG. 4M1 shows a block diagram of a gate biasing circuit according to an embodiment of the present disclosure comprising three frequency dependent gate biasing sub-circuits.

FIGS. 4M2, 4M3 and 4M4 show exemplary gate DC biasing sub-circuits according to some embodiments of the present disclosure.

FIG. 4N1 shows an exemplary DC biasing circuit diagram according to an embodiment of the present disclosure where a $V_{GS}$ synthesis circuit is used to generate a desired $V_{GS}$ voltage.

FIGS. 4N2 and 4N3 show a modified version of the exemplary DC biasing diagram depicted in FIG. 4N1 configured to generate a $V_{GS}$ voltage which closely matches a $V_{GS}$ at a gate of an input transistor to a stack.

FIG. 4O1 shows a circuital arrangement of an exemplary GSM amplifier whose output power is controlled by a control voltage applied to a low dropout regulator (LDO).

FIG. 4O2 shows a graph representing an output power (in volts) of the amplifier of FIG. 4O1 as a function of the control voltage, and a predicted output power (in volts) of the amplifier (4020) as a function of the control voltage.

FIG. 4O3 shows graphs representing predicted output power error and a specified upper limit and lower limit of the error per the 3GPP specification for mobile broadband standard, where the predicted output power is based on a two-point calibration of the output power of the amplifier of FIG. 4O1 with respect to the control voltage, where biasing of the stacked transistors of the amplifier provides a substantially equal division of the supply voltage to the stack across the stacked transistors as the supply voltage, controlled by the control voltage, decreases.

FIG. 4O4 shows graphs representing predicted output power error and a specified upper limit and lower limit of the error per the 3GPP specification for mobile broadband standard, where the predicted output power is based on a two-point calibration of the output power of the amplifier of FIG. 4O1 with respect to the control voltage, where biasing of the stacked transistors of the amplifier controls the transistors to sequentially operate in their respective triode regions of operation while maintaining the input transistor to the stack operating in its saturation region of operation as the supply voltage, controlled by the control voltage, decreases.

FIG. 4O5 shows a biasing circuit according to the present disclosure which can provide bias voltages to the gates of stacked transistors operating in a cascode configuration to sequentially control, with a decreasing Vcc voltage, the stacked transistors for operation in their respective triode regions of operation.

FIG. 4O6 shows a circuital representation of an exemplary implementation according to the present disclosure of the biasing selector circuit (45100) of FIG. 4O5.

FIG. 4O7 shows a circuital representation of another exemplary implementation according to the present disclosure of the biasing selector circuit (45100) of FIG. 4O5.

FIG. 4O8 depicts graphs representing a varying supply voltage Vcc with respect to a control voltage and exemplary gate bias voltages (V145, V120, V120a) generated at nodes (145, 120, 120a) by the biasing circuit (4500) of FIG. 4O5 in response to the varying supply voltage.

FIG. 4O9 shows a variation of the circuital arrangement of FIG. 4O1 wherein a gate biasing supply voltage is separate from the LDO.

FIG. 5 shows waveforms that correspond to an exemplary envelope signal and an exemplary control signal that closely follows peaks of the exemplary envelope signal and is slightly higher than troughs of the exemplary envelope signal.

FIGS. 6 and 7 show example embodiments according to the present disclosure of an envelope tracking amplifier that is configured such that gate bias voltages applied to gates of different FETs can be independent of each other due to inclusion of gate modifiers.

FIG. 9 shows an example embodiment according to the present disclosure of an envelope tracking amplifier with gates and drain modulation, wherein summing resistors are used to provide incremental corrections to gate biases in addition to gate biasing provided by the ETPS unit.

FIG. 12B1 shows an exemplary embodiment according to the present disclosure of gate biasing of an RF amplifier comprising a varying power supply.

FIG. 12B2 shows graphs representing drain voltages of stacked transistors of the RF amplifier shown in FIG. 12B1 as a function of a varying supply voltage.

FIG. 12B3 shows graphs representing biasing voltages to gates of the stacked transistors of the RF amplifier shown in FIG. 12B1 as a function of the varying supply voltage.

FIG. 12B4 shows graphs representing drain-to-source voltages of the stacked transistors of the RF amplifier shown in FIG. 12B1 as a function of the varying supply voltage.

FIG. 12D1 shows graphs, according to an embodiment of the present disclosure, representing drain voltages versus varying supply voltage of stacked transistors of the RF amplifier shown in FIG. 12D4.

FIG. 12D2 shows graphs, according to an embodiment of the present disclosure, representing gate voltages versus varying supply voltage of stacked transistors of the RF amplifier shown in FIG. 12D4.

FIG. 12D3 shows graphs, according to an embodiment of the present disclosure, representing drain-to-source voltages versus varying supply voltage of stacked transistors of the RF amplifier shown in FIG. 12D4.

FIG. 12D4 shows a biasing circuit that provided voltages to gates of the stacked transistors of an RF amplifier according to graphs shown in FIG. 12D1, FIG. 12D2 and FIG. 12D3.

FIG. 12D5 shows an exemplary block diagram of the biasing circuit of FIG. 12D4.

FIG. 12D6 shows an exemplary embodiment according to the present disclosure of a biasing circuit for biasing a gate of a transistor of the stacked transistors of the RF amplifier shown in FIG. 12D4.

FIG. 12D7 shows another exemplary embodiment according to the present disclosure of a biasing circuit for biasing gates of two transistors of the stacked transistors of the RF amplifier shown in FIG. 12D4.

FIG. 12D8 shows another exemplary embodiment according to the present disclosure of a biasing circuit for biasing gates of the stacked transistors of the RF amplifier shown in FIG. 12D4.

FIG. 12D9 is a process chart showing a method for biasing an amplifier according to an embodiment of the present disclosure.

FIG. 28 shows an exemplary method of detecting a switch control signal as well as the relationship between a switch control, the feedback loop status (open/close) and the envelope signal.

FIG. 35 uses an input tunable matching network and an output tunable matching network. FIG. 36 uses a resistor-capacitor feedback loop that can be enabled through the use of a feedback switch. FIG. 37 uses an alternative resistor-capacitor feedback loop that is configured to tune the resistor and capacitor elements based on a desired mode of operation.

FIG. 69B shows an example embodiment according to the present disclosure of an amplifier configuration adapted to pass DC and the envelope modulation frequency components of the ETPS output and stop higher frequency components of the ETPS output susceptible to put the combination of a driver ET amplifier and a final ET amplifier into oscillation.

DETAILED DESCRIPTION

The present disclosure describes methods and arrangements for amplifier dynamic bias adjustment for envelope tracking and other applications where the supply voltage to the amplifier varies. Furthermore, configuration methods and arrangements using such amplifiers as well as related system integration and controls are presented. Such amplifiers may be used within mobile handsets for current communication systems (e.g. WCMDA, LTE, GSM, etc.) wherein amplification of signals with frequency content of above 100 MHz and at power levels of above 50 mW is required. Such amplifiers may also be used to transmit power at frequencies and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 26:
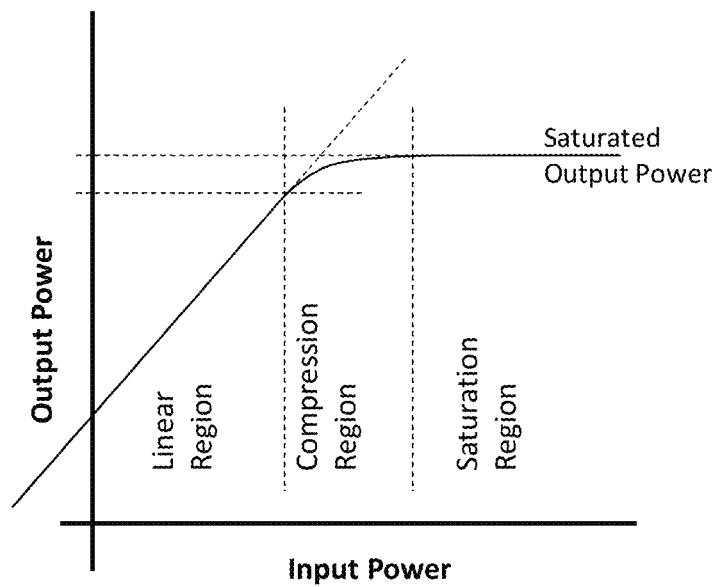
FIG. 26 shows relationships between input/output power and various regions of operation of an amplifier.

Throughout the present disclosure, the terms "linear region" and "compression region" refer to basic operations of an amplifier stage. When operating in the linear region, the amplifier output response is linear, in other words, the change in the output power of the amplifier is linear with respect to a corresponding change in input power. This is the typical response of the amplifier at low input power levels. Typically, there is minimal change in the amplifier's gain or phase response as a function of input power in this region. As the input power level to the amplifier increases and the amplifier output approaches its maximum output level, known as the saturation level, the output response of the amplifier becomes non-linear. In this case, the change in output power of the amplifier for a given change in input power decreases as the output power approaches the saturation level. Once the output power reaches saturation level, any incremental increase in input power will not affect the output power level (zero incremental gain), thus remaining at saturation. The transition region between the linear region and the region of zero incremental gain is referred to as the compression region of operation of the amplifier. The region of zero incremental gain wherein the output power remains at the saturation level is referred to as the saturation region. One measure of the amount of compression typically used in the industry is the −1 dB compression point. This is the point at which the gain has been reduced by 1 dB. Furthermore, it is common in the industry to refer to the saturation level as the −3 dB compression point. FIG. 26 shows the various regions of operation of an amplifier. Typically, the phase response will change along with the gain as the amplifier starts to compress.

Operating an amplifier from a fixed supply results in degraded efficiency when the peak-to-average ratio of the modulation is large. This is because the supply voltage needs to be high enough to accommodate the peak, even though most of the time a much lower supply voltage could be used. The voltage from the supply that is not needed for the RF signal is wasted as heat in the amplifier as depicted by FIG. 29B, where the supply voltage level is indicated by the top of the gray box and the dissipated heat is represented by the gray area.

In applications where the amplitude of the RF signal to be amplified is modulated, one could imagine coarsely following the envelope of the modulated signal with a variable power supply. This provides an advantage if the variable power supply is efficient. The applied variable supply voltage can be relatively slow or fast, compared to the modulation frequency and still provide a benefit, as all cases would result in less power dissipated in the amplifier. In this variable supply case, it is assumed that the supply is always some level above the instantaneous supply voltage needed, which means that all amplitude information is from the RF input waveform, and the amplifier remains as a linear amplifier (operates in the linear region). The amplifier would remain as a linear amplifier throughout (constant gain and phase), but may experience distortion such as AM-PM (amplitude modulation-to-phase modulation) due to the supply voltage changes. Although industry standard definitions don't exist at this time, some refer to this method as envelope following. The supply is following the envelope at some level, but doesn't have to follow it exactly. FIG. 29C depicts such a case, where the variable power supply follows very closely the envelope of the modulated signal (e.g. transmitted RF), which results in a reduction of the dissipated heat.

The next level of improvement comes when the dynamic supply voltage no longer maintains headroom or some margin between the needed voltage and the supplied voltage. In this case, the amplitude of the amplifier's output is set or limited by the supply voltage. This puts the amplifier in compression at these instants, which typically further improves the efficiency because now the efficiency of the amplifier has improved along with the reduced power due to excess voltage wasted as heat. Transition from linear to compressed regions of operation obviously results in reduced gain for the amplifier. Additionally, the phase response often changes as this transition occurs. The transition from compression to linear regions of operation will have the equal but opposite change in gain and phase.

Operating in this mode where the envelope signal from the dynamic supply puts the amplifier into compression means that the output of the dynamic supply must be exact in time or phase and also amplitude, otherwise distortion will result at the output of the amplifier. In other words, the amplitude or envelope path is separate from the phase path, but both must have acceptable time alignment when the two components are combined. This time alignment must be preserved over the bandwidth of the modulation, thus imposing limits on the phase distortion allowed in the paths.

The bandwidth of the envelope signal needs to be several times larger than the baseband modulation bandwidth. This is because a polar decomposition of the modulation into magnitude and phase shows much wider bandwidth for the amplitude portion. Another way to think of it is by considering the modulation in an IQ constellation format. A transition from one symbol to the next may make a phase change of up to 180 degrees, but it may go from the outermost symbol's amplitude, through a peak, then approach or even reach zero, and return to an outermost symbol's amplitude, all within one symbol transition. That translates into a fast amplitude component. This mode of operation, where the envelope must track the signal amplitude precisely, is often referred to as envelope tracking.

In the envelope tracking case, the amplitude and phase information are being supplied at the input to the amplifier (complex modulation). The dynamic supply voltage may further set the amplitude, but isn't required at all signal levels. The dynamic supply voltage may apply the envelope signal at the peaks and through some portion of the modulation, but then reach a minimum value and let the amplitude information at the amplifier's input continue to provide the amplitude or envelope through other portions of the modulation. This minimum value of the dynamic supply is typically chosen based on the capabilities of the dynamic supply and also the minimum acceptable supply voltages for the amplifier.

If the supply were to follow the envelope all the way through every symbol transition and thus impart all amplitude modulation through the envelope path, the result would be a polar modulator. A polar modulator or polar amplifier has all phase information applied at one port, usually the RF input of an amplifier, and all amplitude information applied at a second port, usually the output bias for an amplifier. Polar modulators or amplifiers are challenging for several reasons: 1) the bandwidth of the amplitude signal is much wider than the baseband modulation and wider than the ET envelope bandwidth, 2) the amplitude signal may approach or even reach zero in the modulation, which is difficult to do in a real amplifier setup without significant distortion, and 3) it is difficult to create a modulated signal over a large range of output powers.

It should be noted that although envelope tracking is used throughout the current disclosure to showcase the various embodiments, many of the teachings of the present disclosure apply not only to envelope tracking, but to envelope following, average power tracking (e.g. through DC-DC converter), and polar modulation as well. Many of teachings according to the present disclosure can equally be applied to applications where the RF signal to be amplified is at a fixed amplitude (e.g. GSM) and output power of the amplifier is controlled by varying the power provided to the amplifier by the variable power supply (e.g. low dropout regulator LDO).

Memory effects are also important in amplifiers. Memory effects are when the response of the amplifier is dependent on a previous state of the amplifier. For example, if the input modulation hits a peak and causes increased power dissipation in the amplifier device, the device may experience self-heating or a device temperature increase from the power dissipation. If the modulation amplitude decreases a moment later, the amplifier's gain and phase may still be altered due to the heating associated with the modulation from the previous time. There are many possible sources of memory effects, including thermal, bias circuits, and matching components. Operation in envelope following, envelope tracking, and polar modulation modes can further introduce memory effects due to the dramatically changing bias conditions. These effects must be considered by the amplifier and system designers.

Figure 1:
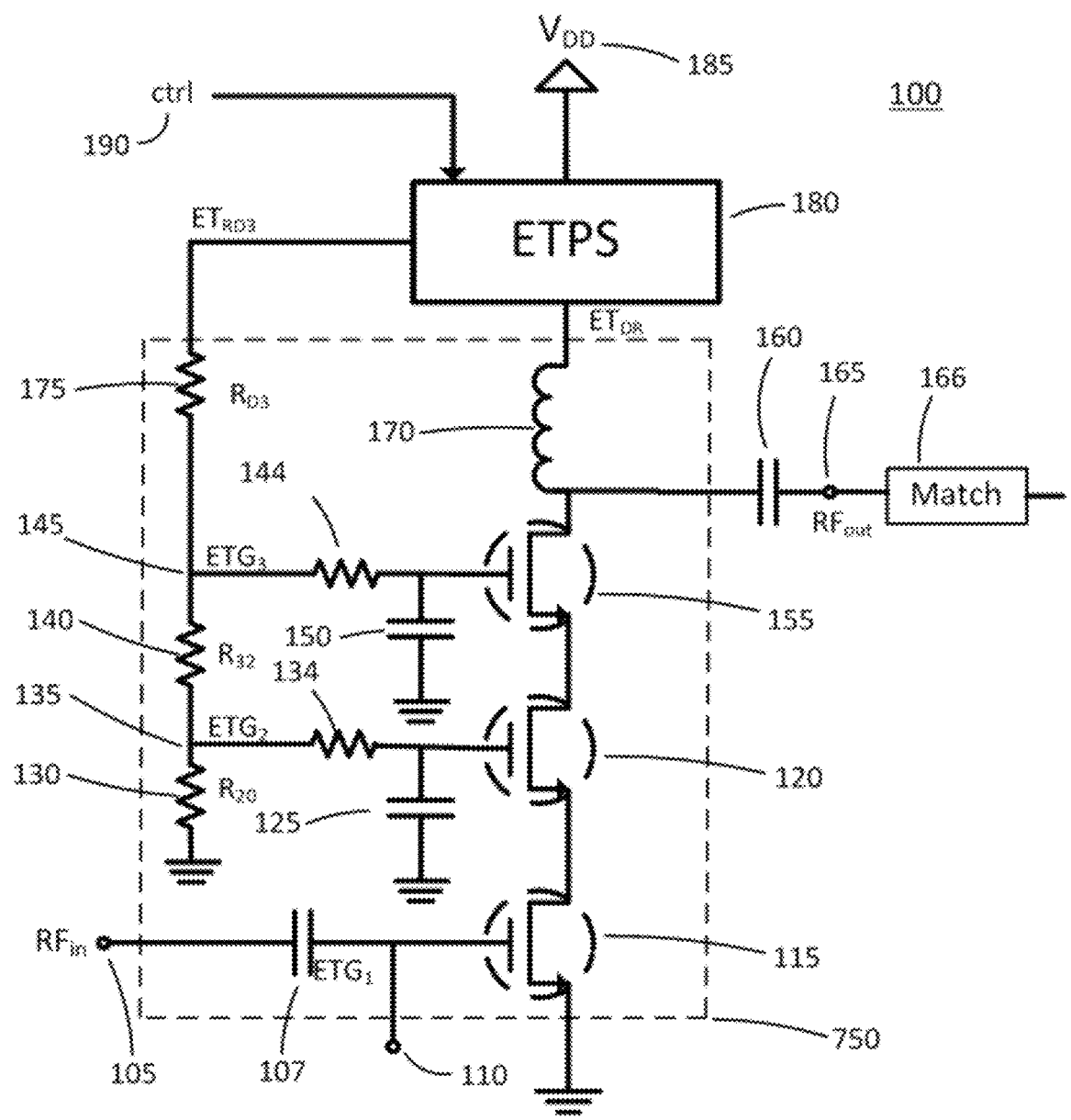
FIG. 1 shows an example embodiment according to the present disclosure of an envelope tracking amplifier with a match circuit at its output.

FIG. 1 shows an example envelope tracking amplifier (100) according to various embodiments of the present disclosure. By way of example and not of limitation, the envelope tracking amplifier (100) can comprise a stack of FETs (e.g., three FETs): a first FET (115), a second FET (120), and a third FET (155). Moreover, the first FET (115) can be referred to as a first subset of FET(s), and the second FET (120) and the third FET (155) (cascode) can be referred to as a second subset of FET(s). The skilled person will note that FETs (115), (120) and 155) are configured as a three-stage cascode amplifier (750). Teachings from other documents, such as U.S. Pat. No. US2011/0181360 A1, published on Jul. 28, 2011, further describe stacked cascode amplifiers and methods to minimize output signal distortion by way, for example, of biasing the various gates of the transistors within the stack. The person skilled in the art may use these teaching for further specifics on multi-stage stacked transistors in a cascode configuration. If the stack of FETs comprises more than three FETs, e.g., four FETs, the second, third, and fourth FETs will be considered as part of the second subset of FET(s). In the embodiment shown in FIG. 1, a DC bias voltage is supplied to the envelope tracking amplifier (100) by a supply voltage $V_{DD}$ (185). Although N-type MOSFETs are used to describe the embodiments in the present disclosure, a person skilled in the art would recognize that other types of transistors such as, for example, P-type MOSFETs and bipolar junction transistors (BJTs) can be used instead or in combination with the N-type MOSFETs. Furthermore, a person skilled in the art will also appreciate the advantage of stacking more than two transistors, such as three, four, five or more, provide on the voltage handling performance of the amplifier. This can for example be achieved when using non bulk-Silicon technology, such as insulated Silicon on Sapphire technology. In general, individual devices in the stack can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

Figure 19:
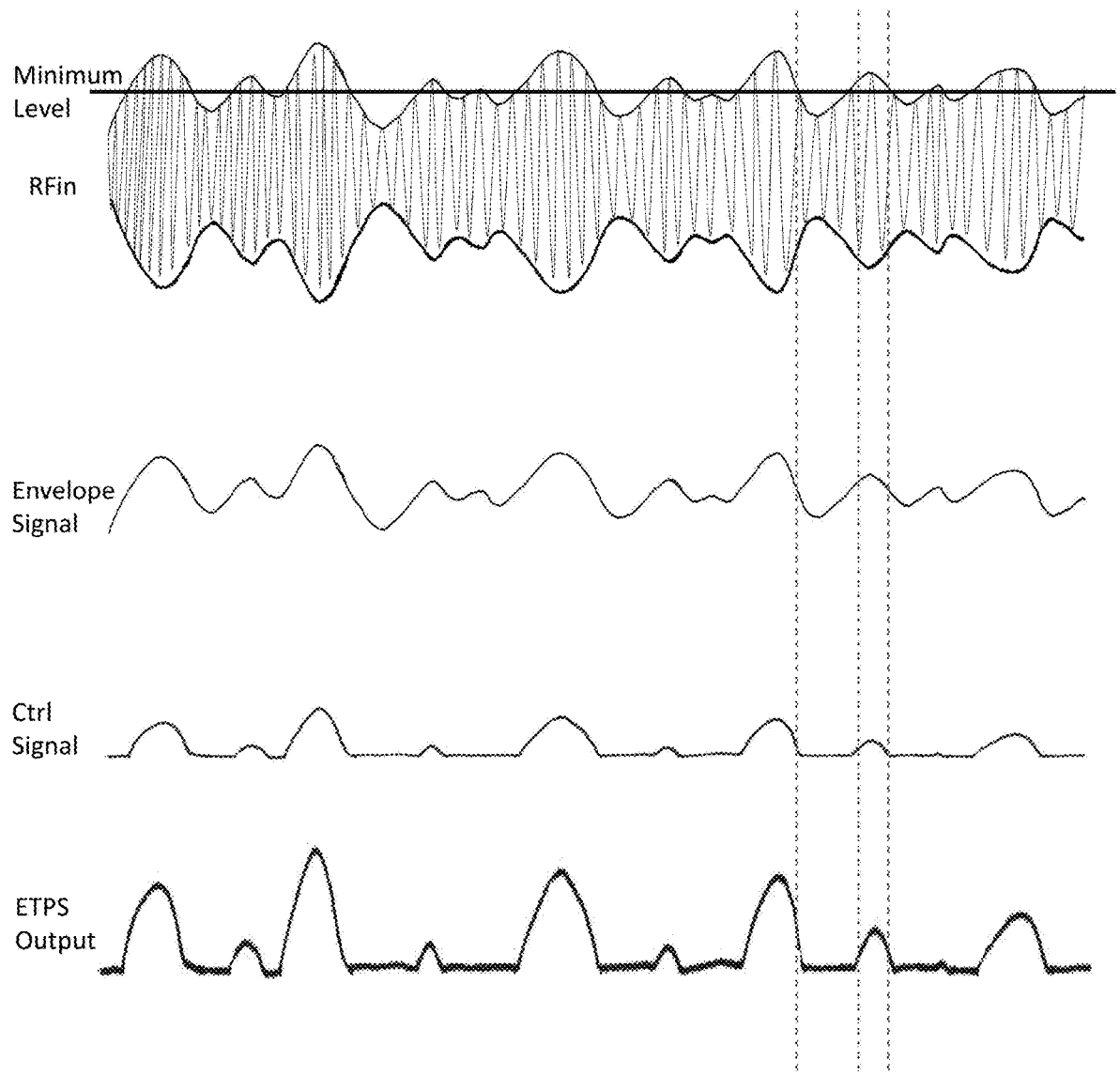
FIG. 19 shows an exemplary relationship between an RF input signal, a corresponding envelope signal, a corresponding ET power supply control signal and a corresponding ET power supply output.

An envelope tracking power supply (ETPS) (180), such as, for example, a variable voltage or current source (e.g. variable DC-DC converter), can be connected to receive power from power supply $V_{DD}$ (185) and output a dynamic bias voltage to a third resistor (175) with a resistance value represented by $R_{D3}$, and to an inductor (170). The dynamic bias output from the ETPS can be controlled by a control voltage or current signal "ctrl" (190). As a consequence of the control signal (190) applied to the ETPS (180) the dynamic bias voltages $ET_{RD3}$ and $ET_{DR}$ are functions of a time varying envelope of an RF input signal (e.g. FIG. 19) that is provided to an input terminal (105) of the envelope tracking amplifier (100). The input port of the envelope tracking amplifier (100) can comprise the input terminal (105) and a reference (e.g. ground) terminal that is connected to a source of the first FET (115). The envelope of the RF input signal is hereinafter referred to as an "envelope signal", and may be represented by a time varying signal roughly following the envelope of the RF input signal. Although a variable DC-DC convertor may be used to describe the ETPS within the various embodiments of the present disclosure, a person skilled in the art would recognize that other types of envelope tracking power supplies (ETPS) based on variable voltage or current sources may be used as well. FIG. 19 shows an exemplary relationship between an input RFin signal, a corresponding envelope signal, an ETPS control signal (ctrl) derived from the envelope signal and an output of the ETPS corresponding to the control signal. It is to be noted that during the envelope tracking operation the ETPS control signal, and thus the ETPS output, at times follows the envelope signal, and at times takes a fix value. The person skilled in the art will know that when ETPS output follows the envelope signal, the output of the amplifier is in compression and the RF output power is provided by the ETPS, and when at a fixed level, the amplifier operates linearly and the RF output is determined by the RF input signal.

Envelope tracking power supplies need to have a bandwidth wide enough to support the amplitude component of the modulation. As mentioned, this can be many times greater than the baseband bandwidth. To accomplish this, many ETPSs are built using a combination of a DC-DC switching converter and an analog error amplifier. They can be constructed in many ways, including serial and parallel combinations. The switching DC-DC converter is typically more efficient than the analog amplifier, but has a more limited bandwidth. This is because the DC-DC converter can support a modulation bandwidth that is approximately a factor of 5 to 10 lower than its switching frequency. Faster DC-DC converters are desired. The process choice plays an important role in setting the bandwidth of the DC-DC converter. While hybrid technologies such as CMOS (control circuits) and GaN (switchers) might offer high speed and efficiency, monolithic integration benefits such as cost and size may push the solution to a process such as CMOS, CMOS SOI, or CMOS SOS. SOI and SOS processes include a variety of benefits, one of which is lower parasitic capacitance, and thus faster speeds. If the DC-DC converter is fast enough, the analog amp would not be required.

There are numerous benefits to integration of these functions and even integration with the amplifier itself. Integration of the ETPS or portions of it with the amplifier can result in reduced parasitic inductance, reduced parasitic capacitance, reduced phase delays and distortion, and device matching. With monolithic integration of circuit blocks that may include the amplifier, ETPS, and/or control circuits, one can make use of the matching between devices to track and adjust variations due to manufacturing tolerances, temperature and others in ways that can't be supported across multiple ICs and possibly multiple technologies.

Figure 2:
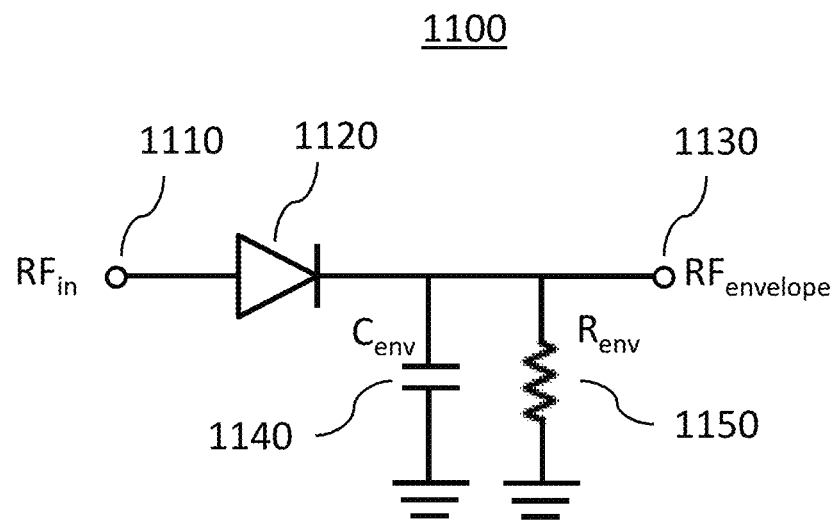
FIG. 2 shows an example implementation of an envelope detector.

The term "port" refers to a two terminal pair, where a signal can be applied across the two terminals. As used herein, the term "dynamic bias voltage" may refer to a bias voltage that can vary with respect to time. The envelope signal may be extracted from the RF input signal by way of an envelope detector. FIG. 2 shows an example implementation of the envelope detector (1100). The envelope detector (1100) can comprise a diode (1120) in series with a load, where the load can be represented by a capacitor (1140) with a value of $C_{env}$ and a resistor (1150) with a value represented by $R_{env}$ that are connected in parallel. $R_{env}$ and $C_{env}$ can be chosen to determine a maximum rate change of an envelope signal $RF_{envelope}$ that is extracted at an output terminal (1130) from an input signal $RF_{in}$ that is fed into an input terminal (1110). Further design details of the envelope detector (1100) as well as other implementations of envelope detectors will be known to a person skilled in the art.

Turning back to FIG. 1, the inductor (170) serves as an RF choke to allow the dynamic bias voltage $ET_{DR}$ to pass to a drain of the third FET (155) while preventing RF energy from flowing to the ETPS (180). The inductor (170) in FIG. 1 can be a choke, a smaller inductor that is part of the matching circuit, or a more complex structure that diplexes signals at different frequencies. A coupling capacitor (160) is connected between the drain of the third FET (155) and an output terminal (165) where an RF output signal can be obtained. An output port of the envelope tracking amplifier (100) can comprise the output terminal (165) and the ground terminal that is connected to the source of the first FET (115). This output port typically feeds a matching circuit (166) (e.g. tunable matching network as described in U.S. Pat. No. 7,795,968 B1, issued on Sep. 14, 2010, which is incorporated herein by reference in its entirety) to condition the RF output signal for the next stage. The third resistor (175) is further connected to a gate resistor (144), which is connected to the gate of the third FET (155). A second resistor (140) with a value represented by $R_{32}$ is connected between node (145) and a second gate resistor (134), which is connected to the gate of the second FET (120). A first resistor with a value represented by $R_{20}$ is also connected between electrical ground and node (135). The value of the gate resistor (144) may be smaller than the value of resistor (175) and the value of gate resistor (134) may be smaller than the value of resistor (140). By way of example and not of limitation, gate resistors (144) and (134) may be 50 ohms.

The third, second, and first resistors (175), (140), and (130), respectively, form a voltage divider network such that a set of bias voltages $ET_{G2}$, $ET_{G3}$ are scaled versions of the dynamic bias voltage $ET_{RD3}$ and therefore vary as a function of the envelope signal. For example, the bias voltage $ET_{G2}$ can be expressed according to the following equation as per standard voltage division:

$$ET_{G2}=ET_{RD3}*(R_{20})/(R_{20}+R_{32}+R_{D3})$$

The voltage divider network may be considered to be an example embodiment of bias adjustment circuitry. As used herein, the term "bias adjustment circuitry" may refer to circuitry that is configured to perform an adjustment operation on a dynamic bias voltage signal prior to applying the dynamic bias voltage signal to bias terminals of an amplifier that comprises stacked FETs. In the embodiment shown in FIG. 1, a third gate capacitor (150) is connected between the gate of the third FET (155) and electrical ground. Also in the embodiment shown in FIG. 1, a second gate capacitor (125) is connected between the gate of the second FET (120) and electrical ground. The gate capacitors (125, 150) allow gate voltages (voltage across the respective gate capacitor) of the second FET (120) and the third FET (155), respectively, to float, that is let the gate voltages vary along with the RF signal at the drain of the corresponding FETs (120, 155), which consequently allow control (e.g. evenly distribute) of the voltage drop across the two transistors for a more efficient operation of the two transistors. See for example, U.S. Pat. No. 7,248,120, issued on Jul. 24, 2007, entitled "Stacked Transistor Method and Apparatus", which is incorporated herein by reference in its entirety.

During operation of the envelope tracking amplifier (100), a bias voltage at the drain of the third FET (155), delivered through the inductor (170), in addition to the bias voltages $ET_{G2}$ and $ET_{G3}$ at the gate of the second FET and the gate of the third FET, respectively, vary as a function of the envelope signal as dictated by the ETPS control signal (190).

Figure 3:
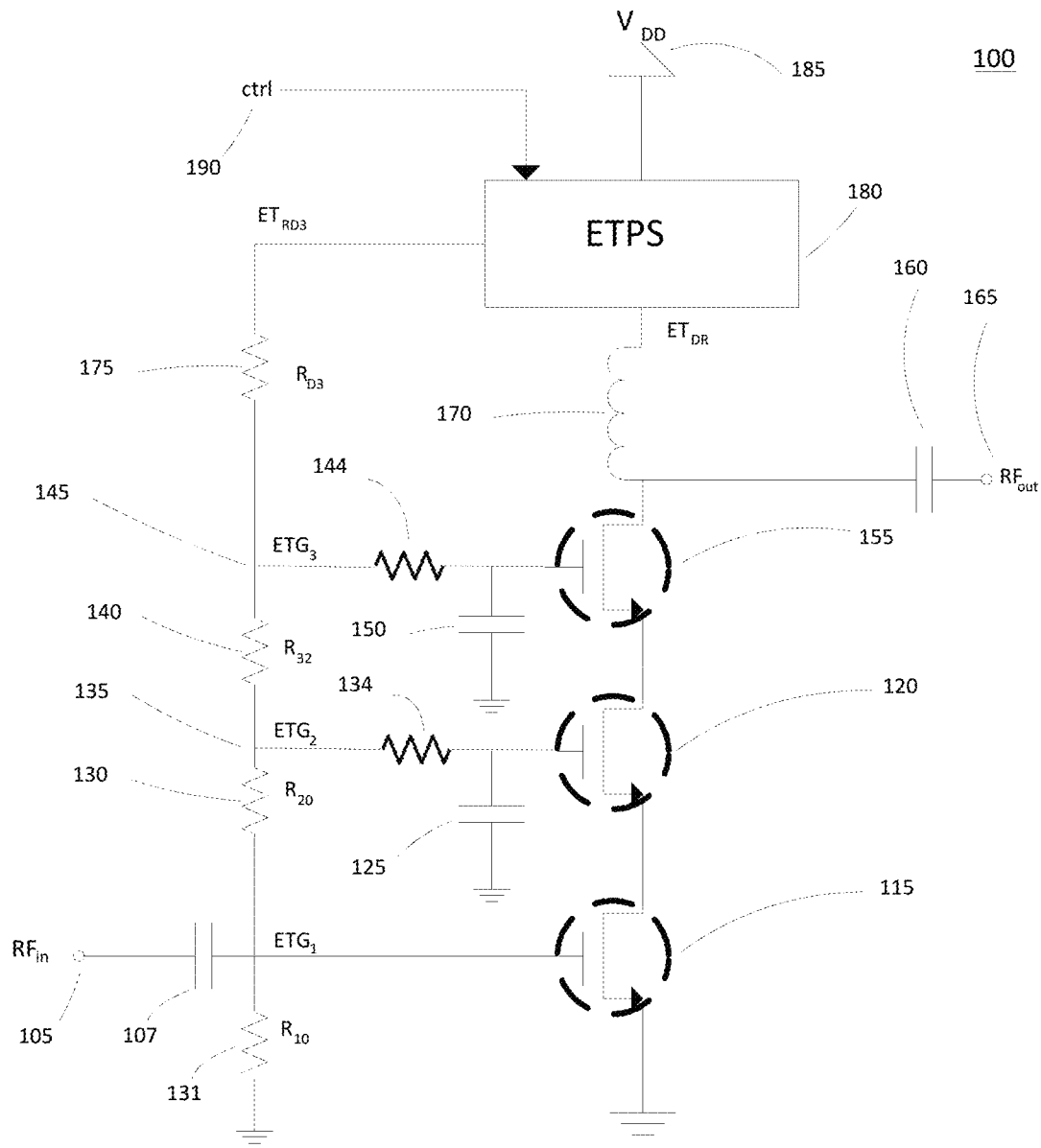
FIGS. 3 and 4A show example alternative embodiments to the envelope tracking amplifier shown in FIG. 1.
Figure 4A:
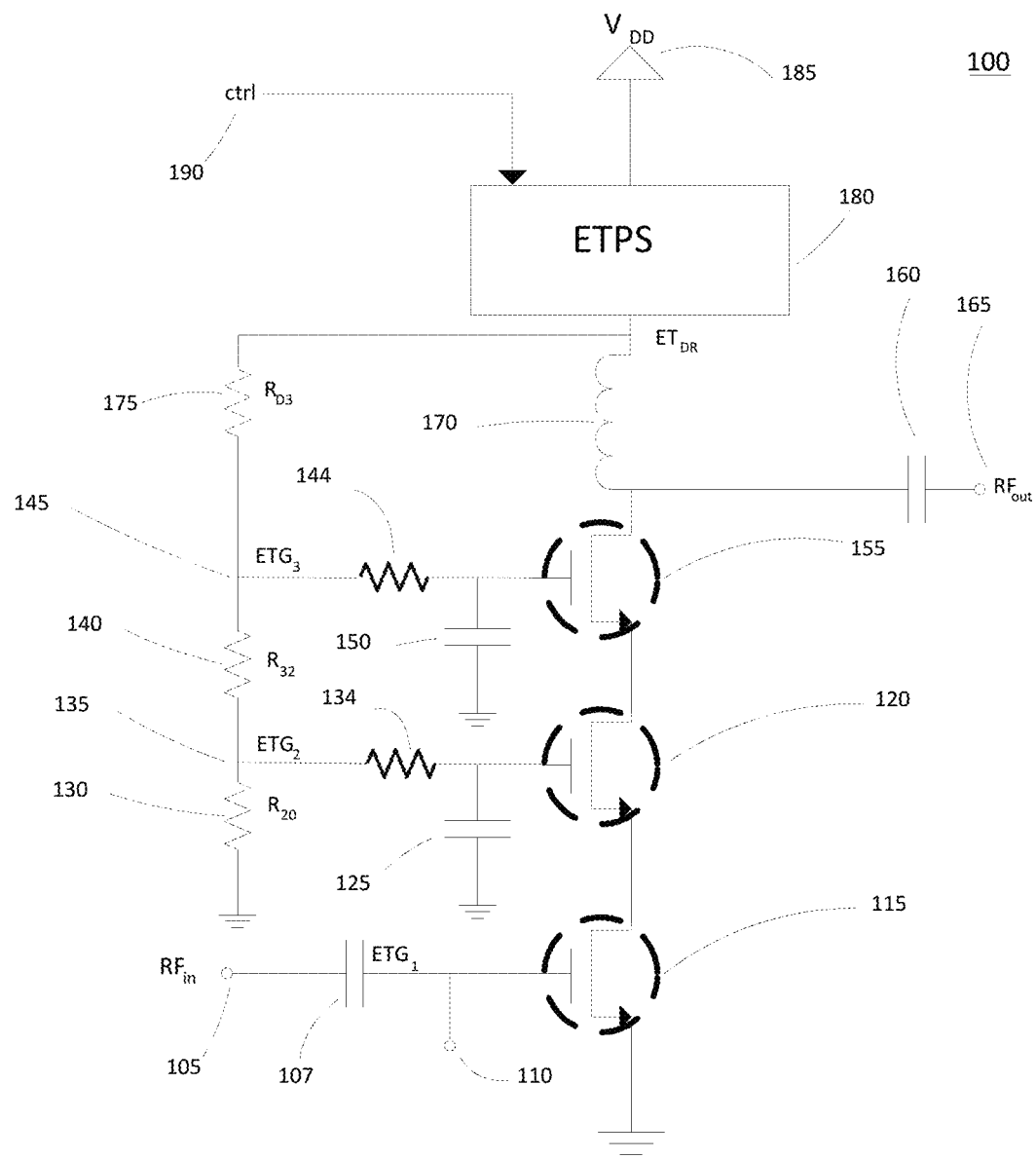

Additionally, a bias voltage $ET_{G1}$ can be applied to a first gate bias node (110) to bias a gate of the first FET (115). The bias voltage $ET_{G1}$ can be either a fixed voltage or a dynamic bias voltage. One or more of the gate bias voltages $ET_{G1}$, $ET_{G2}$, $ET_{G3}$ can be scaled, amplitude shifted, phase shifted, inverted, and/or subject to any mathematical operation (e.g. implemented by an op-amp circuit) with relation to the dynamic bias voltage $ET_{DR}$ supplied to the inductor (170), such operations performed by other embodiments of bias adjustment circuitry. Introducing a phase shift in one or more of the gate bias voltages $ET_{G1}$, $ET_{G2}$, $ET_{G3}$ can compensate for unintended effects of the envelope tracking amplifier (100) by pre-distorting phase(s) of the first, second and/or third FET (115, 120, 155). In some embodiments, the bias voltage $ET_{G1}$ is held fixed while the other two bias voltages $ET_{G2}$ and $ET_{G3}$ vary as a function of the envelope signal. In other possible embodiments, one or more of the gate bias voltages $ET_{G1}$, $ET_{G2}$, $ET_{G3}$ are dynamic bias voltages while other gate bias voltages are fixed bias voltages. By way of example, and not of limitation, FIG. 3 shows an exemplary arrangement of implementing the dynamic bias voltage to the gate of the first FET (115) through the voltage divider formed by resistors $R_{D3}$, $R_{32}$, $R_{20}$, and $R_{10}$. In some embodiments, the dynamic bias voltage for the drain and the gates of the FETs can come from a single output of the ETPS (180), as shown in FIG. 4A.

The envelope tracking amplifier (100) can be used as a driver, a final, or any other type of amplifier. For example, such an amplifier may be used within a mobile handset for current communication systems to amplify signals with frequency content above 100 MHz and at power levels of above 50 mW. The stack of FETs may comprise any number of FETs (e.g. FIG. 8B, described later) and be chosen to be partially or fully depleted for best overall performance. The embodiment shown in FIG. 1 uses three FETs merely by way of example, as a person skilled in the art will be able to extend the teachings of the present disclosure to other embodiments comprising any number of FETs in the stack of transistors. The bias for the gate of the first FET (115) can be provided by, for example, a current mirror circuit, or any of a variety of standard biasing configurations known to a person skilled in the art.

Figure 5:
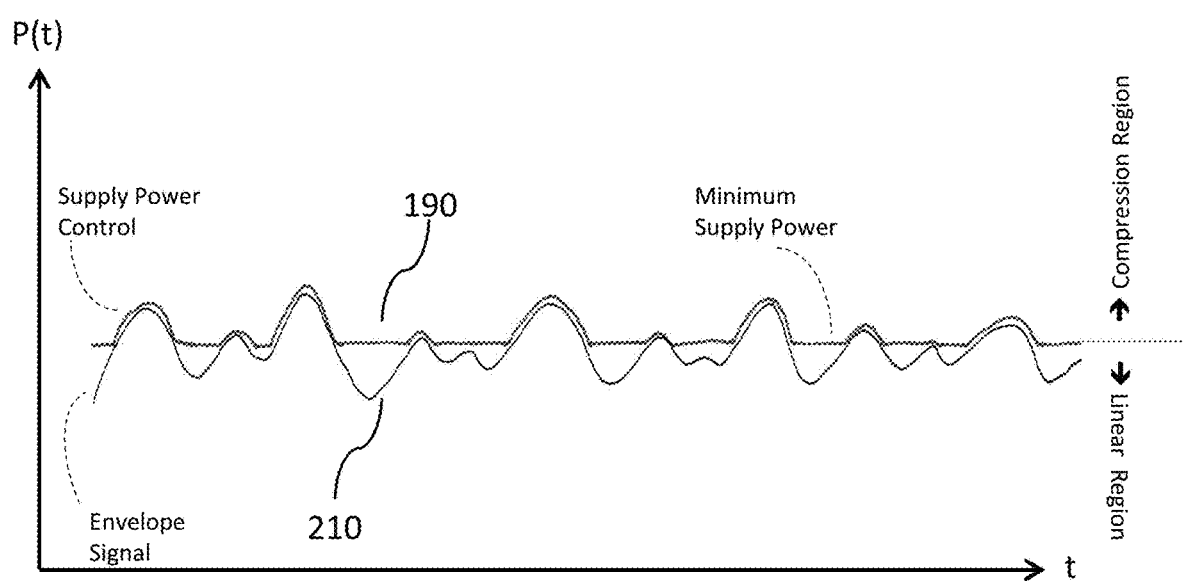

In some embodiments, the control signal (190), that is used to determine the dynamic bias voltages $ET_{RD3}$ and $ET_{DR}$, closely follows the envelope signal. In other embodiments, the control signal (190) closely follows peaks of the envelope signal and can be slightly higher than the troughs of the envelope signal. In yet other embodiments, the control signal (190) may alternate between following the envelope signal during certain periods of time, and being constant during other periods of time. FIG. 5 shows waveforms that correspond to an exemplary envelope signal (210) and an exemplary control signal (190) that closely follows peaks of the exemplary envelope signal and is constant during the troughs of the exemplary envelope signal. Such an embodiment enables the envelope tracking amplifier to operate in or near the compression region of the amplifier during peaks of the envelope signal, and operate in the linear region of the amplifier during troughs of the envelope signal. In embodiments where the dynamic bias voltages $ET_{RD3}$ and $ET_{DR}$ are directly related (e.g. $ET_{RD3}$ and $ET_{DR}$ both increase or decrease at similar times), equal voltage division across the second and third FETs (120, 155) can be maintained, which contributes to keeping the second and third FETs (120, 155) in saturation as the RF input signal and the RF output signal vary. Modulating the gate voltage (e.g. via $ET_{RD3}$ or $ET_{DR}$) lets the transistors in the stack remain in the saturation region, thus preserving their amplitude and phase characteristics as the envelope signal is varied. This can lead to better overall amplifier linearity and thus efficiency.

In some embodiment it may be desirable to modulate the gate voltage via an envelope signal, such as $ET_{RD3}$ (or $ET_{DR}$), while letting the gate float with the RF signal as described earlier (e.g. via gate capacitances). In this situation and considering the third FET transistor (155) (e.g. FIG. 4A), the corresponding gate capacitor (150) and resistor (144) have to be chosen such as the low pass filter seen by $ET_{RD3}$ passes the entire frequency spectrum of the envelope signal (e.g. DC to a higher frequency component of the envelope signal), and at the same time the impedance seen by the RF signal looking from the gate of the transistor (e.g. capacitor (150) in parallel with resistor (144)) is such that the RF signal attenuation is set by the capacitor (150) (or combination capacitor (150) and resistor (144)) as designed and not by the bias and envelope path. In other words, the resistor-capacitor network (144, 150) can decouple the RF signal at the gate of the transistor from the biasing circuit used to provide a dynamic bias voltage to the gate of the transistor while allowing the dynamic bias voltages generated by the biasing circuit to reach the gates of the transistors. Given these constraints, derivation of corresponding resistor and capacitor values, as well as derivation of the more generalized formula taking into account, for example, transistor's model and other components within the circuit, are well within the reach of the skilled person. Although the biasing circuit depicted in FIG. 4A shows biasing signals provided via a resistor divider tree to the various transistor gates, as seen in later paragraphs of the present disclosure, the biasing circuit can further comprise a DC biasing circuit (e.g. average DC voltage) and a higher frequency biasing circuit (e.g. corresponding to a higher frequency content of the dynamic supply), each feeding a corresponding DC biasing signal and a higher frequency biasing signal to the transistor gates of the stack.

According to various embodiments of the present disclosure, the output signal (e.g. voltage at the drain of the output transistor (155)) can be distributed across the various transistors of the stack, either equally or per a desired distribution, by providing biasing signals based on components of the output signal to each gate of the upper transistors of the stack. Such components can comprise a low-frequency DC component (e.g. average voltage of the output signal), a mid-frequency dynamic supply frequency component (e.g. corresponding to an envelope tracking signal) and a high-frequency RF frequency component corresponding to the input RF signal of the amplifier (e.g. $RF_{in}$ at terminal (105) of FIG. 4A). Accordingly, various biasing circuits coupled to the gates of the transistors of the stack are provided to each generate a gate biasing signal based on one of the three components such as the combination of the three gate biasing signals provided to each gate of the upper transistors of the stack produces the desired output voltage distribution across the drain-source terminals of the transistors of the stack. According to some exemplary embodiments and related to usage of such amplifier in a cellular phone system, the DC component can be bounded by a high frequency content of approximate 300 KHz (referred to as low-frequency), the dynamic supply frequency component can be within an approximate frequency range of 300 KHz to 60 MHz (herein referred to as mid-frequency) and the RF frequency component can be equal or greater than about 1 GHz (herein referred to as high-frequency). With reference to FIGS. 4H1-4H2 which are described in later sections of the present application, items (195, 197) in combination with the resistor tree divider (175, 140, 140a, 130) can provide the DC biasing signal to each of the upper transistors (155, 120, 120a) of the stack (155, 120, 120a, 115), items (151,152), (121, 122) and (121a, 122a) can each provide a dynamic supply biasing signal to each of the transistors gates and capacitors (150, 125, 125a) can provide (in combination with the internal gate-to-source capacitance of the transistor) the RF biasing signal to said gates, whereas resistors (144, 134, 134a) can isolate the RF biasing provided to the gates from the DC biasing circuits. According to the various embodiments of the present disclosure, the biasing circuits providing the DC and the dynamic supply biasing are not "stiff" at the RF frequencies of operation which is to say that they allow for additional voltage excursions at the gates of the transistors at frequencies of the RF signal, via, for example, the gate capacitors (150, 125, 125a).

Figure 4B:
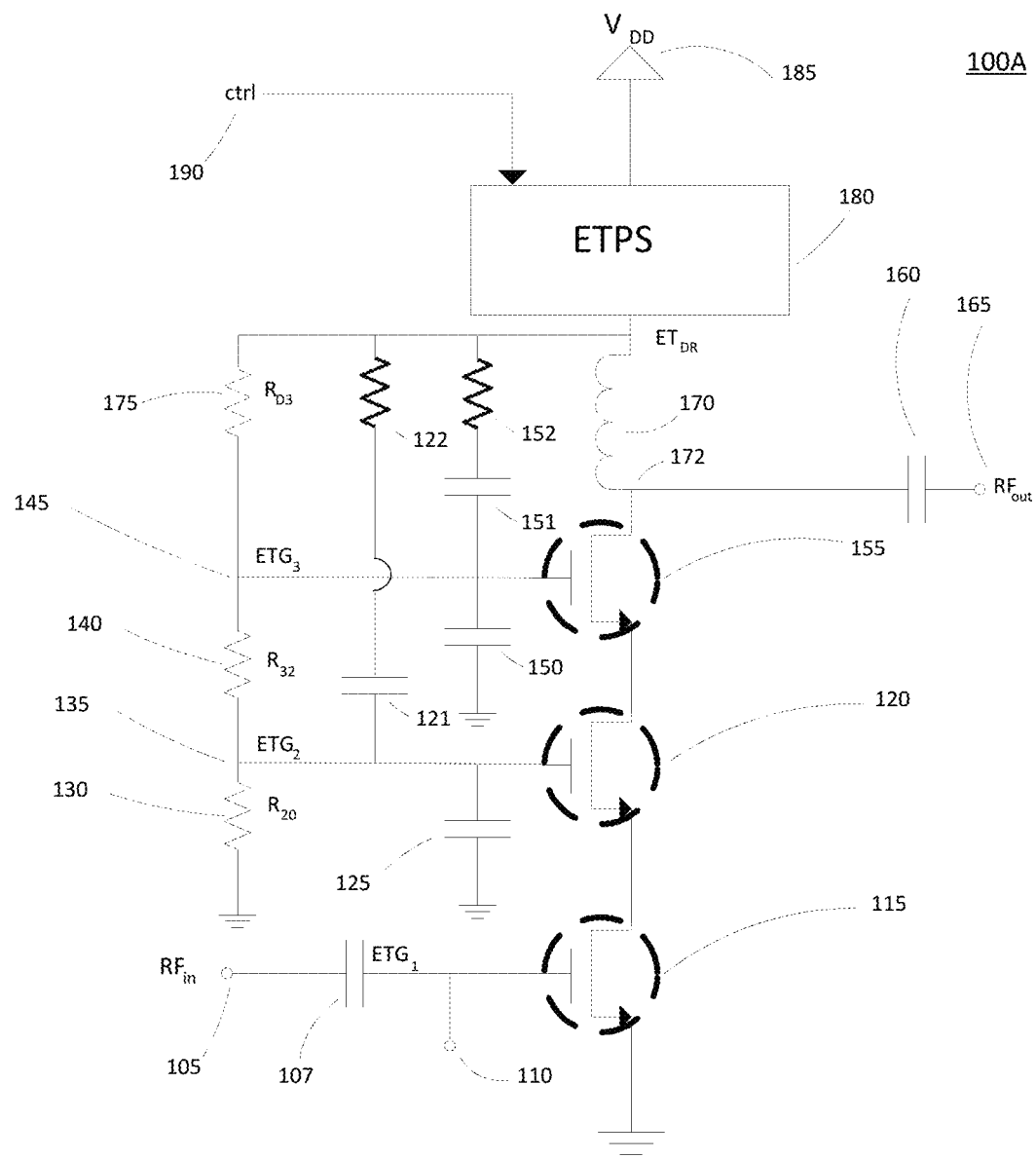
FIG. 4B shows an example alternative embodiment to the envelope tracking amplifier shown in FIG. 1 where a direct AC coupled path between gates of transistors of a stack and a dynamic bias voltage is provided.

According to further embodiments of the present disclosure and with reference to FIG. 4B, the gate resistor (144, 134) can be removed (e.g. FIG. 4A) although its presence can allow further decoupling of the RF signal at the gates of the transistors from the gate biasing circuits used to provide the DC and dynamic supply frequency components of the biasing. Furthermore, the dynamic supply biasing signal (e.g. mid-frequency component) can be provided via a direct AC coupled path from the gate of the FET (155, 120) to the dynamic bias voltage $ET_{DR}$ via, for example, a series connected RC network (e.g. (121,122) and (151,152) of FIG. 4A, as depicted in FIG. 4B. Such direct AC coupled path can simplify control of a fraction of the AC component of the dynamic bias voltage $ET_{DR}$ to be applied to the gates of FETs (155, 120) such as to allow control (e.g. evenly distribute) of the voltage drop across the two transistors for a more efficient operation of the transistor stack (115, 120, 155). According to an embodiment of the present disclosure capacitors (121, 151) can be chosen such as to provide a ratio of the dynamic supply voltage (e.g. $ET_{DR}$) to the gates of the higher transistors of the stack commensurate (e.g. equal) to the ratio of the resistor divider tree (175, 140, 130) for gate node (145, 135). Equal distribution of the voltage seen at the output of the transistor stack (e.g. drain of the output transistor (155)) across the transistors of the stack (115, 120, 155) can also distribute the stress of the transistor stack across the devices (e.g. transistors) which in turn can result in better reliability of the stack. The combination of the added series connected RC networks with the gate capacitors (150, 125) of FETs (155, 120) creates a low pass filter whose cutoff frequency and gain/phase can be chosen via selection of component values of the series connected networks. In some embodiments the cutoff frequency can be selected to be the geometric mean of the RF signal operating frequency (e.g. $RF_{out}$) and an upper frequency content of the dynamic bias voltage ($ET_{DR}$). The person skilled in the art is readily familiar with the concept of a geometric mean and a corresponding formulation. In a case where the dynamic bias voltage is based on an envelope signal of the RF signal, for the exemplary case of the operating RF frequency signal of about 700 MHz, the dynamic bias voltage can have an upper frequency content of about 30 MHz and therefore a corresponding geometric mean is about 145 MHz. Although the above mentioned components were described to create a low pass filter, the skilled person will know how to use other component combinations (R, C, L) to create other types of filters, such as band pass and band reject filters, in order to create a same frequency/phase response at the frequencies of interest and a corresponding signal fed to the gates of the higher stack transistors. In the embodiment according to the present disclosure depicted by FIG. 4B, the gate capacitors (150, 125) allow for coupling of the RF signal to the corresponding gates whereas the combination of the added series connected RC networks (e.g. (151, 152), (121, 122)) and said gate capacitors allow for coupling of the AC component of the dynamic bias voltage to the gates of FETs (155, 120). Such configuration can be used for efficient biasing of the gates of FETs (155, 120) such as to allow even distribution of the voltage drop across the transistors of the stack (115, 120, 155) for a more efficient and reliable operation of the amplification cascode stack (115, 120, 155). Although the cascode stack of FIG. 4B contains three transistors (115, 120, 155), the skilled person will readily know that concepts according to the various teachings presented can be easily extended to the case where the stack comprises more than three transistors, such as 4, 5, 6, 7 and more.

Figure 4C:
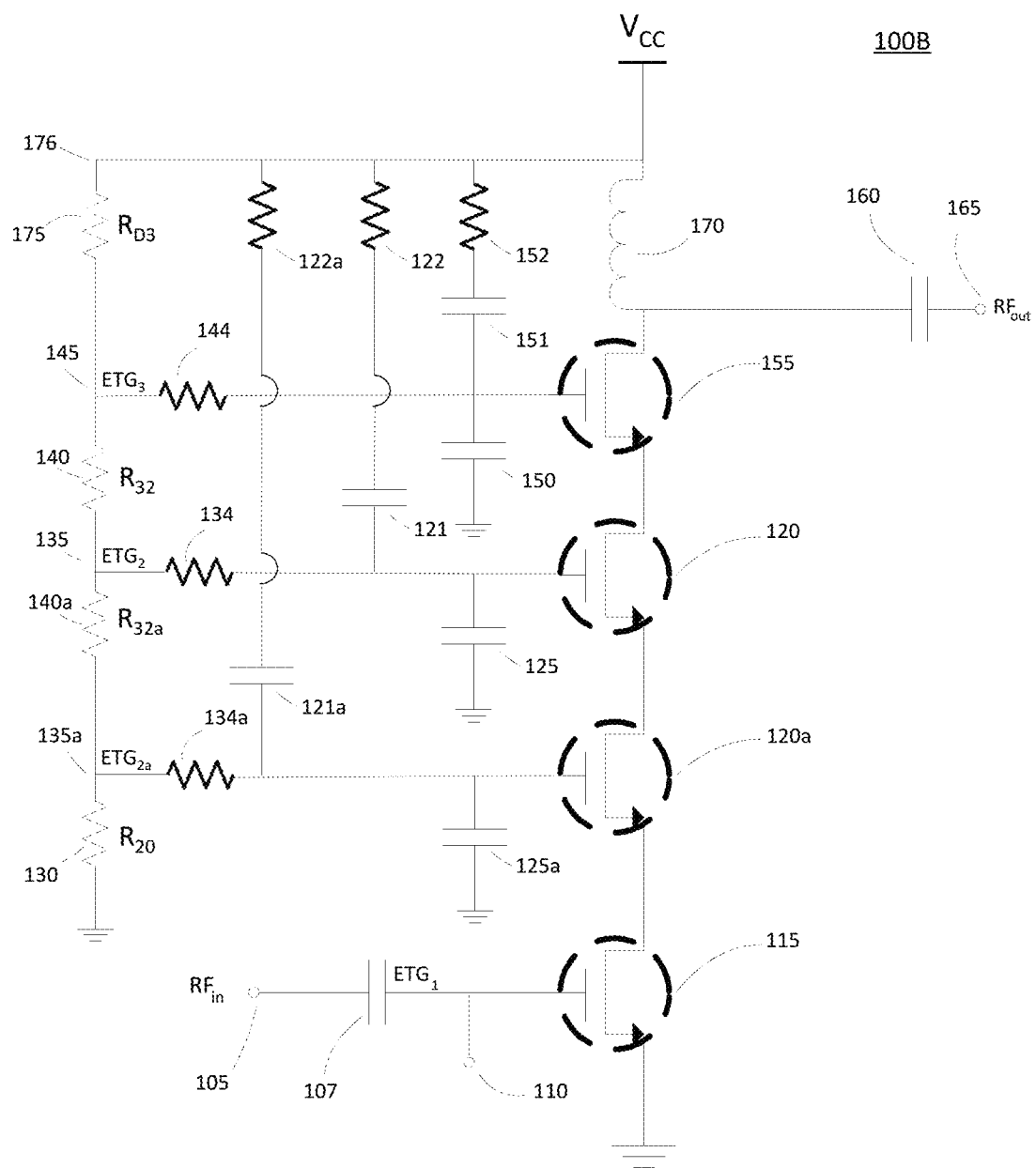
FIG. 4C shows an exemplary amplifier configuration according to an embodiment of the present disclosure comprising a stack of four transistors.

FIG. 4C depicts a configuration similar to one depicted in FIG. 4B for a case of four stacked transistors where series gate resistors (144, 134, 134a) are used to decouple RF signal at the gates of the higher stack transistors (155, 120, 120a) from the low-frequency biasing circuit (175, 140, 140a, 130). In this configuration, capacitor (125a) and RC series connected network (122a, 121a) are used to provide RF and envelope signal coupling to the gate of the transistor (120a) for similar effect (see prior section) as provided by (150, 151, 152) and (125, 121, 122) to transistors (155) and (120) respectively. The skilled person readily knows that such couplings are purely AC (e.g. no DC component passed through a capacitor) and DC biasing to the plurality of FET transistors (120a, 120, 155) is provided by the resistive ladder network comprising ($R_{D3}$, $R_{32}$, $R_{32a}$, $R_{20}$), which can divide the (dynamic) supply voltage to the stack (e.g. Vcc) to appropriate DC biasing voltages for the FETs (155, 120, 120a) provided at nodes (145, 135, 135a). As mentioned in previous sections of the present application, the ratio of low-frequency component of Vcc (e.g. DC, low-frequency biasing component) provided to the gates via the resistive ladder network can be commensurate to the ratio of the higher frequency component (e.g. mid-frequency biasing component) of the Vcc provided to the gates via the corresponding RC series connected networks. According to some exemplary embodiments of the present disclosure, such ratios can be substantially equal (e.g. within 1%) or can be controlled for a desired relationship between the two ratios (for a given gate).

According to an embodiment of the present disclosure, the combination of the DC biasing voltage provided by the ladder network to the gates of the transistors of the stack (e.g. 120a, 120, 155), and the AC biasing provided by the RC series connected networks (e.g. envelope signal) and the gate capacitors (e.g. RF signal) to said gates, can be such as to provide an efficient distribution of the voltage across the transistors of the stack, and therefore allow the stack to operate efficiently and reliably. As mentioned in prior sections of the present application, efficient distribution of the voltage (e.g. voltage at the drain of the output transistor (155)) can mean uniform and therefore substantially equal distribution of the output voltage (e.g. voltage at the drain of the output transistor (155)) across the transistors of the stack. Such an efficient operation of the stack can therefore allow, for example, no one transistor of the stack to be individually subjected to a voltage (e.g. across its source-drain terminals)

substantially larger than voltages applied across other transistors of the stack for a given output RF voltage amplitude, and therefore keep, for the given output RF voltage amplitude, each of the transistors of the stack at voltages (e.g. across its drain-source terminals) as far away as possible from a corresponding device breakdown threshold voltage, and therefore equally distribute overall stress to the stack across the transistors of the stack.

With further reference to FIG. 4C and according to an embodiment of the present disclosure, each of the transistors of the stack (e.g. 120a, 120, 155 and not including the input transistor 115) can be preferably biased such that a voltage drop across each transistor (e.g. its drain-source terminals) of the stack, including the input transistor (115), is substantially the same (e.g. equal or less than 10% of Vcc). For example, in the exemplary case of the stack depicted in FIG. 4C which comprises four transistors, the desired voltage drop across each transistor can be about $¼^{th}$ of the bias supply voltage Vcc. Therefore, for such biasing of the transistors (120a, 120, 155), the voltage at the source terminal of FET (120a, 120, 155) can be Vcc×(¼, 2/4, ¾) when no input RF is present at the input gate of FET (115). Such biasing can be provided by the resistive network divider comprising ($R_{20}$, $R_{32a}$, $R_{32}$, $R_{D3}$) which can divide the Vcc supply voltage (e.g. dynamic voltage) equally between any two consecutive nodes (176, 145, 135, 135a, Gnd), by for example, setting the value of each of the resistors to a same value (e.g. FIGS. 4E1-4H1 where each resistor has a same value $R_{Tree}$). The skilled person readily understands that as used herein, the "Gnd" notation can refer to reference potential of a circuital arrangement which can be a system reference ground, an RF ground or a virtual ground. As mentioned in previous sections of the present disclosure, the exemplary numbers of transistors in the stack are for the sake of discussion and description of the various teachings according to the present disclosure, and are not intended to limit what the inventors of the present disclosure consider their invention. The teachings according to the present disclosure allow a person skilled in the art to expand or reduce the number of transistors according to their specific design requirement while maintain all the features and benefits obtained from said teachings.

Figure 4D:
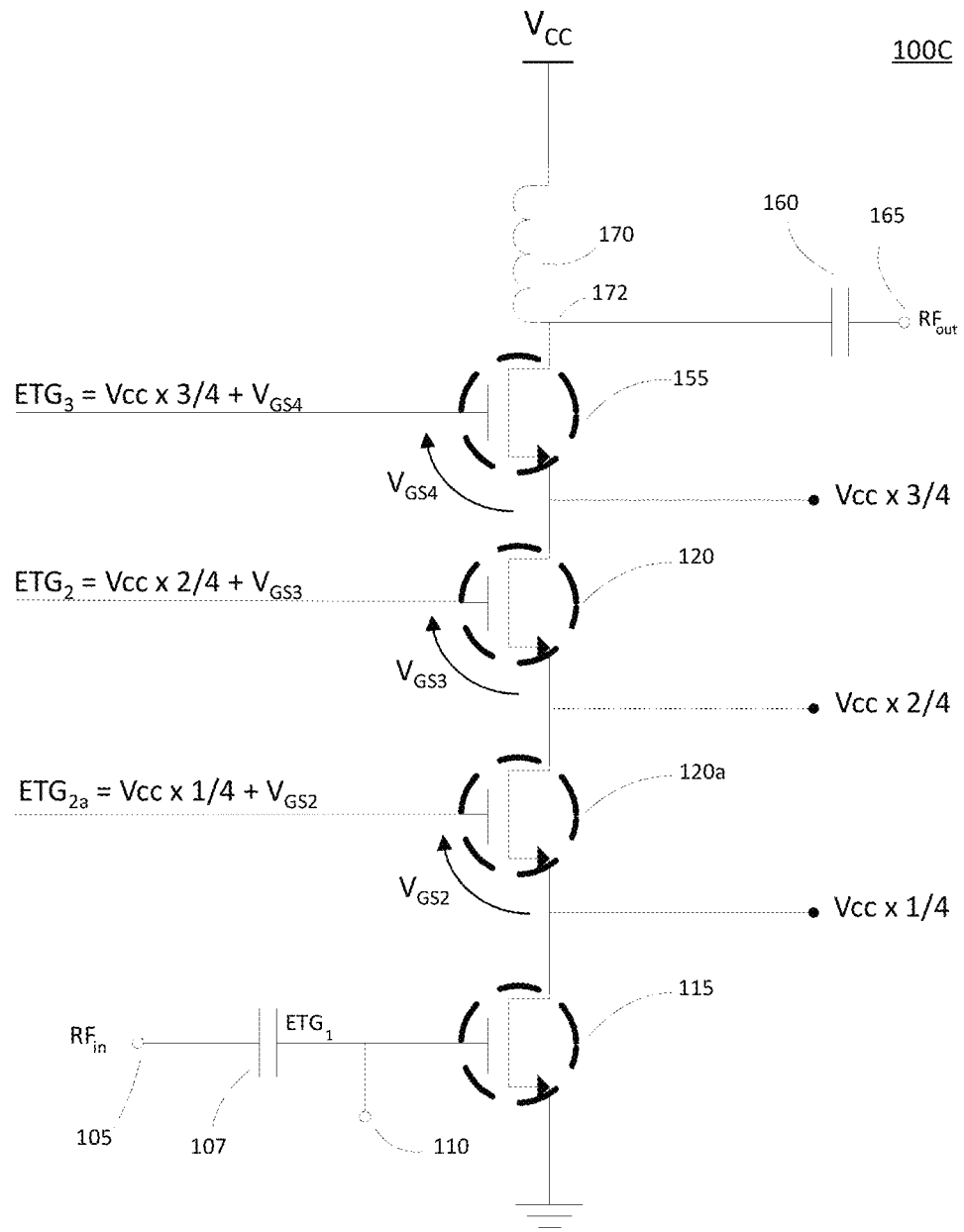
FIG. 4D shows voltage corresponding to a DC gate biasing configuration according to an embodiment of the present disclosure for an amplifier comprising a stack of four transistors.

According to an embodiment of the present disclosure as depicted in FIG. 4D, a biasing method for the transistor stack (115, 120a, 120, 155) is provided. Such biasing method can provide a constant (e.g. a same value) voltage drop across each of the transistors of the stack as described in the prior paragraph and with resulting voltage values at the source terminals of the higher transistors (e.g. excluding input transistor 115) of the stack as depicted in FIG. 4D. The biasing method depicted in FIG. 4D can provide constant voltage drop across each of the transistors of the stack (115, 120a, 120, 155) by biasing the gates of the transistors with a bias voltage being one $V_{GS}$ (gate-to-source voltage) above the source voltage of a corresponding FET transistor. According to the various teachings of the present disclosure, such relationship between the voltage at the gate terminal of a higher transistor (e.g. (120a, 120, 155) and the voltage at the source terminal of the corresponding transistor is maintained during operation of the transistor stack and irrespective of an amplitude of an input RF signal fed at terminal (105) of the amplifier.

According to an embodiment of the present disclosure, biasing of the various transistors of the stack (e.g. higher transistors) is provided via a combination of circuital arrangements coupled to the gates of the transistors. As described with respect to the embodiment of the present disclosure depicted in FIG. 4C, such biasing circuital arrangements can be configured to bias for a DC voltage (e.g. low-frequency bias signal) and/or an AC voltage (e.g. mid-frequency bias signal and high-frequency biasing signal). FIG. 4E1 depicts a configuration according to an embodiment of the present disclosure where a resistive voltage divider network comprising resistors (175, 140, 140a, 130) can provide a desired voltage (e.g. low-frequency bias signal) at a gate of any of the higher transistors of the stack based on the supply voltage Vcc (e.g. dynamic supply voltage) and the rank of a transistor within the stack. For example, the resistive divider (175, 140, 140a, 130) comprising a same resistor value ($R_{Tree}$) can provide voltage Vcc×(¾, 2/4, ¼) at gate of transistor (155, 120, 120a) of the stack. As previously mentioned, supply voltage Vcc can be a dynamic voltage (e.g. based on the RF envelope signal) and therefore during operation of the transistor stack, voltage at the gates of the transistors of the stack as provided by the resistive divider can represent the dynamic supply voltage. Furthermore, and according to an embodiment of the present disclosure, a current source (195) can be used to inject a current into the resistive voltage divider (175, 140, 140a, 120) such as to raise the gate bias voltage by a controlled and desired amount, based for example, on the $V_{GS}$ voltage of the constituent stack transistors. For example, by making the value of the current injected into the resistive divider by the current source (195) be $V_{GS}×4/(3×R_{Tree})$, each gate voltage can have a combined bias voltage as represented by points ($ETG_3$, $ETG_2$, $ETG_{2a}$) in FIG. 4E1, and therefore provide a voltage at a source of a corresponding transistor be such as to provide a desired distribution of the supply voltage Vcc across each transistor of the stack (as further explained in previous sections). Although the distribution of the supply voltage Vcc across the transistors of the stack for the exemplary embodiment according to the present disclosure depicted in FIG. 4E1 is not exactly equal (e.g. $V_{DS}$ values represented in FIG. 4E1), such distribution can nonetheless be beneficial in some applications. It should be noted that here it is assumed that each higher transistor of the stack (e.g. 120a, 120, 155) can have a same $V_{GS}$ voltage and therefore, with reference to FIG. 4D, $V_{GS2}=V_{GS3}=V_{GS4}=V_{GS}$. This can be achieved by monolithic integration of the stack which can therefore provide transistors of a same characteristic (e.g. same current versus voltage relationship). The skilled person readily understands a contribution provided by the injected current at node (145) of the transistor stack and its affect over a voltage at nodes (145, 135, 135a) connected to the gates of transistors (155, 120, 120a), which can be derived using basic electronic circuit analysis methods known to the skilled person. Based on such derived gate voltage values, one can readily derive the voltage at a corresponding source terminal ($V_{S3}$, $V_{S2}$, $V_{S2a}$), as the source terminal voltage is one $V_{GS}$ lower than the voltage of the corresponding gate. In turn, based on the voltages at the source terminals, $V_{DS}$ for each of the transistors of the stack can be derived where the source and drain of two consecutive transistors are connected (e.g. (115,120a), (120a, 120), (120, 155)), and therefore the difference voltage between two consecutive source voltages at two consecutive source terminals is the $V_{DS}$ voltage of a transistor bounded by those terminals. For the case of the output transistor of the stack (155), since voltage drop across inductor (170) is very small (e.g. as its impedance can be insignificant within the frequency range of the dynamic Vcc signal), the drain voltage of the transistor (155) can have an average value of Vcc (and therefore the output RF signal can swing around the value of Vcc), whereas the source terminal of the input transistor (115) is at reference ground. Based on these voltages, namely the drain voltage of transistor (155) (e.g. Vcc), the source voltage of transistor (115) (e.g. reference ground) and the derived gate voltages of the transistors of the stack (e.g. $ETG_{2a}$, $ETG_2$, $ETG_3$) based on the injected current (195) and the resistive divider (175, 140, 140a, 130), voltage drop across each transistor of the stack can be provided as represented in FIG. 4E1.

According to a further embodiment of the present disclosure and as depicted in FIG. 4E2, a single current source (195) is provided to inject a current at the lower node (135a) of the resistive voltage divider (175, 140, 140a, 130). Such configuration allows a desired unequal voltage distribution of the Vcc voltage across the transistors of the stack such as provided by the exemplary configuration depicted in FIG. 4E1. However, in the configuration depicted in FIG. 4E2 the lower transistor in the stack (115) has a $V_{DS}$ value equal to $\frac{1}{4}^{th}$ of Vcc, whereas in the configuration depicted by FIG. 4E1 the higher transistor in the stack (155) has a $V_{DS}$ value equal to $\frac{1}{4}^{th}$ of Vcc.

Figure 4F:
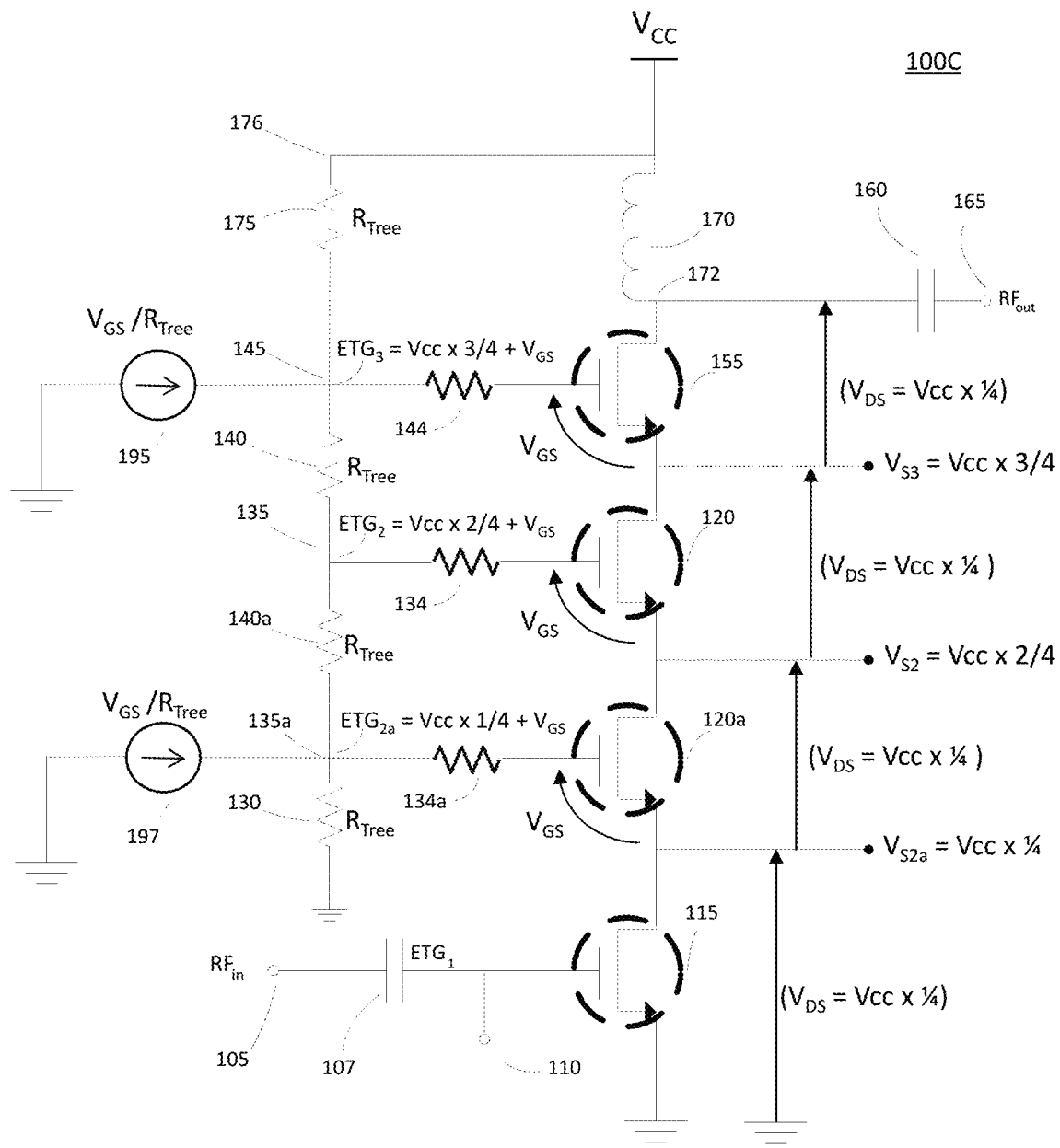

Injection of a DC current as depicted in FIGS. 4E1 and 4E2 can be provided to more than one node (145, 135, 135a) of the resistive voltage divider (175, 140, 140a, 120), such as to provide for more control over the generated gate voltages (e.g. at $ETG_3$, $ETG_2$, $ETG_{2a}$) for a subsequent desired distribution of Vcc across the stack's constituent transistors (115, 120a, 120, 155). According to a further exemplary embodiment of the present disclosure, such DC current can be injected to any of the nodes (145, 135, 135a) with an injected DC current value at each injected node based on a $V_{GS}$ of the constituent transistors, which can be different or same value DC current at each injected node, as depicted, for example, in FIG. 4G1, where a current source is provided at each node (135a, 135, 145). FIG. 4F represents an exemplary embodiment according to the present disclosure where two current source (195, 197) inject a DC current of value $V_{GS}/R_{Tree}$ at nodes (145, 135a) of the resistive ladder (175, 140, 140a, 120), such as to obtain equal distribution of the Vcc voltage across transistors (115, 120a, 120, 155) of the stack, as represented in the figure. It should be noted that although FIGS. 4E1-4G1 assume a same operating $V_{GS}$ voltage across the higher transistors of the stack, the various teachings according to the present disclosure for providing equal or controlled distribution of Vcc across constituent transistors of a stack equally apply to biasing of gates for the case where the higher constituent transistors of the stack operate at different $V_{GS}$ voltages. In such cases where different operating $V_{GS}$ voltages are present, the injected current values can be based on the different operating $V_{GS}$ voltages. Using methods known to the skilled person, values of gate currents to be injected based on operating $V_{GS}$ voltages of higher transistors in a stack can be derived such as to obtain a desired voltage distribution of Vcc across the transistors of the stack.

According to a further embodiment of the present disclosure, protection of a current source (e.g. 195, 196, 197) connected to a node (e.g. 145, 135, 135a) of the resistive voltage divider (175, 140, 140a, 130) is provided. Such protection can be required since a voltage at a node (145, 135, 135a) connected to the output of the current source can vary according to a dynamic Vcc voltage provided to the resistive voltage divider, and can therefore be higher than a voltage supply provided to the current source (not shown in FIGS. 4E1-4G1). Accordingly, an embodiment according to the present disclosure places a protection resistor (146) in series connection between an output of the current source (195) and a node (145) as depicted in FIG. 4G2. In addition to the protection resistor (146), a filtering capacitor can also be used in a shunted configuration at the output of the current source (195) as further depicted in FIG. 4G2. The combination of the serially connected resistor (146) and shunted capacitor (147) can provide filtering of a dynamic voltage component at node (145) such as to reduce its impact on the operation of the current source (195). Values for the capacitor (147) and resistor (146) can be selected based on frequency component and voltage amplitude at the node (145) such as to sufficiently isolate the current source (195) from voltage swings at node (145). As noted before, a desired isolation can be based on a known voltage supply to the current source. Although not shown in FIG. 4G2, similar protection scheme can be implemented, if desired, to each node of the resistive voltage divider (175, 140, 140a, 130) connected to a current source and based on frequency and voltage amplitude of a corresponding node. The skilled person readily understands that due to the voltage division (e.g. of Vcc) provided by the resistive voltage divider (175, 140, 140a, 130), voltage amplitudes at lower nodes of the divider (e.g. 135a is lower than 135) are lesser and therefore protection of a current source connected to a lower node may not be desired.

With further reference to any of the FIGS. 4E1-4G2, in a case where Vcc is a dynamic voltage based, for example, on an envelope signal of an input RF signal, there can be situations where, during operation of the stack, the gate voltage of a higher transistor of the stack (120a, 120, 155) can be larger than the supply voltage Vcc, which means that in order to keep the equal voltage distribution across the transistors of the stack, the gates of the higher transistors in the stack may need to be also at a voltage higher than the supply voltage Vcc. For example, assuming that voltage at $ETG_3 = Vcc \times \frac{3}{4} + V_{GS}$ as depicted in FIG. 4E1, where the component $Vcc \times \frac{3}{4}$ of $ETG_3$ is provided by the resistor voltage divider (175, 140, 140a, 130) and the component $V_{GS}$ of $ETG_3$ is provided by the current source (195). For a fixed value of $V_{GS}$, as the dynamic bias voltage Vcc varies (e.g. FIG. 19 and related description), if Vcc voltage drops below $4 \times V_{GS}$, which is equivalent to the expression $V_{GS} > Vcc \times \frac{1}{4}$, then $ETG_3$ voltage become larger than Vcc, since:

$$\{ETG_3 = Vcc \times \tfrac{3}{4} + V_{GS} \text{ and } V_{GS} > Vcc \times \tfrac{1}{4}, \} \Rightarrow \{ETG_3 > [Vcc \times \tfrac{3}{4} + Vcc \times \tfrac{1}{4}]\}$$

In an exemplary operating case of the circuit (100C) of FIG. 4E1, the $V_{GS}$ value can be around 400 mV, and a lower voltage of Vcc can be around 1.0 V, and therefore according to the above analysis there can be cases where the gate of the transistor can have a voltage larger than Vcc. As it is known by a person skilled in the art, a current source, such as current source (195) of FIG. 4E1, cannot drive a current into a node (e.g. 145) with a voltage (e.g. $ETG_3$) higher than a voltage of a supply powering the current source. As the current source may be powered by the same Vcc voltage, a solution to the problem of driving the current source (195) into a node (145) at a higher voltage ($ETG_3$) than a supply voltage to the current source is therefore provided and depicted in FIG. 4H1. According to an embodiment of the present disclosure, for the case where the supply voltage Vcc is a dynamic voltage, such as, for example, based on the RF envelope signal, the combination of the biasing to the gates of the higher transistors of the stack (e.g. FIGS. 4E1-4G2) and an RC series connection between the supply voltage Vcc and each of the gates of said transistors (e.g. (151,152), (121, 122), (121a, 122a), can provide a voltage at a gate of the higher transistor (e.g. 120a, 120, 155) of the stack which is larger than the supply voltage Vcc. Such configuration according to an embodiment of the present disclosure is depicted in FIG. 4H1. For example, and with reference to FIG. 4H1, the RC network (e.g. 152, 151) connected to the gate of transistor (155) injects an AC component of the Vcc voltage (e.g. mid-frequency bias signal) to the gate of the transistor such as to boost the voltage at the gate to a level higher than Vcc when the Vcc amplitude becomes small. Although FIG. 4H1 depicts such RC networks connected to each of the higher transistors of the stack, the requirement for such network lessens for the lower transistors as a function of the rank of the transistor within the stack (e.g. 120a lower than 120, 120 lower than 155) since a threshold in Vcc amplitude level (e.g. lower amplitude) to provide a condition where a gate voltage becomes larger Vcc becomes lower with the rank of the transistor. For example, based on same analysis provided above, $ETG_2$ becomes larger that Vcc when Vcc drops below $2 \times V_{GS}$, which is a threshold lower than the $4 \times V_{GS}$ threshold required for the higher ranked transistor (155). Provision of such compensating RC networks at the various gates of the transistor stack can therefore be made based on characteristic of the dynamic Vcc voltage and desired bias voltages at the gates of the transistors of the stack. The skilled person readily realizes that the embodiment presented in FIG. 4H1 is based on the embodiment presented in FIGS. 4B-4C with the added feature of the injected current at, for example, nodes (145, 135a), as described in reference to FIGS. 4E1-4G2. References to the features of the embodiment depicted in FIG. 4H1 can therefore be found in the description of FIGS. 4B-4C and 4E1-4G2 of the present disclosure.

As discussed in the prior sections of the present disclosure and with further reference to FIG. 4H1, gate series resistors (144, 134, 134a) can decouple a low frequency component from a higher frequency component of the Vcc dynamic supply and therefore allow usage of each component separately via corresponding biasing circuits. In turn, outputs of such biasing circuits are combined at the gates of the transistors to provide gate biasing that control the distribution of Vcc across the various transistors of the stack. For example, by adding a capacitor between node (145) and ground in FIG. 4H1, node (145) of FIG. 4H1 can hold an average value of the Vcc voltage which is lower than an instantaneous Vcc voltage (e.g. higher frequency) value and therefore the current source (195) can be powered by Vcc and still provide current to the node (145) such as to maintain the desired $V_{GS}$ voltage offset at the gate of transistor (155). Simultaneously, during an instantaneous peak in Vcc, capacitor (151) can inject current to the gate of transistor (155) and therefore can increase voltage at the gate of the transistor according to the instantaneous Vcc voltage increase. To be noted that the average value of Vcc at node (145) can be assumed significantly lower than peak excursions of the Vcc voltage, where in an exemplary embodiment the term 'significantly' can mean greater than about one volt for a Vcc voltage swinging between 0.5V and 4.5V. FIG. 4H2 depicts said configuration wherein a capacitor (153) is coupled between ground and node (145) such as to filter the Vcc signal at node (145). Similar filtering capacitors can be added to other nodes (e.g. 135, 135a) if desired to couple node to a low-frequency bias generation circuit (e.g. such as node 135a). It should be noted that nodes coupled to a current source, such as nodes (145, 135a) of FIG. 4H1 inherently see a parasitic capacitance which is the output capacitance of the current source. Since the current source (195, 197) preferably has a high output resistance, such current source has tendency to have a considerable output capacitance which is capable of affecting (e.g. filtering) the Vcc signal at said nodes (e.g. 145, 135a of FIG. 4H1). Therefore, capacitor (153) of FIG. 4H2 can be considered to be associated to the output capacitance of the current source (195). According to further embodiments of the present disclosure, capacitor (153) can be a combination of an output capacitor of a coupled current source or biasing circuit and an added capacitor.

As discussed in prior sections of the present disclosure and according to some embodiments of the present disclosure, there can be a sizing ratio between capacitors at the gates of the transistors (e.g. (151, 150), (121, 125), (121a, 125a)) of, for example, FIG. 4H2, which is commensurate with the voltage ratio of the resistor divider tree (175, 140, 140a, 130). In an exemplary embodiment, the resistor divider tree and the gate capacitors can maintain a same voltage ratio, which for a case of equal Vcc distribution across the stack transistors (155, 120, 120a, 115) as depicted in FIG. 4H2 can lead to the following relationship between gate capacitors values:

$C(151) = 3 \times C(150)$ $C(121) = C(125)$ $C(121a) = \frac{1}{3} \times C(125a)$ where the operator C(.) denotes capacitance value. Furthermore, resistors (122a, 122, 152) can be sized sufficiently small so as to pass the higher Vcc frequencies (e.g. mid-frequency signal) onto the gates. These resistors also serve to prevent RF signals at the gates of the transistors from passing to the Vcc source. According to an exemplary embodiment, the RC networks can be sized equally, such as for example, using their geometric means as discussed in earlier sections of the present disclosure. For example, RC networks can be sized such as:

$1/(2 * pi * R(122a) * C(121a)) = 145$ MHz $1/(2 * pi * R(122) * C(121)) = 145$ MHz $1/(2 * pi * R(152) * C(151)) = 145$ MHz where the operator R(.) denotes resistance value. Alternatively, sizing, and therefore the associated RC filter cutoff frequency can be chosen to be different for the different RC networks biasing the gates (e.g. providing mid-frequency bias signals) so long as each size is selected considering a lower-bound frequency specification to pass dynamic supply frequencies through an associated RC network and an upper-bound frequency specification such as to block RF frequencies associated to the input RF signal to the amplifier (e.g. 100D of FIG. 4H2).

Figure 4J:
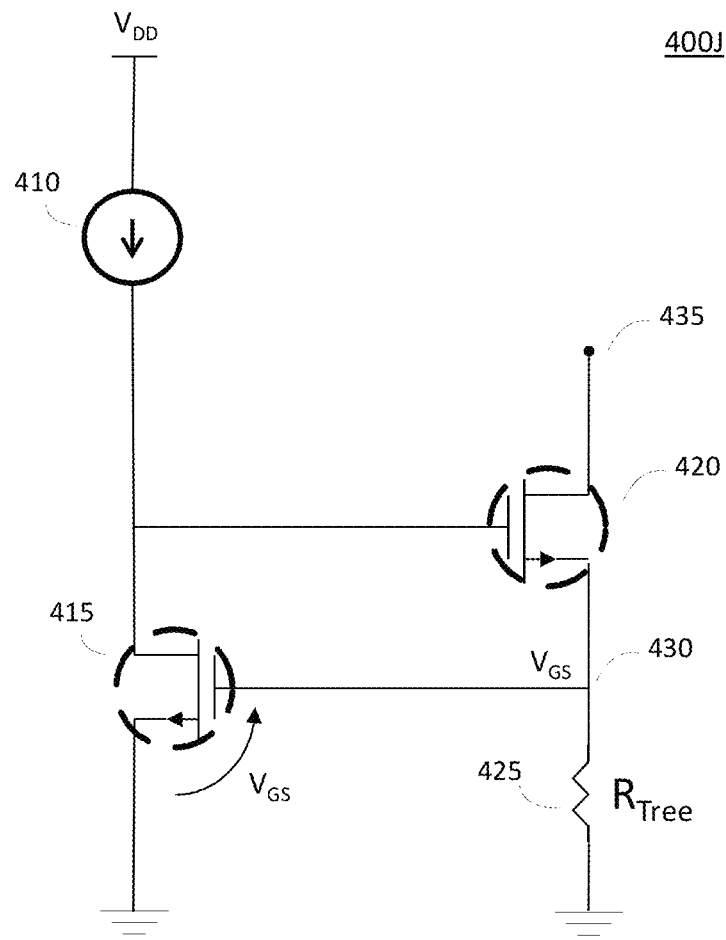
FIGS. 4J and 4K show exemplary circuital arrangements for generating a desired current used for injection in a DC gate biasing circuital configuration depicted in FIGS. 4E1-4H2.

FIG. 4J represents a circuital arrangement which according to an embodiment of the present disclosure can be used in one or more of the current sources (195, 196, 197) to provide a current of amplitude $V_{GS}/R_{Tree}$ (e.g. injected at gate nodes (145, 135, 135a). FET transistor (415) of FIG. 4J can be a transistor with similar (e.g. same) characteristics (e.g. I-V characteristics) to higher stack transistors (155, 120, 120a), and therefore, for a biasing current provided to the drain terminal of the FET transistor (415) via current source (410) (e.g. an $I_{DS}$ current), a corresponding gate-to-source voltage $V_{GS}$ is created between the gate and the grounded source terminal of FET (415). Such $V_{GS}$ voltage is therefore created across resistor (425) which is coupled to the source terminal of transistor (420). Since transistor (415) draws very little current at its gate terminal, the amplitude of the current through transistor (420) can therefore be substantially equal to (e.g. within 1 μA, or better than 0.1% of) the current through resistor (425) and which therefore equals to $V_{GS}/R_{Tree}$, where $R_{Tree}$ is the resistance value of the resistor (425). By making the current output by the current source (410) be a bias current desired to flow through the stack transistors (155, 120, 120a) and by virtue of transistors (415, 155, 120, 120a) having similar characteristics, the $V_{GS}$ voltage for transistor (415) can correspond to a same $V_{GS}$ voltage for stack transistors (155, 120, 120a) and therefore the current flowing through transistor (420) can be used for injection into the biasing circuit according to the various embodiments of the present disclosure previously presented. A current mirror circuit can be used in combination with the circuit of FIG. 4J to provide the functionality of the current source (195, 196, 197), wherein mirroring of the reference current created by the circuit of FIG. 4J can create an active current of same amplitude as $V_{GS}/R_{Tree}$ irrespective of the loading presented. The person skilled in the art readily knows how to design various current mirroring circuits and couple those to the circuitry of FIG. 4J. An exemplary circuital arrangement coupling such functionalities is presented in FIG. 4K where two matched P-channel transistors (440a, 440b) of substantially same device characteristics (e.g. I-V curves, threshold voltage) are used as a current mirror. In such configuration, current flowing through transistor (440b) when under load is same as current flowing through transistor (440a), which is also same as current flowing through transistor (420).

Figure 4K:
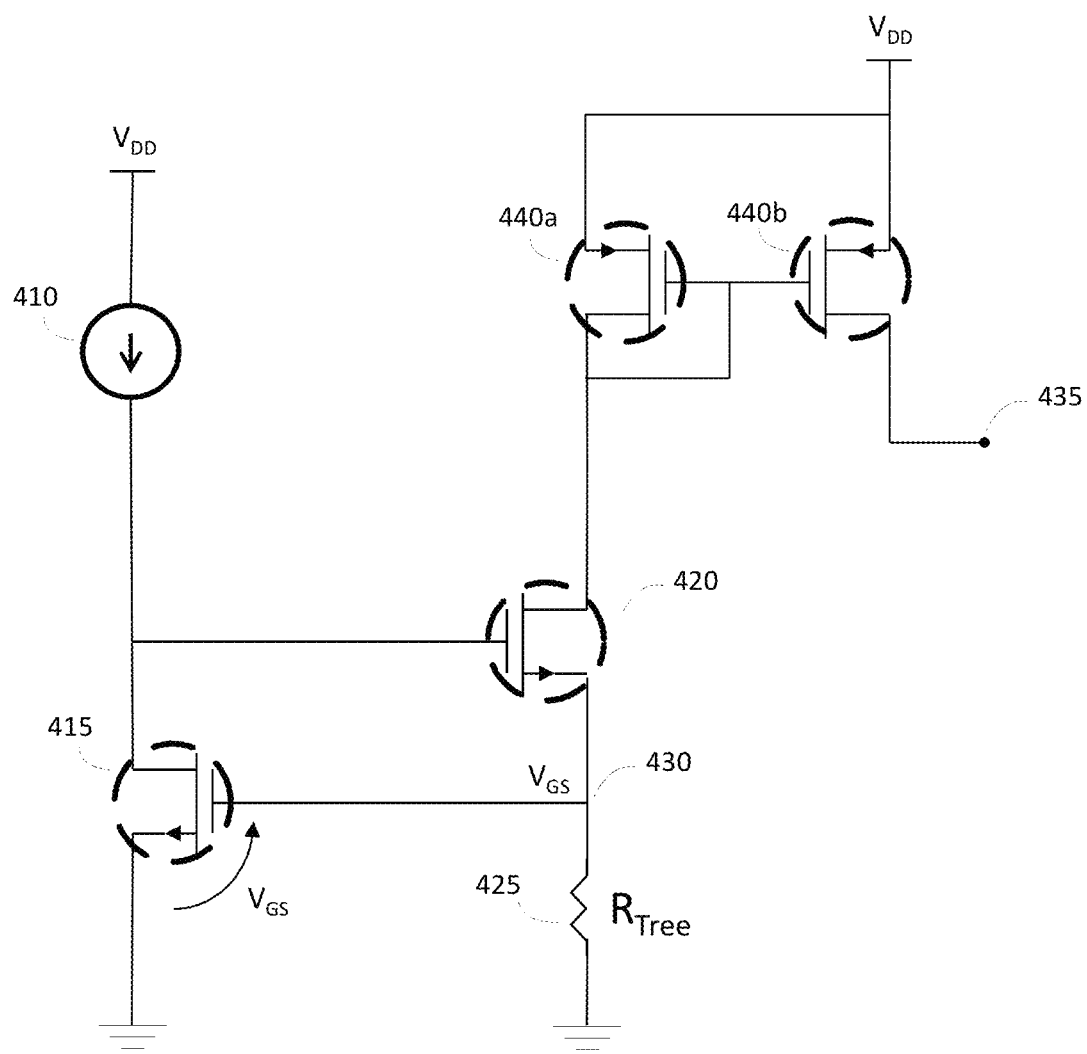
Figure 401:
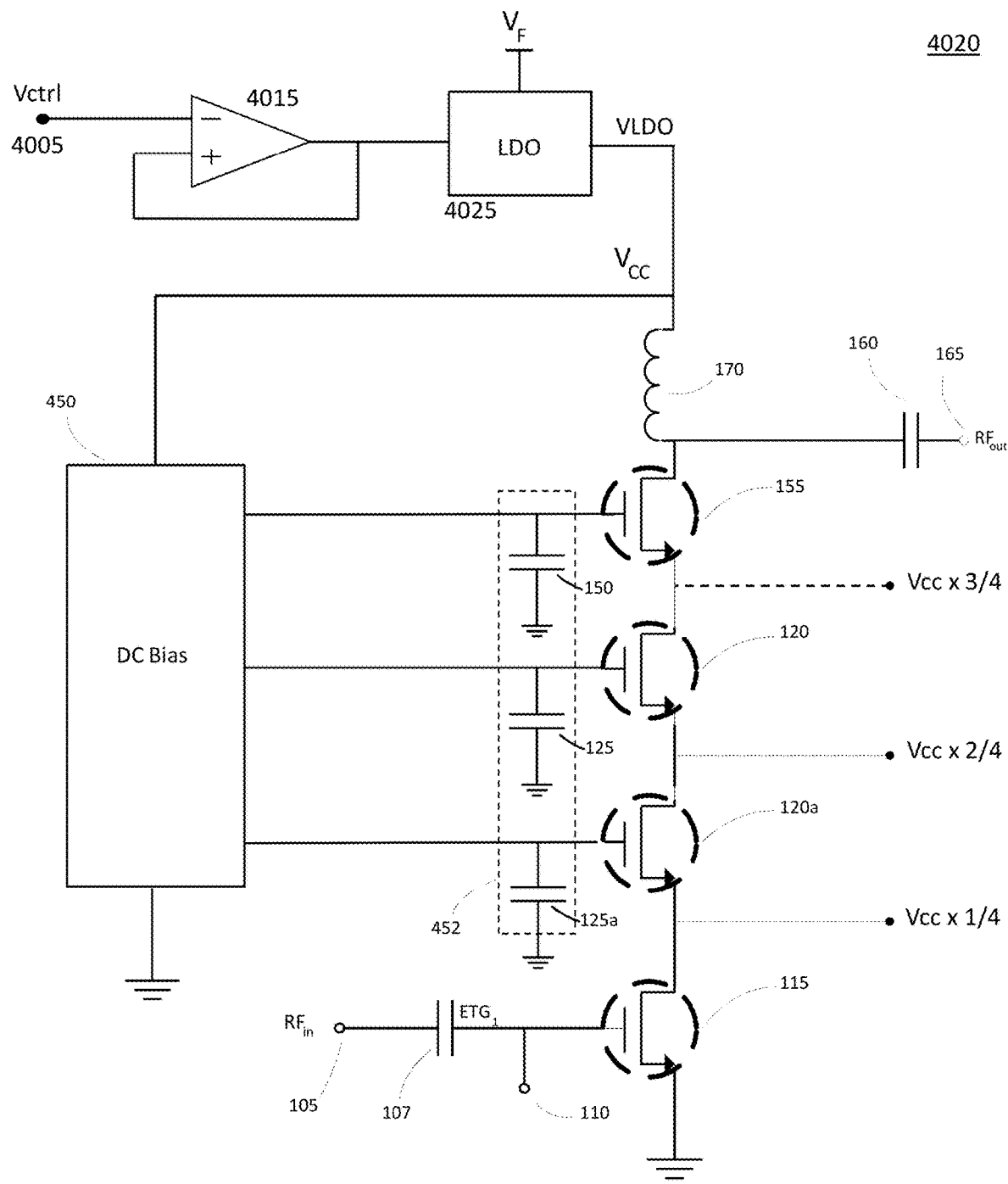
Figure 402:
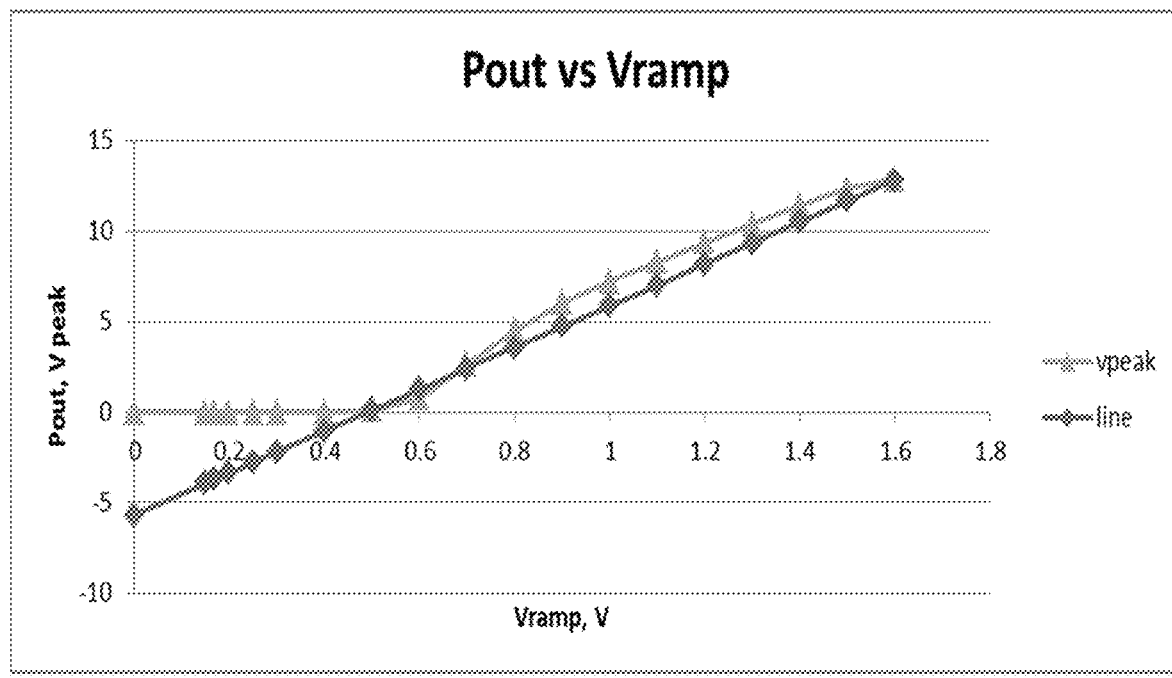
Figure 403:
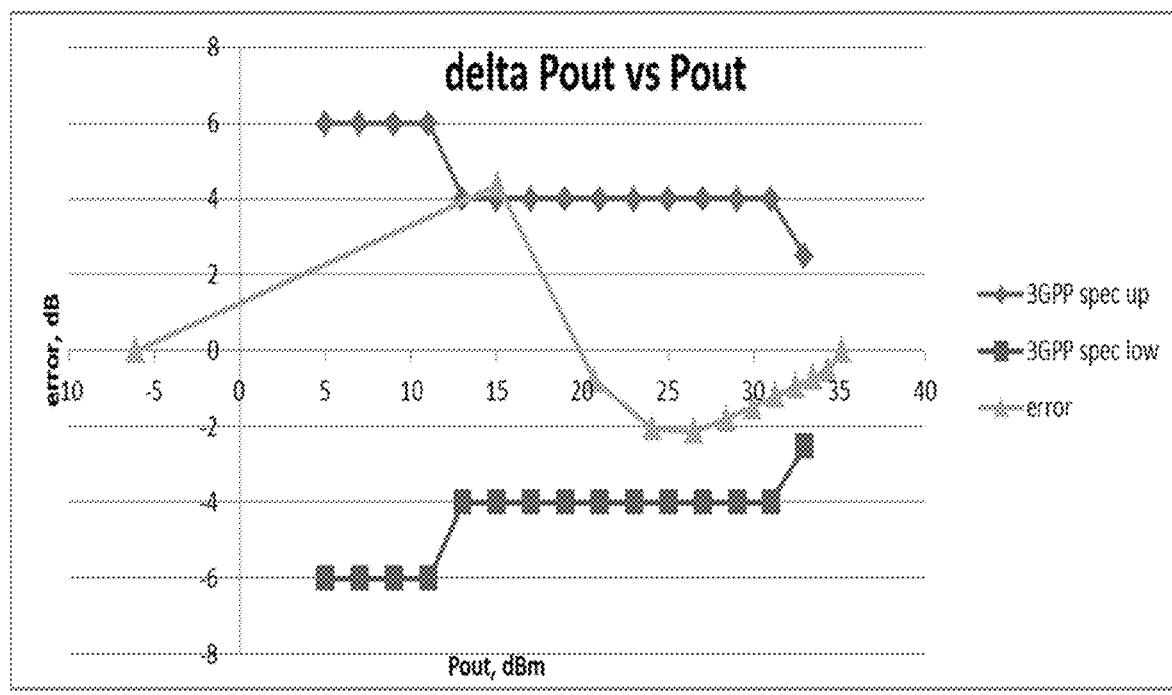
Figure 404:
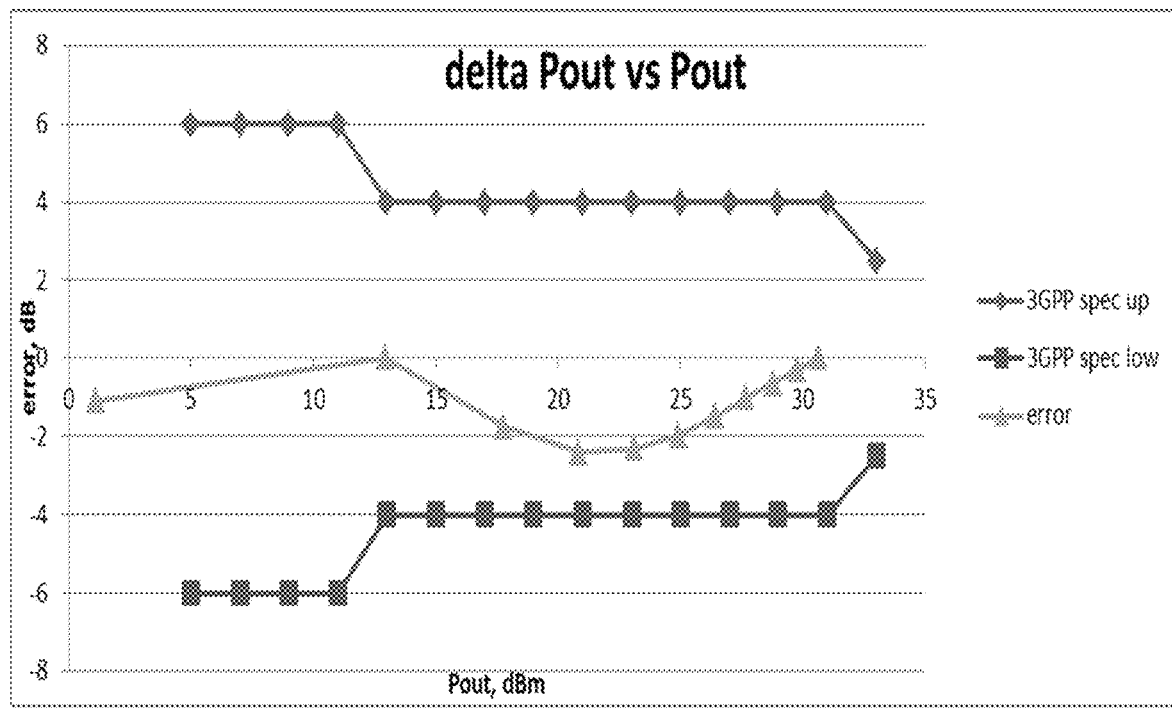
Figure 405:
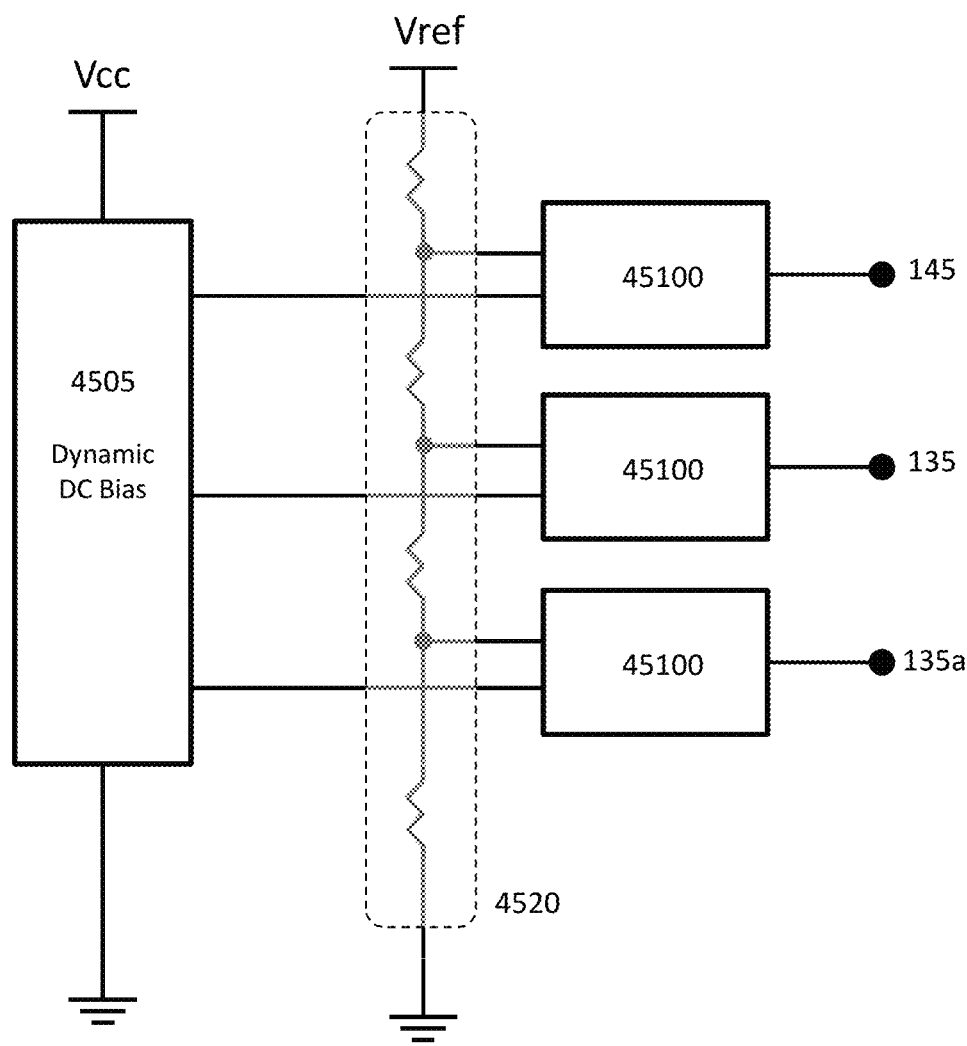
Figure 406:
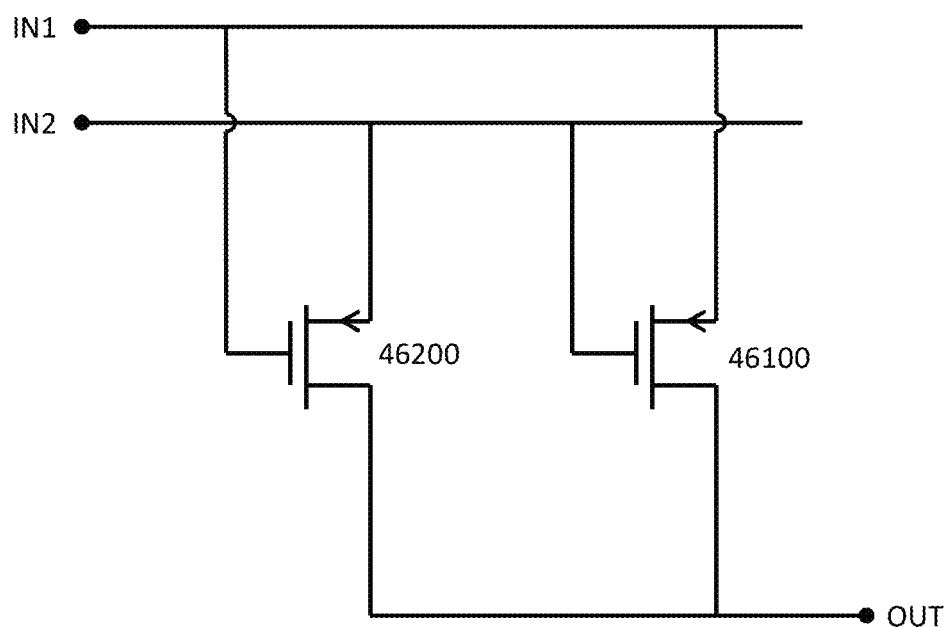
Figure 407:
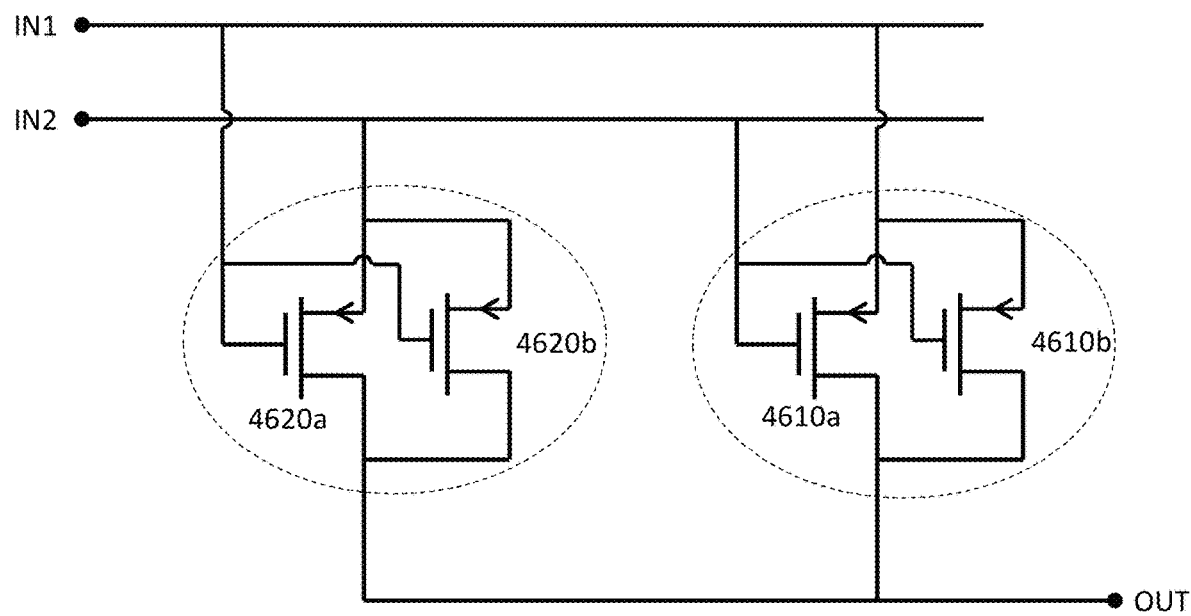
Figure 408:
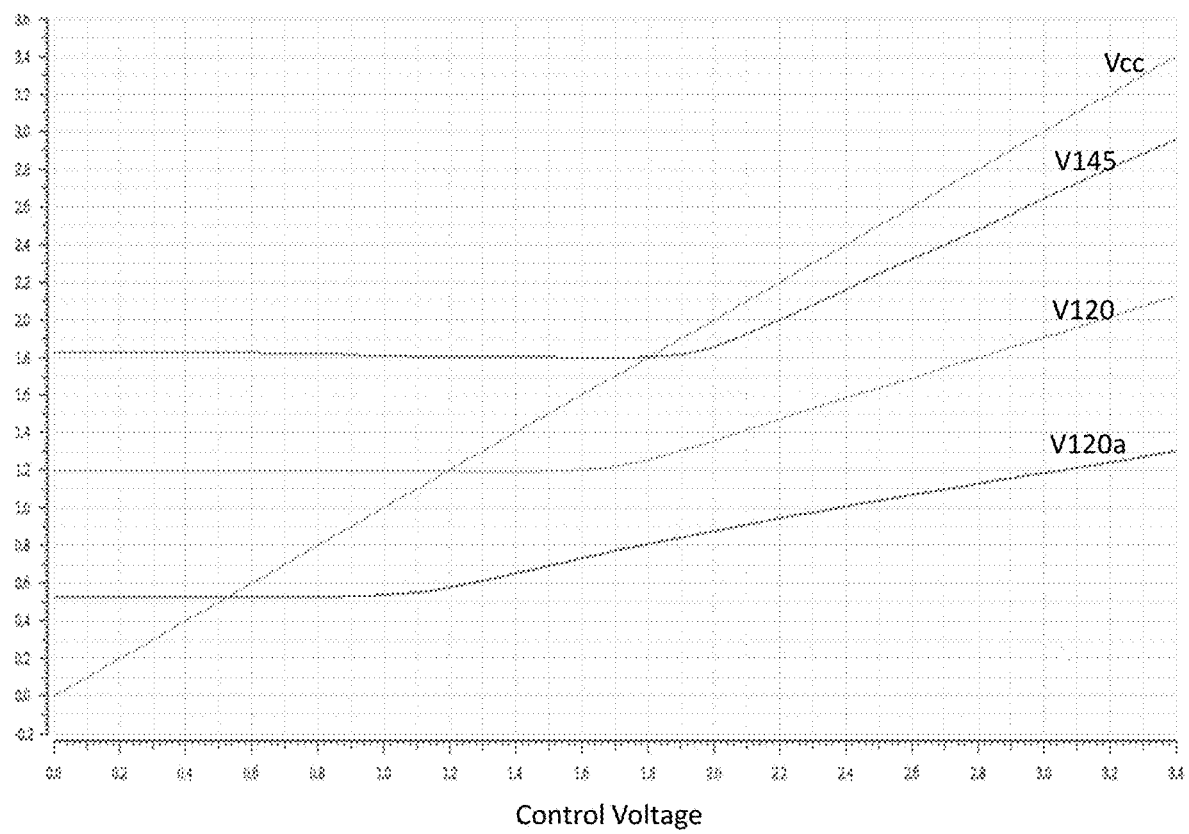
Figure 409:
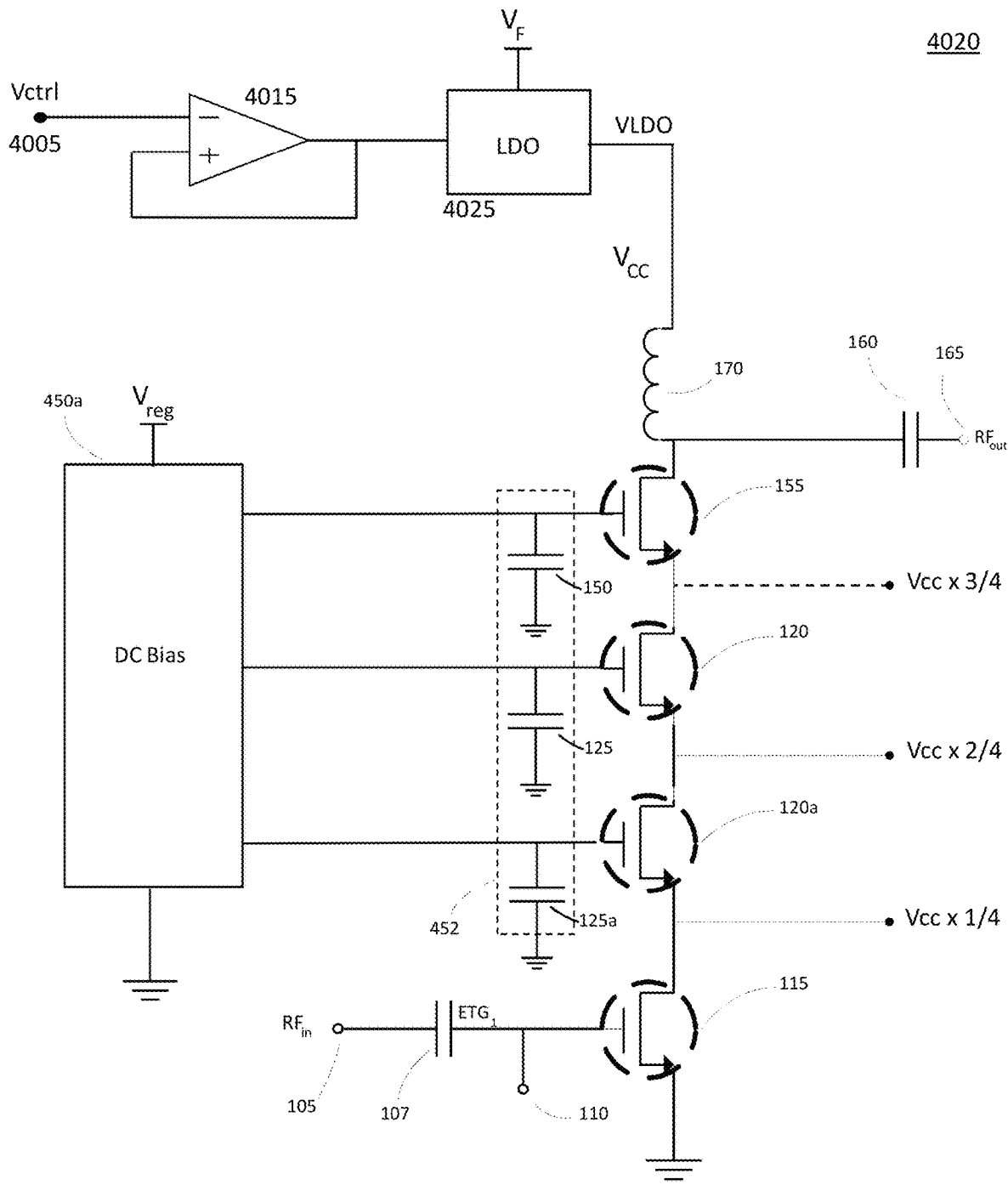

The $V_{DD}$ supply voltage provided to the various circuits depicted in FIGS. 4J-4K can be a battery supply voltage and can therefore have a fluctuating output voltage whose range is dependent on the charge of the battery. Such battery output voltage range for a handheld device (e.g. cellular phone, tablet, etc.) can be in the order of 2.0 V to 5.5 V. Furthermore, the supply voltage Vcc to the stack can be a dynamic voltage (e.g. based on an RF envelope signal) and therefore can also fluctuate within a range of approximately 0.5V to 5.5 V. For example, in some embodiments the supply voltage Vcc can be based on a buck/boost DC-DC converter whose output is further modulated based on a dynamic signal such as an RF envelope signal. Since Vcc is based on a buck/boost converter, it can be less susceptible to variations of a battery supply voltage, whereas $V_{DD}$ can be more susceptible to such variations and therefore voltages Vcc and $V_{DD}$ can vary/fluctuate independently of each other. As performance of the current mirror depicted in FIG. 4K can be impacted by its supply voltage (e.g. by a low supply voltage), according to an embodiment of the present disclosure, an auto-select current mirror functionality is provided such as to allow automatic usage of a current mirror with a higher supply voltage, as depicted in FIG. 4L1. The current source (400L1) depicted in FIG. 4L1 uses more than one current mirror to provide a desired current (e.g. of amplitude $V_{GS}/R_{Tree}$) to a load connected to terminal (435) of the current source (400L1). Such load can be, for example, the load present at any of the nodes (145, 135a) of the RF amplifier (100D) depicted in FIGS. 4H1 and 4H2, or in other words, terminal (435) can be coupled to any of the nodes (145, 135a). A first current mirror (440a, 440b) can be connected to a supply voltage $V_{FIX}$ which can be a battery voltage or a regulated voltage based on the battery voltage. Since the regulated voltage is based on the battery voltage, it can also fluctuate, although not as rapidly as the battery voltage. In one exemplary embodiment the regulator can be set to provide a 3.0V fixed DC voltage. A second current mirror (440c, 440d) which can have same components as the first current mirror (440a, 440b) can be supplied with the Vcc supply voltage (e.g. dynamic voltage) provided to the stacked transistor amplifier (e.g. FIGS. 4C-4H2). Both current mirrors duplicate the current through transistor (420) to their output transistors (440b, 440d) which share a same terminal (435) connected to a load (not shown). In a case where $V_{FIX}$ is substantially larger than Vcc (e.g. $V_{FIX}$>Vcc+$V_{th}$, where $V_{th}$ is the threshold voltage of the transistors), transistors (440c, 440d) are reverse biased and therefore both branches of the second current mirror circuit (440c, 440d) are off and current to the load via terminal (435) is solely provided by the first current mirror circuit (440a, 440b). In a case where $V_{FIX}$ is substantially smaller than Vcc (e.g. $V_{FIX}$<Vcc-$V_{th}$), transistors (440a, 44b) are reverse biased and therefore both branches of the first current mirror circuit (440a, 440b) are off and current to the load via terminal (435) is solely provided by the second current mirror circuit (440c, 440d). Finally, in a case where $V_{FIX}$ and Vcc are substantially equal (e.g. Vcc-Vth<$V_{FIX}$<Vcc+$V_{th}$), all transistors (440a, 440b, 440c, 440d) are forward biased and therefore current to the load via terminal (435) is provided by the both current mirror circuits (440a, 440b) and (440c, 440d).

With further reference to FIG. 4L2 and as known to the person skilled in the art, the diode-connected transistors (440a, 440c) of the current mirrors (440a, 440b) and (440c, 440d) may not turn on if their corresponding substrates (e.g. body terminal) are connected to a biasing voltage lower than a controlling voltage (e.g. $V_{GS}$ provided at node (430)). Accordingly, an embodiment of the present disclosure addresses this behavior by connecting the bodies of the transistors (440a, 440b, 440c, 440d) to the larger of the two supply voltages ($V_{FIX}$, Vcc) provided to the auto-select current mirror circuit of FIG. 4L2. This embodiment is depicted in FIG. 4L3 where two diodes (441, 442) are used to connect each of the supply powers ($V_{FIX}$, Vcc) to a common node (443) which ties the bodies of transistors (440a, 440b, 440c, 440d). The configuration depicted in FIG. 4L3 therefore connects the transistors bodies to the larger voltage of ($V_{FIX}$, Vcc). In order to further avoid the voltage drop associated to diodes (441, 442) reduce a voltage at the bodies of transistors (440a, 440b, 440c, 440d), such diodes can each be replaced by a zero-threshold (voltage) diode-connected transistor, such as, for example, a zero-threshold P-type MOSFET transistor (e.g. P-type metal-oxide-semiconductor field effect transistors).

With further reference to the current source (400L1) depicted in FIG. 4L1, it is noted that the supply voltage Vcc provided to the second current mirror (440c, 440d) can be a dynamic supply voltage, such as, for example, a time varying signal based on an envelope signal of an RF signal (e.g. FIGS. 5 and 19) processed by the transistor stack. Since the voltage at terminal (435), when under load, is a slow moving voltage, there can be a case where the combination of such slow moving voltage and the relatively fast moving time varying supply voltage Vcc puts the transistor (440d) into a reverse conduction state and therefore can potentially reverse conduct and therefore collapsing node (435) and also injecting undesired current into the Vcc supply. Collapsing of the node (435) can mean pulling down the node (e.g. voltage of the node) lower than intended compared to a correctly functioning circuit. The inventors of the present disclosure have addressed this potential issue by filtering a time varying component of the Vcc supply voltage via an RC based filter as depicted in FIG. 4L2, where resistor (426) and capacitor (427) provide such filtering (e.g. cutoff frequency). Furthermore, a capacitor (428) connected to the drain side of transistor (440d) is used to further provide a filtering of a gate voltage dynamic components when the current source (400L2) is coupled to the gate of a transistor of a stack (e.g. at nodes 145, 135, 135a). This is described in prior sections of this disclosure in relation to FIG. 4G2, where capacitor (147) of FIG. 4G2 can be the same capacitor (428) of FIG. 4L2.

The various embodiments presented in the previous sections of the disclosure with references to FIGS. 4C-4L3, describe gate biasing methods of the transistor stack used, for example, in an ET amplifier configuration (e.g. dynamic supply voltage) with a main goal to bias the gates of the various transistors of the stack in a way so that, during operation of the stack, the various transistors of the stack share across their drain-source terminals a desired portion of a voltage at the output of the stack. According to some embodiments of the present disclosure the sharing can be such as to equally divide the output voltage across the transistors of the stack, whereas according to other embodiments the sharing can provide larger portions of the output voltage across some of the transistors in a controlled manner. As previously noted, such biasing can take into account an AC component of the output RF signal, an AC component of the time varying dynamic supply voltage and a DC component which can include a $V_{GS}$ voltage of a transistor of the stack. Various circuitries according to the embodiments of the present disclosure as depicted, for example, in FIGS. 4C-4L3 are therefore provided to couple some AC/DC components (e.g. voltage, current) to the gates of the various transistors of the stack according to a desired voltage division across the various transistors of the stack. Such circuitries can work together to provide a desired bias voltage at a gate of each of the higher transistors of the stack, such as, for example, the desired bias voltage is the sum of the coupled AC/DC components. In an exemplary case where the supply voltage to the stack does not vary with time (e.g. constant, no AC component), a corresponding circuit providing a biasing component based on the AC component of a time varying dynamic supply voltage can be removed. Although the exemplary cases according the various teachings of the present disclosure depicted in FIGS. 4C-4H2 relate to biasing of a stack of 4 transistors, the person skilled in the art readily knows that such teachings are applicable to transistor stacks of any height, such as, for example, 3, 4, 5, 6, 7 and higher, and that the exemplary height of 4 transistors used herewith should not be considered as a limitation of the teachings according to the present disclosure.

FIG. 4M1 shows a block diagram according to an embodiment of the present disclosure showing the various AC (e.g. mid- and high-frequency) and DC (e.g. low-frequency) biasing methods for the gates of the higher transistors of the stack. Item (452) in the block diagram of FIG. 4M1, is the high-frequency bias generation circuit which provides AC coupling of the RF signal to the gates of the transistors (120a, 120, 155) and is described in various sections of the present disclosure, including in the sections related to FIGS. 4B and 4C. Item (451) of FIG. 4M1 is a supply-based AC biasing module (e.g. mid-frequency bias generation circuit) which can provide AC coupling of the dynamic supply voltage to the gates of said transistors which can allow bringing the gates at a voltage higher than the dynamic supply voltage when latter swings to lower amplitudes (e.g. see related description to FIGS. 4C and 4H1-4H2). An exemplary circuital implementation of item (451) according to an embodiment of the present disclosure is provided in FIGS. 4B, 4C and 4H1-H2. Item (450) of FIG. 4M1 is a DC bias module (e.g. low-frequency bias generation circuit) which provides DC biasing to the gates of transistors (120a,

120, 155) of the stack while consistently and irrespective of an RF input to the amplifier (e.g. transistor stack) providing the corresponding transistor gates with a DC bias of one $V_{GS}$, or a fraction thereof. The combination of the three biasing modules (450, 451, 452) provide a combined biasing signal at the gates of the higher transistors of the stack (155, 120, 120a) which is the one $V_{GS}$ or a fraction thereof above the desired voltages at the corresponding source terminals of the transistors. Latter voltages corresponding to a desired distribution of the voltage at the output of the amplifier (e.g. drain of transistor (155)) across the transistors (115, 120a, 120, 155) of the stack. An exemplary embodiment according to the present disclosure of the DC bias module (450) is provided in FIGS. 4E1-4H2 via a combination of a resistive ladder network (130, 140a, 140, 175) and current injection circuits (195, 196, 197). It should be noted that although not shown in FIG. 4M1, series resistors between nodes (145, 135, 135a) and corresponding outputs of the DC biasing module (450) can be provided such as discussed, for example, in relation to FIGS. 4H1 and 4H2.

FIGS. 4M2-4M4 show some exemplary circuits according to further embodiments of the present disclosure which can be used to implement the DC bias module (450) depicted in FIG. 4M1.

The circuit represented by FIG. 4M2 is a DC biasing circuit using a combined resistive network and current injection as described, for example, with reference to FIG. 4F, which can generate a $V_{GS}$ voltage independent of supply Vcc (e.g. using auto-select current mirror of FIGS. 4L1-4L3) to the transistor stack. As described in reference to the embodiment depicted in FIG. 4G2, the DC biasing circuit represented in FIG. 4M2 can include some safeguards (e.g. items 146, 147 of FIG. 4G2) in order to protect its current source from large voltage swings at a corresponding gate (e.g. to which the current source is injecting current).

The circuit represented by FIG. 4M3 is a DC biasing circuit (e.g. resistor-diode voltage divider) using a combination of serially connected resistors (e.g. of same value $R_{Tree}$) and transistors ($T43_1, T43_2, T43_3, T43_4$), where the transistors are configured as diodes (e.g. diode-connected transistor where the gate terminal is connected to the drain terminal). Each one of the transistors ($T43_1, T43_2, T43_3, T43_4$) of the resistor-diode voltage divider tree of FIG. 4M3 can be selected to have same device characteristic (e.g. I-V curves and threshold voltage) as a corresponding transistor of the stack (155, 120, 120a, 115) respectively, and therefore, a contribution to a corresponding ($ETG_3, ETG_2, ETG_{2a}$) can be such as to provide an equal distribution of an output voltage across the transistors of the stack. Such equal distribution can also be provided in a case where the transistors of the stack (155, 120, 120a, 115) have different device characteristics (e.g. heterogeneous stack), by simply matching (to the stack transistors) the corresponding transistors in the biasing circuit depicted in FIG. 4M3. The skilled person readily realizes that similar to the biasing circuit of FIG. 4M2, the biasing circuit of FIG. 4M3 can also be used to provide any controlled (e.g. unequal) distribution of an output voltage of a corresponding stack across its transistors. Resistor values for resistors $R_{TREE}$ can be chosen such as to provide a current flow through the diode-connected transistors equal to a desired current flow through the transistors of a corresponding stack (155, 120, 120a, 115). More specifically, each transistor+resistor combination ($R_{Tree}, T43_n$) in FIG. 4M3 has a voltage equal to Vcc/4 across it, since there are 4 such combinations serially arranged between Vcc and ground. Therefore, source of transistor $T43_2$ is at a voltage equal to Vcc/4 and therefore node (135a) is at Vcc/4+V$_{GS}$. The person skilled in the art can perform similar analysis to verify voltages at nodes (135, 145) as depicted in FIG. 4M3. The DC biasing circuit depicted in FIG. 4M3 has the advantage of being simple and not requiring much area (e.g. within an IC) and can therefore be placed near a power-amplifier (PA) stage, thereby improving matching between the bias generation and the actual PA stage. Although the biasing circuit of FIG. 4M3 comprises three output nodes (135a, 135, 145) to provide biasing to an amplifier comprising a stack of four transistors, such biasing circuit can be easily modified to comprise more or less output nodes to match an amplifier stack height different from four.

The circuit depicted in FIG. 4M4 is yet another exemplary DC biasing circuit (450) according to an embodiment of the present disclosure which can be used in the circuital configuration depicted in FIG. 4M1. The exemplary DC biasing circuit depicted in FIG. 4M4 uses stacked regulators (e.g. only two bottom stacks shown for compactness of the figure) to provide the DC portion of the gate voltages to the higher transistors (155, 120, 120a) of the stack, comprising a low frequency component of Vcc and an offset proportional (e.g. equal) to a V$_{GS}$ voltage of the stack transistors. The stacked regulators configuration depicted in FIG. 4M4 uses feedback for a more stable output bias voltage at nodes (135a, 135, 145). Such feedback, as provided by transistors (T43$_2$, T43$_3$, . . . ) can allow for better immunity of the output voltage with respect to supply voltage variations (e.g. Vcc). Although not shown in the figure, input voltages to the input terminals (471, 472, 473) of the various stacks can be provided via a resistor voltage divider similar to (175, 140, 140a, 130) of FIG. 4E1, to provide input voltages Vcc×(¾, 2/4, ¼) to the respective input terminals. More specifically, each stacked regulator (T46$_1$, T44$_2$, T45$_1$, T45$_2$, T43$_2$), (T46$_2$, T44$_3$, T45$_3$, T45$_4$, T43$_3$) comprises an operation transconductance amplifier (OTA) with corresponding differential pairs (T46$_1$, T44$_2$) and (T46$_2$, T44$_3$), and their respective PMOS loads (T45$_2$, T45$_1$) and (T45$_4$, T45$_3$). Each OTA has a differential input (e.g. via the differential pairs) and a single-ended output (e.g. via drain of T45$_1$, T45$_3$) connected to a gate terminal of an output transistor (e.g. T43$_2$, T43$_3$), latter transistor being further connected via its source terminal to the OTA to provide a negative feedback to one of the input pairs of the OTA (e.g. T44$_2$, T44$_3$). Since the other transistor of the input pairs (e.g. T46$_1$, T46$_2$) is connected to (Vcc/4, Vcc/2) and the OTA together with the output transistor (T43$_2$, T43$_3$) is connected in a negative feedback, the feedback loop thus created can regulate the source of the output transistor (T43$_2$, T43$_3$) to (Vcc/4, Vcc/2). Therefore, each source of the output transistor (T43$_2$, T43$_3$ . . . ) is at a regulated voltage equal to the voltage provided at the opposite input of the corresponding OTA (e.g. Vcc/4, Vcc/2, Vcc×¾). Since the output transistors are connected serially to transistor (T43$_1$), a same current flows through these transistors, and if these transistors (T43$_1$, T43$_2$, T43$_3$ . . . ) have the same device characteristics (e.g. same gate periphery), their V$_{GS}$' are equal. As a result, the nodes (135a, 135, 145) can be at one V$_{GS}$ above (Vcc/4, Vcc/2, Vcc×¾) respectively, which is the desired offset (e.g. assuming transistors (T43$_1$, T43$_2$, T43$_3$ . . . ) are same or reduced size version of transistors (115, 130a, 120, 155 . . . ), such as for example, if first set is a replica circuit of the second set). The person skilled in the art appreciates the regulated output voltages provided at nodes (135a, 135, 145) by the stacked regulator configuration depicted in FIG. 4M4 with a V$_{GS}$ offset which is immune to Vcc supply variations (e.g. only function of the gate biasing of transistor T43$_1$).

FIG. 4N1 depicts a simplified DC basing diagram according to the various embodiments discussed in the prior sections of the present application. The current mirror depicted in FIG. 4N1 can be the current mirror described with respect to FIGS. 4K-4L3 of the present disclosure, and items (410, 415, 420, 425) can be referred to as a V$_{GS}$ synthesis circuit which can generate, as per related description of FIG. 4J of the present disclosure, a current proportional to a desired V$_{GS}$ voltage to be injected into the resistor divider tree at one or more of the nodes (145, 135, 135a) (shown for nodes (145, 135a) in FIG. 4N1). As described with respect to said figures, the current source (410) generates a current which matches a desired current flowing into the stack transistors (115, 120a, 120, 155) and therefore the V$_{GS}$ of transistor (415) is more or less same as the V$_{GS}$ of a transistor of the stack. In cases where the stack is heterogeneous, and therefore comprises transistors of different device characteristics, several similar such biasing circuits can be provided, with each providing a biasing for transistors of a same device characteristics. For example, according to one exemplary embodiment, the input transistor (115) can have a different device characteristics from the other transistors of the stack which have a same device characteristics, and therefore one dedicated biasing circuit similar to one depicted in FIG. 4N1 can be provided to bias the gates of the upper transistors (120a, 120, 155), and another dedicated biasing circuit similar to one depicted in FIG. 4N1 can be provided to bias the gate of the input transistor (115). In such exemplary embodiment, transistor (415) of the V$_{GS}$ synthesis circuit is selected to match the device characteristics of the target transistor(s) of the stack.

As mentioned in the above section, according to some embodiments of the present disclosure, it can be desirable that the V$_{GS}$ generated by the V$_{GS}$ synthesis circuit is substantially equal to the V$_{G1}$ voltage (provided) at the gate of the input transistor (115) of the stack. This, for example, can be the case where a dedicated biasing circuit, such as one depicted in FIG. 4N1, is used to bias the gate of the input transistor (115) only, as opposed to biasing the gates of the upper transistors (120a, 120, 155) of the stack as shown in FIG. 4N1. According to some embodiments of the present disclosure, the V$_{GS}$ generated can equal the V$_{G1}$ voltage by within 10% of a saturation voltage (V$_{DSAT}$) of the input transistor (115), such as expressed by: |V$_{GS,415}$−V$_{G1,115}$|<10%*|VD$_{SAT,115}$|. According to a preferred embodiment of the present disclosure, the V$_{GS}$ generated can equal the V$_{G1}$ voltage by within 1% of the saturation voltage of the input transistor (115), such as expressed by: |V$_{GS,415}$−V$_{G1,115}$|<1%*|VD$_{SAT,115}$|. For this to be true, the voltage at the drain of transistor (415) can be substantially the same as the desired voltage at the drain of the stack input transistor (115) since for a given current (e.g. from (410)), V$_{GS}$ can vary according to the drain-to-source voltage of a transistor (e.g. (415)). Therefore, and according to a further embodiment of the present disclosure, a V$_{GS}$ synthesis circuit is provided which can generate a V$_{GS}$ voltage substantially equal to the V$_{GS}$ voltage of the input transistor (115) of the stack. Such circuit is depicted in FIG. 4N2. It should be noted that the voltage V$_{G1}$ provided to the gate of the input transistor (115) can be susceptible to RF signal feed-through which at higher powers of the RF signal, such feed-through can mix down to a base-band signal (e.g. a lower RF signal frequency component) of the RF signal and perturb the signal at V$_{G1}$ node, such as giving rise to a low-frequency distortion component. Such low-frequency distortion, if isolated to the input transistor, can still provide a desirable output of the stacked transistor amplifier. However, coupling of such distortion into one or more of nodes (135a, 135, 145) of the RF stacked amplifier can cause an undesirable effect (e.g. distortion) at the output of the RF stacked amplifier. For this reason, and according to an embodiment of the present disclosure, the $V_{G1}$ voltage provided at the gate of the input transistor (115) can be independently generated via the $V_{GS}$ synthesis circuit described in FIG. 4N1, or via the $V_{GS}$ synthesis circuit depicted in FIG. 4N2 which is described below. As previously mentioned, a duplicate of the same synthesis circuit (e.g. using a transistor (415) with different device characteristics) can be used to generate gate voltages for the upper transistors of the stack.

The $V_{GS}$ synthesis circuit of FIG. 4N2 uses an additional transistor Tease, connected in series between the current source (410) and the transistor (415), to regulate the drain voltage of the 'reference' transistor (415). Since transistor (415) is the source device which generates the desired $V_{GS}$ voltage (e.g. offset DC voltage), it can be referred to as the reference transistor. Device characteristics of the reference transistor (415) can be made to closely match those of the stack input transistor (115), or to the upper transistors of the stack should the $V_{GS}$ synthesis circuit be used to bias the upper transistors of the stack. A voltage at the gate terminal ($G_{case}$) of transistor ($T_{case}$) is provided such as to place a desired voltage (e.g. Vcc/4) at the drain of the reference transistor (415). As previously mentioned, such desired voltage can be the same voltage as the voltage at the drain of the stack input transistor (115), and equal to Vcc/4 according to some embodiments of the present disclosure, but can also be the voltage (e.g. $V_{DS}$) across any of the upper transistors of the stack, which by virtue of the equal voltage distribution in the stack, can also be equal to Vcc/4. Therefore, transistors (415, 115) having a same drain-to-source voltage, a same drain-to-source current and a same device characteristics, the $V_{GS}$ of the reference transistor (415) can accurately match the $V_{GS}$ of the input transistor (115). Alternatively, transistor (415) can be selected to match the device characteristics of an upper transistor of the stack and therefore accurately match the $V_{GS}$ of that transistor. An additional resistor (426) of same value ($R_{Tree}$) is provided in order to correctly bias the additional transistor ($T_{case}$), which may keep said transistor operating in its saturation region. Furthermore, it should be noted that transistor ($T_{case}$) need not have a same device characteristics as the stack transistors (115, 120a, 120, 155) and therefore can be selected to have device characteristics such as to reduce its $V_{GS}$ dependence on its drain-to-source voltage (e.g. supply variations). Latter can be done, for example, by selecting transistor (Tease) to have a larger gate-length, which has a larger output resistance and therefore reduces the $V_{GS}$ dependence on the $V_{DS}$ voltage of the transistor. The $V_{GS}$ synthesis circuit of FIG. 4N2 can be used to bias the gate of the input transistor (115), and a duplicate circuit can be used to bias the gates of the upper transistors (120a, 120, 155) of the stack. The person skilled in the art will know of other circuital arrangements which can be used to bias the gate of the input transistor (115).

With further reference to FIG. 4N2, since the voltage provided at the gate terminal ($G_{case}$) generates the desired voltage (e.g. Vcc/4) at the drain of the reference transistor (415), the voltage provided at the gate terminal ($G_{case}$) can therefore be one $V_{GS}$ above the desired drain voltage. Therefore, one can use a $V_{GS}$ synthesis circuit similar to circuit depicted in FIG. 4N1 to generate the gate terminal ($G_{case}$) voltage (e.g. Vcc/4+$V_{GScase}$), as depicted in FIG. 4N3. The reference transistor (416) of the $V_{GS}$ synthesis circuit depicted in FIG. 4N3 is set to operate at a $V_{GS}$ which matches the desired $V_{GS}$ of transistor (Tease).

Alternatively, the dynamic bias voltage $ET_{RD3}$ can be inversely related to the envelope signal. As voltage at a drain terminal of the third FET (155) becomes sufficiently low, the third FET (155) and/or the second FET (120) begin(s) to act as a gate voltage controlled resistor (triode) instead of a gate voltage controlled current source (saturation). If the dynamic bias voltage $ET_{RD3}$ becomes high as the third FET (155) and/or the second FET (120) begin(s) to act as a gate voltage controlled resistor, an equivalent resistance presented by the third FET (155) and/or the second FET (120) can become low since an equivalent resistance presented by a FET in triode operation can be inversely proportional to a gate bias voltage of the FET in triode operation. As a result, when the dynamic bias voltage $ET_{RD3}$ is inversely related to the envelope signal, it is possible that the third FET (155) and/or the second FET (120) do(es) not significantly hinder operation of the envelope tracking amplifier (100) when voltage at a drain terminal of the third FET (155) becomes sufficiently low that the third FET (155) and/or the second FET (120) begin(s) to act as a gate voltage controlled resistor (triode).

As previously noted, in some applications the dynamic supply voltage Vcc can be based on a control voltage that controls a desired output power of the amplifier. One particular case of such applications is a GSM amplifier (4020) whose output power can be controlled by an output (VLDO) of a low dropout regulator (LDO) as depicted in FIG. 4O1, where the LDO is powered by a substantially fixed voltage $V_F$ (e.g. battery). A control signal (4005) can be provided to the LDO (4025) which can cause an output voltage VLDO of the LDO (4025) to change, which in turn can change the supply voltage and gate bias voltages provided to the amplifier (4020) comprising stacked transistors (155, 120, 120a, 115) arranged in a cascode configuration. Biasing of the stacked transistors (155, 120, 120a) of the amplifier (4020), provided by the DC bias circuit (450), can be according to any of the dynamic biasing methods discussed in the present application, and as depicted, for example, in FIG. 4D, where a substantially equal voltage division of the supply voltage Vcc to the amplifier (4020) across the stacked transistors is provided. In the exemplary configuration depicted in FIG. 4O1, the control signal (4005) is processed by an operational amplifier (4015). A person skilled in the art would realize that the control signal (4005) may be processed by a variety of circuits, including the open loop configuration depicted in FIG. 4O1, or a closed loop configuration where the control signal is further affected by, for example, an effective output power or output voltage of the amplifier (4020) or of the LDO (4025). It should be noted that description of some elements depicted in FIG. 4O1 not discussed here have been provided in the previous paragraphs of the present disclosure, as like reference designators represent like elements.

With further reference to FIG. 4O1, is some applications it may desirable to obtain a linear response of the output power of the amplifier (4020) as a function of the control voltage (4005), over a predetermined range of operation of the control voltage (4005). In other words, a relationship between the output power Pout of the amplifier (4020) and the control voltage Vctrl of the control signal (4005) to the LDO (4025) be modelled according to the expression: Pout=A*Vctrl+B, where A and B are constants. A person skilled in the art readily understands that although a perfect linear response according to such model is not practically feasible, design implementations may greatly influence an error with respect to such desired linear model.

With continued reference to FIG. 4O1, as the supply voltage Vcc (Vcc=VLDO) to the amplifier decreases responsive to the control voltage Vctrl of the control signal (4005), DC bias voltages to the gates of the stacked transistors (155, 120, 120a) follow such decrease so as to provide an equal voltage division of the supply voltage Vcc to the amplifier (drain of the transistor 155) across the stacked transistors (155, 120, 120a, 115) of the amplifier (4020). As a result, when the supply voltage Vcc becomes sufficiently low, the transistors (150, 120, 120a, 115) transition from a saturation region of operation to a triode (linear) region of operation where each of the transistors act as a gate voltage controlled resistor (triode) instead of a gate voltage controlled current source (saturation). Operation of the stacked transistors in the triode region of operation can in turn impact amplifier characteristics, such as, for example, an output power response of the amplifier (4020) with respect to the control voltage (4005), mainly due to the operation of the input transistor (115) away from the saturation region of operation. By maintaining operation of the input transistor (e.g. 115) within its saturation region of operation so that it operates as a transconductor as long as possible (with respect to a decreasing supply voltage Vcc), improved amplifier characteristics can be obtained in spite of operation of the top transistors (e.g. 150, 120, 120a) in their respective triode regions of operation. It follows, that according to an embodiment of the present disclosure, responsive to a decreasing supply voltage Vcc to the amplifier (4020), a bias voltage to the gates of the stacked transistors (155, 120, 120a, 115), provided by a biasing circuit according to the present disclosure (e.g. FIG. 4O5 later described), is configured to control a region of operation of each of the transistors of the stack so as to improve amplifier characteristics (e.g. increase an output power linearity of the amplifier). According to a further embodiment of the present disclosure, such improvement in amplifier characteristics is provided by maintaining operation in the saturation region of the input transistor (115) responsive to the decreasing supply voltage Vcc while other transistors of the stack (155, 120, 120a) are controlled to transition to their respective triode regions of operation. According to an embodiment of the present disclosure, the controlling of the other transistors (155, 120, 120a) can be according to fixed gate biasing voltages provided to the gates of such transistors which allow these transistors to transition to their respective triode regions of operation as the supply voltage Vcc decreases (e.g. FIG. 4O9 later described). According to yet another embodiment of the present disclosure, the controlling of the other transistors of the stack (155, 120, 120a) is according to a sequential top to down transition scheme, where responsive to a decreasing supply voltage Vcc, the top transistor (155) is first controlled to operate in the triode region of operation, responsive to a further decreasing of the supply voltage Vcc, the next transistor (120) is controlled to operate in the triode region of operation, and so on. As the top transistor (150) is controlled to operate in its triode region of operation, it is effectively removed from contributing to the operation of the stack as a cascode stack (and therefore from contributing in the distribution of the supply voltage Vcc across the stacked transistors), leaving the lower transistors (120, 120a, 115) for operation as the cascode stack for an improved characteristics of the amplifier, including a better linearity of the stack. Such biasing of the transistors of the stack causes a sequential decrease of the effective stack height of the cascode stack. Finally, at the lower range of operation of the supply voltage Vcc, only the input transistor (115) operates in its saturation region of operation as the remaining transistors (150, 120, 120a) operate in their respective triode regions of operation.

An increase in the linearity of the amplifier (4020) with respect to the control voltage (4005), as provided by the gate bias voltage of the present disclosure discussed above, can allow for a more accurate prediction of the output power Pout of the amplifier (4020) with respect to the control voltage Vctrl (4005) based on a reduced number of reference Pout versus Vctrl points. According to various embodiments, it may be desirable to store a minimum number of such reference points, captured, for example, via a calibration routine. According to some embodiments of the present disclosure, only two reference points may be necessary to predict the output power of the amplifier (4020) over the entire power range of operation of the amplifier while maintaining a desired predicted power accuracy. FIG. 4O2 shows a graph representing an output power (in volts) of the amplifier (4020) as a function of the control voltage (4005), and a predicted output power (in volts) of the amplifier (4020) as a function of the control voltage (4005), where the predicted output power is based on two reference points (Ref1, Ref2) and a line passing through such reference points.

With further reference to FIG. 4O2, an error between the predicted power and the (effective) power of the amplifier (4020) can vary. In some applications such error is a specified error to which device manufacturers and system integrators need to comply. One such application is in a GSM power amplifier (PA), where such error is specified in the 3GPP standard body specifications for the GSM air interface (also known as 3GPP specification for mobile broadband standard). FIGS. 4O3 and 4O4 show graphs representing such error and a specified upper limit and lower limit of the error per the 3GPP standard. Specifically, FIG. 4O3 shows the error for a case where the biasing circuit provides a biasing to evenly distribute the supply voltage over the transistors of the stack over the entire range of operation of the amplifier, which as noted above, can drive all the transistors of the stack to gradually transition to their respective triode regions of operation with decreasing supply voltage Vcc. FIG. 4O4 shows the error for the case where the biasing circuit sequentially controls the transistors of the stack to operate in their respective triode regions of operation while controlling the input transistor (115) to operate in its saturation region of operation as the supply voltage decreases. A person skilled in the art will appreciate the reduced error shown in FIG. 4O4 provided by the biasing circuit according to the present disclosure which allows for a larger headroom for operation within the specified limits.

FIG. 4O5 shows a biasing circuit (4500) according to the present disclosure which can provide, at nodes (145, 135, 135a), the bias voltages to the gates of the transistors (150, 120, 120a) according to the above described embodiments to sequentially control, with a decreasing Vcc voltage, the transistors (150, 120, 120a) for operation in their triode regions of operation. The biasing circuit (4500) comprises, for each gate of the gates of the transistors (155, 120, 120a), a biasing selector circuit (45100) which provides to the each gate, a larger of a dynamic bias voltage, provided by a dynamic DC biasing circuit 4505, which varies as a function of the supply voltage Vcc, and a fixed bias voltage provided by a resistor tree divider circuit (4520) based on a fixed reference voltage Vref. The dynamic DC biasing circuit (4505) can be any of the circuits described in the present disclosure, or known to a person skilled in the art, for providing a DC bias voltage to each of the gates of cascoded transistors of a stack (e.g. all except the input transistor 115) which varies as a function of a supply voltage to the cascoded stack (which operates as an amplifier), such as, for example, DC biasing circuits discussed with reference to FIGS. 1, 3, 4A, 4B, 4C, 4D, 4E1, 4E2, 4F, 4G1, 4G2, 4H1, 4H2, 4M1, 4M2, 4M3, 4M4, 4N1, 4N2 and 4N3. The resistor tree divider circuit (4520) divides the fixed reference voltage Vref to fixed voltages of decreasing amplitudes, with a highest amplitude fixed voltage provided to the biasing selector circuit (45100) connected to the gate of the top transistor (155) at node (145), the next highest amplitude fixed voltage provided to the biasing selector circuit (45100) connected to the gate of the next transistor (120) at node 135, and the lowest amplitude fixed voltage provided to the biasing selector circuit (45100) connected to the gate of the transistor (120) at node (135a), the transistor (120) being connected to the input transistor (115). It should be noted that the biasing circuit (4500) may be suited for providing bias voltages to the gates of stacked transistors operating in a cascode configuration and part of an RF power amplifier (RF) whose supply voltage can vary. Some non-limiting exemplary applications can be the GSM amplifier discussed with relation to FIG. 4O1, or any of the ET (envelope tracking) amplifiers discussed in the present disclosure.

With further reference to the biasing circuit (4500) depicted in FIG. 4O5, when the supply voltage Vcc, which is the supply voltage to the cascode stack (155, 120, 120a, 115), is sufficiently high, each of the dynamic bias voltages generated by the dynamic DC bias voltage circuit (4505) is higher than a corresponding fixed bias voltage generated by the resistor tree divider circuit (4520). Therefore, the nodes (145, 135, 135a) carry the dynamic bias voltage to the gates of the transistors (155, 120, 120a) for operation of such transistors in their respective saturation regions of operation. As previously mentioned, in this case, the entire stack operates as a cascode stack where the bias voltages further allow a substantially equal division of the supply voltage to the stack across the transistors of the stack.

With continued reference to FIG. 4O5, as the supply voltage decreases from the sufficiently high voltage level, according to an embodiment of the present disclosure, the dynamic bias voltage associated with the top transistor (155) of the stack becomes lower than the fixed bias voltage associated to the such transistor while the dynamic bias voltage associated to the transistors (120, 120a) remain higher than the corresponding fixed bias voltages. As a result, the biasing selector circuits (45100) select the fixed bias voltage generated by the circuit (4520) for output at the node (145) and the dynamic bias voltages generated by the circuit (4505) for output at the nodes (135, 135a). In this case, top transistor (155) operates in its triode region of operation and is therefore effectively removed from contributing to the cascode stack. As the top transistor (155) now operates in the triode region, it becomes equivalent to a small resistor which therefore provides enough voltage headroom for operation of the transistors (120, 120a, 115) as a cascode configuration. As the supply voltage further decreases, it reaches a next lower level associated to a switching of the bias voltage at node (135) connected to the gate of the transistor (120), which effectively further reduces the height of the cascode stack by putting the transistor (120) into triode, and so on. A last lower level of the supply voltage is associated with a switching of the bias voltage to the last cascoded transistor (120a) to put such transistor in its triode region of operation. This effectively leaves only the input transistor (115) operating in the saturation region, as all other transistors of the stack are provided with the fixed biasing voltage generated by the resistor tree divider circuit (4520).

Figure 6:
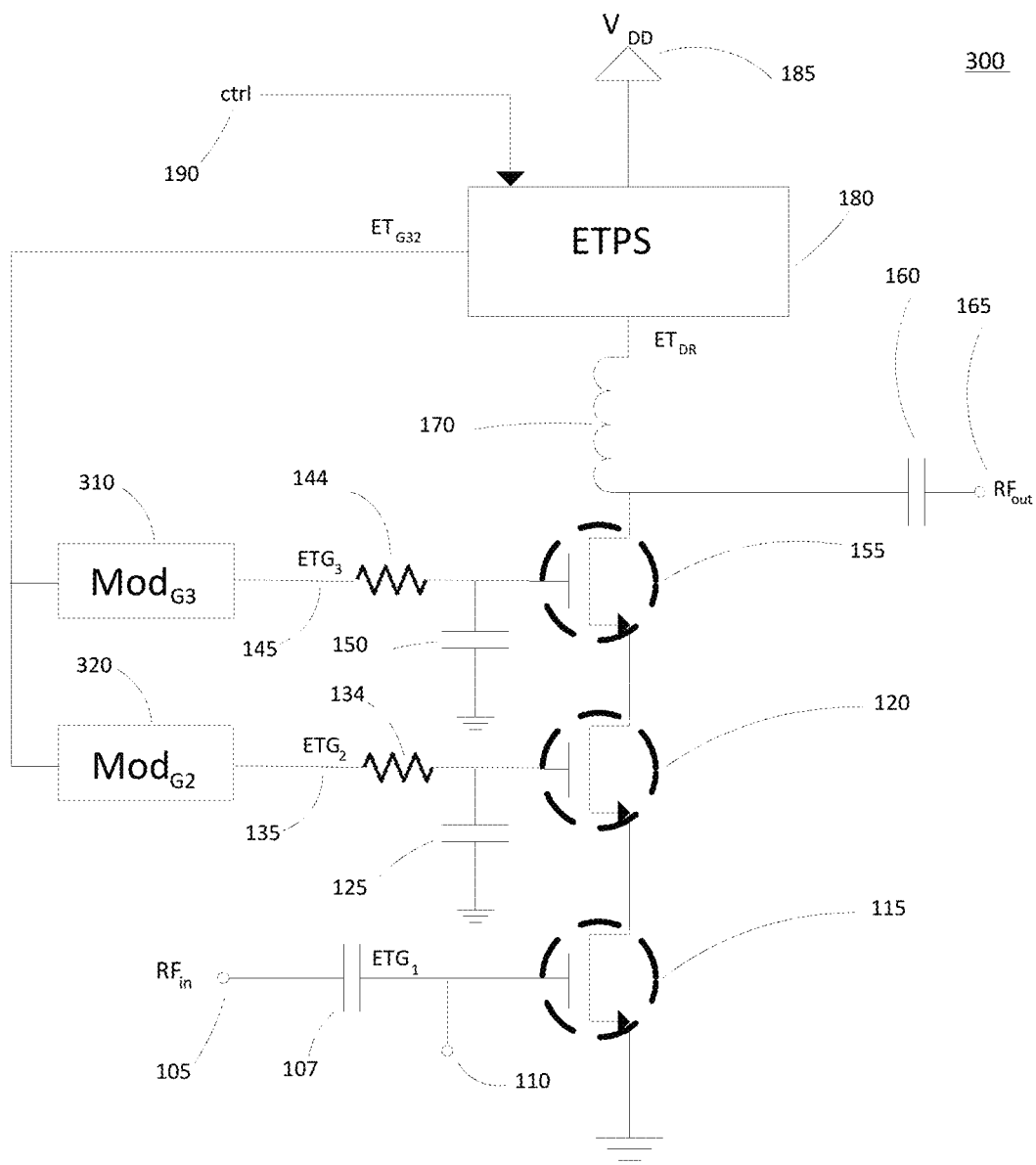

FIG. 4O6 shows a circuital representation of an exemplary implementation (4510a) of the biasing selector circuit (45100) of FIG. 4O5. In such exemplary implementation, two PMOS transistors (46100, 46200) of substantially same characteristics (e.g. I-V characteristics) are used to compare two input voltages (IN1, IN2) and select a larger of the two input voltages for output to an output node, OUT. The input voltage IN1 is connected to the source of the transistor (46100), the input voltage IN2 is connected to the gate of the transistor (46100), and the output node, OUT, is connected to the drain of the transistor (46100). Similarly, input voltage IN2 is connected to the source of the transistor (46200), the input voltage IN1 is connected to the gate of the transistor (46200), and the output node (OUT) is connected to the drain of the transistor (46200). Accordingly, if the input voltage IN1 is larger than the sum of the input voltage IN2 and the threshold voltage Vth of the transistor (46100), the transistor (46100) conducts and can provide a voltage at the output node OUT which is substantially equal to the input voltage IN1. In this case, the transistor (46200) does not conduct and presents a substantially high impedance to the output node OUT. On the other hand, if the input voltage IN2 is larger than the sum of the input voltage IN1 and the threshold voltage Vth of the transistor (46200), the transistor (46200) conducts and can provide a voltage at the output node OUT which is substantially equal to the input voltage IN2. In this case, the transistor (46100) does not conduct and presents a substantially high impedance to the output node OUT.

Figure 7:
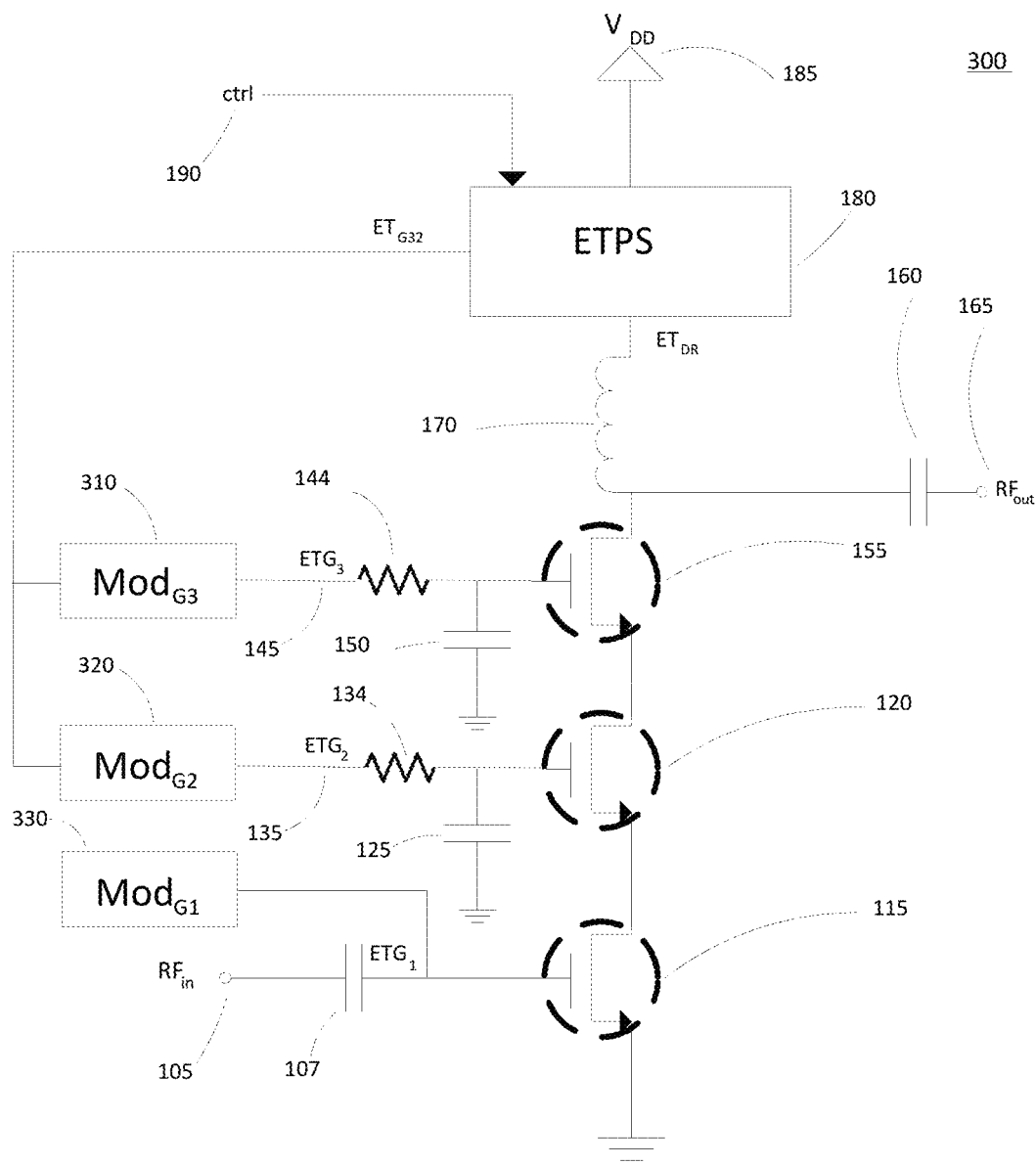

With further reference to FIG. 4O6, a person skilled in the art would realize that a non-zero threshold voltage Vth of the transistors (46100, 46200) can cause an undesirable offset error in the comparison of the two input voltages (IN1, IN2). It follows that according to an exemplary embodiment of the present disclosure, the transistors (46100, 46200) are configured to have a substantially zero threshold voltage (Vth=0 V, intrinsic transistors). This allows the transistor to (46100) to switch ON (conduct) when the input voltage IN1≥input voltage IN2, and the transistor (46200) to switch ON (conduct) when the input voltage IN2≥input voltage IN1. However, usage of intrinsic transistors can pose some issues, such as turning OFF (non-conduction) of the intrinsic transistors that may require negative voltages that are not readily available to the circuit. On the other hand, an intrinsic transistor that is not completely turned OFF, may have some leakage current which can leak, for example, into the resistor tree divider circuit (4520) and create some undesired offsets in the voltages defined by the resistor tree. In order to mitigate such issue with the using of the intrinsic transistors, according to an embodiment of the present disclosure, the intrinsic transistors are selected to have a small size so as to reduce a corresponding leakage current. Additionally, a large size non-intrinsic transistor (Vth>0 V) is coupled in parallel with the small size intrinsic transistor so as to provide a higher drive current to the output node OUT while reducing a voltage drop between the selected input voltage and the output node OUT, as an equivalent resistance of a transistor is reduced with an increase of the size of the transistor. This is shown in FIG. 4O7, where the transistor (46100) is shown to be composed of two parallel transistors (4610a, 4610b), and transistor (46200) is shown to be composed of two parallel transistors (4620a, 4620b), where transistors (4610a, 4620a) are small size intrinsic transistors, and transistors (4610b, 4620b) are large size non-intrinsic transistors. According to a non-limiting exemplary embodiment of the present disclosure, the small intrinsic transistors (4610a, 4620a) have each a gate width of 400 nm and a gate length of 10000 nm, whereas the large non-intrinsic transistors (4610b, 4620b) have each a gate width of 4000 nm and a gate length of 350 nm.

FIG. 4O8 depicts graphs representing a varying supply voltage Vcc with respect to a control voltage (e.g. Vctrl of FIG. 4O1) and exemplary gate bias voltages (V145, V120, V120a) generated at nodes (145, 120, 120a) by the biasing circuit (4500) of FIG. 4O5 in response to the varying supply voltage. The gate bias voltages (V145, V120, V120a) are provided to the transistors (155, 120, 120a) through the nodes (145, 135, 135a) of the basing circuit (4500). As can be seen in FIG. 4O8, the gate bias voltages sequentially flatten out as Vcc is reduced; first to flatten out is bias voltage at node (145) that biases the top transistor (155), then the bias voltage at node (135) that biases the transistor (120), and last, the bias voltage at node (135a) that biases the transistor (120a). When responsive to a reduction of the supply voltage Vcc a gate bias voltage (V145, V120, V120a) flattens out, the gate of a corresponding transistor (155, 120, 120a) is held at a fixed voltage as described above. According to some embodiments of the present disclosure, the fixed voltage can be generated by the resistor tree divider circuit (4520) discussed with reference to FIG. 4O5. When the supply voltage Vcc is greater than 2 V (in this example), the dynamic bias circuit (4505) generates dynamic bias voltages which can each be represented by a ratio of the Vcc supply voltage (as discussed, for example, with respect to FIG. 4E1). As Vcc is reduced, first the gate of the top transistor (155) is held at a fixed voltage (~1.8 V) in which case the top transistor in the stack is pushed to operate in the triode region. As Vcc is reduced further, the drain-to-source voltage $V_{DS}$ of the top transistor (155) approaches 0 V. As Vcc is reduced further, similar triode operation will occur sequentially for the transistor (120), gate held at a fixed voltage ~1.2 V, and then for the transistor (120a), gate held at a fixed voltage ~0.6 V. When the stack of transistors (155, 120, 120a, 115) is used as an RF PA, such biasing of the transistors of the stack can allow a transistor on top of the stack to operate in the triode region and therefore to have a small drain to source resistance, or low loss for transmitting RF signals to an output node of the PA. Small values of $V_{DS}$ for transistors at the top of the stack implies that the transistors at the bottom of the stack have an increased $V_{DS}$ and can therefore remain in the saturated mode of operation at lower supply voltage Vcc values.

Figure 9:
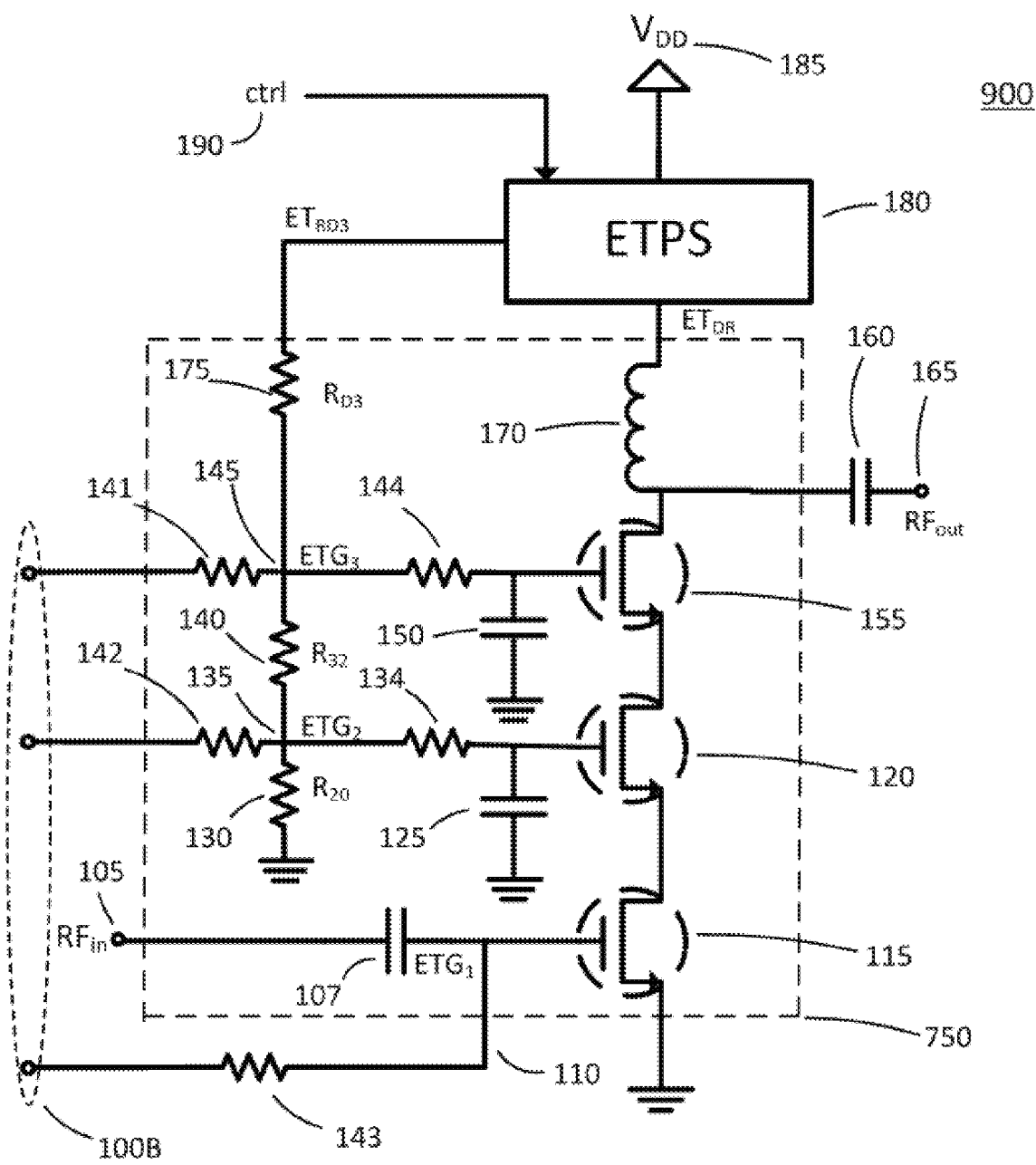

As previously described, according to an embodiment of the present disclosure, controlling of the transistors (155, 120, 120a) of the stack can be according to fixed biasing voltages (independent of the varying supply voltage Vcc) provided to the gates of such transistors which allow such transistors to transition to their respective triode regions of operation as the supply voltage Vcc decreases, while controlling the input transistor (115) to maintain operation in its saturation region of operation, and therefore, provide an improved amplifier characteristics. This is shown in FIG. 4O9, where a DC biasing module (450a) that operates from a fixed supply voltage, Vreg, that is separate from the supply voltage Vcc, provides fixed gate biasing voltages to the gates of the transistors (155, 120, 120a). Such fixed gate biasing voltages can be based on a known variation (e.g. range thereof) of the supply voltage Vcc, so that throughout such variation, the fixed biasing voltages ensure that the input transistor (115) maintains operation in its saturation regions of operation, while allowing the top transistors (155, 120, 120a) to transition between their triode/saturation modes of operation. Using the teachings according to the present disclosure, a person skilled in the art would know of many ways to implement the DC biasing module (540a). According to an exemplary embodiment of the present disclosure, the DC biasing module (540a) comprises the resistor tree divider (4520) shown in FIG. 4O5.

It should be noted that although the above description of the biasing of the gates of the transistors of the stack (e.g., 155, 120, 120a, 115) for maintaining operation of the input transistor (e.g., 115) within its saturation region of operation so that it operates as a transconductor as long as possible (with respect to a decreasing supply voltage Vcc) is provided with respect to an exemplary amplifier that operates as a GSM amplifier (e.g., FIG. 4O1, FIG. 4O9), a person skilled in the art would understand that such teachings according to the present disclosure can equally apply to other amplifier configurations using a transistor stack (e.g. stacked transistors) powered by a varying voltage. For example, one may apply the present teachings to a linear power amplifier that operates in an average power tracking (APT) mode, where a varying supply voltage to the transistor stack of the amplifier is provided via a DC-DC converter.

FIG. 6 shows an embodiment according to the present disclosure of an envelope tracking amplifier (300) that is configured such that the gate bias voltages applied to node (145) and node (135) can be independent of each other due to inclusion of a third gate modifier (310) and a second gate modifier (320), both of which, alone or in combination, are example embodiments of bias adjustment circuitry. The third gate modifier (310) and the second gate modifier (320) can comprise circuits that are configured to independently scale, amplitude shift, phase shift, invert, and/or perform any mathematical operation (e.g. implemented by an op-amp circuit) of the dynamic bias voltage $ET_{G32}$ to generate the gate bias voltages $ET_{G3}$ and $ET_{G2}$ that are adapted to be applied to node (145) and node (135), respectively. The first gate ($ET_{G1}$) can be biased by, for example, a current mirror circuit connected to the gate of the first FET (110). Compared to the embodiment shown in FIG. 1, the embodiment shown in FIG. 6 provides additional freedom because voltages $ET_{G3}$ and $ET_{G2}$ are not tied together by a resistive voltage divider.

FIG. 7 shows an alternative embodiment where the gate of the first FET (115) can also be biased by a first gate modifier (330) in substantially a similar manner as the second gate modifier (320) and the third gate modifier (310). In some embodiments, the gate modifiers (310, 320, 330) can be made of a variety of analog or digitally tuned circuits known by those skilled in the art. By way of example and not of limitation, the gate modifiers (310, 320, 330) can be a simple op amp circuit, or an RLC circuit.

Figure 8A:
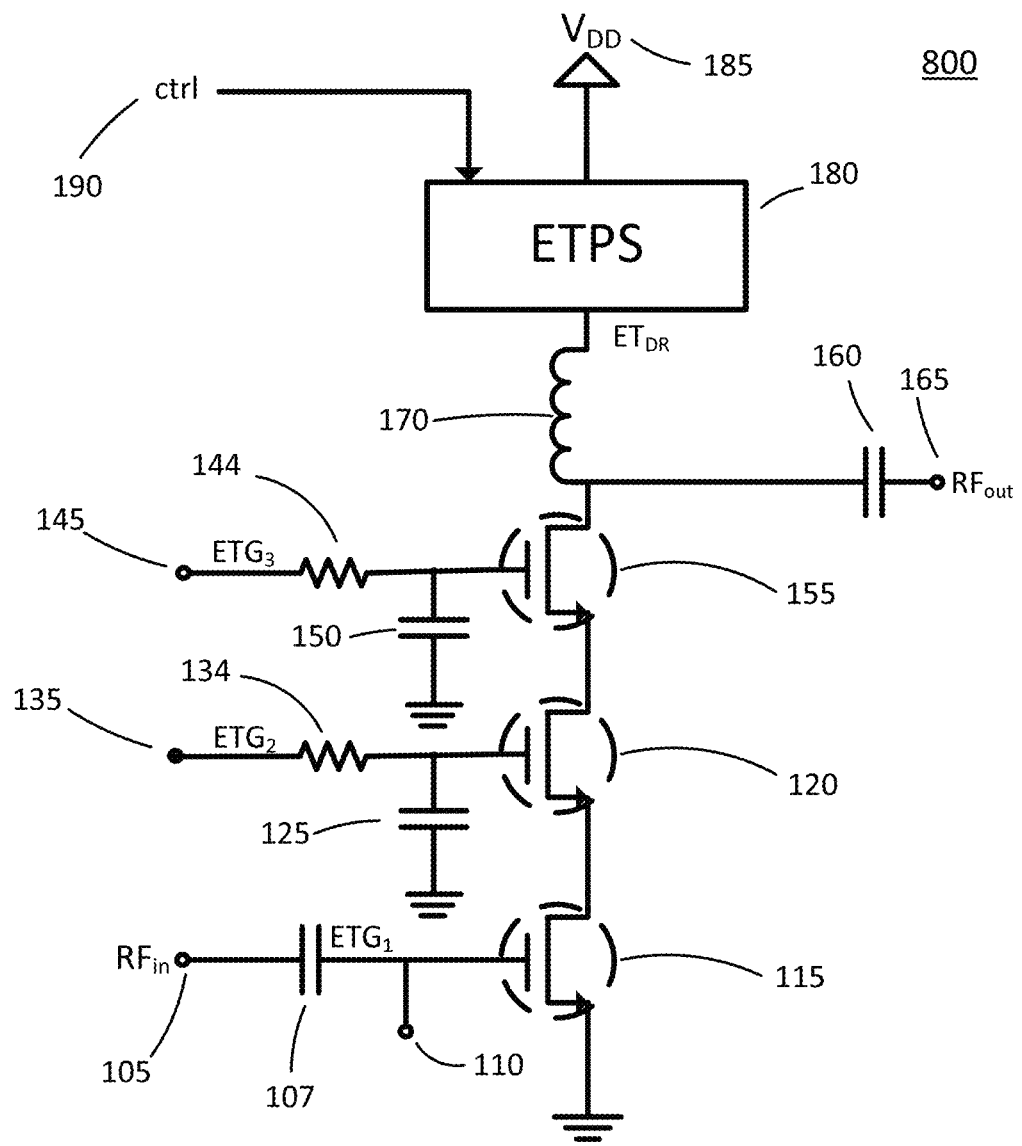
FIG. 8A shows an embodiment according to the present disclosure of an envelope tracking amplifier that is configured such that the gate bias voltages are supplied by a source (not shown) other than an ETPS (e.g. variable DC-DC converter).

FIG. 8A shows an embodiment according to the present disclosure of an envelope tracking amplifier (800) that is configured such that the gate bias voltages applied to node (145) and node (135) are supplied by a source (not shown) other than the ETPS (180). By way of example, and not of limitation, the source other than the ETPS (180) may comprise a baseband controller such as a transceiver unit (not shown). The baseband controller can be a part of an RF circuit that comprises the envelope tracking amplifier (800). Regardless of the method of supply of the gate bias voltage (e.g. to nodes (135), (145)), when operating in the envelope tracking mode, usually such gate bias voltage would share the characteristic of varying as a function of the envelope signal (e.g. FIG. 27). In some cases however, even though ET operation is desired, it may be desirable not to vary all of the gate bias voltages, as any one of the gates, including the gate of the input transistor (115), may be held at fixed voltage during ET operation. This selection, or optimization of gate bias voltage, is based on device choices, corresponding devices breakdown voltages, the choice of DC bias conditions, and voltage division through the stack, among other things.

Figure 8B:
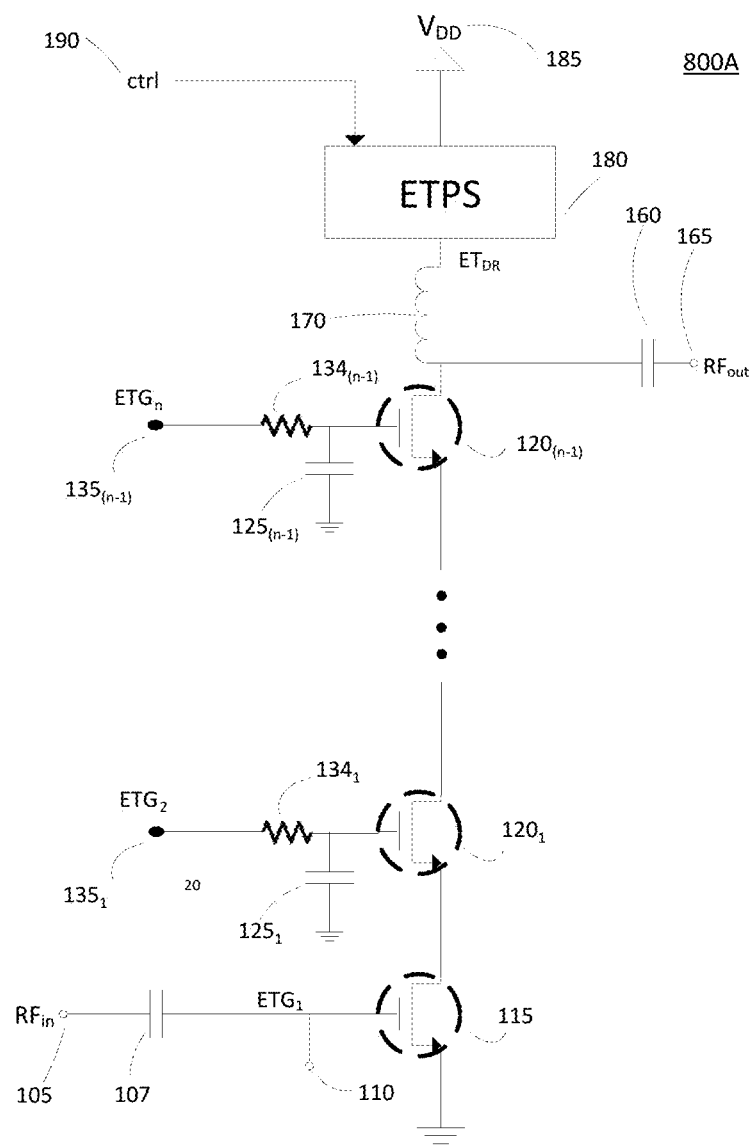
FIG. 8B shows the exemplary embodiment of FIG. 8A for a case where N stacked devices are used in the amplification stage, where N is larger than three.

FIG. 8B depicts the embodiment of FIG. 8A for a case where the number of stacked devices in the amplifier is n, where n is larger than three. The configuration of FIG. 8B allows the envelope tracking amplifier 800A to be fed (n−1) gate bias voltages via node $135_1$ through node $135_{(n-1)}$. As previously mentioned, configurations with stacked higher than three devices can be applied to any of the embodiments of the present disclosure, and is not limited to FET devices only. Transistors in the stack can be of different sizes (e.g. oxide thickness) and types (e.g. different threshold voltages).

Figure 8C:
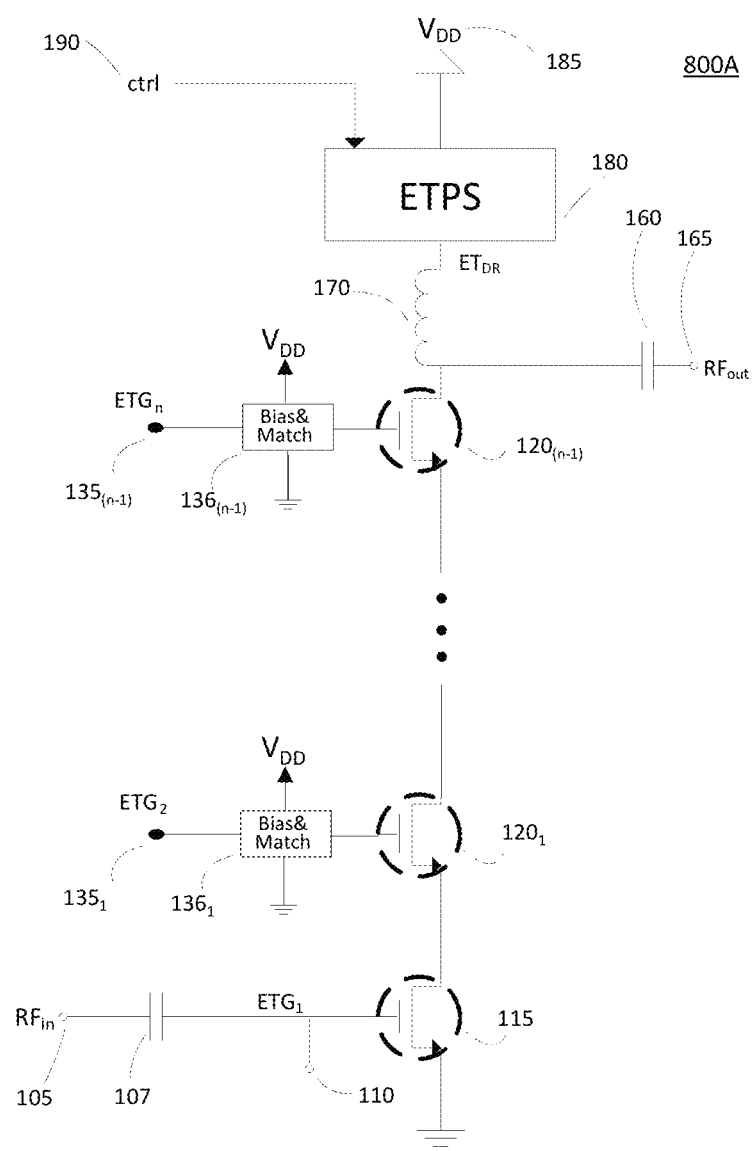
FIG. 8C shows an exemplary embodiment according to the present disclosure of an ET configuration where special bias and matching circuits are used at the gates of the transistor devices.

In some embodiments it may be desirable to replace the R-C networks (e.g. 134, 125 of FIG. 8B) at the gate of the cascode devices (or equivalent) with a different circuitry and as suited by the configuration. FIG. 8C shows such an embodiment according to the present disclosure, wherein the R-C networks at the gates are replaced with application specific biasing and matching circuits (136). These circuits may include a combination of active and passive devices and shape the input gate bias voltage ETG at terminals (135) to an effective gate bias voltage as required by the desired mode of operation of the ET amplifier. These circuits may operate at frequencies ranging from DC to the RF modulation frequency.

In some embodiments, the baseband controller can be used to generate the envelope signal, whether from the baseband signal or directly from the RF signal. Furthermore, the baseband controller can generate the gate bias voltages $ET_{G1}$, $ET_{G2}$, and $ET_{G3}$ in a manner similar to the embodiments previously discussed by scaling, amplitude shifting, phase shifting, inverting, and/or performing any mathematical operation (e.g. implemented by an op-amp circuit or digital signal processors) on the envelope signal. By way of example, and not of limitation, digital techniques (e.g. look-up tables, D/A and A/D converters) can be used to generate arbitrary voltage signals that are then used as the gate bias voltages $ET_{G1}$, $ET_{G2}$, and $ET_{G3}$. Analog circuit techniques may be used to generate arbitrary voltage signals (including fixed voltages) that can then be used as the gate bias voltages $ET_{G1}$, $ET_{G2}$, and $ET_{G3}$ as well. Example embodiments of such configurations can be found in FIGS. 53-70C, which will be described in detail in later paragraphs.

Figure 10:
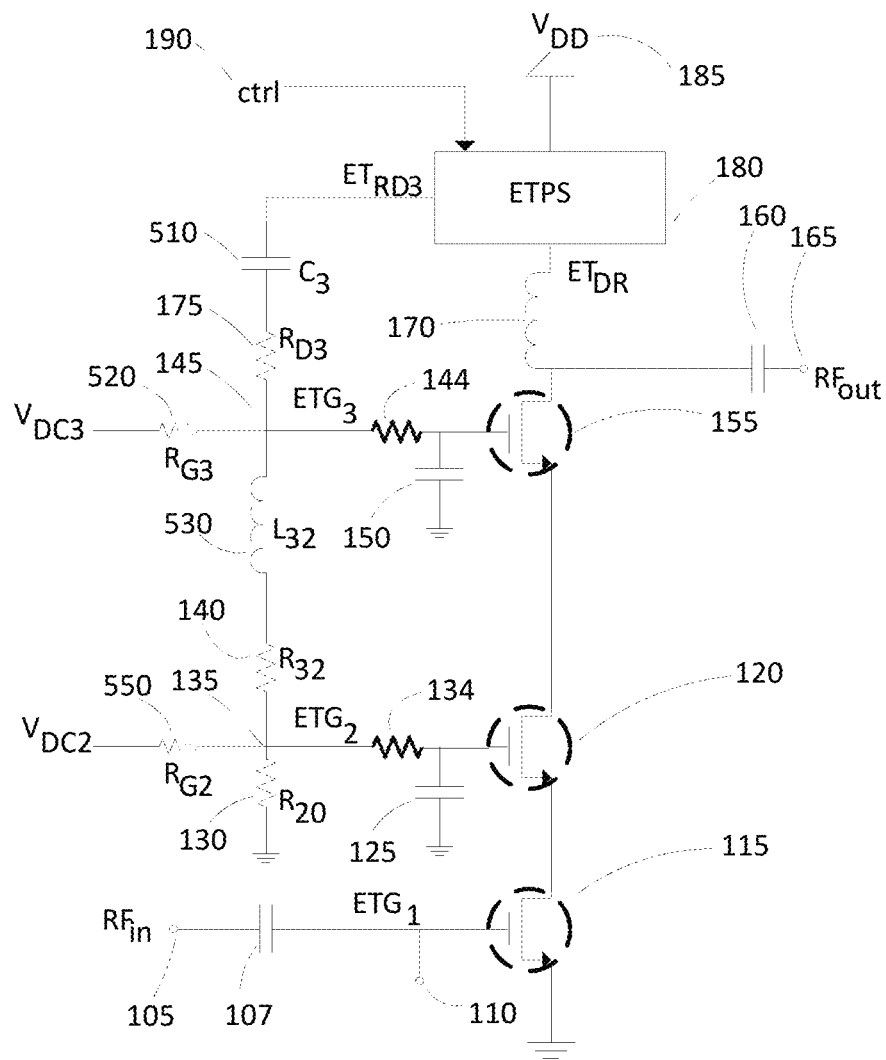
FIGS. 10 and 11 show example embodiments according to the present disclosure of an envelope tracking amplifier that is configured to introduce various phase shifts between the dynamic voltage applied to the drain and the dynamic bias voltages applied to the gates.
Figure 11:
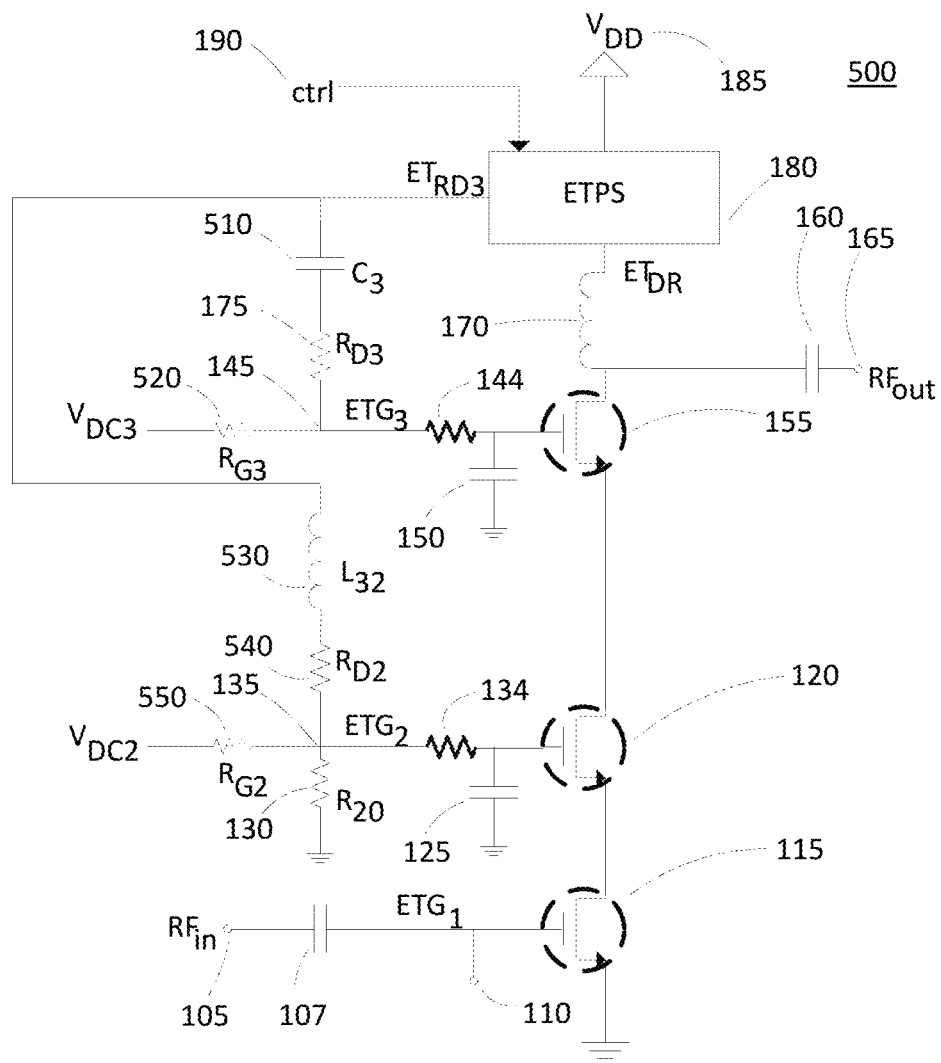

FIGS. 10-11 show example alternate embodiments of an envelope tracking amplifier (500) that is configured to introduce both a phase shift and/or amplitude changes in the dynamic bias voltage $ET_{RD3}$ prior to the dynamic bias voltage $ET_{RD3}$ being applied (by way of a capacitive-resistive network) to the gate of the third FET (155) and being applied (by way of an inductive-resistive network) to the gate of the second FET (120) as the dynamic gate bias voltages $ET_{G3}$ and $ET_{G2}$, respectively. The capacitive-resistive network and the inductive-resistive network, alone or in combination, are further example embodiments of bias adjustment circuitry. In comparison with the embodiment shown in FIG. 1, a capacitor (510) (e.g., a variable capacitor, digitally tunable capacitor) with a value represented by $C_3$ has been connected between the third resistor (175) and the ETPS (180) (e.g. variable voltage or current source). Additionally, a third gate resistor (520) with a value represented by $R_{G3}$ has been connected between node (145) and a DC voltage $V_{DC3}$.

The embodiments shown in FIGS. 10 and 11, as well as FIGS. 6, 7, and 8C allow for the ability to adjust the amplitude and phase of the envelope signal applied to the gates. This can be used as a modulation port for imparting modulation, or for a pre-distortion method to compensate for distortion in the amplifier. This is true for all modes of operation (linear, envelope following, envelope tracking, polar, and other modes).

The capacitor (510) may block a DC component of the dynamic bias voltage $ET_{RD3}$ and pass a time-varying component of the dynamic bias voltage $ET_{RD3}$. The DC voltage $V_{DC3}$ can restore the DC component of the dynamic bias voltage $ET_{RD3}$ to the gate of transistor (155). In a similar manner, $V_{DC2}$ can restore the DC component to the gate of transistor (120). The embodiment of FIG. 10 thus allows application of the DC component of the gate bias supplies separately from the dynamic component representing the envelope signal.

Capacitor (510) may be used to create a desired phase shift between the dynamic bias voltage $ET_{RD3}$ and the third gate bias voltage $ET_{G3}$. Circuit analysis that accounts for the resistor (520), the third gate capacitor (150), possibly a parasitic gate capacitance of the third FET (155), and other components surrounding node (145) to derive an equation for the amount of phase shift is within the capability of a person skilled in the art. Results of such analysis can be used to determine appropriate values of $C_3$, $R_{D3}$, $R_{G3}$, and the third gate capacitor (150) and resistor (144) that can yield a desired phase shift.

With further reference to FIG. 11, the inductive-resistive network comprises an inductor (530) with a value represented by $L_{32}$ (e.g., variable inductor, digitally tunable inductor) connected in series with a second resistor (540) with a value represented by $R_{D2}$. The inductive-resistive network is connected between node (135) and the ETPS (180). A DC bias voltage $V_{DC2}$ may be overlaid to the envelope signal at node (135). The circuit comprising the inductor (530), the second resistor (540), and the second resistor (130) forms a voltage divider from the dynamic bias voltage $ET_{RD3}$ to the second gate bias voltage $ET_{G2}$. Assuming that the voltage source that connects to $R_{G2}$ has a low output resistance when compared with $R_{G2}$, the second gate bias voltage $ET_{G2}$ that results from such voltage divider can be determined according to the following equation:

$$ET_{G2}=ET_{RD3}*(R_{20}//R_{G2}/(R_{20}//R_{G2}+R_{D2}+j\omega L_{32}),$$

where the "//" sign indicates a parallel combination of resistors: R1//R2=(R1*R2)/(R1+R2).

Complex number analysis of the equation stated above can reveal that a phase shift in an amount equal to an inverse tangent of a quantity represented by $\omega*L_{32}/(R_{20}+R_{D2})$ can occur between the dynamic bias voltage $ET_{RD3}$ to the second gate bias voltage $ET_{G2}$. A more complete analysis that accounts for the second gate capacitor (125) and possibly a parasitic gate capacitance of the second FET (120) is within the capability of a person skilled in the art. Results of such analysis can be used to determine appropriate values of $L_{32}$, $R_{D2}$, $R_{20}$, and the second gate capacitor (125) that can yield a desired phase shift.

In other embodiments similar to FIGS. 10-11, phase shifts may be introduced in signal paths between the ETPS (180) and the gates of the second and third FETs (120, 155) by using capacitive-resistive networks in both signal paths, or by using inductive-resistive networks in both signal paths. In other embodiments, a capacitive-resistive network can be used to introduce a phase shift in a signal path between the ETPS and node (135) while an inductive-resistive network is used to introduce a phase shift in a signal path between the ETPS (180) and node (145). Alternatively, a phase shift may be introduced in a signal path between the ETPS (180) and a gate of one FET from among the second and third FETs (120, 155) while the other FET from among the second and third FETs (120, 155) receives a dynamic bias voltage that has not been phase shifted. A person skilled in the art will not require further diagrams to understand such embodiments.

Figure 12A:
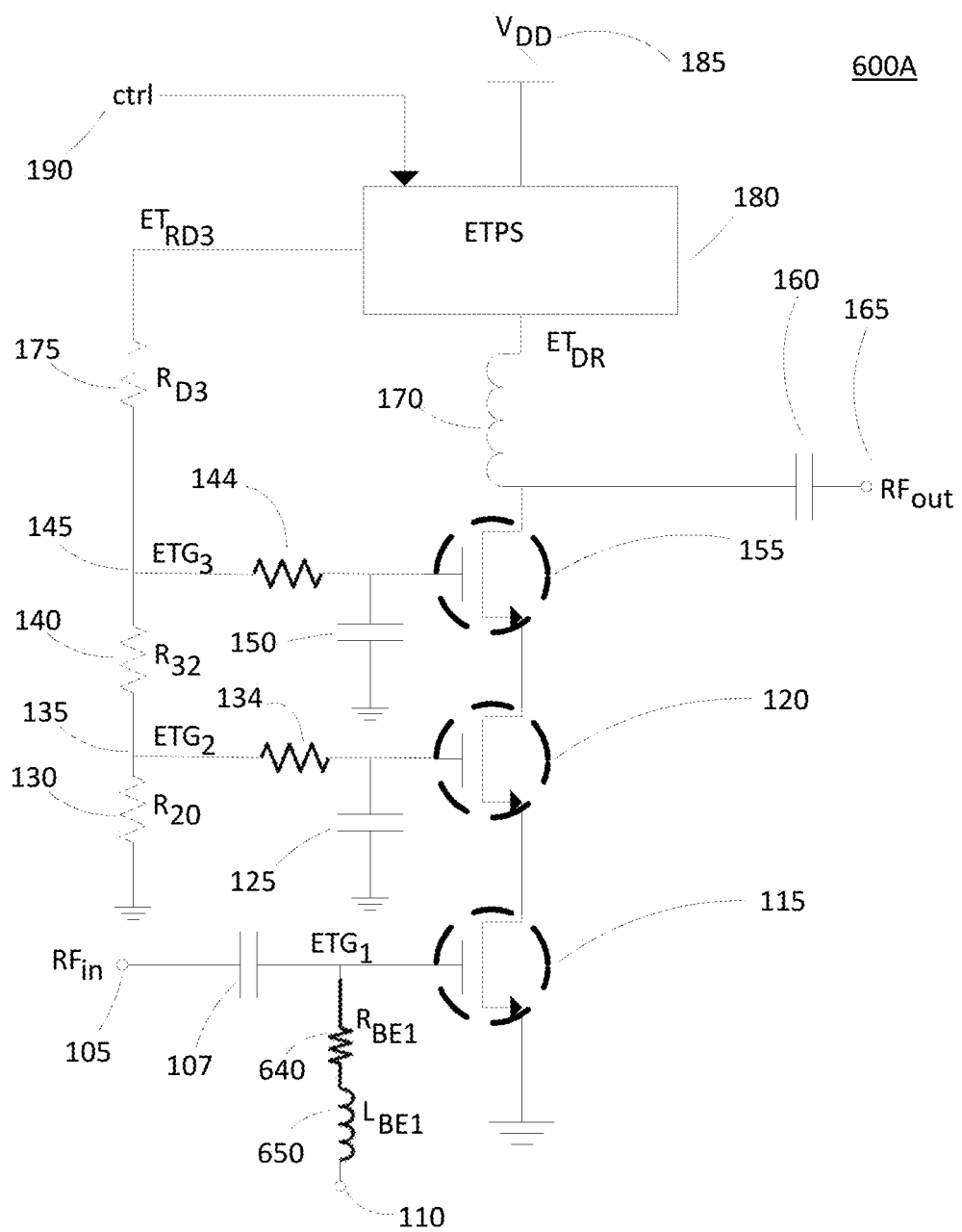
FIG. 12A shows an example embodiment according to the present disclosure of an envelope tracking amplifier that can phase shift a bias input to the gate of the first FET.

FIG. 12A shows an embodiment according to the present disclosure of an envelope tracking amplifier (600A) similar to the envelope tracking amplifier (100) of FIG. 1 except for a circuitry being added to introduce a phase shift in the dynamic bias voltage or current that is applied to the first gate bias node (110). By way of example and not of limitation, an inductive-resistive network similar to the inductive-resistive network shown in FIGS. 10-11 is connected between the gate of the first FET (115) and the first gate bias node (110) to phase shift the signal between the first gate bias node (110) and the gate of the first FET (115). The example inductive-resistive network comprises an inductor (650) with a value represented by $L_{BE1}$ connected in series with a resistor (640) with a value represented by $R_{BE1}$. Analysis and design of the inductive-resistive network comprising the inductor (650) and the resistor (640) is within reach of the skilled person.

In some embodiments, a capacitive-resistive network can be connected between the first gate bias node (110) and the gate of the first FET (115). In circuits where the capacitive-resistive network is connected between the first gate bias node (110) and the gate of the first FET (115), a DC voltage can also be applied to the gate of the first FET (115) to restore a DC component of a dynamic bias voltage that is applied to the first gate bias node (110), in a manner similar to the capacitive-resistive network shown in FIGS. 10-11.

Figure 12B:
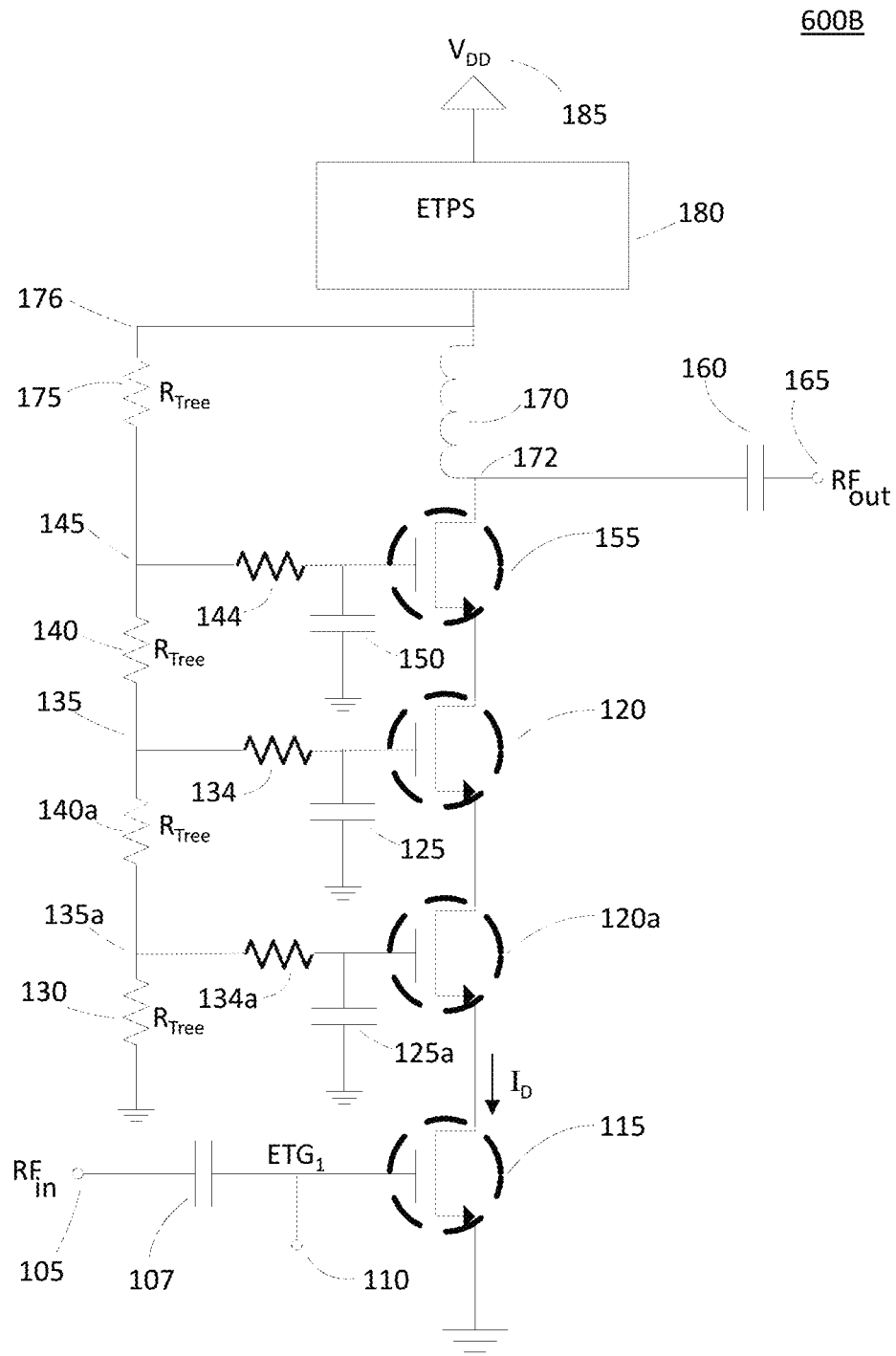
FIG. 12B shows an exemplary embodiment according to the present disclosure of gate biasing of an RF amplifier comprising a dynamic power supply.

With further reference to the exemplary embodiment depicted in FIG. 12B, as the dynamic supply power provided via inductor (170) to the drain of the output transistor (155) of the transistor stack (115, 120a, 120, 155), voltage at node (172) can vary (e.g. within approximate range of 4.5V to 1V) according to the provided dynamic supply. In turn, voltage variation at node (172) can affect a bias current ($I_D$) through the transistor stack such as to vary the bias current as a function of the voltage variation. Such function is dependent on an equivalent output impedance of the transistor stack such as the higher the equivalent output impedance, the lower the current variation for a given voltage variation (e.g. $\Delta I = \Delta V/R$, where R is the equivalent output impedance of the transistor stack). As known to a person skilled in the art, bias current variation through a device (e.g. a transistor, a transistor stack) can affect the transconductance ($g_m$) of the device which in turn can affect the gain of the device. As the gain of the transistor stack (115, 120a, 120, 155) is defined by the gain of the input transistor (115), device gain change in the input transistor (115) can affect gain of RF amplifier (600B) depicted in FIG. 12B and therefore affect operating characteristics of the RF amplifier (600B), such as, for example, linearity, efficiency and ACLR. It is therefore an object of the present application to provide devices and methods to reduce the impact of the dynamic supply (e.g. supply voltage variation) over the gain of the input transistor of the RF amplifier depicted in FIG. 12B as presented in the following paragraphs. It should be noted that voltage variation at node (172) can be technology-dependent, where higher voltages can be seen at this node for various RF related applications. For example, while the approximate range of 4.5V to 1V can be expected in low voltage applications, such as hand-held cellular units, higher voltages, up to 100V and more with corresponding ranges can be expected for base-station applications where, for example, stacked gallium nitride (GaN) devices, due to their ability to withstand higher voltages, instead of FET devices can be used.

A person skilled in the art would clearly understand that the teachings according to the present disclosure equally apply to cases where the (dynamic) supply voltage to the drain of the output transistor (e.g., node 176 of FIG. 12B1) of the stack is a fast- or slow-moving supply voltage, and irrespective of existence or not of a relationship of the supply voltage to the stack with respect to, for example, an envelope of the RF signal. A person skilled in the art is aware of other amplifier configurations where the supply voltage may be varied either under control of an external control signal, or simply as a feature inherent to the power supply (e.g., a battery). An exemplary configuration (600B1) of such amplifier is shown in FIG. 12B1, where the supply voltage Vcc indicates a varying (i.e., variable) supply voltage. It would be clear to a person skilled in the art that the configuration (600B1) shown in FIG. 12B1 is based on the configuration (600B) of FIG. 12B where the ETPS (180) is replaced with the varying supply voltage Vcc. According to some exemplary embodiments, the varying supply voltage Vcc may vary according to a wide voltage range, for example, in a range of zero volts to five volts or higher. Such range may be based on design goals and parameters, such as for example, output power of the amplifier and/or normal operating range of a (rechargeable) battery.

With further reference to the configuration of FIG. 12B1, according to an exemplary embodiment of the present disclosure, biasing voltage ($V_{G2}$, $V_{G3}$, $V_{G4}$) to the gates of the (cascode) transistors (120a, 120, 155) may be according to a distribution of the supply voltage Vcc provided at the drain of the output transistor (155) across the entire stack (115, 120a, 120, 155), as described, for example, with reference to FIG. 4D. Exemplary circuits to generate such gate biasing voltages ($V_{G2}$, $V_{G3}$, $V_{G4}$) are described above with reference to, for example, FIGS. 4E1, 4E2, 4F, 4G1 and 4G2.

FIG. 12B2 shows graphs representing drain voltages ($V_{D1}$, $V_{D2}$, $V_{D3}$, $V_{D4}$) of the transistors (115, 120a, 120, 155) of the stack shown in FIG. 12B1 as a function of the varying supply voltage Vcc. As can be seen in such graphs, the drain voltage $V_{D4}$ tracks (is equal to) the supply voltage Vcc, whereas the drain voltages ($V_{D1}$, $V_{D2}$, $V_{D3}$) linearly (e.g. piecewise) vary with the supply voltage Vcc but with different slopes at different ranges of the supply voltage. In particular, as the supply voltage Vcc decreases from high to low voltages, slopes of the drain voltages ($V_{D1}$, $V_{D2}$, $V_{D3}$) may change in a region designated in FIG. 12B2 as B1. The bottom device (first FET 115) enters the triode region of operation at Vcc voltages below region B1 (e.g., below about 1.5 volts). It is noted that operation of device (115) in the triode region may negatively alter the amplifier's response. It should also be noted that the slope of drain voltages $V_{D2}$ and $V_{D3}$ change because the $V_{GS}$ voltages decrease in region B1 and below as the bottom device (115) bias current is greatly reduced.

FIG. 12B3 shows graphs representing the biasing voltages ($V_{G2}$, $V_{G3}$, $V_{G4}$) to the gates of the (cascode) transistors (120a, 120, 155) as a function of the varying supply voltage Vcc. In particular, resistor values of the resistor tree (130,

140a, 140, 175) of FIG. 12B1 may be selected such as to generate voltages at nodes (135a, 135, 140) of FIG. 12B1 corresponding to the respective biasing voltages ($V_{G2}$, $V_{G3}$, $V_{G4}$) to the gates of the transistors (120a, 120, 155). It should be noted that due to the negligible current to the gates of the transistors (120a, 120, 155), voltages at nodes (135a, 135, 140) are substantially equal to the respective biasing voltages ($V_{G2}$, $V_{G3}$, $V_{G4}$).

With further reference to FIGS. 12B2 and 12B3, the biasing voltages ($V_{G2}$, $V_{G3}$, $V_{G4}$) may be derived from the drain voltages ($V_{D1}$, $V_{D2}$, $V_{D3}$, $V_{D4}$) for a given value of the varying supply voltage, since $V_{G2}=V_{D1}+V_{GS2}$; $V_{G3}=V_{D2}+V_{GS3}$ and $V_{G4}=V_{D3}+V_{GS4}$. For example, as shown in such figures, for a supply voltage Vcc having a value of about 3.3 volts, as indicated in the figures by a line A1, if equal division (e.g., even distribution) of the supply voltage Vcc across the transistors (115, 120a, 120, 155) is desired, then resistor values of the resistor tree (130, 140a, 140, 175) of FIG. 12B1 may be selected such as to generate voltages at nodes (135a, 135, 140) of the resistor tree respectively corresponding to $V_{D1}+V_{GS2}$; $V_{D2}+V_{GS3}$ and $V_{D3}+V_{GS4}$, wherein ($V_{D1}$, $V_{D2}$, $V_{D3}$) is equal to (¼×3.3, ²⁄₄×3.3, ¾×3.3) volts. Accordingly, as shown in the graph of FIG. 12B4, a perfect Vcc voltage division across the transistors of the stack is obtained at line A1, wherein $V_{DS1}$, $V_{DS2}$, $V_{DS3}$ and $V_{DS4}$ are equal to ¼×Vcc.

As the supply voltage Vcc varies away from the line A1, the biasing voltages ($V_{G2}$, $V_{G3}$, $V_{G4}$) vary per FIG. 12B3 and, as a consequence, the drain voltages ($V_{D1}$, $V_{D2}$, $V_{D3}$, $V_{D4}$) vary per FIG. 12B2. As shown in FIG. 12B4, as the supply voltage Vcc varies, the desired (equal) distribution of Vcc across the stack may not be maintained and consequently the transistors (115, 120a, 120, 155) may each see different portions of the supply voltage Vcc. This in turn may lead to subjecting one or more of the transistors of the stack to voltages higher than their voltage withstand capabilities (e.g., over-voltage condition), which in turn may damage such transistors.

Furthermore, the drain voltage $V_{D1}$ also sets operating points (e.g., I-V curve) of the input transistor (115) which, as clearly understood by a person skilled in the art, determines a performance (e.g., gain) of the amplifier shown in FIG. 12B1. Accordingly, the operating points of the input transistor (115) may be optimized for a supply voltage Vcc at the (reference) line A1, but as the drain voltage $V_{D1}$ varies per FIG. 12B2, operating points of the input transistor (115) may shift and therefore a degradation in the performance of the amplifier may be obtained.

Figure 12C:
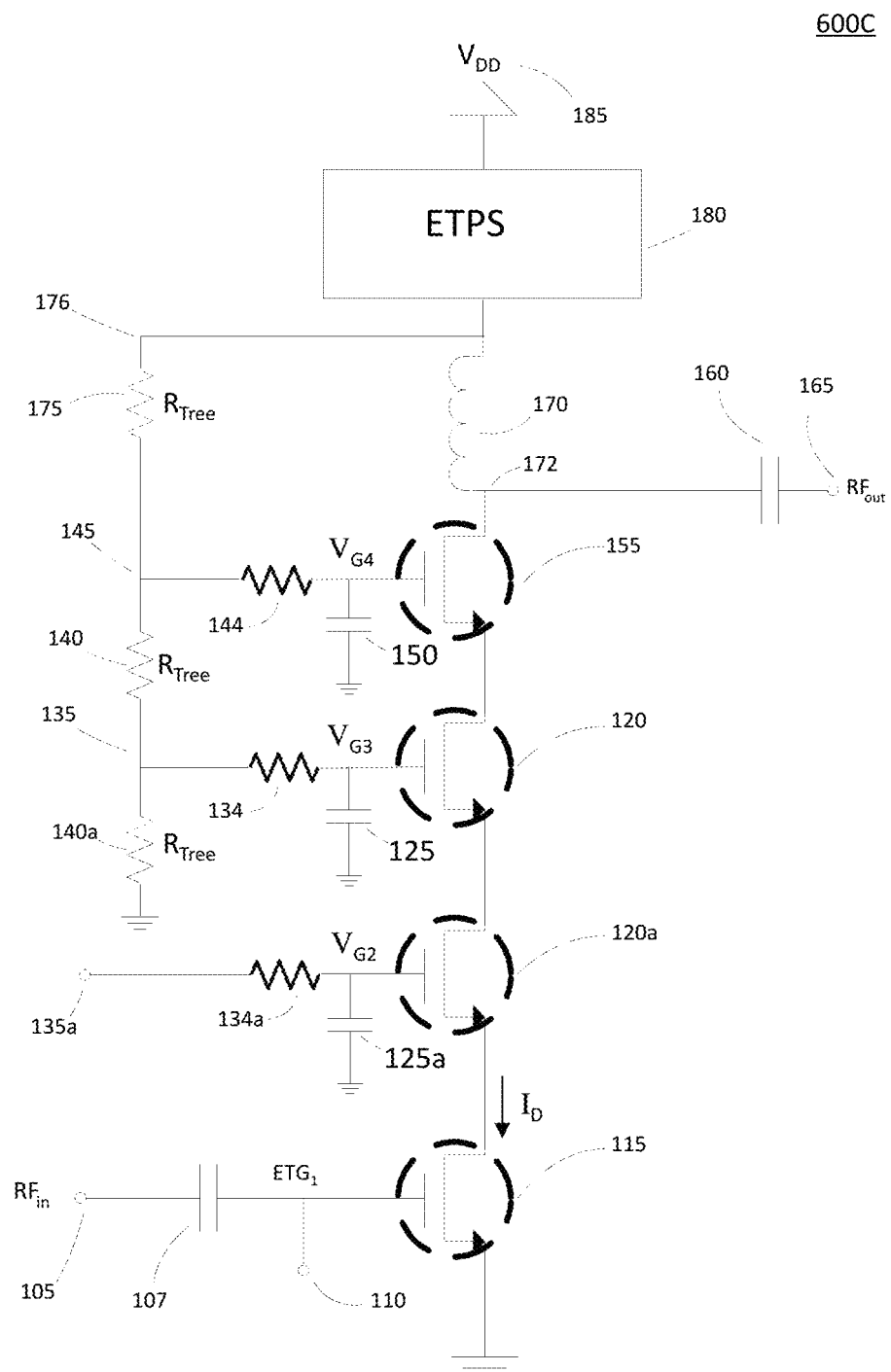
FIG. 12C shows an exemplary embodiment according to the present disclosure of gate biasing of the RF amplifier of FIG. 12B for an increased output impedance of the RF amplifier.

FIG. 12C shows a biasing method according to an embodiment of the present disclosure which increases the equivalent output impedance of the transistor stack by not allowing the gate of the first cascode device (120a) to vary as a function of the dynamic supply (e.g. output of ETPS unit (180), or alternatively per a varying supply voltage Vcc described above with reference to FIG. 12B1) and therefore providing a fixed (or nearly/substantially fixed) voltage at the drain of the input transistor (115). A nearly-fixed $V_{DS}$ across the input transistor (115) (or $V_{DS}$ across input transistor that is nearly/substantially fixed) can therefore help in maintaining a fixed gain (e.g. fixed bias current through the stacked transistors) of the stacked amplifier (600C) (e.g. by reducing bias current variation and increasing equivalent output impedance). As depicted in FIG. 12C, this may be achieved by decoupling the gate node (135a) of transistor (120a) from the output of the ETPS supply (180) and providing a fixed bias voltage ($V_{G2}$) to the gate node (135a). However, as the dynamic (or varying) supply voltage decreases, voltage at the drain of transistor (120a) decreases and therefore drain-to-source voltage across the transistor (120a) decreases while the corresponding gate voltage remains the same, which can cause transistor (120a) to operate outside the compression region and into the linear region. In other words, as the supply voltage decreases, the drain-to-source voltage across the transistor (120a) may decrease faster than the drain-to-source voltage across the top transistors (120, 155), and therefore division of (a portion of) the supply voltage across the transistors (120a, 120, 155) may become unequal. Such operation of transistor (120a) can in turn affect efficiency and linearity of the RF amplifier.

Figure 12D:
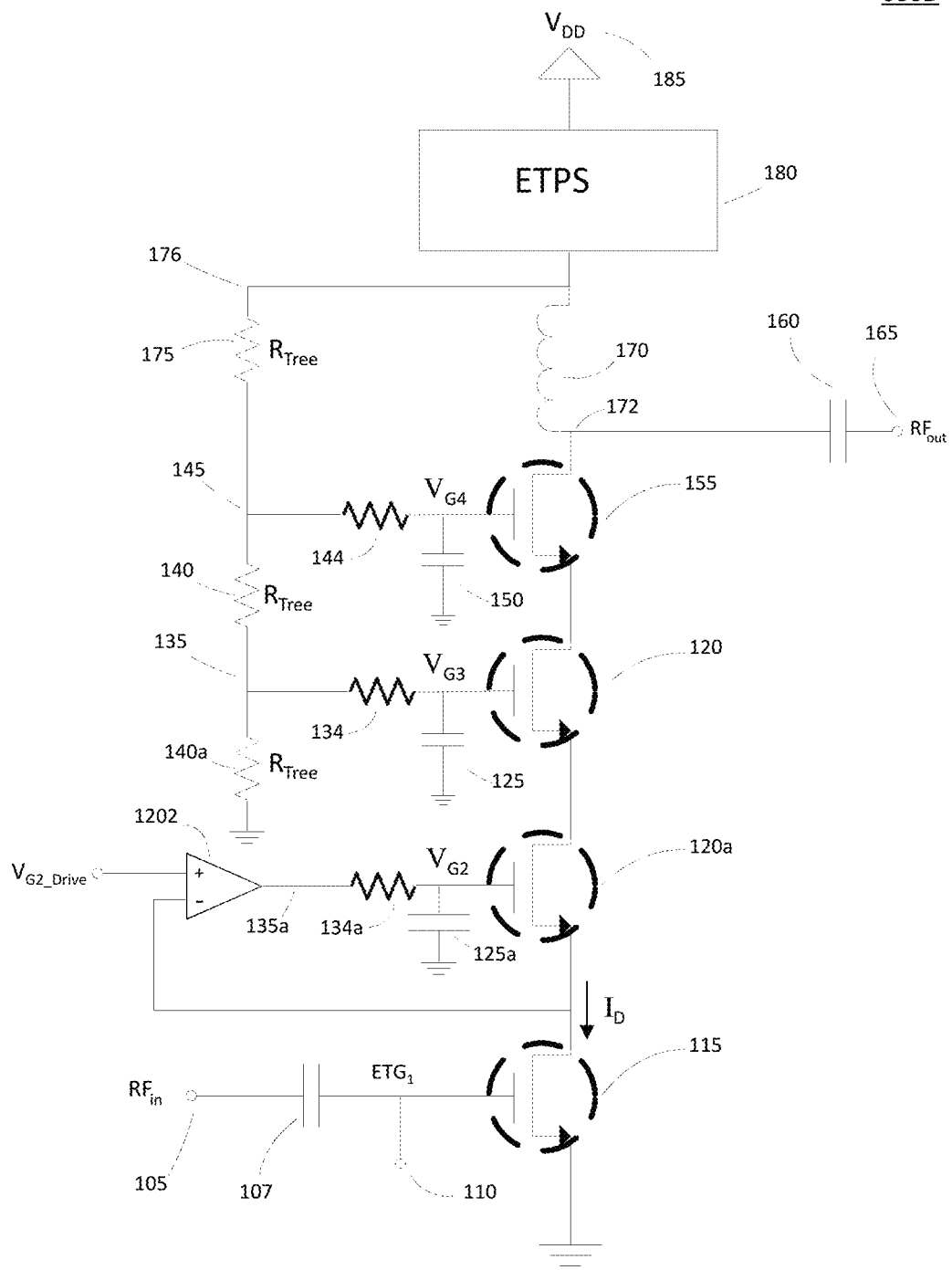
FIG. 12D shows another exemplary embodiment according to the present disclosure of gate biasing of the RF amplifier of FIG. 12B for an increased output impedance of the RF amplifier.

FIG. 12D shows an alternative biasing method to the method depicted in FIG. 12C wherein a local feedback, using a feedback amplifier (1202), is used to further increase the (equivalent) output impedance of the stacked amplifier (600D) and therefore decrease bias current variation as a function of the dynamic supply. As previously described, for example with reference to FIG. 12B1, teachings according to the present disclosure equally apply to cases where the (dynamic) supply voltage to the drain of the output transistor (e.g., node 176) of the stack is a fast- or slow-moving supply voltage, and irrespective of existence or not of a relationship of the supply voltage to the stack with respect to, for example, an envelope of the RF signal. As known by the person skilled in the art, local feedback, or 'gain boosting' can be used to increase the equivalent output impedance of a stacked transistor amplifier by a factor 'G' which can be equal to the gain of the feedback amplifier (1202). More information on the gain boosting technique can be found, for example, in a paper by Klaas Bult and Govert Geelen, entitled "The CMOS Gain-boosting technique", published in "Analog Integrated Circuits and Signal Processing, Vol. 1, No. 2, October 1991, pages 119-135, which is incorporated herein by reference in its entirety. Furthermore, according to some embodiments of the present disclosure, the low pass filter (134a, 125a) formed at the output of the amplifier (1202) can be made specific to boost the gain at frequency content of the dynamic supply (e.g. envelope signal) while still allowing voltage sharing across the stack at the higher RF signal frequencies.

With further reference to FIGS. 12C and 12D, according to some embodiments of the present disclosure, transistors (115, 120a, 120, 155) of the stack can be designed for different performances. For example, the input transistor can be designed to optimize for a desired gain, whereas the second transistor (120a) can be optimized to maximize a voltage handling capability and a corresponding output impedance. As known by the person skilled in the art, such design parameters can be adjusted by changing corresponding transistor gate length and/or oxide thickness.

As described above with reference to FIG. 12C, providing a fixed bias voltage ($V_{G2}$) through the gate node (135a) of the amplifier can in turn hold the operating points of the input transistor (115) essentially constant, at least to a first order, while the supply voltage varies. However, as the dynamic (or varying) supply voltage at node (176) decreases, the biasing voltages ($V_{G3}$, $V_{G4}$) generated by the resistor tree (140a, 140, 175) can cause unequal distribution/division of a portion of the supply voltage (e.g., Vcc-$V_{D1}$) that is between the node (176) and the drain of the input transistor (115) across the transistors (120a, 120, 155). As described above, such unequal distribution caused by the resistor tree (140a, 140, 175) can cause an undesired over-voltage condition in one or more of the transistors (120a, 120, 155).

According to an embodiment of the present disclosure, a biasing circuit (i.e. circuital arrangement) (1250) of FIG. 12D4 is provided that can allow, for a varying supply voltage, maintaining of a desired supply voltage distribution across the top (cascode) transistors (e.g., (120a, 120, 155) of the stack while maintaining a constant drain-to-source voltage of the input transistor (e.g., 115). Synthesis of such biasing circuit (1250) can be based on drain voltages ($V_{D1}$, $V_{D2}$, $V_{D3}$, $V_{D4}$) versus varying supply voltage Vcc and gate voltages ($V_{G2}$, $V_{G3}$, $V_{G4}$) versus varying supply voltage Vcc as represented in the graphs of FIG. 12D1 and FIG. 12D2 respectively. It should be noted that although the varying supply voltage may in theory vary according to any range, in practice, such range may be limited to, for example, about 1 volt to 5 volts or higher. A more common range for an ET amplifier for handset operation may be 0.8 volts to 4.5 or 5 V. A varying supply voltage for a PA in a non-ET handset may vary from 2.5 volts to 4.8 volts as an example. Another example range is 3.0 volts to 3.6 volts. The PA in this case sees large voltage variations because it is often connected directly to the battery and does not have a regulator to create a more constant voltage. Yet another handset operating range may be for average power tracking (APT) configurations where a switching regulator is placed between the battery and the PA, and the regulator's output voltage may be changed as a function of a targeted output power to reduce a current drain. An example voltage range for a handset APT application may be 0.8 volts to 3.3 volts. Furthermore, teachings according to the present disclosure may be implemented/designed in view of a minimum variation range of the varying supply voltage over which the amplifier may operate according to a desired performance. 211 FIG. 12D1 and FIG. 12D2 respectively show graphs, according to an embodiment of the present disclosure, representing drain voltages ($V_{D1}$, $V_{D2}$, $V_{D3}$, $V_{D4}$) versus varying supply voltage Vcc and gate voltages ($V_{G2}$, $V_{G3}$, $V_{G4}$) versus varying supply voltage Vcc of the stacked transistors amplifier (1200) of FIG. 12D4. As can be seen in FIG. 12D1, for a supply voltage Vcc that is above about 0.8 volts represented by line A2, the drain voltage $V_{D1}$, and therefore drain-to-source voltage $V_{DS1}$, of the input transistor (115) is held to a (substantially) constant value, whereas drain voltages ($V_{D2}$, $V_{D3}$, $V_{D4}$) vary with respect to the supply voltage Vcc so that a (varying) voltage Vcc−$V_{D1}$ is (substantially) equally divided across the transistors (120a, 120, 155) of the stacked transistors amplifier (1200).

As shown in FIG. 12D1, for Vcc voltages above line A2, the drain voltage $V_{D1}$ is held to a (substantially) constant value by holding, as shown in FIG. 12D2, $V_{G2}$ to $V_{D}$1+$V_{GS2}$. A person skilled in the art would clearly realize that the value of $V_{D1}$, and therefore $V_{DS1}$, may be based on a desired performance of the stacked transistor amplifier (1200) of FIG. 12D4 at a nominal supply voltage Vcc that may be defined, for example, by line A1 (e.g., 3.3 volts). A person skilled in the art would also realize that for smaller values of the supply voltage Vcc, for example values below line A2, the input transistor (115) may switch region of operation from saturation to triode where, as shown in FIG. 12D1, $V_{D1}$ collapses as a function of a decreasing Vcc.

The substantially constant value $V_{D1}$ defines a varying voltage Vcc−$V_{D1}$ that is (substantially) equally divided across transistors (120a, 120, 155) of the stacked transistors amplifier (1200). In other words, as shown in FIG. 12D3, for a supply voltage Vcc that is above the line A2 (e.g., 0.8 volts), voltage values of ($V_{DS2}$, $V_{DS3}$, $V_{DS4}$) are substantially equal to ⅓×(Vcc−$V_{D1}$). According to an embodiment of the present disclosure, such equal division of the varying voltage Vcc−$V_{D1}$ across transistors (120a, 120, 155) is provided by linear functions (i.e., Vgi(Vcc)=Ai.Vcc+Bi) that define the voltages $V_{G3}$ and $V_{G4}$ at the gate nodes of the transistors (120) and (155) with respect to the varying supply voltage Vcc. According to an embodiment of the present disclosure, such linear functions are so that, for a (hypothetical) supply voltage Vcc of zero volts, each of the voltages $V_{G3}$ and $V_{G4}$ take different non-zero values. In particular, as can be seen in FIG. 12D2, for the hypothetical Vcc of zero volts, $V_{G2}$>$V_{G3}$>$V_{G4}$>0 volts. The curves were chosen to optimize performance for Vcc voltages above A2 and are not meant to imply the preferred implementation for operation below A2. As can be seen in FIG. 12D3, the $V_{DS}$ voltage of the upper 3 devices goes to zero at the point A2. A variety of control schemes may be employed for the upper devices for Vcc voltages below A2, especially since all three upper devices have entered the triode region at that point (A2). For example, it is possible that one may want to create a circuit that holds $V_{G3}$ constant for Vcc voltages between somewhere above A2 and 0 volts. This would try to keep the second device in saturation for a wider supply voltage range. The theory of this is similar to the circuit being described in FIGS. 12D1 through 12D4 where the bottom device is preserved in saturation as long as possible. According to a further embodiment of the present disclosure, the linear functions defining $V_{G3}$ and $V_{G4}$ intersect $V_{G2}$) at a supply voltage that is at the vicinity of line A2, such as, for example, in a range of +/−10% of the Vcc voltage defining line A2. In other words, values of $V_{G2}$, $V_{G3}$ and $V_{G4}$ coincide when voltage value of Vcc is in a range of +/−10% of the Vcc value at line A2. According to a further embodiment of the present disclosure, the linear function defining $V_{G3}$, the linear function defining $V_{G4}$, and $V_{G2}$ intersect (e.g., respective voltages coincide) at the supply voltage Vcc that defines line A2. According to yet another embodiment of the present disclosure, at the Vcc voltage defining line A2, the value of the drain voltage $V_{D1}$ of the input transistor (115) is equal to the "edge of triode voltage" of the input transistor (115), which is defined herein as a value of the drain voltage $V_{D1}$ below which the input transistor (115) operates in its triode region of operation. It should be noted that the top (cascode) transistors (e.g., (120a, 120, 155) of the stack may not necessarily divide the voltage Vcc−$V_{D1}$ equally. Although it has been described in this paragraph that gate voltages $V_{G3}$ and $V_{G4}$ may be set so that the voltage Vcc−$V_{D1}$ is equally divided across the upper devices (120a, 120, and 155), in some instances it may be advantageous to set the gate voltages $V_{G3}$ and $V_{G4}$ for unequal division of the voltage Vcc−$V_{D1}$. This could be done to set a sequence of the upper devices (e.g., (120a, 120, 155) to enter their respective triode regions as the supply voltage Vcc decreases or to optimize RF performance of the amplifier by putting more or less voltage across certain devices of the stack.

It should be noted that, as it would be clear to a person skilled in the art, that for values of the supply voltage Vcc below line A2 (e.g., <0.8 volts), the top transistors (115a, 120, 155) also operate in their respective triode regions of operation. However, transition from saturation to triode region of operation for the top transistors may occur at higher Vcc voltages, such as, for example, at a Vcc voltage such that ⅓×(Vcc−$V_{D1}$)="edge of triode voltage" of each of the top transistors. The teachings according to the present disclosure maintain the (substantially) equal division of the varying voltage (Vcc−$V_{D1}$) across the top transistors (115a, 120, 155) irrespective of their operation in saturation or triode region, while maintaining operation of the input transistor (115) in the saturation region as long as possible with respect to decreasing supply voltage Vcc. It should also be noted that although FIG. 12D2 shows single slope graphs for each of the voltages at nodes $V_{G3}$ and $V_{G4}$, effective gate voltages at such nodes for values of the varying supply voltage Vcc below the value corresponding to the "edge of triode voltage" of the input transistor may not follow the same slopes, as for such Vcc voltage values, drain-to-source voltages of the top transistors are substantially zero and therefore corresponding gate voltages would not affect operation conditions of the top transistors. Therefore, the single slope of each of the gate voltages $V_{G3}$ and $V_{G4}$ may be considered between any two values of Vcc equal to or larger than value at line A2, with possible slope change for values of Vcc smaller than value at line A2. While not shown in the graphs of FIG. 12D2, it would also be clear to a person skilled in the art that it may be possible to create multiple slopes or curves of upper gate voltages (e.g., $V_{G3}$, $V_{G4}$) as a function of the varying Vcc above and/or below the point A2. Likewise, $V_{G2}$ may be varied as a function of Vcc below the point A2. As a result, and according the various exemplary embodiments of the present disclosure, $V_{G2}$ and thus $V_{D1}$ is held substantially constant over a large range of Vcc variation. In other words, although some small slope or curvature to the gate voltage $V_{G2}$ may be possible, the teachings according to the present disclosure attempt to prevent a condition as depicted in FIG. 12B2 where the drain voltage $V_{D1}$ voltage collapses early. In the broadest sense, the present invention relates to establishing gate biases of transistors of a stack operating as an amplifier so that the bottom (input) device is the last device to enter the triode region as the supply voltage Vcc is decreased.

With further reference to FIG. 12D2, according to an exemplary embodiment of the present disclosure, slopes of the linear functions defining $V_{G3}$ and $V_{G4}$ may be obtained via two points of each representative graph, one at a nominal supply voltage value represented by line A1, and one at a supply voltage corresponding to the "edge of triode voltage" of the input transistor (115) represented by line A2. By synthesizing the biasing voltages shown in the graphs of FIGS. 12D1-12D2 via the biasing circuit (1250) of FIG. 12D4, drain-to-source voltages according to FIG. 12D3 can be obtained for the amplifier (1200).

With continued reference to FIG. 12D4, according to an embodiment of the present disclosure, the biasing circuit (1250) takes the varying supply voltage Vcc as an input, and generates therefrom, the voltages at gate nodes ($V_{G2}$, $V_{G3}$, $V_{G4}$) according to graphs of FIG. 12D2. Accordingly, drain voltages ($V_{D1}$, $V_{D2}$, $V_{D3}$, $V_{D4}$) per graphs of FIG. 12D1 and drain-to-source voltages (Vds1, Vds2, Vds3, Vds4) per graphs in FIG. 12D3 are provided to the transistors (115, 120, 120a, 155) of the stacked transistor amplifier (1200).

A person skilled in the art would know of many design implementations of the biasing circuit (1250), details of which are beyond the scope of the present disclosure. Such design implementations may include a combination of analog and/or digital circuits that generate the gate biasing voltages, e.g., per FIG. 12D2, based on continuous or sampled values of the varying supply voltage Vcc. For example, as shown in FIG. 12D5, the biasing circuit (1250) may include separate (and independent) biasing circuits (1251), (1252) and (1253) to (independently) generate, based on values of the varying supply voltage Vcc, gate voltages presented at nodes (145), (135) and (125a) respectively.

FIG. 12D6 shows a simplified circuit diagram of a gate biasing circuit (1251A) according to an exemplary embodiment of the present disclosure that can be used as one or more of the separate biasing circuits (1251) and (1252) of the biasing circuit (1250) of FIG. 12D5. The gate biasing circuit (1251A) comprises a resistive divider (R121, R122) that is provided, at one end, with the varying supply voltage Vcc, and at another end, a fixed supply voltage Vk. In practice, such fixed supply voltage Vk may be a substantially fixed (e.g., constant) supply voltage. A common node, $V_G$, of the two series-connected resistors (R121, R122) provides a voltage that is a linear function of the varying supply voltage Vcc, according to $V_G = a \cdot Vcc + b \cdot Vk$, where $a = (R122/R121) \cdot b$ and $b = R121/(R121+R122)$. A person skilled in the art would clearly know how to determine values of the resistors R121 and R122, as well as the fixed supply voltage Vk. For example, it would be clear that for Vcc=0, $V_G = b \cdot Vk$ which can therefore be established in view of the graphs representing, for example, $V_{G3}$ or $V_{G4}$ in FIG. 12D2 (for Vcc=0). Furthermore, via analysis of the circuit of FIG. 12D6, a person skilled in the art would clearly establish that: $V_G = (Vcc \cdot R122 + Vk \cdot R121)/(R121+R122)$ and $V_G = (R122/(R121+R122)) \cdot Vcc + (R121/(R121+R122)) \cdot Vk$, and therefore: $a = R122/(R121+R122)$ and $b = R121/(R121+R122)$.

A person skilled in the art would clearly understand that the separate biasing circuit (1253) to generate the voltage at gate node $V_{G2}$ may include, for example, a voltage source that outputs the constant voltage, or a combination of a voltage source (e.g., Vk of FIG. 12D7) and a resistive divider (e.g., R123, R124) that scales an output of the voltage source to provide the constant voltage. According to an exemplary embodiment of the present disclosure, the voltage source (e.g., Vk) used for generation of ($V_{G3}$, $V_{G4}$) as described with reference to FIG. 12D6 may be shared with a (e.g., resistive divider R123, R124) circuit for generation of the constant voltage $V_{G2}$, as shown in FIG. 12D7.

FIG. 12D8 shows a simplified circuit diagram of a gate biasing circuit (1251C) according to an exemplary embodiment of the present disclosure that can be used as one or more of the separate biasing circuits (1251), (1252) and (1253) of the biasing circuit (1250) of FIG. 12D5. According to an exemplary embodiment, the gate biasing circuit (1251C) may comprise a sampling block (1251c1) that samples a value of the varying supply voltage Vcc, a mapping block (1251c2) that maps the sampled value of the varying supply voltage Vcc to a value representative of a corresponding point (Vgate axis) in a graph of FIG. 12D2, and a voltage conversion block (1251c3) that converts the mapped value to a voltage according to the graph of FIG. 12D2. It should be noted that a person skilled in the art would clearly know of many possible implementations of the sampling block (1251c1), the mapping block (1251c2) and the voltage conversion block (1251c3), including combination of analog and/or digital circuits, such as, for example, D/A converters, A/D converters, memory-based lookup tables and operational amplifiers.

FIG. 12D9 is a process chart showing various steps a method for biasing an amplifier according to an embodiment of the present disclosure. FIG. 12D9 is a process chart (1290) showing various steps of a method for biasing an amplifier based on the above description with reference to FIGS. 12D-12D8. As can be seen in the process chart (1290), the method comprises: providing an amplifier comprising an input transistor and a plurality of cascode transistors comprising a first cascode transistor coupled to the input transistor, per step (1291); applying a variable supply voltage to the amplifier, per step (1292); based on the applying, providing a fixed bias voltage to a gate of the first cascode transistor so to maintain a substantially constant drain voltage of the input transistor, per step (1293); and based on the applying, providing a variable bias voltage, that is a function of the variable supply voltage, to a gate of each cascode transistor of the plurality of cascode transistors except the first cascode transistor, per step (1294).

Figure 12E:
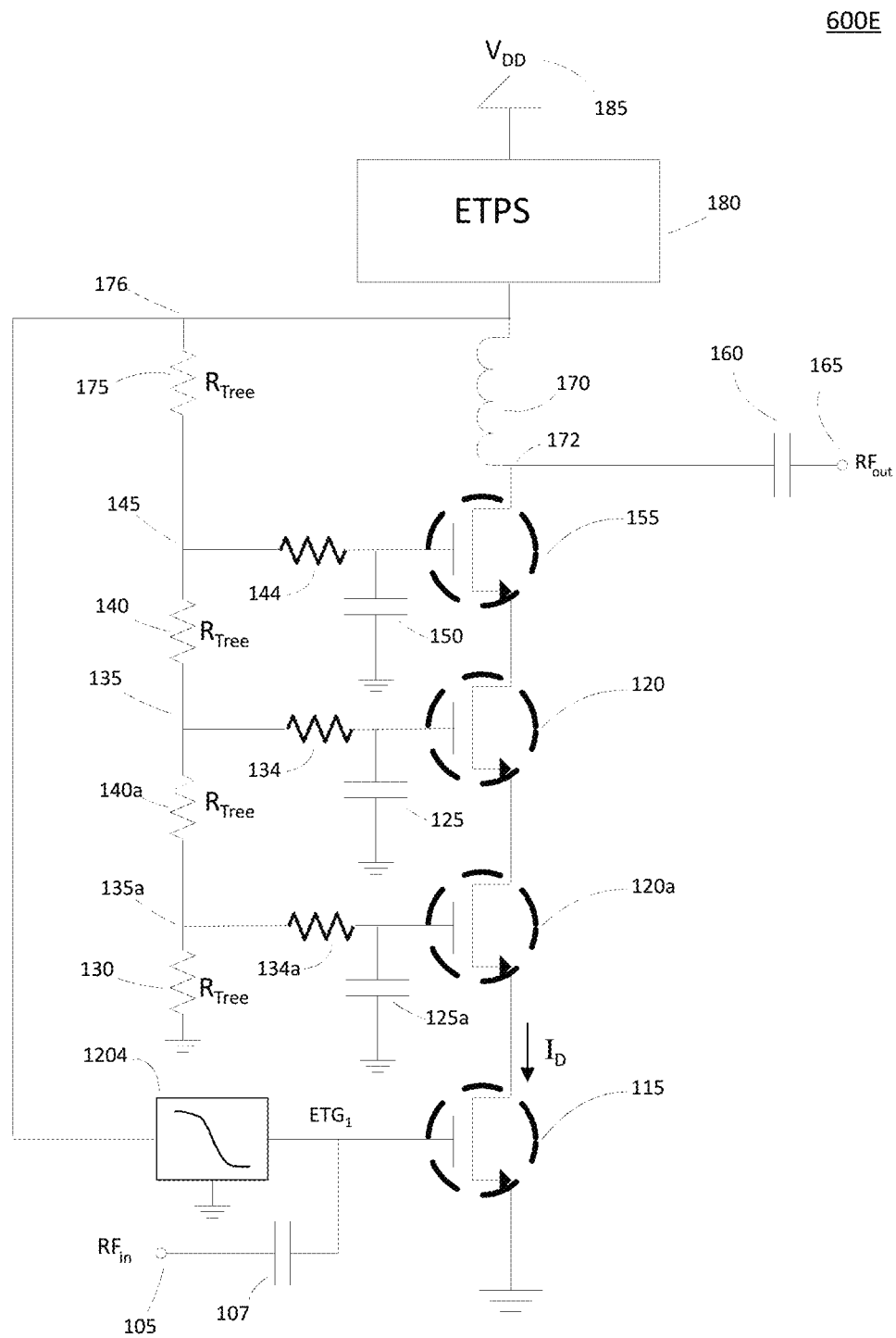
FIG. 12E shows an exemplary embodiment according to the present disclosure of gate biasing of the input transistor to the RF amplifier for an increased output impedance of the RF amplifier.

In some cases, maintaining high output impedance while providing gate biasing to the higher transistors of the stack (120a, 120, 155) based on the dynamic bias supply (180) can be desirable. Such configuration, as depicted in FIG. 12E, can maintain the higher transistors of the stack to operate within their compression regions in spite of variation of the supply (e.g. ETPS) and therefore maintain a desired efficiency and linearity of the stacked RF amplifier. FIG. 12E shows a gate biasing arrangement (1204) according to a further embodiment of the present disclosure which increases the stacked RF amplifier (115, 120a, 120, 155) equivalent output impedance by providing a gate biasing signal to the input transistor (115) of the stacked RF amplifier which can vary as a function of the dynamic supply voltage provided by the ETPS unit (180). The gate biasing arrangement (1204) provides a gate bias voltage to the gate of the input transistor (115) (e.g. at node $ETG_1$) based on the dynamic supply output by the ETPS unit (180) and therefore controls the bias current $I_D$ flowing through the transistor stack. According to an embodiment of the present disclosure, the gate biasing arrangement (1204) provides a dynamic bias voltage to the gate of the input transistor (115) such as to produce a constant bias current $I_D$ (e.g. fixed amplitude) flowing through the transistor stack while latter stack is provided with a dynamic power supply (e.g. via ETPS). In other words, the gate biasing arrangement (1204) keeps the bias current $I_D$ constant, and at a desired value, by providing a gate bias voltage to the input transistor (115) based on the dynamic power supply output by the ETPS unit. As mentioned in prior sections of the present disclosure, the ETPS unit can output a dynamic supply voltage (or current) based on an envelope signal of the input RF signal to the transistor stack (e.g. envelope tracking mode), but can also output a dynamic supply voltage such as to allow other modes of operation of the amplifier stack, such as, for example, envelope following mode, average power tracking mode and polar modulation mode, all of which are well known to the person skilled in the art.

Figure 12F:
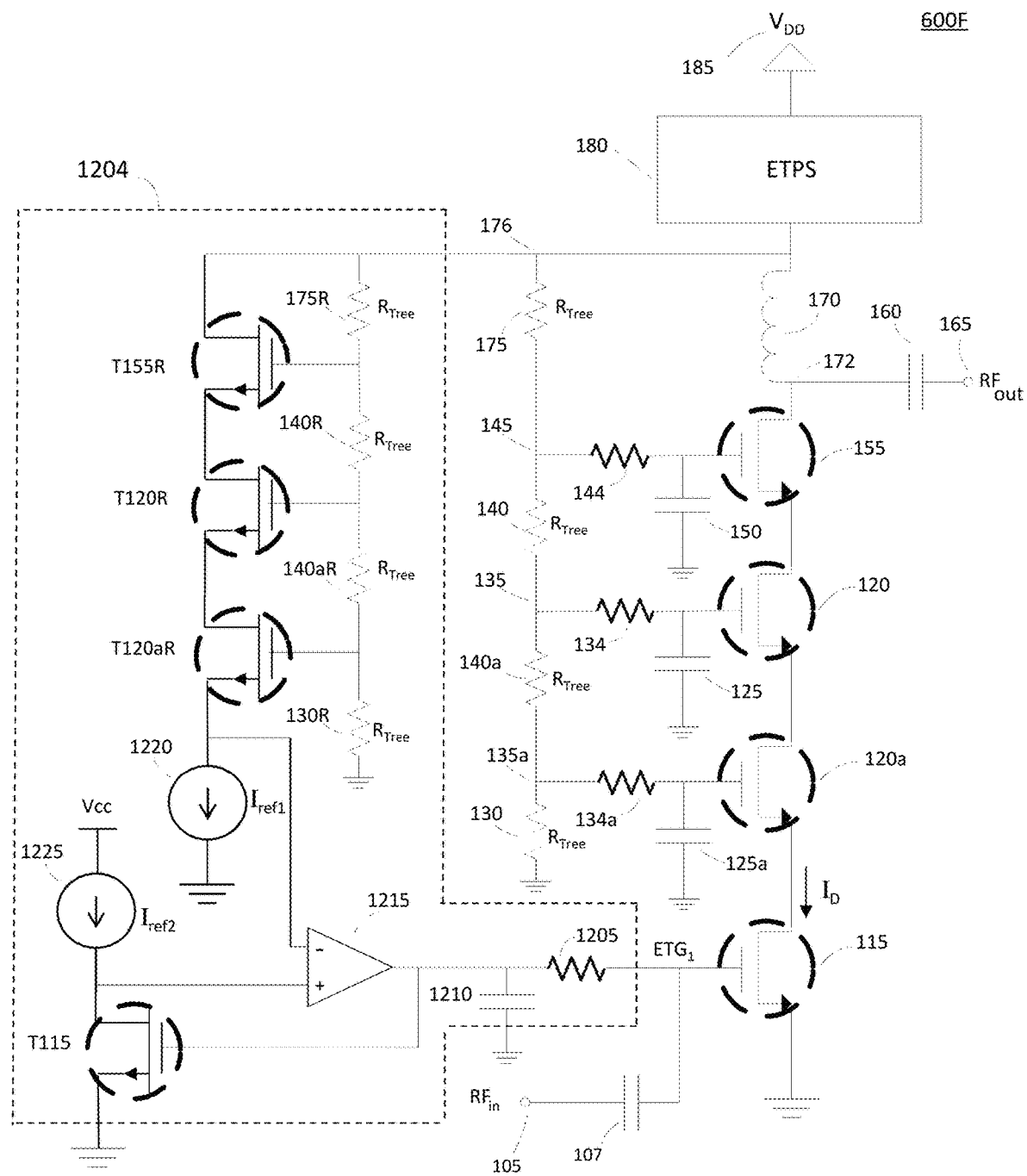
FIG. 12F is a more detailed representation of the input gate biasing circuit used in the exemplary embodiment according to the present disclosure depicted in FIG. 12E.

FIG. 12F provides more details of an exemplary circuital configuration, according to an embodiment of the present disclosure, of the gate biasing arrangement presented in FIG. 12E. In the exemplary circuital configuration depicted in FIG. 12F, an operational amplifier (1215) is used to provide a dynamic gate bias voltage to the input transistor (115) such as the bias current $I_D$ flowing through the transistor stack (115, 120a, 120, 155) is a multiple of a reference current $Iref_2$ output by a current source (1225). This is accomplished by first providing a drain voltage equal to a drain voltage of the input transistor (115) to a reference transistor (T115) through which the reference current $Iref_2$ flows, and determining a corresponding gate biasing voltage of the reference transistor (T115), where the reference transistor (T115) is a reduced size version (e.g. by a factor N, where N can be from 100 to 1000) of the input transistor (115). Generation of such drain voltage is accomplished via a replica transistor stack circuit (T120aR, T120R, T155R, 130R, 140aR, 140R, 175R) which is provided the same dynamic bias supply and gate biasing as the transistor stack (115, 120a, 120, 155) and through which a bias current ($Iref_1$) (e.g. based on a band-gap reference voltage) in proportion to a desired bias current through the transistor stack flows (e.g. as determined by a current source (1220)). Although the replica transistor stack circuit can be made with smaller size devices (e.g. as compared to second set subset transistors 120a, 120, 155) such as to consume less power, for a same biasing condition as the transistor stack, the replica transistor circuit will produce a same voltage at the source of its lower transistor (T12aR) as the drain voltage of the input transistor (115), where a corresponding bias current proportion (e.g. $Iref_1$ versus $I_D$) is determined by the relative size of the replica circuit with respect to the transistor stack circuit as provided by the afore mentioned scaling factor N. According to an exemplary embodiment of the present disclosure, the scaling factor value can be within a range of 100 to 1000, such as, for example, 640. The drain voltage of the transistor stack derived via the replica circuit is then fed to the negative input of the operational amplifier (1215) which in turn forces its positive input terminal to be at the same voltage and therefore provides a same drain voltage to the reference transistor (T115) as the drain voltage of the input transistor (115). As the output of the operational amplifier is connected to the gate of the reference transistor (T115) (e.g. via a low-pass filter network (1210, 1205), such output has to be at a voltage such as to allow $Iref_2$ to flow through the reference transistor. The low-pass filter network at the output of the operational amplifier (1215) decouples the operational amplifier from RF signal components present at the gate of the input transistor (115). Finally by providing the same gate voltage to the input transistor (115) as provided to the reference transistor (T115) and by virtue of both transistors having a same drain-to-source $V_{DS}$ voltage, the current flowing through the input transistor (115) equates the reference current $Iref_2$ multiplied by the size factor N. According to some exemplary embodiments $Iref_1$ and $Iref_2$ can be equal.

Figure 13:
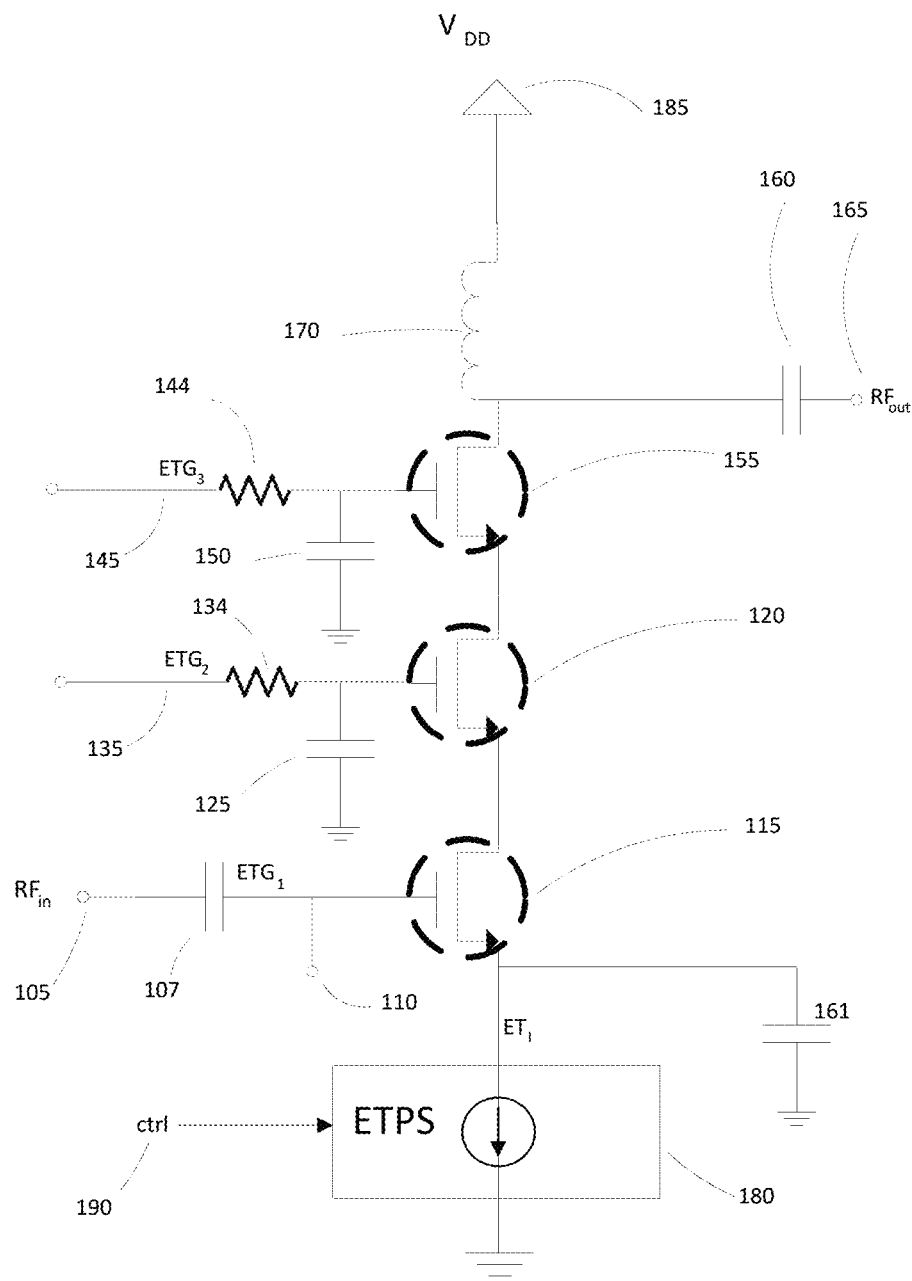
FIG. 13 shows an example embodiment according to the present disclosure of an envelope tracking amplifier wherein the ET power supply is a variable current source.

FIG. 13 shows an example embodiment according to the present disclosure of an envelope tracking amplifier wherein the ET power supply is a variable current source. In this configuration the ETPS (180) is a current source, connected to the source terminal of transistor (115), and which modulates the current of the stack via its input control signal (190). Main supply power is still provided by $V_{DD}$ (185), now connected to the inductor (170). A capacitor (161) is connected between the source terminal of transistor (115) and ground. At RF frequency, the equivalent impedance of the capacitor is very small, effectively providing an RF ground to the source of the transistor. In this configuration, gate biases are controlled in a similar manner as in the previous cases.

Figure 14:
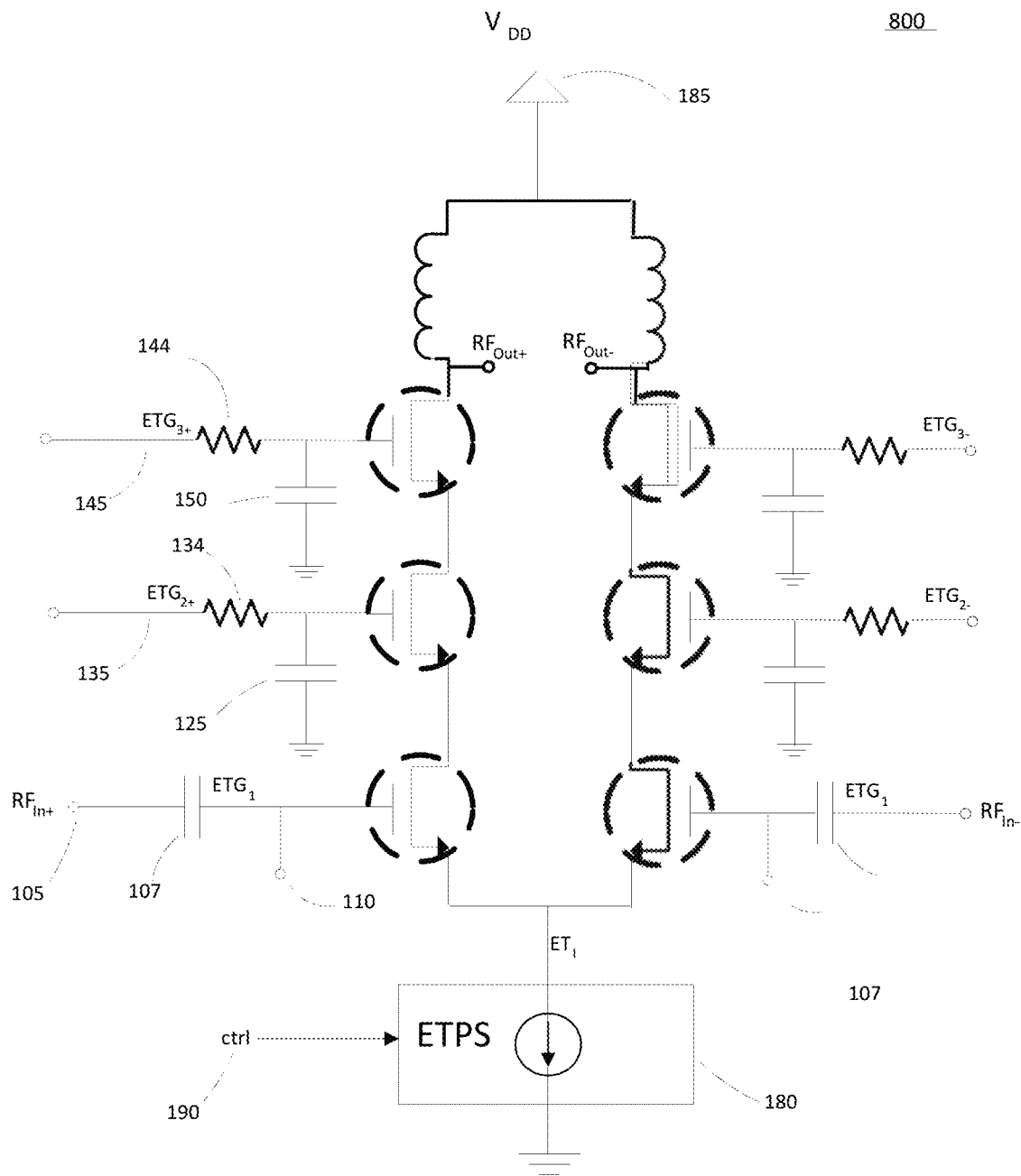
FIG. 14 shows an example embodiment according to the present disclosure of a differential input envelope tracking amplifier wherein the ET power supply is a variable current source.
Figure 15:
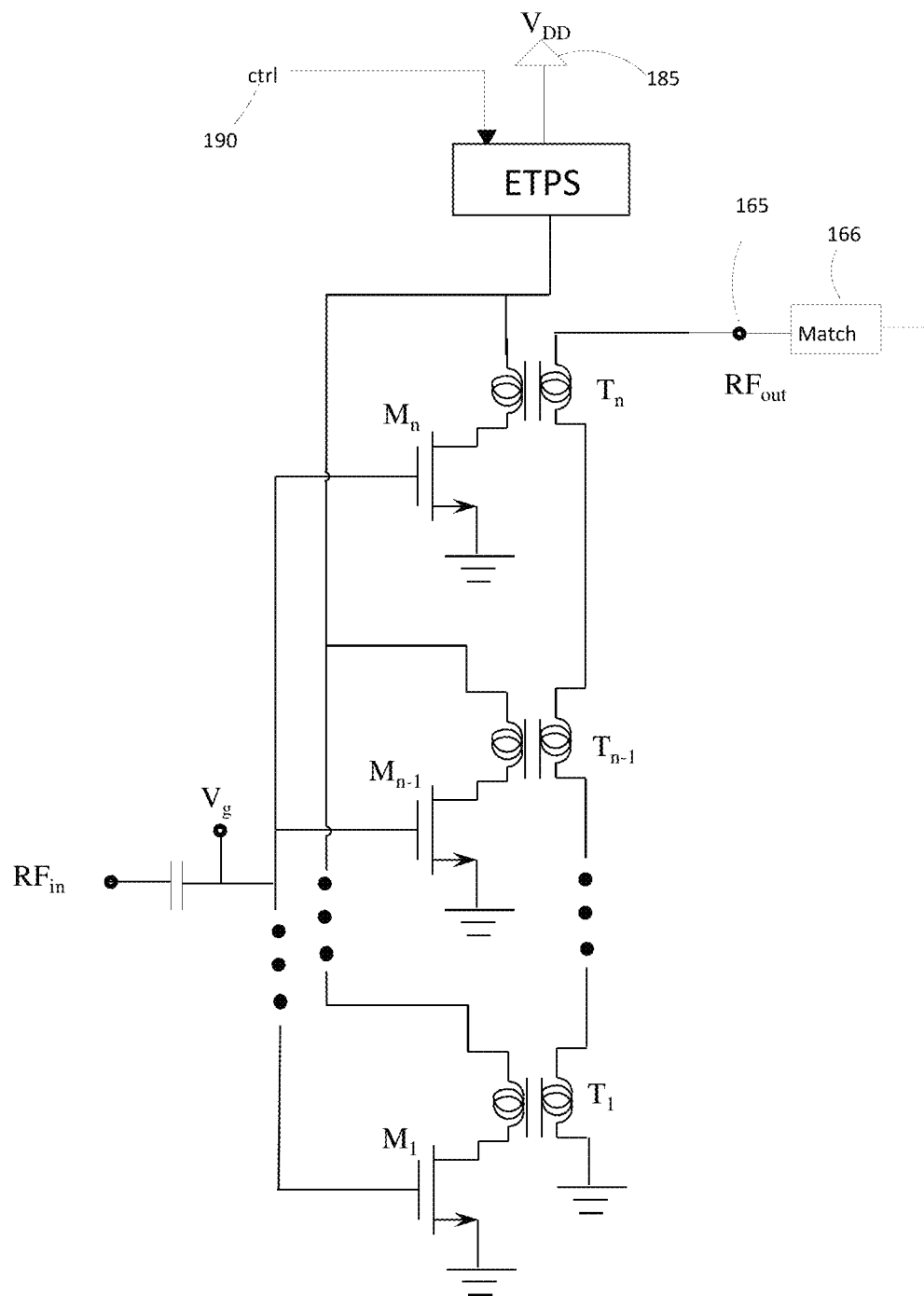
FIG. 15 shows an example embodiment according to the present disclosure of a combined output envelope tracking amplifier, wherein transformers are used to combine outputs of the various transistors of a stack.
Figure 18:
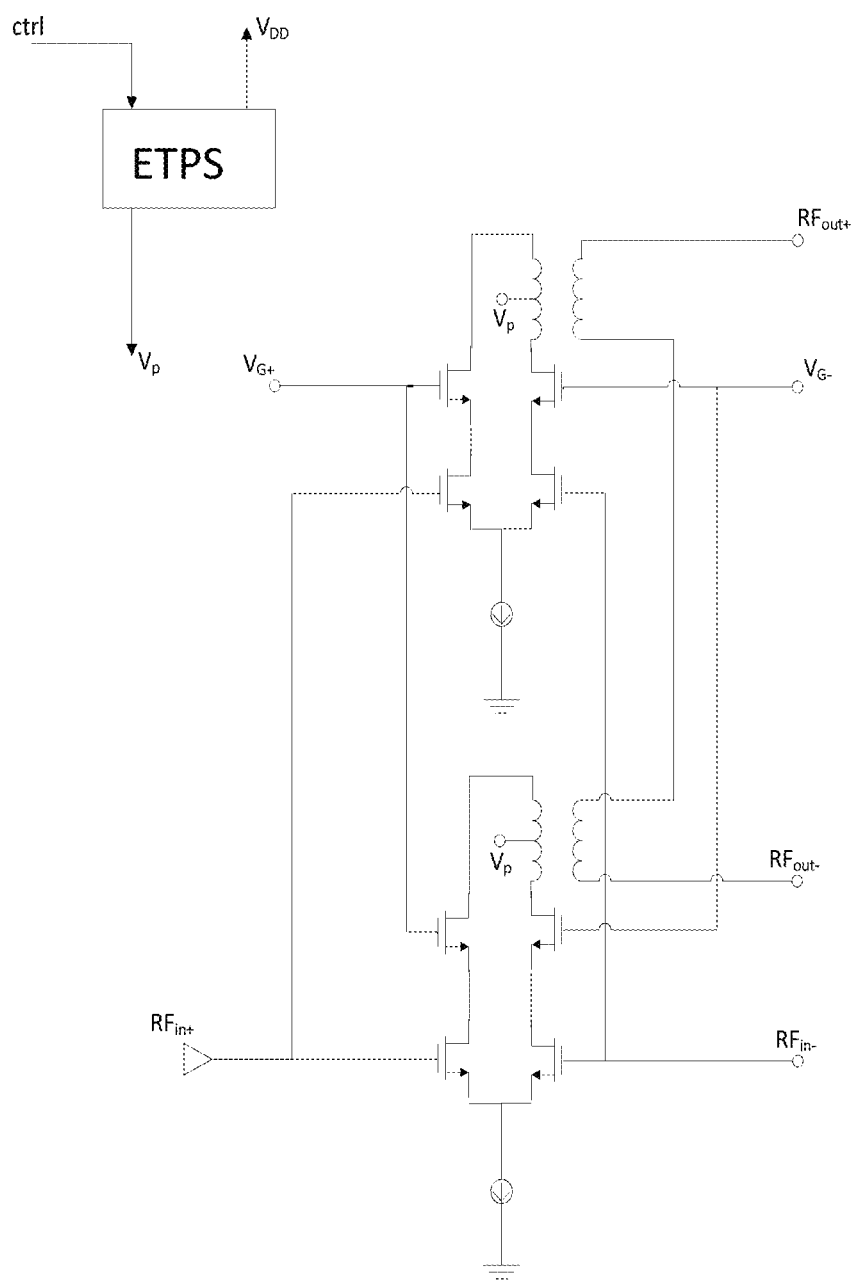
FIG. 18 shows a differential input/output configuration of the embodiment of FIG. 15.

FIG. 14 shows an example embodiment according to the present disclosure of a differential envelope tracking amplifier wherein the ET power supply is a variable current source. In this configuration the input RF signal, as well as the various bias supplies, may be provided differentially to the corresponding complementary input terminals. It is to be noted that in some cases, nodes $ET_{G3+}/ET_{G3-}$ and $ET_{G2+}/ET_{G2-}$ may be connected to create a single gate bias node for each transistor pair, such as single ended bias supplies may be provided to the gates of the transistor pairs through these nodes. In the embodiment of FIG. 14, node ($ET_f$) is a virtual ground. In general, for all the arrangements disclosed, the source terminal of the input transistor is connected to a reference potential of the arrangement, which may be effectively a system reference ground as in FIGS. 1-4, an RF ground as in FIG. 13, or a virtual ground as in FIG. 14. 226 FIG. 15 shows an example embodiment according to the present disclosure of a combined output envelope tracking amplifier, wherein transformers ($T_n$, $T_{n-1}$, ..., $T_1$) are used to combine outputs (power) of the various transistors ($M_n$, $M_{n-1}, \ldots, M_1$). In this embodiment the input RF signal is fed to all the transistors in parallel, which thus have a common input node at their gates. Each transistor is thus biased similarly, by way of the common gate bias voltage ($V_g$), and the variable supply provided by the ETPS unit to their drains via a plurality of transformer chokes (primary side of the transformer). In this configuration, the gate bias voltage may be further modified dynamically as per prior description (e.g. envelope signal). The person skilled in the art will understand that each of the transistors ($M_n$, $M_{n-1}, \ldots, M_1$) may be replaced by a cascode configuration for higher RF output power capability and/or higher gain. Similarly, the same person may envision a differential implementation of this embodiment. FIG. 18 shows such an example, wherein differential input/output amplifiers in cascode configuration are used.

Figure 16:
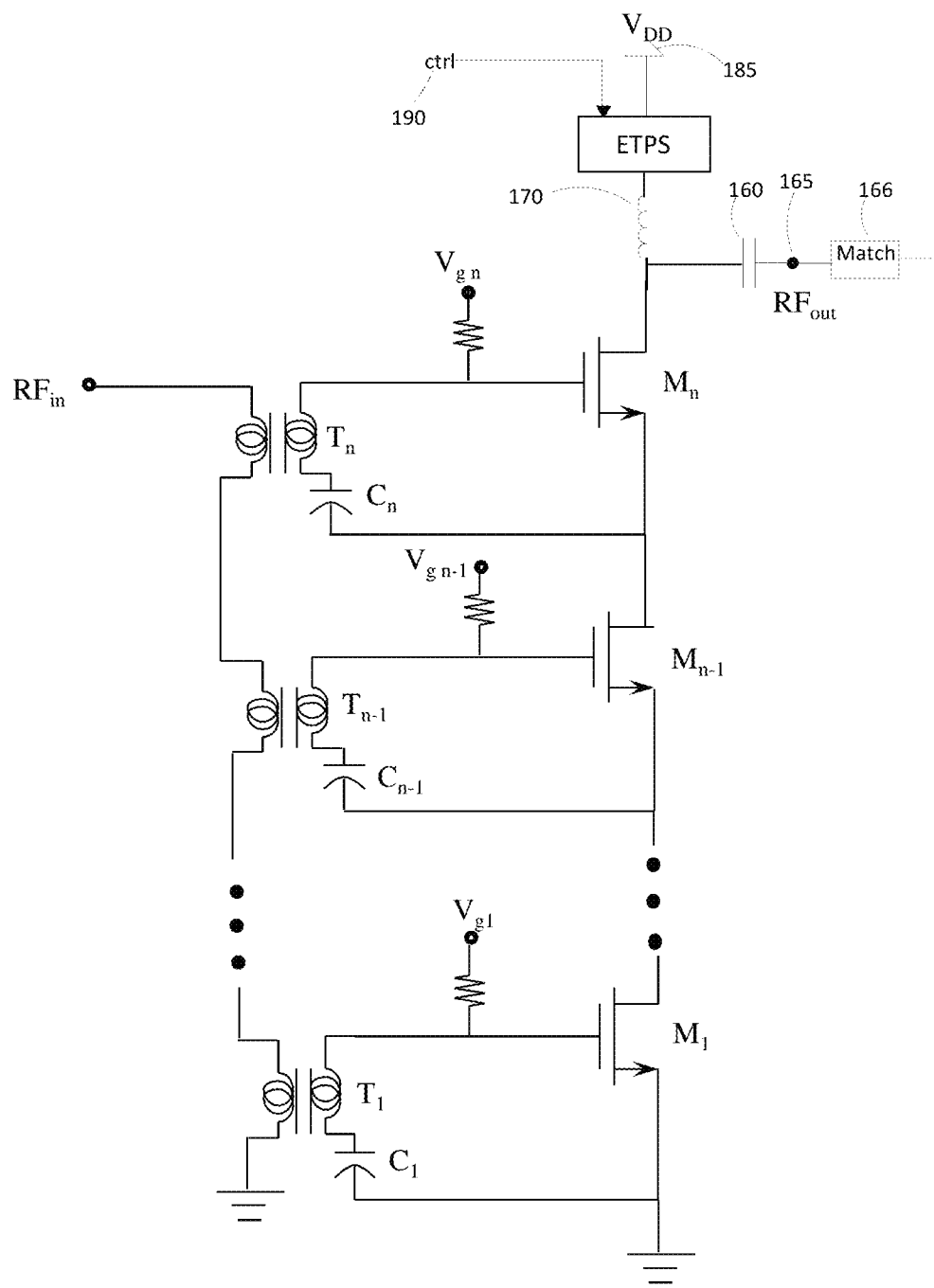
FIG. 16 shows an example embodiment according to the present disclosure of a transformer-coupled envelope tracking amplifier, wherein transformers are used to couple the various input gates of transistors of a stack to an input signal.

FIG. 16 shows an example embodiment according to the present disclosure of a transformer-coupled input envelope tracking amplifier, wherein transformers ($T_n, T_{n-1}, \ldots, T_1$) are used to couple the various input gates of transistors of a stack to an input RF signal. In this configuration, transistors from the stack are connected in a series configuration (e.g. source to drain), with power from the ETPS unit connected to the transistor at the top ($M_n$), and a reference potential (e.g. ground) connected to the source terminal of the bottom transistor ($M_1$). Dynamic gate biasing may be provided via voltages ($V_{gn}, V_{g(n-1)}, \ldots, V_{g1}$), which with the help of the capacitors ($C_n, C_{n-1}, \ldots, C_1$) set the gate-to-source voltages for each of the transistors. The person skilled in the art will notice that in this embodiment $V_{gn} > V_{gn(n-1)} > \ldots > V_{g1}$. The person skilled in the art will understand that each of the transistors ($M_n, M_{n-1}, \ldots, M_1$) may be replaced by a cascode configuration for higher RF output power capability and/or higher gain. Similarly, the same person may envision a differential implementation of this embodiment.

Figure 17:
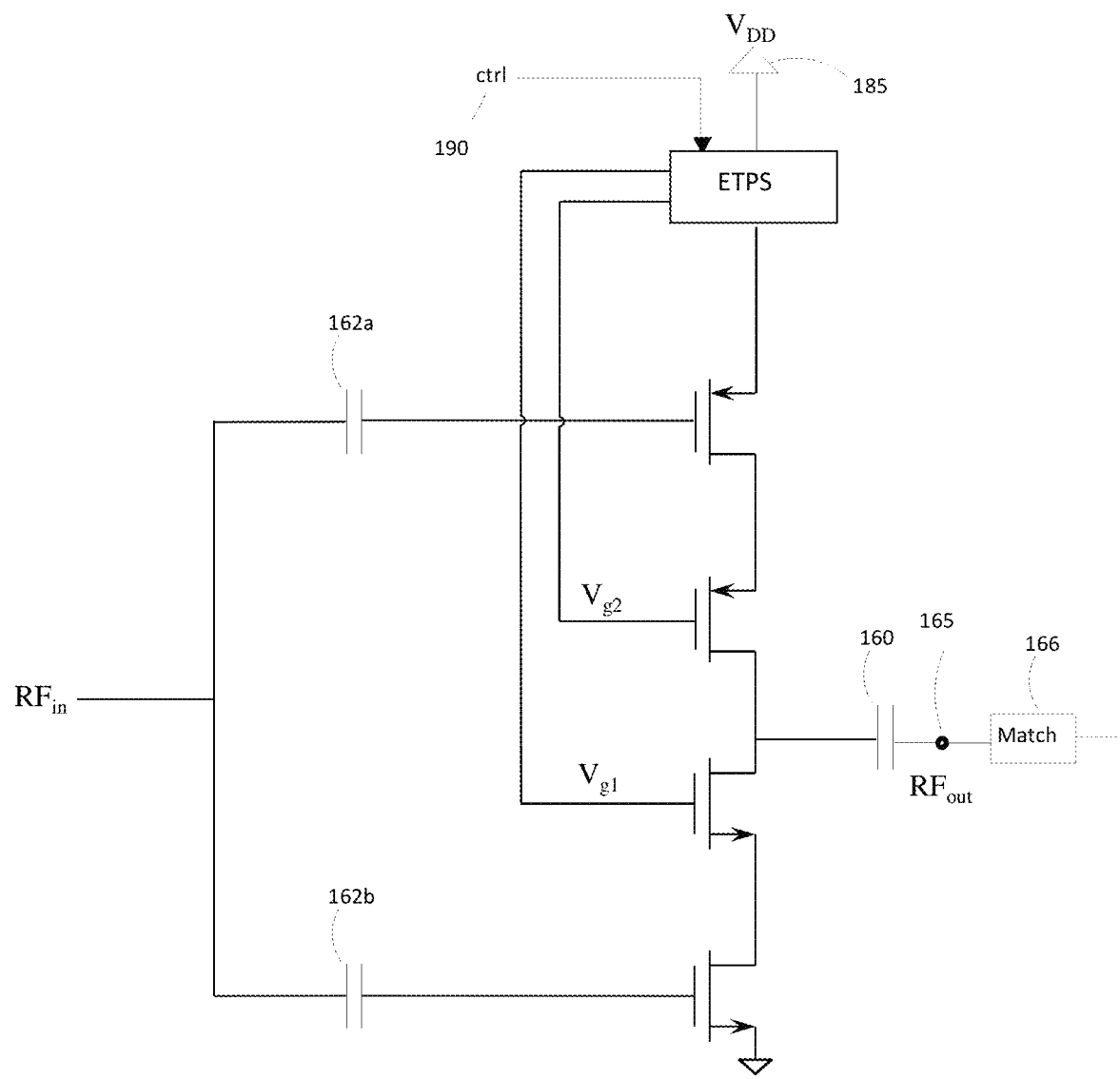
FIG. 17 shows an example embodiment according to the present disclosure of an envelope tracking amplifier with push-pull output stage.

FIG. 17 shows an example embodiment according to the present disclosure of an envelope tracking amplifier with push-pull output stage. In this configuration the top of the stack may comprise a number of P-type MOSFET devices connected in a series configuration, and the bottom may comprise the same number of N-type MOSFET devices also connected in a series configuration. The middle two devices are thus of opposite types and interconnected at their drain terminals. In this embodiment the input RF is fed to the top and bottom devices, via input coupling capacitors (162a, 162b), which in turn propagates through the top and bottom halves of the stack in a complementary fashion, yielding in outputting the amplified RF output signal from one half of the stack or the other half of the stack. In some embodiments both halves may output simultaneously but at different power levels. Biasing of the gates may be provided via fixed voltages, or via dynamic voltages (Vg1, Vg2) as depicted in FIG. 17 and generated within the ETPS unit. The person skilled in the art will understand that each of the transistors may be replaced by a cascode configuration for higher RF output power capability. Similarly, the same person may envision a differential implementation of this embodiment.

As previously discussed, in the case of an amplifier configured for ET operation, also referred to as "ET mode of operation", such amplifier is susceptible to operate in either the linear or the compression region, latter being the desired region of operation. Furthermore, when the amplifier is not configured for ET mode of operation (non-ET mode), for example by virtue of supplying a fixed supply voltage to the amplifier, the amplifier is also susceptible to operate in either linear or compression regions, but in such case the desired region of operation is the linear region.

As discussed in prior sections, ET amplifiers operate as a function of an envelope of the input RF signal, referred to as the envelope signal, to the amplifier which may be applied to their supply and biasing inputs. The envelope signal can be equivalent to the time varying tracking signal corresponding to the successive peaks of the input RF signal. When the output of the amplifier tracks the envelope signal due to a change in the applied supply level, the amplifier operates mainly in the highly efficient compression region. When operating in this region, the applied supply restores the amplitude of the output which is lost due to operation in the compression region of the amplifier (AM/AM distortion). Alternatively, and mainly at low input power levels, the amplifier output follows the envelope of the input RF signal and operates in the linear region, which is a less efficient region of operation typical to non-ET configurations.

One of the main drives for ET implementation within power amplifiers is the improvement in power efficiency while maintaining a good linear response of the amplifier. ET seeks to improve efficiency by adjusting the supply power based on roughly following the time varying envelope signal thereby adjusting the supply power to the amplifier based on the potential demand. Thus less supply power is provided for lower level input signals, thereby reducing wasted power provided to the amplifiers. Adjustment of the supply power for ET implementation can be done by either adjusting the supply voltage (FIGS. 1, 3, 4) to the amplifier or by adjusting the supply current (FIGS. 13-14) to the amplifier. In both cases, a supply control signal derived from the envelope signal and encompassing desired ET behaviors may be used to dynamically adjust the ET supply power.

The supply control signal is constructed using the envelope signal and such as to reflect limitations associated with ET mode of operation, such as bandwidth limitation of the dynamic output of the variable power supply as well as limitations in output linearity of the amplifier at low power levels when operating in the compression region (e.g. due to low $V_{DS}$ voltage across one or more of the stack transistors), latter limitation defining a minimum preset power level for ET mode of operation. Additional scaling and offset components are applied to the control signal such as to map the output signal of the amplifier to the desired operational range.

Even though the amplifier is set to operate in ET mode, there are instances when the combination of low input RF power level to the amplifier and the ET supply power level (controlled by the supply control signal) removes the amplifier from the compression region and puts it into the traditional linear region of operation typical to non-ET configurations. This switching from compression region to linear region of operation and vice versa, is dependent on the modulation scheme used on the input RF signal, but expected to occur especially in RF signals with high peak-to-average power ratio.

Figure 27:
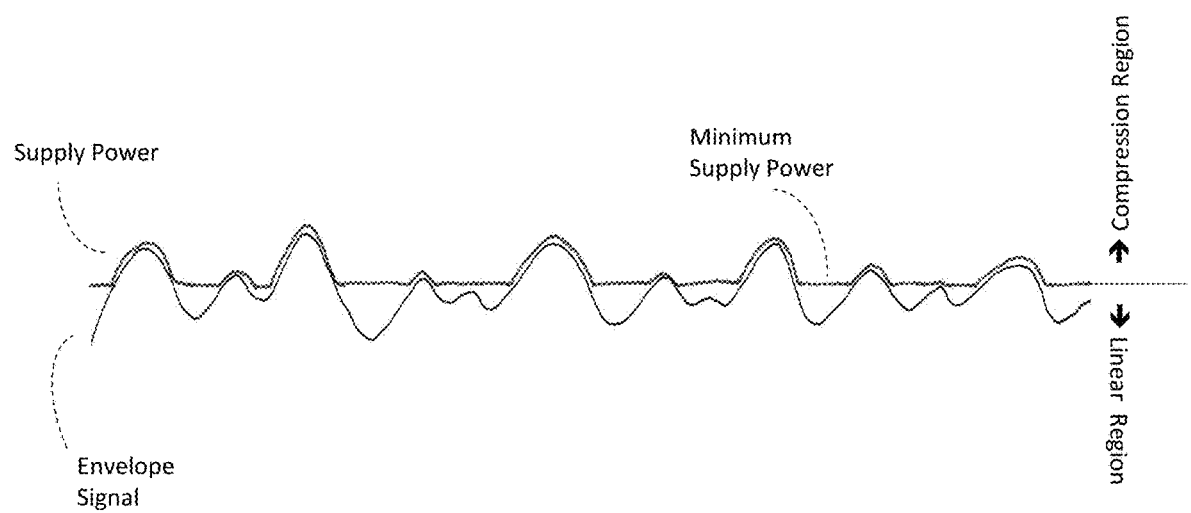
FIG. 27 shows an example of an envelope signal, associated amplifier supply power and region of operation for an amplifier operating in an envelope tracking mode.

FIG. 27 shows an example of an envelope signal and associated amplifier supply power when operating in ET mode. The supply power follows the time varying envelope signal (e.g. amplitude varies as a function of time) during its peaks, pushing the amplifier to operate in compression and controlling the envelope through the applied envelope voltage. As the supply power lowers and reaches its minimum preset level, the supply stops following the envelope signal and thus the amplifier starts operating in the less efficient linear region wherein the supply level is static. In an ET mode, the linear region of operation is thus characterized by the region wherein the supply power is set to the minimum preset value.

As discussed earlier, operating in the compression region has the advantage of linearity and reduced power dissipation to some degree. FIGS. 29B and 29C show the level by which the dissipated heat can be reduced between a traditional fixed supply operation depicted by FIG. 29B, and a variable supply operation depicted by FIG. 29C (not accounting for difference in heat dissipation between the power supplies operating at these different regions), where the supply closely follows the envelope signal of the modulation. Going to FIG. 29D, the power added efficiency (PAE) versus output power is plotted for the same two cases of operation. During linear operation, for a given fixed supply, the PAE rises with a rise of the output power until the output eventually saturates (e.g. close to saturation) and the PAE reaches a maximum practical level, for example around 28% at an output power level of 15.5 dBm for a supply voltage of 1.5 volts. This maximum practical level is a function of the fixed supply voltage, and rising the fixed supply voltage will yield to higher maxima values for the PAE as depicted by FIG. 29D, where the PAE is plotted for various fixed supply voltages, ranging from 1.5 volts to 6 volts. In the case where the amplifier operates in the compression region and with a variable supply voltage, the PAE follows the heavy dashed curve, which corresponds at a higher output power range to the points swept by the maxima of the fixed supply operation, and at a lower output power range it falls back into a linear operation. This fall back occurs at an equivalent power supply level of 1.5 volts. This level is the "minimum level" referenced in FIG. 29A and discussed in the following paragraphs.

When the amplifier makes the transition from the compression region to the linear region, it operates with less power efficiency and with some added level of distortion to the amplified output as the benefit of AM/AM amplitude correction via supply power modulation is lost. Another undesired side effect of the switching between regions of operation of the amplifier is the change in gain at the output of the amplifier stage; when in the compression region the output signal is clipped and thus reduces the gain of the amplifier as compared to the gain obtained when operating in the linear region.

The present disclosure provides systems and methods by which said limitations can be overcome or at least reduced by some degree. For example, a feedback network can be used within a feedback path around an ET amplifier to create a closed loop configuration such as to optimize response when the amplifier is pushed into operating in the linear region. Given the electrical characteristics of the amplifier, traditional feedback amplifier design techniques can be used to optimize amplifier performance in the linear region and thus positively affect corresponding vital parameters such as gain, phase, distortion and stability. This feedback network can be switched in and out, to effectively activate and de-activate the feedback loop, in unison with the desired operational mode and/or region of operation of the amplifier (ET versus non-ET modes or compression versus linear regions) and under control of a main controller unit which may be aware of the input RF signal to the amplifier or the corresponding envelope signal.

One example of this benefit is that by using feedback in the linear region and removing the feedback in the compressed region is that the gain and efficiency are maximized in the compressed region, while linearity is maximized in the linear region. Another example is that using feedback in the linear region and removing the feedback in the compressed region lets one choose how much gain and thus gain compression (e.g. amount of gain less than the equivalent gain in the linear region) they want in their system as a design parameter, not just a device property.

In another embodiment further linearization of the amplifier can be obtained by adjusting the various gate bias supplies (e.g. $ET_{G1}$, $ET_{G2}$, $ET_{G3}$ of FIGS. 1, 3-4, 6-14) such as to compensate for changes in the gain curves of individual transistors of the stack as the ET supply power (e.g. voltage) varies. A controller which is aware of the ET supply power level or the corresponding controlling signal, in combination with lookup tables (shaping tables) containing transistor characteristic data (e.g. current gain characteristic curve), may be used to create and apply the desired adjustments.

Figure 30:
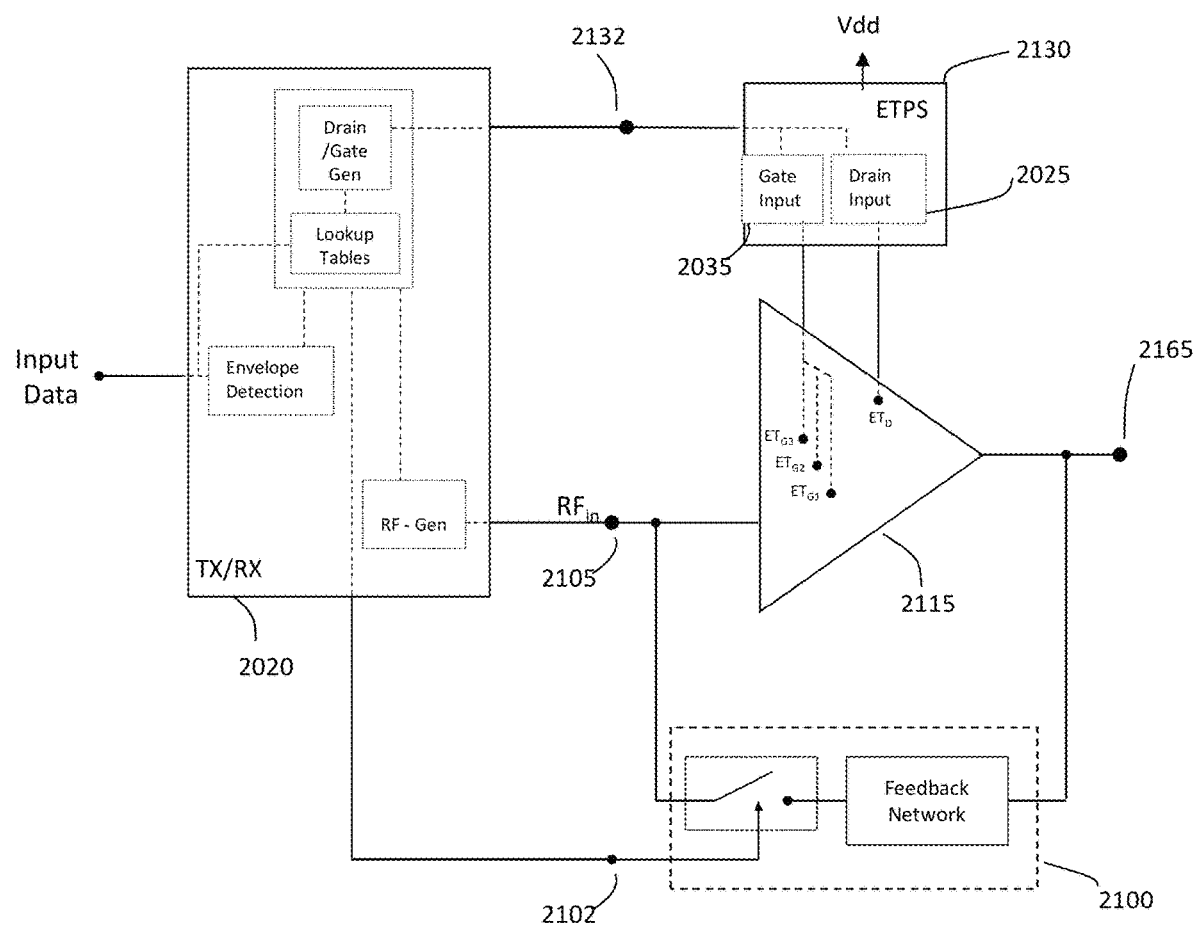
FIG. 30 shows an exemplary system configuration for proposed embodiment, wherein a transceiver is used as main controller.

Such a controller mentioned in the above embodiments can be the transceiver unit traditionally used in modern communication systems. The controller can generate a switch control signal which is synchronized to the change in operational mode/region of the amplifier. FIG. 30 shows such an embodiment, wherein the switch control signal is generated within the transceiver unit (2020) and fed to switch control input terminal (2102). In the embodiment of FIG. 30, the same transceiver unit (2020) generates the supply control signal which in turn is fed to input terminal (2132) of the ET power supply unit (2130), which latter uses to generate the effective supply power to the amplifier stage (2115) via its internal dedicated circuitry (gate input and drain input modules (2025, 2035)).

FIG. 28 shows a relationship between the switch control, the feedback status (open loop, close loop) and the amplifier operating region. In FIG. 28, a comparator unit is used to generate the switch control signal, as an alternative method to having a controller, such as one shown in FIG. 30, perform this task. As shown in FIG. 28, the envelope signal and a preset minimum value corresponding to the minimum supply power to the ET amplifier are the inputs to the comparator. In FIG. 28, it is assumed that the switch is open when input switch control is in a low state (e.g. value of 0). A person skilled in the art will understand that other implementations to obtain the switch control signal are possible. Also, one skilled in the art will understand that it is not limited to open and closed loop, but can be a switching between different levels of feedback or even a continuously variable level of feedback. FIG. 28 shows the feedback being switched based on the envelope compared to a reference level. As mentioned, the feedback could be continuously varied, for example based on the envelope voltage, or other parameters such as input power level.

Figure 29A:
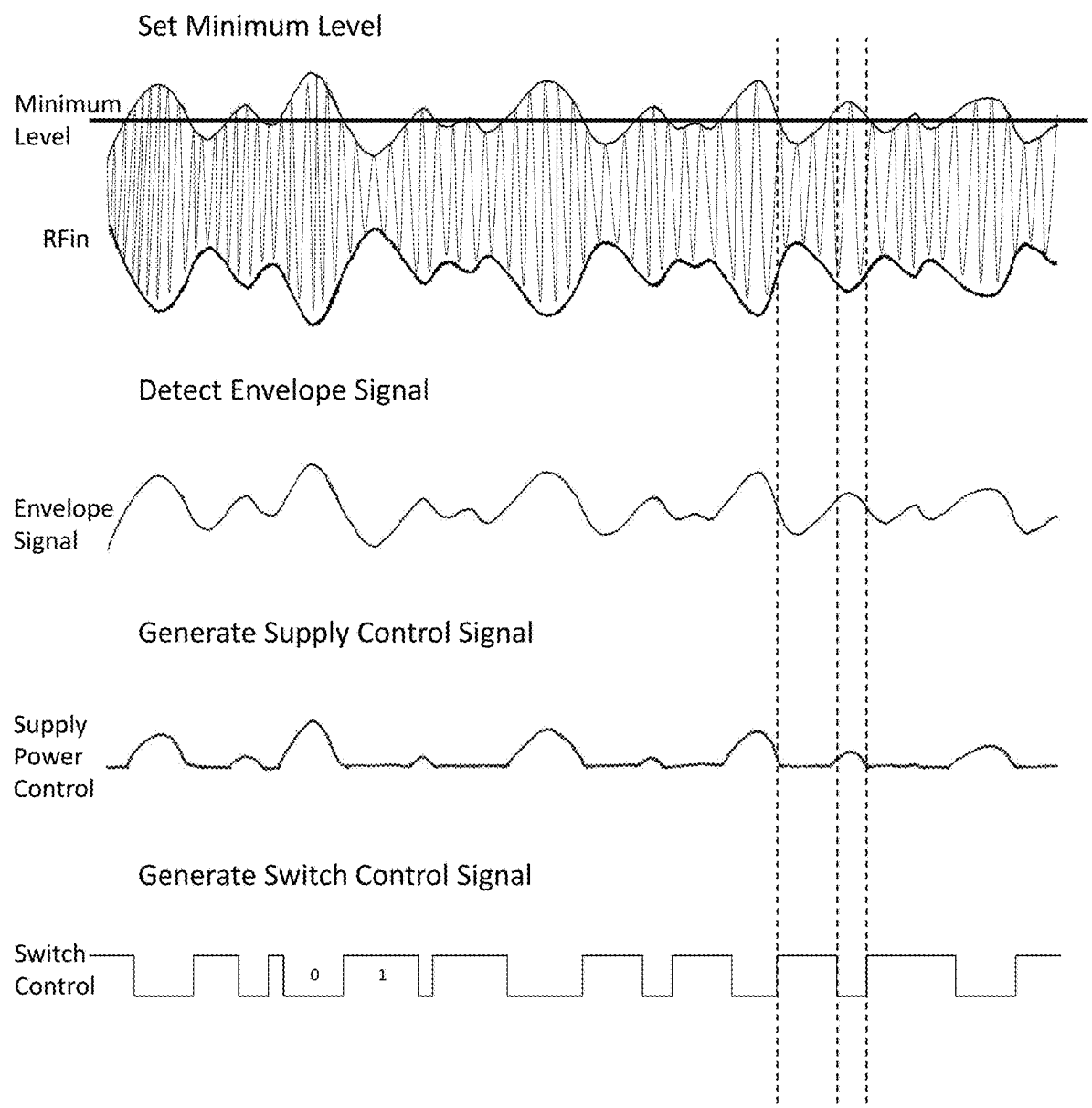
FIG. 29A shows relationship amongst various signals used in the proposed embodiment.
Figure 29B:
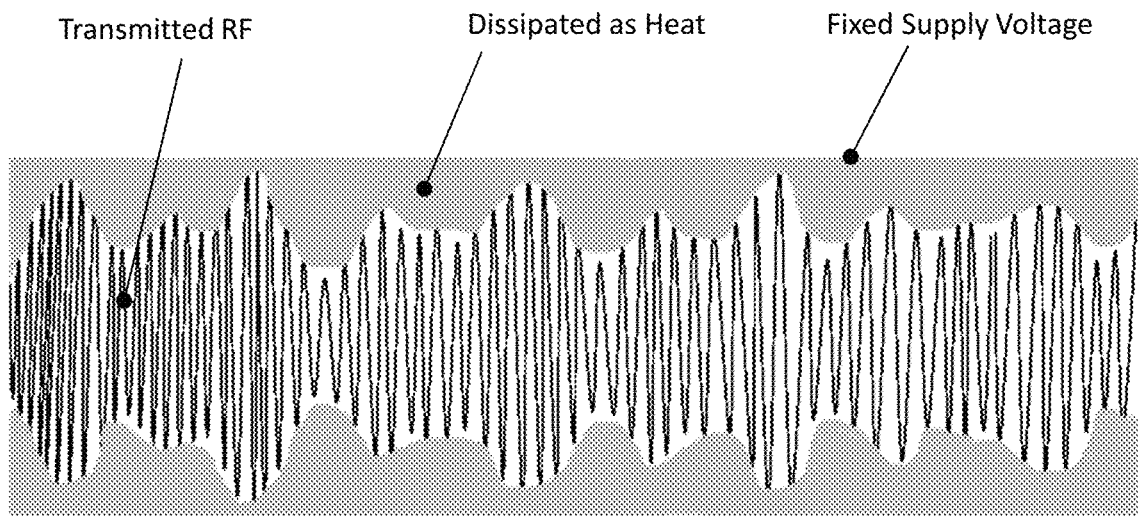
FIGS. 29B and 29C contrast the dissipated power in an amplifier operating in a linear region where the supply power is fixed, versus an amplifier operating in a compression region where the supply power follows the envelope of the input RF signal.
Figure 29C:
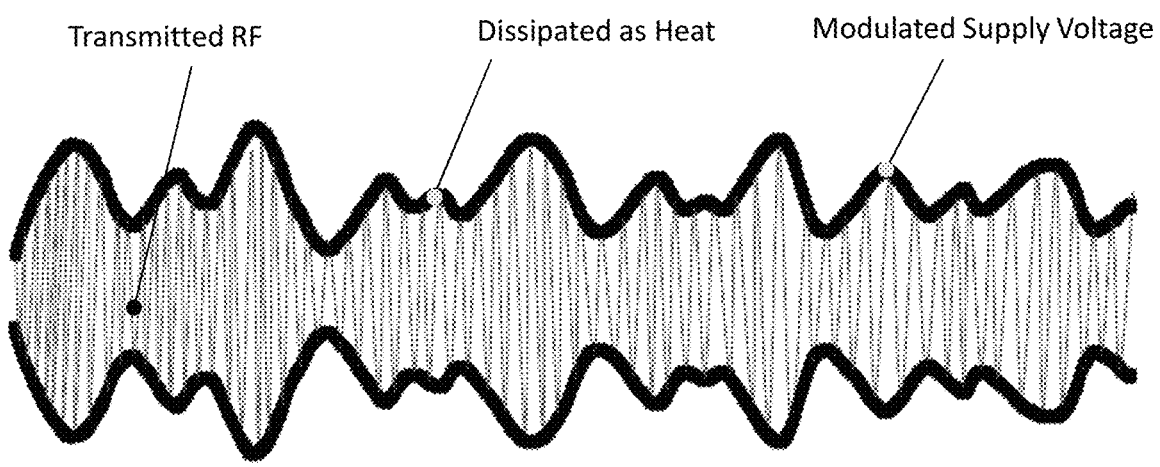
Figure 29D:
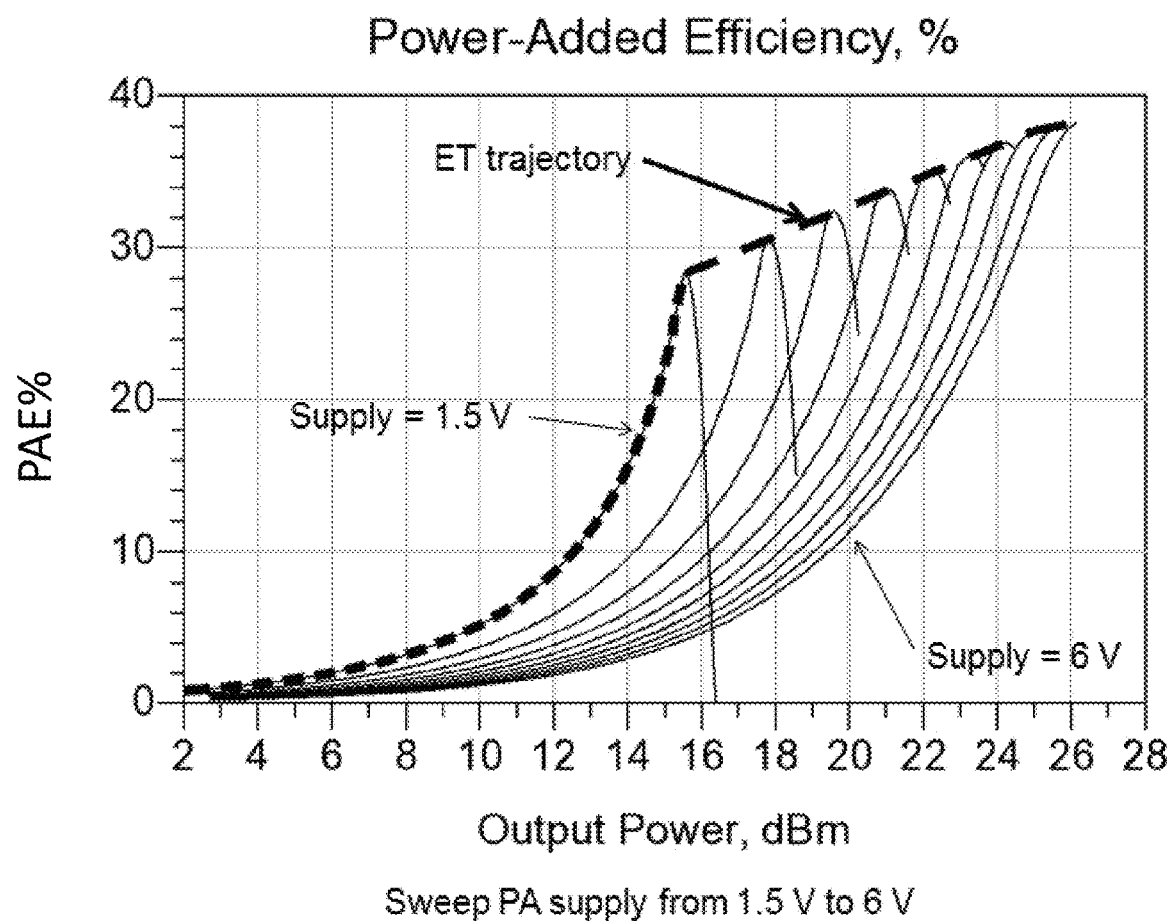
FIG. 29D contrasts the Power-Added Efficiency (PAE) of an amplifier operating in a linear region at different fixed supply voltages versus an amplifier operating in a compression region where the supply power follows the envelope of the input RF signal.

FIG. 29A is an exemplary depiction of relationships between the various signals mentioned in previous paragraphs. Starting from the $RF_{in}$ signal and a preset minimum level corresponding to the minimum ET supply power level, the envelope signal, the supply power control signal and the switch control signal are generated.

Figure 20:
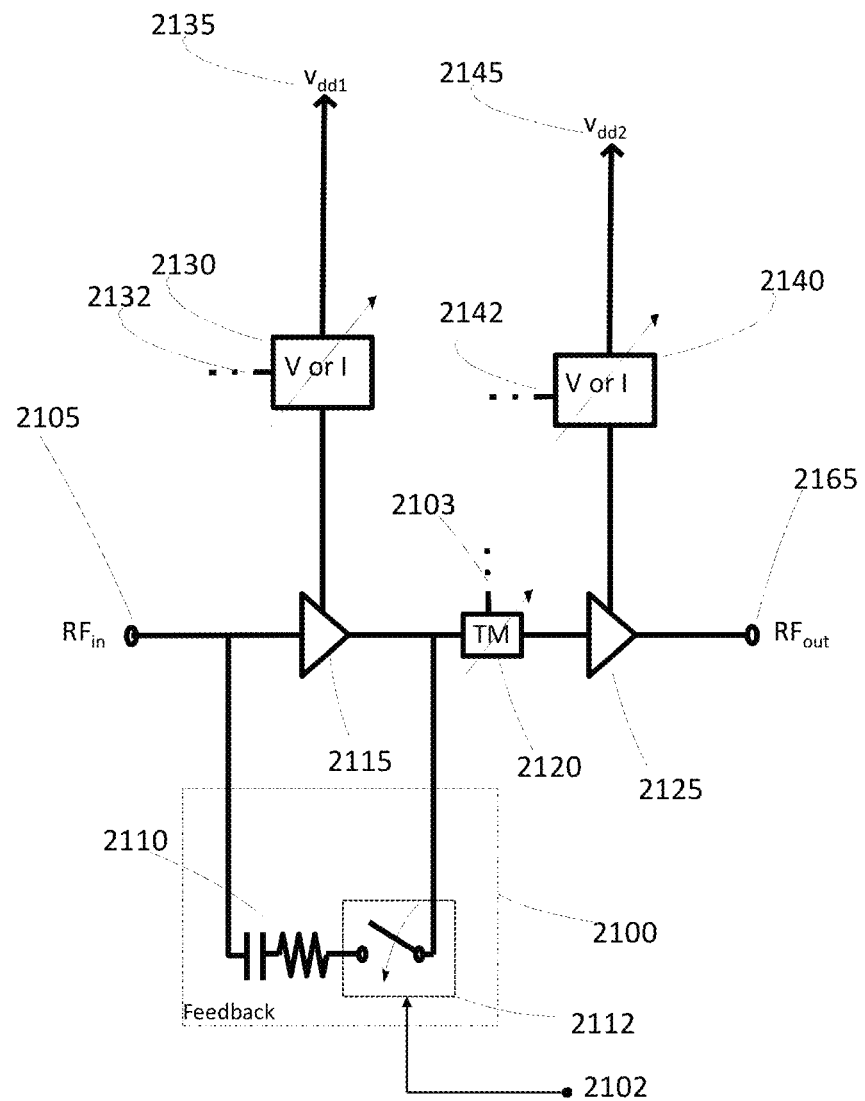
FIG. 20 shows embodiments where a feedback network and a tunable matching network are connected to an amplifier arrangement comprising a plurality of amplifiers, each amplifier being provided with its own power source, used to bias the amplifier and to provide power to the amplifier. Each amplifier of FIG. 20 may operate in either an ET or a non-ET mode.

Furthermore, and in order to compensate for possible mismatch of the output impedance of the amplifier stage between the two distinct configurations (feedback loop active and feedback loop not active), and thus loss of effective output power seen by the next stage, a tunable matching network can be added at the output stage of the power amplifier (e.g. FIG. 1). Same controller unit as previously mentioned can control such a network as well. FIG. 20, later described in detail, shows an embodiment wherein a switchable feedback network (2100) is used within a feedback path created around a first stage amplifier (2115), which is followed by a tunable matching network (2120). The tunable matching network may be continuously variable or variable in discrete steps under control of an input control signal (2103). Same tunable matching network may also be used for modifying the load lines of the amplifier stage (2115) and thus impact gain, since amplifier gain is proportional to its load (e.g. $G_{voltage} \approx g_m \times R_{Load}$).

Figure 21:
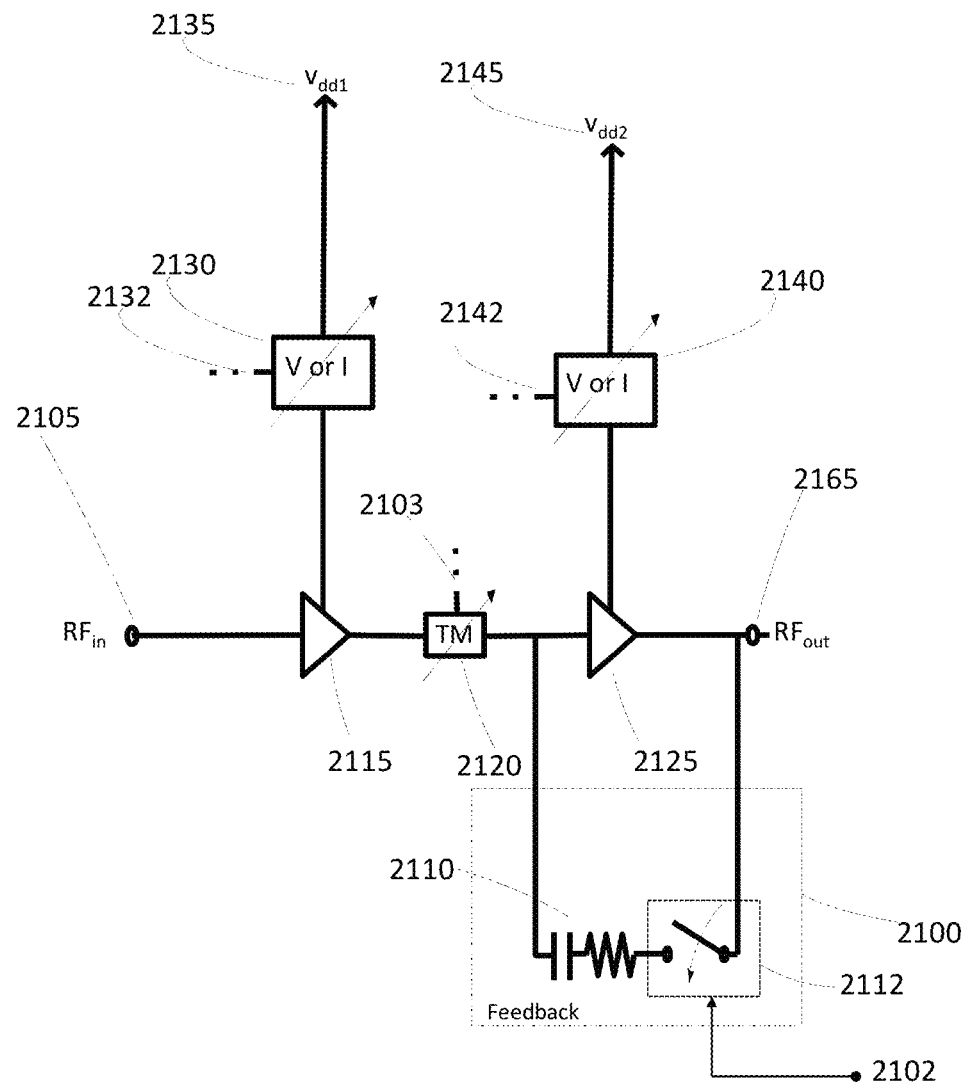
FIGS. 21 and 22 show alternative embodiments where the feedback network can be arranged in different locations within the amplifier arrangement compared to FIG. 20.
Figure 23:
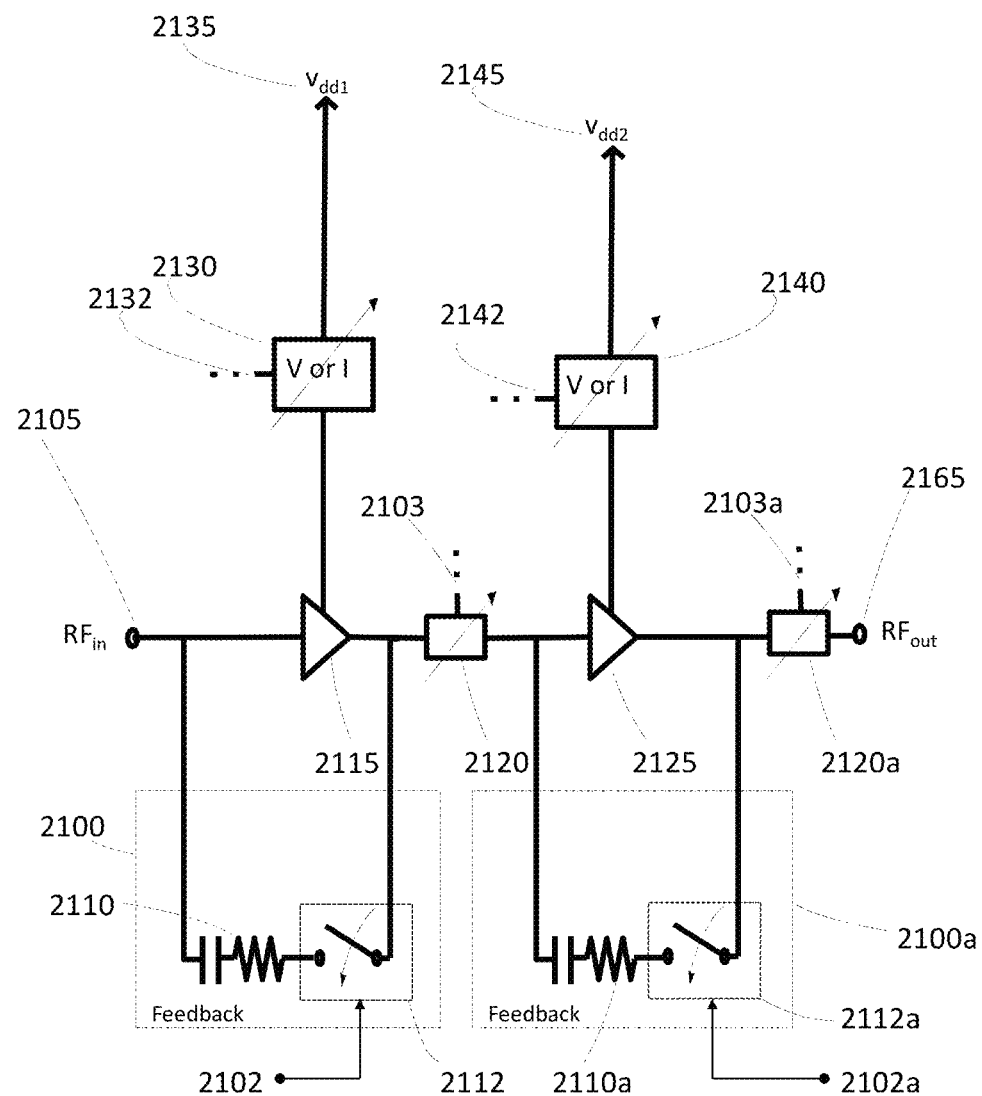
FIG. 23 shows an alternative embodiment where a feedback network and a tunable matching network are connected to each of the amplifiers within the amplifier arrangement.
Figure 24:
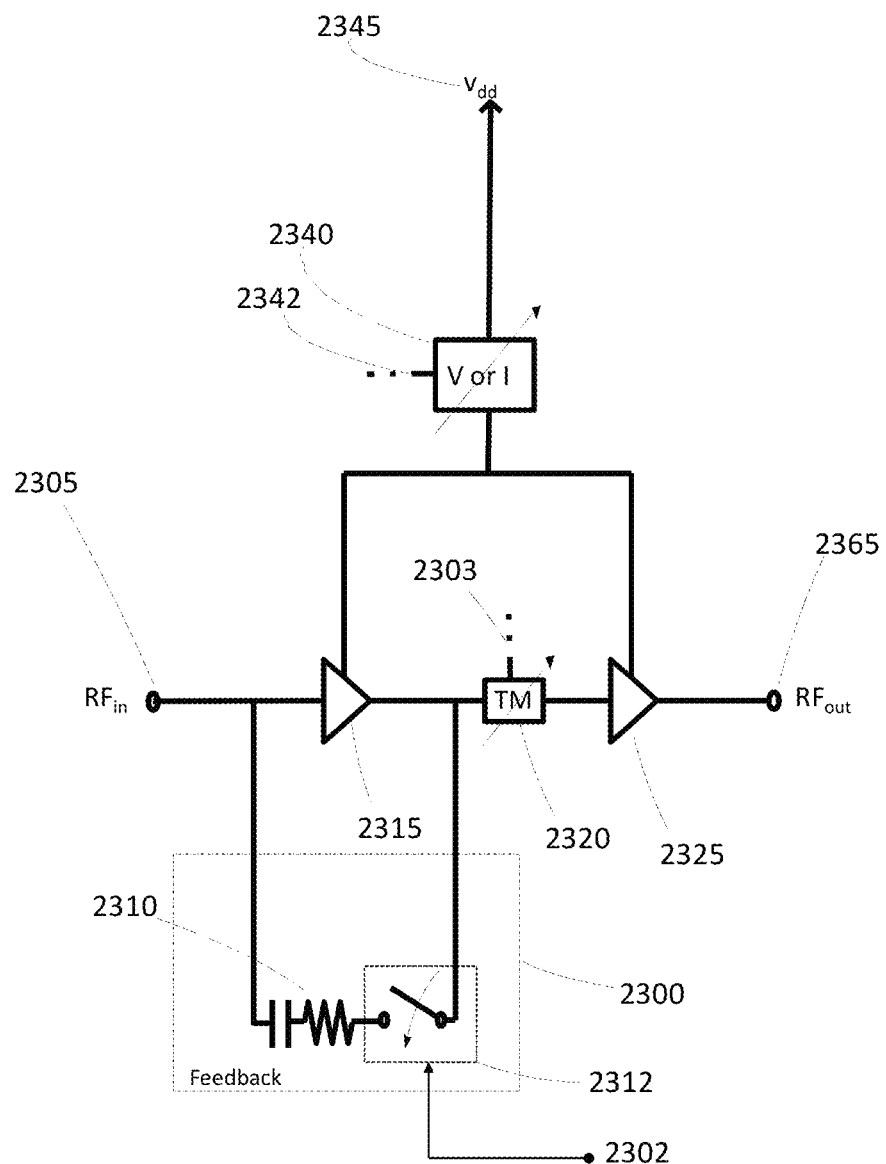
FIG. 24 shows an embodiment of the present disclosure where a feedback network is connected to an amplifier arrangement, each amplifier sharing a common power source.

In another example, a two-stage amplification can be used wherein the first stage preconditions the input RF power level to the second stage such as to reduce switching of the second stage to the linear region of operation, thus enhancing overall power efficiency and linearity of the output stage; since minimum RF input power level to the second amplifier is increased by the first amplification stage, second amplifier will operate more time in the compression region for an increase in overall efficiency. In this configuration, both stages can be ET amplifiers, each with its own ET power supply and each fitted with a switchable feedback network for optimal overall performance. FIGS. 20-21 and FIG. 23, later described in detail, depict such embodiments. A person skilled in the art will understand that such a configuration is not limited to two stages and can easily be extended to multiple stages.

FIG. 20 shows an embodiment of the present disclosure where a feedback network (2100) is connected through a feedback path to an amplifier arrangement comprising a driver stage (2115) and a final stage (2125). Each of the amplifiers (2115, 2125) can be built by including a stacked arrangement of FETs in a cascode configuration as depicted by FIGS. 1-8. The amplifier arrangement of FIG. 20 further comprises an input terminal (2105) and an output terminal (2165). In other embodiments, it may be desired that the arrangement operates in differential signal mode, in which case alongside the input terminal (2105) and the output terminal (2165), the amplifier arrangement would also have, at each terminal, a respective complementary signal terminal.

The feedback network (2100) is used within a feedback path to create a feedback loop around the driver stage (2115), such as when the feedback loop is active, the output of the driver stage (2115) is taken and combined with the input of the same driver stage (2115) after being subjected to the transformation defined by the feedback network (2100). Such feedback loop is active when the switch (2112) is closed, thus engaging the feedback network (2100) into creating the loop. Control signal to switch (2112) is provided at terminal (2102). By way of example and not limitation, feedback network (2100) is comprised of the switch (2102) and RC series network (2110) in series.

As shown in FIG. 20, each of the driver stage (2115) and final stage (2125) is provided with a corresponding dynamic power source (2130) and (2140) respectively, each of them being, in turn, powered by supply voltages (2135) and (2145) respectively. The power sources (2130, 2140) can be variable voltage sources (e.g. a DC-DC converter) or variable current sources, and are controlled via control signals fed to corresponding input controls (2132, 2142) respectively.

A possible circuital connection between the amplifier stage (e.g. a driver stage or a final stage) and the dynamic power source is shown in FIG. 1, wherein a variable power supply provides bias power to the drain of the output transistor as well as to the gates $ETG_2$ and $ETG_3$ of the stacked transistors via a ladder resistor network. FIG. 8A shows another possible configuration of the amplifier stage wherein the biasing of the gates can be done through external supplies fed to the various gates. In both configurations, biasing for the gate of the input transistor may be done through $ETG_1$. A control signal (ctrl) to the variable power supply is used to dynamically adjust its output power level such as the output power level varies as a function of time.

Going back to FIG. 20, control signals fed to inputs (2132, 2142) can be used to set corresponding amplifier stages (2115, 2125) to independently operate in ET or non-ET modes. For example, in one embodiment, to set an amplifier stage to a non-ET mode, a fixed static control voltage is used to set a fixed supply to the amplifier stage, whereas a control voltage representing the envelope signal of the $RF_{in}$ signal is fed to the amplifier stage when an ET mode of operation is desired. A person of ordinary skill in the art will understand that this flexibility of controlling the power sources (2130, 2140) via control signals (2132, 2142), allows for dynamic switching between the two operational modes of a given amplifier stage (2115, 2125), given a corresponding control signal (2132, 2142) which dynamically switches between a static level and one representing the envelope signal. More such embodiments to control the amplifier's operation between these two modes are described in later paragraphs. It should be noted that the bias voltage of the cascodes can also be switched between operations in ET and non-ET modes.

Furthermore, and as depicted in FIG. 20, by virtue of its switchable feedback network (2100) and the tunable matching network (2120) at its output stage, the configuration of amplifier (2115) provides the added advantage over the configuration of amplifier (2125) of allowing further control of the amplifier's (2115) overall response based on the mode of operation (ET or non-ET).

As previously noted, control signals for input controls (2132, 2142) can be generated within a transceiver unit, which typically generates the modulated RF input signal to the amplifier arrangement at input terminal (2105), and thus has full knowledge of the input data used to generate the RF signal. As such, the transceiver unit can be fitted with dedicated circuitry and lookup tables suitable to generate the desired control signals not only for the supply voltages (e.g. gates and drain bias supplies) but also for controlling the switch unit (2112) via input control (2102) and the tunable matching network unit (2120) via input control (2103). For example, when a control signal to input (2132) dictates an ET operational mode for the amplifier unit (2115), the transceiver unit concurrently generates a control signal (2102) to the switch unit (2112) to open the switch and a control signal (2103) to tunable matching network unit (2120) to optimize impedance matching between input stage to amplifier unit (2125) and output stage of amplifier unit (2115) when in ET mode. Alternatively, when control signal to input (2132) dictates a non-ET operational mode, control signals to close the switch unit (2112) and to set the tunable matching network unit (2120) for non-ET impedance matching are concurrently generated by such transceiver unit. In this case, the feedback network (2100) and tunable matching network unit (2120) determine the response of the amplifier. Furthermore, and as previously mentioned, gate bias supplies to various transistors within the stack may additionally be adjusted, by same controller unit, to control amplifier's response in either modes of operation.

The person skilled in the art will understand that a transceiver unit is just one example of a controller capable of performing the task of configuration control for elements (2112, 2115, 2120) of FIG. 20. In general, any controller with sufficient processing power and with access to the RF input signal or corresponding baseband data is able to perform such task. The person skilled in the art may find other possible implementations for this task, using simple logic gates and/or more complex arrangements including CPLDs and FPGAs.

While the control signal used to control the output level of the variable power supply can steer a corresponding amplifier stage to operate in a desired region, due to limitations discussed earlier when operating in an ET mode, exclusive operation in more efficient compression region is not always possible as there will be instances where the input RF power level is smaller than the supply power level, since latter is bounded by the minimum preset level, causing the amplifier to operate in the non-compression (linear) region.

As such, the control signal fed to input (2132) of the variable power supply unit (2130) defines the operational strategy of the amplifier unit (2115) with respect to the input $RF_{in}$ signal fed to input (2105). In other words, the switching of the amplifier unit (2115) between operating in the compression and linear regions is not only function of the input control (2132), but also function of input $RF_{in}$ signal (2105). That is, when operating in the ET mode, for a given power level of the $RF_{in}$ signal (2105) at a given instance, compression occurs if such power is larger than the dynamic power supplied to the amplifier unit (2115), thus causing the amplifier to operate in the compression region. Alternatively, when power level of the $RF_{in}$ signal (2105) is below the threshold set by the variable power supply, compression does not occur and amplifier (2115) operates in the linear region. As previously mentioned, this switching of the amplifier operation from one region to the other is dependent on the modulation scheme used to generate the input RF signal and becomes more pronounced in cases where modulation schemes with high peak-to-average power ratio are used.

Considering the embodiment of FIG. 20, when amplifier unit (2115) is operating in an ET mode, a controller which at any given instant in time is aware of both the dynamic supply power level (e.g. via the corresponding control signal (2132)) and the $RF_{in}$ power level being fed to the amplifier unit (2115), can predict when switching between operation in the compression region and the linear region occurs for amplifier unit (2115). Therefore, such controller can generate timely control signals (2102, 2103) to dynamically configure amplifier stage via feedback network (2100) and tunable matching network (2120) for optimal operation, and thus reducing the undesired effects due to the change of the region of operation of the amplifier and as described in previous sections. In this case the switching and therefore associated controls may be provided to operate at speeds equivalent (or higher) to the modulation carrier frequency used to generate the $RF_{in}$ signal so to be able to react quickly and therefore reduce the time in which the amplifier is not optimized (e.g. amplifier operating in linear region and feedback network not switched in). This is in contrast to the switching between ET and non-ET modes described previously and for which a static control signal may be used as switching speed is not relevant. Under supervision of the same controller, adjustments to the gates bias supplies of the various transistors within the stack for controlling output linearity of the amplifier stage when operating in each region is also possible (e.g. FIGS. 8A, 30).

The above changes in amplifier configuration and various adjustments affecting its operation may engender some undesired effects measurable at the output signal of the amplifier. In one embodiment, these undesired effects may be further controlled by pre-distortion (e.g. phase, amplitude) of the input RF signal to the amplifier stage, in a manner to compensate for these effects. Simulation results may be used to create lookup tables which may be subsequently used by the controller during operation. These lookup tables may include mapping of the various changes and adjustments to pre-distortion coefficients to be applied to the input RF signal. FIG. 30 shows an exemplary system configuration for proposed embodiment, wherein a transceiver is used as main controller.

Although FIG. 20 shows a particular arrangement of the driver stage (2115), the final stage (2125) and the feedback network (2100), it should be noted that alternative arrangements could also be implemented, as depicted by FIGS. 21-25.

In a similar manner and as depicted in FIG. 21, a feedback network (2100) can also be implemented to optimize response of the final stage (2125) when operated in the linear region. In this case the feedback network (2100) is optimized based on the electrical characteristics of the amplifier (2125), which may be different from the characteristics of amplifier (2115).

FIG. 23 depicts an embodiment wherein both amplifiers (2115, 2125) are fitted each with a feedback network (2100, 2100a) selected to optimize response of each amplifier when operating in the linear region. In this case, feedback network (2100) is used to optimize response of amplifier (2115) and feedback network (2100a) is used to optimize response of amplifier (2125). Each of the feedback networks can independently be switched in and out using the dedicated switch control signals (2102, 2102a) which control the state of the switches (2112, 2112a). This configuration allows the flexibility to independently operate each amplifier in ET mode or non-ET mode, as well as optimizing operation of each amplifier when operating in their respective regions. Tunable matching network (2120) with associated control signal (2103) are used for matching output stage impedance of the arrangement composed by (2115, 2100) with the input impedance of the following stage composed of (2125, 2100a) for optimum power transfer between the two stages irrespective of their operating regions. To be noted that in this configuration the second amplifier (2125) is also fitted with a tunable matching network (2120a) at its output. Under control of (2103a) this network can be tuned for optimum power transfer between the arrangement composed of (2125, 2100a) and the subsequent stage not shown in the figure (e.g. antenna). Although not shown explicitly in the figure, controls (2132, 2142) may also be used to adjust various gate biases as needed.

Figure 22:
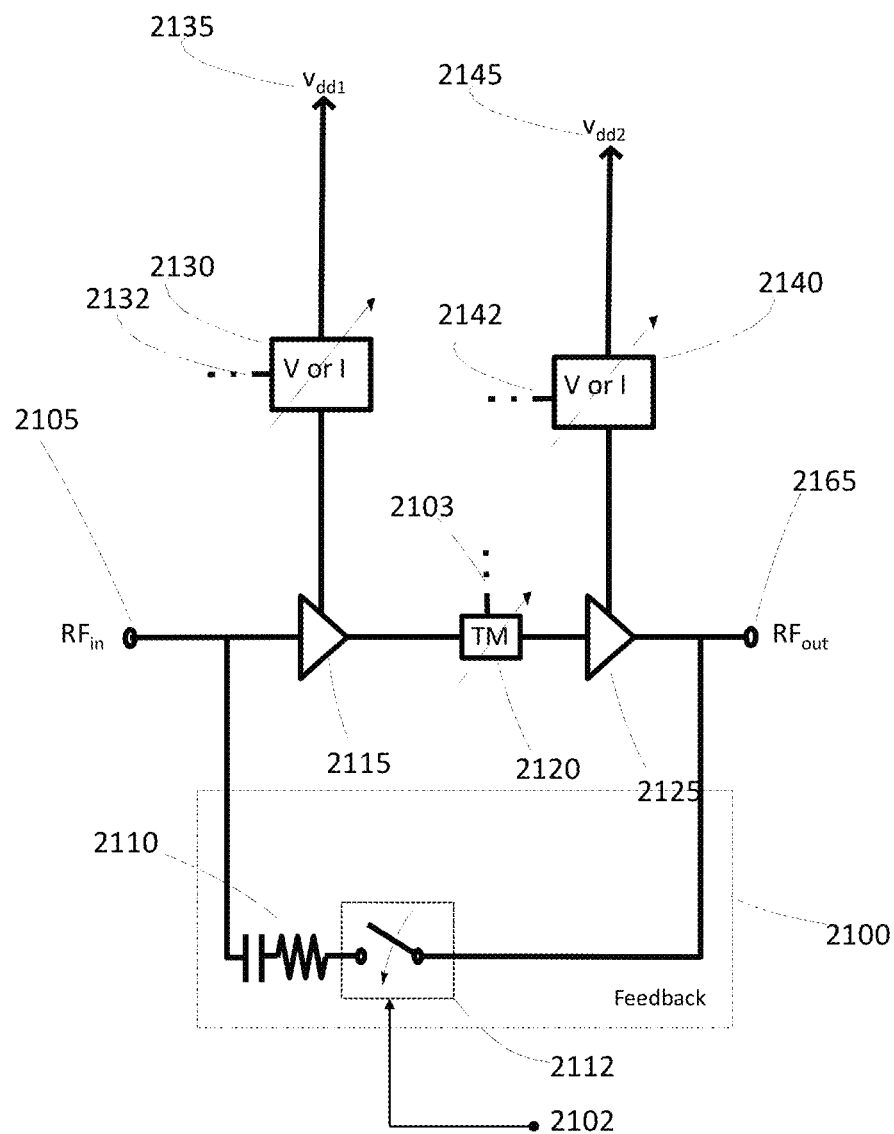

In yet another embodiment and as depicted by FIG. 22, a feedback network (2100) is used to create a single feedback loop around the combination of amplifiers (2115, 2125) and tunable matching network (2120) to again optimize overall response (e.g. linearity, phase, gain, stability) of corresponding arrangement when operated in the linear region.

Furthermore, although two amplifiers are currently shown in FIGS. 20-23, it is also possible to use more than two amplifiers such as in cases where the arrangement, for example, contains a pre-driver stage, a driver stage and a final stage.

In FIGS. 20-23, a tunable matching network (2120) is connected between the driver stage (2115) and the final stage (2125). It should be noted that the tunable matching network (2120) need not necessarily be present only in the arrangement as shown in these figures. As such, it is possible that other embodiments place the tunable matching network before the driver stage (2115) or after the final stage (2125) (e.g. FIG. 23). Furthermore, there may be embodiments where multiple tunable matching networks, each with dedicated control input, can be used in-between stages, with the main goal of adaptive impedance matching amongst stages subjected to mode/region changes and/or for modifying the load lines of the amplifier stage and thus controlling gain (e.g. $G_{voltage} \approx g_m \times R_{Load}$).

In the above embodiments a switch unit is used to activate or de-activate a feedback loop around an amplifier stage with the overall goal of controlling differences in the amplifier's response function when the amplifier's region of operation changes from linear to compression. Additionally, it was noted that in a two stage configuration (e.g. a driver stage followed by a final stage), the first stage amplifier gain when operating in the linear region (feedback network is engaged) can be selected such as to reduce the switching of the final stage to the linear region, thus increasing the time the final stage operates in the more efficient compression region.

Figure 25:
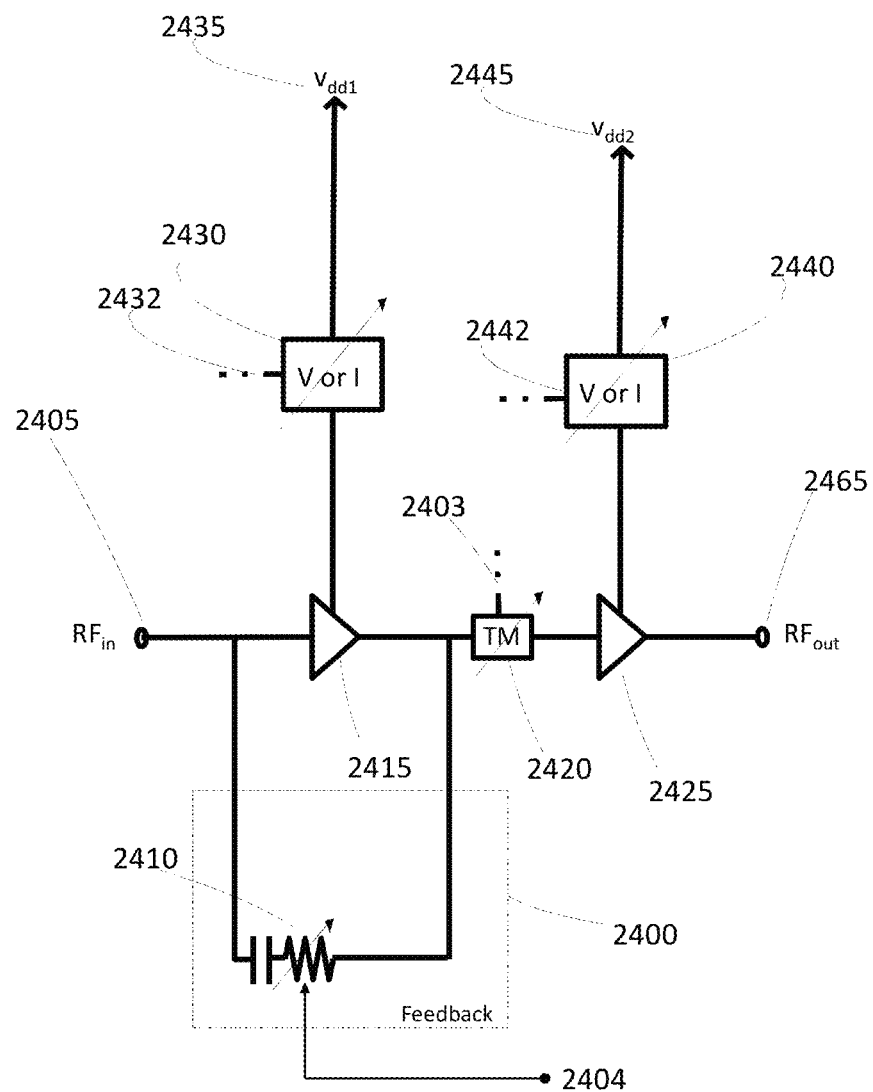
FIG. 25 shows an embodiment where a variable feedback resistor is used for further flexibility in tuning the feedback network. In particular, instead of using a switch as depicted in FIGS. 21-22 and FIG. 24, the variable resistor can be used to reduce the effect of the feedback network by being set at a high value.

In yet another embodiment of the present disclosure, as shown in FIG. 25, the feedback network (2400) includes a variable resistor (2410) which value can be controlled using a control signal fed to the input control terminal (2404). Here, instead of having the feedback network (2400) included or excluded in the feedback path to the driver (2415) by a controlled switch unit, the variable feedback resistor's (2410) value is controlled in order to adjust the response of the driver stage (2415) when operating in each region. For example, when operating in the linear region, the resistance value may vary within a first range suitable for a lower gain of the amplifier stage, and when operating in the compression region the resistance value may vary within a second range suitable for a higher gain of the stage. Resistance value of this resistor may either be continuously variable or variable in discrete steps under control of (2404). This embodiment allows for all the benefits of the prior embodiments, with the added benefit of fine tuning the amplifier gain via incremental resistor changes. Additionally, this embodiment allows for smooth transition between the two regions by gradually varying the resistance value (e.g. from a high value when in the compression region to a low value when in the linear region) and thus removing possibility of glitches and other related undesired effects arising from an abrupt change of the feedback configuration. Finally, this feature can also be advantageous when the amplifier is subjected to different input RF modulation schemes, each requiring a different first stage gain in order to improve efficiency of the final stage (so increase operation time in the compression region).

The person skilled in the art will know that the feedback function or variable gain function can be realized in various ways. For example, the feedback can be in the form of a shunt resistor from the source of the input device to ground (degeneration), or a variable gain amplifier topology, many of which are common in the industry. The feedback can be switched, variable, or variable and switched.

Figure 33:
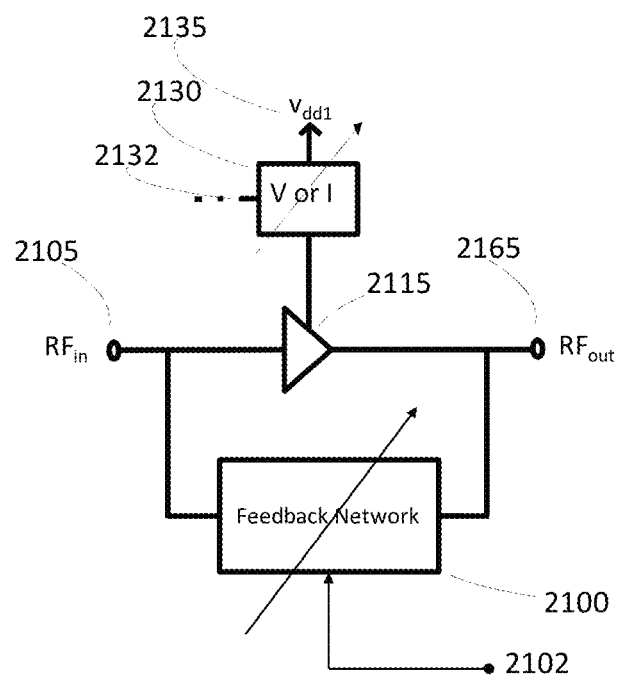
FIG. 33 shows an embodiment of the present disclosure for a tunable feedback network.

It should be noted that although the inventors have discussed a "feedback network" as a means to optimize and adapt gain/response of an amplifier stage when switching between regions of operation (e.g. linear region vs. compression region), for the sake of simplicity and not by limitation of the embodiments, all figures show the feedback network as an RC series network with the addition, in some cases, of a switch. A person skilled in the art will understand that the presented embodiments allow for various types of feedback networks, whether tunable or fixed and/or using active or passive elements, to be used, based on the desired overall response of the corresponding amplifier stage and governed by known amplifier feedback design techniques. Tuning of such a feedback network is merely limited by the elements comprised in the network and can be easily adapted for given the built-in intelligence in the controller. FIG. 33 shows an embodiment of the present disclosure for a tunable feedback network.

Figure 31:
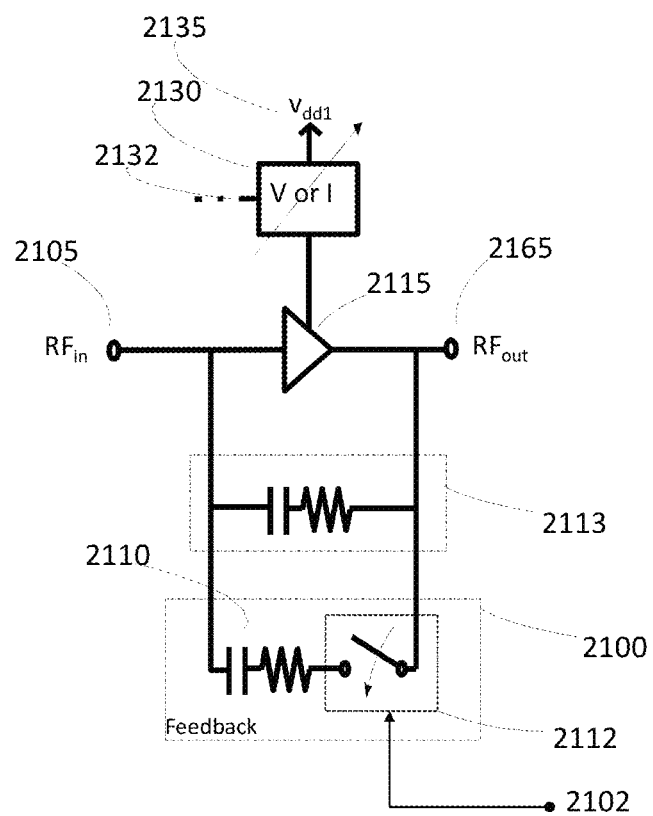
FIG. 31 shows an alternative embodiment with a fixed feedback loop in addition to the switchable feedback network.
Figure 32:
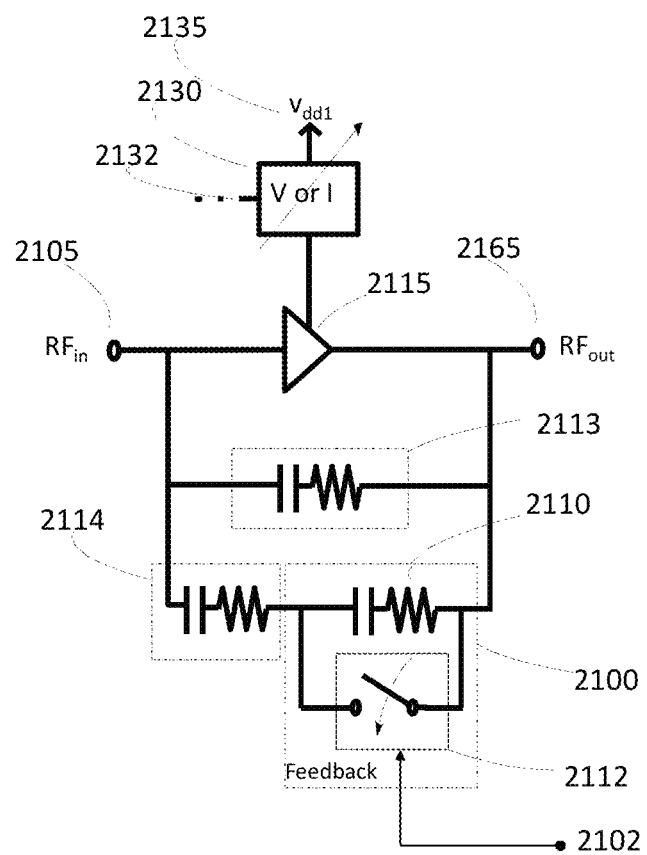
FIG. 32 shows an alternative embodiment with a fixed feedback loop and a switchable feedback network with an additional network in series.

Furthermore, it should also be noted that although FIGS. 20-23 and FIG. 24 do not show a feedback loop (e.g. open loop) when the amplifier is in ET mode or when it operates within the compression region, in practice however, the implementation may include some active feedback components around the amplifier, whether specifically dictated by design requirements or due to parasitic effects at operating frequencies (e.g. due to corresponding circuit layout). The embodiment presented in FIG. 25 provides a fixed active feedback path and the adjustable variable resistor (2410) may be used in any mode or region of operation to control the response of the amplifier arrangement. FIGS. 31-32 show other possible embodiments.

In FIG. 31, the first stage arrangement of FIG. 20 is shown with the addition of a fixed feedback loop (2113), which may be contributed to parasitic effects as discussed earlier. When the amplifier unit (2115) operates in the linear region, the feedback network (2100) is switched in (switch (2112) close) and thus the overall feedback network around the amplifier stage becomes the equivalent network comprised of the two networks (2100, 2113) put in parallel. Design implementation will therefore take into account contribution of network (2113).

In FIG. 32, in addition to the fixed network (2113) of FIG. 31, an additional network (2114) is shown. Network (2114) can be a design requirement for the case where the amplifier unit (2115) operates in the compression region. When operating in the compression region, the switch (2112) is closed, thus reducing feedback network (2100) to a low resistance resistor (equivalent circuit of the closed switch). In this case, the effective feedback network around the amplifier unit (2115) can be approximated by the equivalent network comprised of the two networks (2113, 2114) in parallel. When the amplifier (2115) operates in the linear region, the network (2100) is inserted in the feedback loop by opening the switch (2112). In this case the effective feedback network around the amplifier unit (2115) becomes the equivalent network comprised of the two networks (2100, 2114) in series, in parallel with the network (2113). Here again, well known amplifier feedback design techniques can be used to derive the component values for each of the networks, once the parasitic network (2113) is identified. It should be noted that in the case of the FIG. 32, for operation in the linear region the switch (2112) needs to be open, and not close as it was the case in all other design examples.

As previously discussed, the term "ET" mode can refer to the mode of operation where one or more bias voltages or bias currents are varied as a function of an envelope signal. Such mode can be used to cause the envelope tracking amplifier to operate in a compression region thereby increasing amplifier efficiency. Also, the term "non-ET" mode can refer to the mode of operation where no bias voltages and no bias currents are varied (e.g. as a function of an envelope signal). Such mode can be used to cause the envelope tracking amplifier to operate in a linear region.

Going back to FIG. 1, it shows an example embodiment according to the present disclosure of an envelope tracking amplifier (100) capable of adapting between ET mode and non-ET mode. The ETPS (180) of FIG. 1 is influenced by a control signal ctrl (190) generated externally from the envelope tracking amplifier (100). The control signal ctrl (190) provides a time-varying envelope signal to the ETPS (180), which may indicate a desired mode of operation (ET mode or non-ET mode). Based on the control signal ctrl (190), the ETPS (180) provides to the stack of FETs a corresponding power (envelope tracking/variable power supply or a non-envelope tracking/constant power supply). Although control signal ctrl (190) appears to provide input only to ETPS (180), implementations could also include related signals from control signal ctrl (190) to provide appropriate secondary control signals to related switches and tunable elements within an envelope-tracking amplifier arrangement and to related switches and tunable elements externally connected to the envelope tracking amplifier arrangement to appropriately configure the overall behavior of one or more envelope-tracking amplifiers (or configure an envelope tracking embodiment) to operate in a desired mode of operation (ET or non-ET mode). Furthermore, although the control signal, as depicted in FIG. 1, is generated externally from the envelope tracking amplifier (100), other embodiments could incorporate methods or implementations where such control signals can be generated within the envelope tracking amplifier (100).

In one embodiment, the amplifier system would be switched from ET mode to non-ET mode of operation when the input and thus output power level drops to a point that the power consumption in the ETPS is more than the power it saves. As an example, the amplifier may operate in ET mode from the maximum average output power down to the maximum average power −10 dB. At that time the ETPS would be switched off, bypassed, or switched to an average power tracking mode, (average power tracking mode is one where a DC-DC converter slowly follows the average power of the amplifier and an analog error amp would not be required). The non-ET mode would be used at this power and all lower power levels. The example of Pmax-10 dB is an example. The actual value depends on the system optimization, including amplifier efficiency with and without ET and the power consumption of the ETPS.

A transceiver can be such an example of a source that could be used to provide control signals to the envelope tracking amplifier (100) indicating a desired mode of operation and thereby configure the envelope tracking amplifier (100) to adapt to the desired mode of operation. The transceiver used to provide an input signal to the envelope tracking amplifier (100) could know a desired mode of operation for a particular input signal being provided. Thus an embodiment could be imagined where the transceiver also provides control signals to the ETPS and/or related switches and tunable elements of an embodiment to configure the embodiment to operate accordingly.

Figure 34:
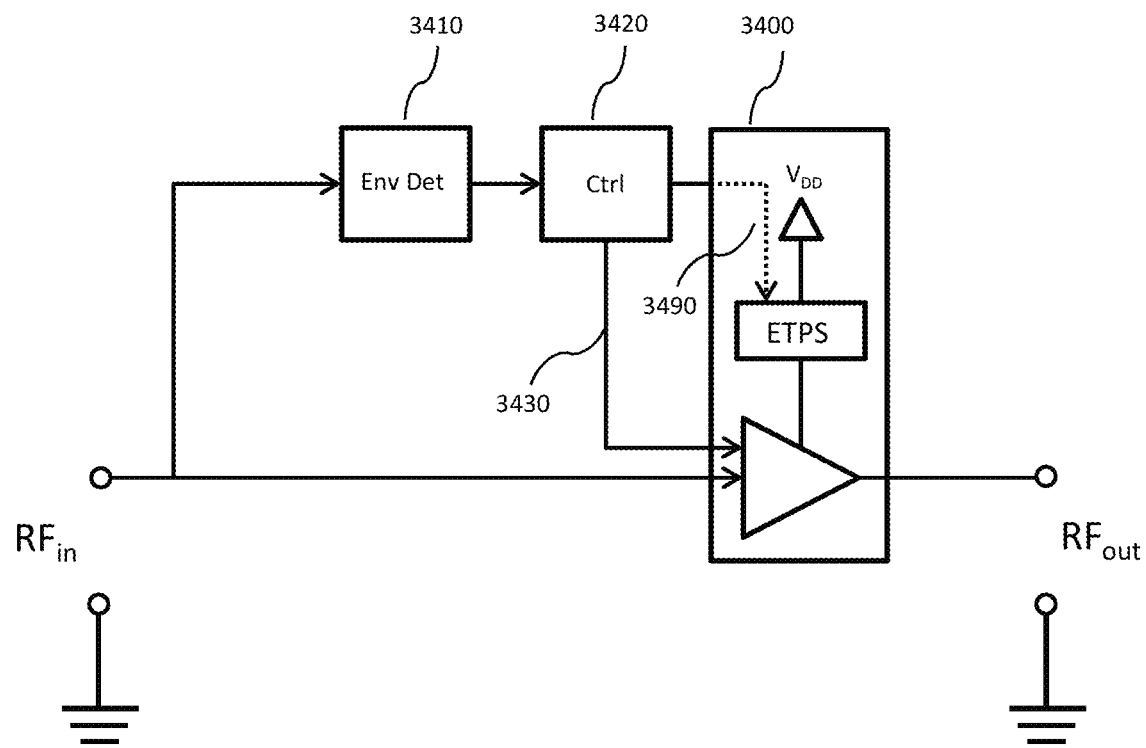
FIG. 34 shows an example embodiment according to the present disclosure with an envelope tracking amplifier (e.g. the envelope tracking amplifier shown in FIG. 1 or 8), an envelope detector and a control unit.

FIG. 34 shows an example embodiment according to the present disclosure comprising an envelope tracking amplifier (3400) (e.g. the envelope tracking amplifier (100) shown in FIG. 1), an envelope detector (3410) and a control unit (3420). The envelope detector (3410) can comprise the implementation shown in FIG. 2 or can be implemented in any manner that is within the capability of a person skilled in the art. An input signal (e.g. an RF signal) can be fed to both to the input port of the envelope tracking amplifier (3400) as well as the envelope detector (3410). The envelope signal from the envelope detector (3410) can be fed to the control unit (3420). The control unit (3420) can produce the control signal (3490) based on the envelope signal from the envelope detector (3410). As discussed above, the control signal ctrl (190) of FIG. 1 is used to indicate to the ETPS (180) of FIG. 1 what type of power (variable supply power or constant supply power) to provide to the stack of FETs given a desired mode of operation (envelope tracking or non-envelope tracking). The control signal (3490) of FIG. 34, generated by the control unit (3420) can be an example of an external generator of the control signal ctrl (190) of FIG. 1. Additionally, a baseband signal, such as an in-phase and quadrature phase Cartesian representation, can also be used to create the envelope signal. In an alternative embodiment, the envelope signal is fed directly to the envelope tracking amplifier (3400), in particular to the ETPS (180) and used as the control signal (3490).

Furthermore, the control unit (3420) can also provide one or more secondary control signals (3430) to other components (e.g. a configuration arrangement comprising switches and/or tunable elements such as tunable resistors and tunable capacitors) within the envelope tracking amplifier (3400). The one or more secondary control signals (3430) can configure one or more switches and/or one or more tunable components within the envelope tracking amplifier (3400) described below such that the one or more switches and/or one or more tunable components are adapted to operate according to the desired mode of operation.

As stated above, other devices external to the envelope tracking amplifier can provide one or more control signals to the ETPS (180) and/or related switches and tunable elements. For example, a transceiver can be used to provide an input signal to the envelope tracking amplifier. Since the transceiver would know what is being provided to the envelope tracking amplifier, the transceiver could also provide an indication (either through an envelope signal and/or control signal) to the ETPS (180) and/or related switches and tunable elements to configure the envelope tracking amplifier to operate in a desired mode of operation (ET mode or non-ET mode) adapted for the input signal provided.

The envelope tracking amplifier (100, 800) shown in FIGS. 1 and 8 can both be connected to additional circuitry that is configured to enable an amplifier arrangement comprising the envelope tracking amplifier to adapt between operation in an ET mode or in a non-ET mode. By way of example, and not of limitation, the additional circuitry can comprise one or more switches, one or more passive elements (e.g. resistors or capacitors), one or more active elements (e.g. one or more FETs or amplifiers), or some combination thereof. Furthermore, secondary control signals (3430) discussed above, different from the control signal (3490), can be generated to configure other elements besides the ETPS (180) influencing, thereby assisting the envelope tracking amplifier to adapt between operation in the ET mode or in the non-ET mode. Numerous embodiments comprising an envelope tracking amplifier (such as the envelope tracking amplifiers (100, 800) shown in FIG. 1 or 8) connected to additional circuitry that provides additional functionality are presented below.

As stated above, it is desirable to have an envelope tracking amplifier be configurable to operate between operating in ET and non-ET mode. In such situations the envelope tracking amplifier (such as the envelope tracking amplifier (100) of FIG. 1) can be configured to adapt between ET mode and non-ET mode by adjusting the dynamic bias voltages applied to the gate and drain of the stack of FETs ($ET_{RD3}$ and $ET_{DR}$). For example, for non-ET mode, the envelope tracking amplifier (100) of FIG. 1 can have the second dynamic bias voltage $ET_{DR}$ be held at a fixed value. Furthermore, fixed gate bias voltages $ET_{G1}$, $ET_{G2}$ and $ET_{G3}$ are also provided to the gate bias terminals. It should be noted that selection of dynamic bias voltages to operate an envelope tracking amplifier in the non-ET mode described in this paragraph may also be applied to envelope tracking amplifiers comprising a number of stacked transistors other than three. It should also be noted that embodiments, within the scope of the present disclosure, could be implemented where the DC gate bias voltage stays the same or changes when the mode of the envelope tracking amplifier is switched. Furthermore, the decision to change or maintain the DC gate bias voltage can be made in conjunction with or separate from the state of a tunable matching network based on an indicated mode of operation. A person skilled in the art will not require further explanation or diagrams to understand such embodiments.

In some other embodiments switching between other modes, not just ET and non-ET may be desired. This may include such modes as polar, ET, envelope following, and fixed supply.

Figure 35:
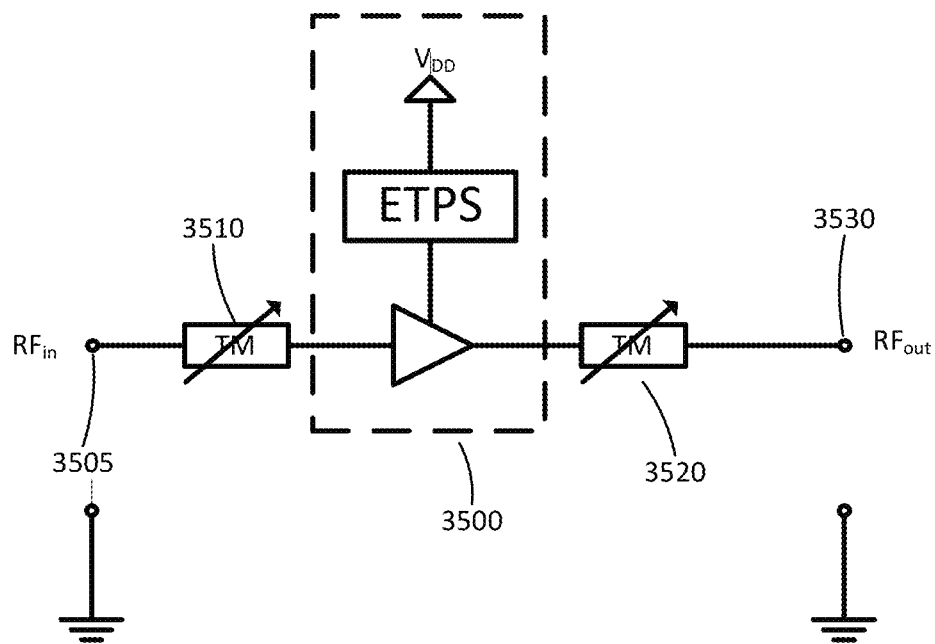
FIGS. 35, 36 and 37 show different embodiments according to the present disclosure used to configure an envelope tracking amplifier between ET and non ET mode.
Figure 36:
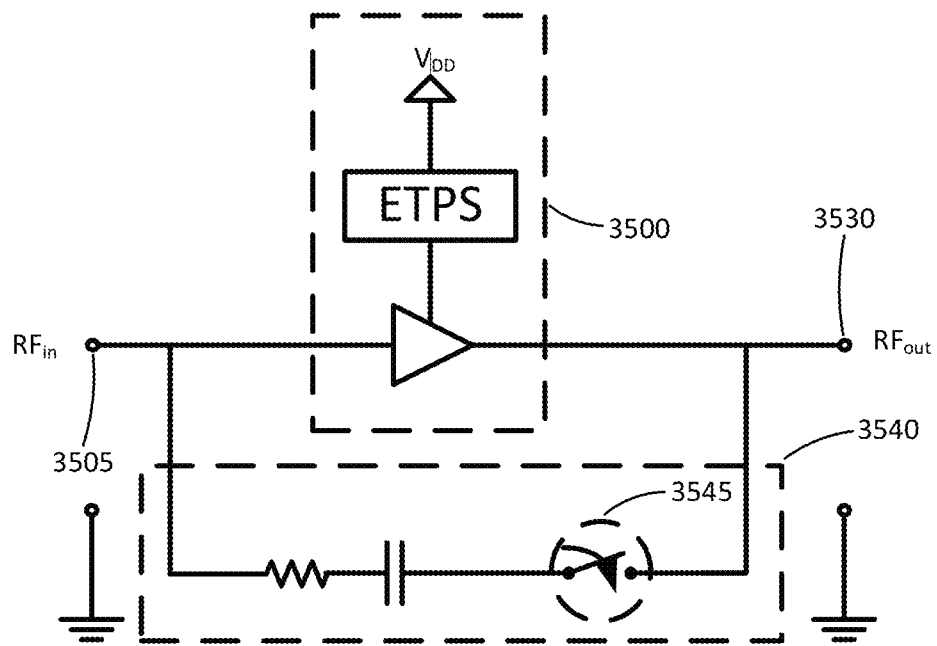
Figure 37:
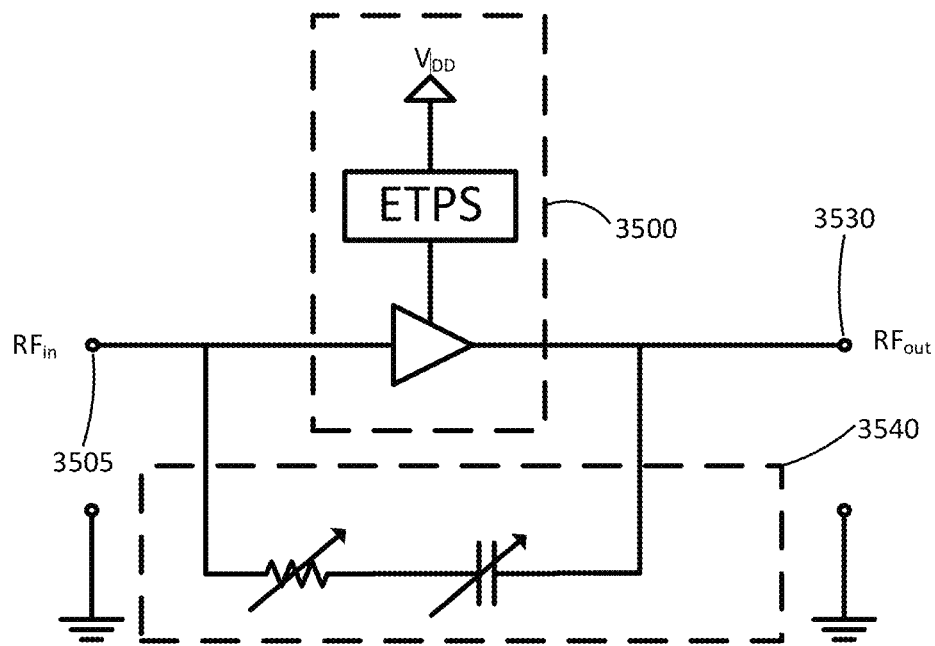

FIGS. 35-37 show different embodiments according to the present disclosure used to configure an envelope tracking amplifier (3500) between operation in ET and non-ET mode. FIG. 35 utilizes an input tunable matching network (3510) and an output tunable matching network (3520). The input tunable matching network (3510) can be tuned to provide impedance matching between an input terminal (3505) and an input of the envelope tracking amplifier (3500). The output tunable matching network (3520) can be tuned to provide impedance matching between an output terminal (3530) and an output of the envelope tracking amplifier (3500). Either or both of the tunable matching networks can be tuned appropriately, based on an envelope signal, depending on whether the ET mode or the non-ET mode of operation is desired for the envelope tracking amplifier (3500) as each mode of operation could desire a different type of impedance matching. This is the case as it is possible that the network, between ET mode and non-ET mode, each have a different optimal match.

FIGS. 36 and 37 utilize a resistor-capacitor feedback loop (3540) to configure the envelope tracking amplifier (3500) between operation in ET and non-ET mode. In FIG. 36, a resistor-capacitor feedback loop (3540) is shown whereby a feedback switch (3545) controls when the resistor-capacitor feedback loop (3540) is used. Depending on the desired mode of operation, the feedback switch (3545) can be open or closed to disable or enable, respectively, the use of the resistor-capacitor feedback loop (3540). The resistor-capacitor feedback loop (3540) can be used to adjust the gain of the envelope tracking amplifier (3500) based on a desired mode of operation Alternatively, FIG. 37 shows another resistor-capacitor feedback loop (3540) except that in this embodiment the resistor and capacitor elements are tunable. Depending on the desired mode of operation, the resistor and capacitor elements of the resistor-capacitor feedback loop (3540) can be tuned to configure the envelope tracking amplifier (3500) to operate in ET or non-ET mode.

Generally speaking, embodiments comprising a plurality of amplifiers that are operatively connected in cascade, where one or more of the amplifiers are envelope tracking amplifiers, configured to switch between the ET mode and the non-ET mode, can be accommodated by using one or more switches to selectively include or bypass one or more amplifiers from among the plurality of amplifiers. When operating in the ET mode, appropriate operation of the switches can increase the total number of amplifiers present in a signal amplification path. Conversely, when operating in the non-ET mode, appropriate operation of the switches can decrease the total number of amplifiers present in the signal amplification path. The term "signal amplification path" can refer to a path which an input signal flows through while being amplified by successive amplifiers operating in cascade. Numerous embodiments that operate by using switches to selectively include or omit one or more amplifiers in the signal amplification path are possible, two of which will be described below. Implementations of such embodiments are alternative ways to configure a particular embodiment to operate according to a desired mode of operation (ET or non-ET mode).

Figure 38:
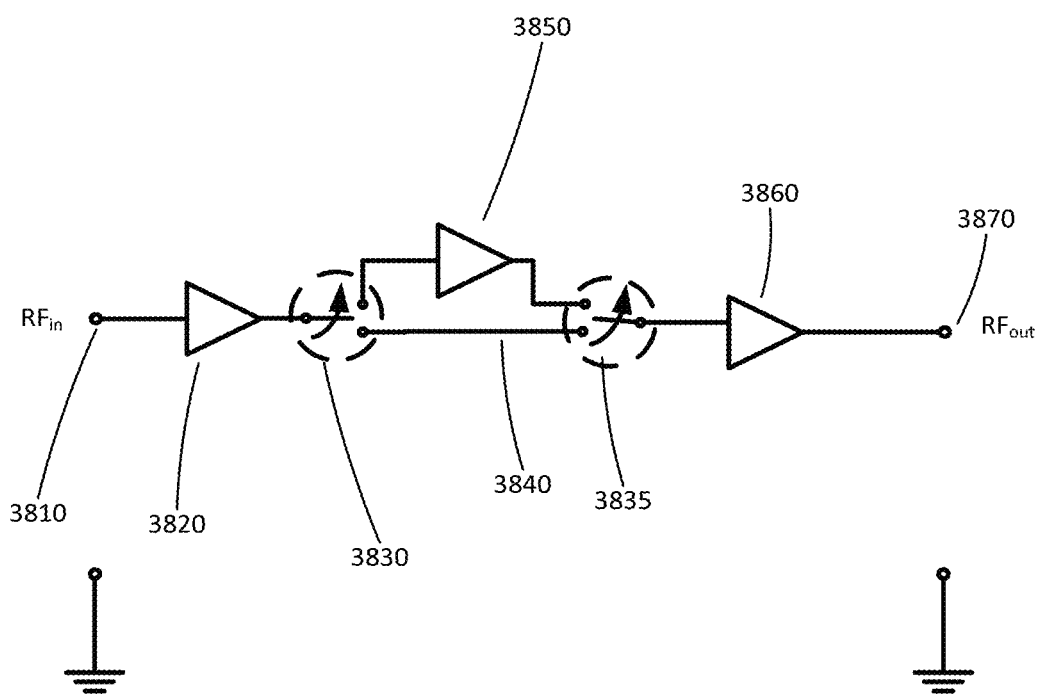
FIG. 38 shows an embodiment according to the present disclosure with an input terminal, a first amplifier, a first switch, a second amplifier, a through circuit, a third amplifier, a second switch and an output terminal.

FIG. 38 shows an embodiment according to the present disclosure that can be used to configure a plurality of amplifiers to adapt between operating in ET and non-ET mode. The embodiment of FIG. 38 comprises an input terminal (3810), a first amplifier (3820), a first switch (3830), a second amplifier (3850), a through circuit (3840), a third amplifier (3860), a second switch (3835) and an output terminal (3870). An input port can comprise the input terminal (3810) and ground, while an output port can comprise the output terminal (3870) and ground. In the embodiment shown in FIG. 38, one or more of the amplifiers (3820, 3850, 3860) can be an envelope tracking amplifier such as the envelope tracking amplifier (100) shown in FIG. 1 or the envelope tracking amplifiers 800, 800A shown in FIG. 8A and FIG. 8B. The first switch (3830) can be operated to select either the second amplifier (3850) or the through circuit (3840). The second switch (3835) would be enabled at the same time to follow the selection of the first switch (3830) so that one path is chosen while the other path is completely removed. For operation in the non-ET mode, the first and second switches (3830, 3835) can be operated to select the through circuit (3840), allowing signal flow from the input terminal (3810) to the output terminal (3870) to bypass the second amplifier (3850). For operation in the ET mode where a higher gain may be required to keep the amp in compression and/or compensate for the reduced gain when in compression, the first and second switches (3830, 3835, respectively) can be operated to select the second amplifier (3850), thereby including all three amplifiers (3820, 3850, 3860) in a signal amplification path that begins at the input terminal (3810) and ends at the output terminal (3870) where such signal amplification path is configured to operate for ET mode.

Alternatively, a second through path can be added to the embodiment shown in FIG. 38 to allow an input signal to be routed through the first amplifier (3820) or bypass the first amplifier (3820) in addition to features already described that allow inclusion or bypassing of the second amplifier (3850) as described above. In other embodiments, the first and second switches (3830, 3835) and the through path (3840) are applied only to the first amplifier (3820) such that only the first amplifier (3820) can be included or bypassed, depending on switch operation. Additional embodiments include a switch and a through path that are connected to the third amplifier (3860) in a similar manner that allows the third amplifier (3860) to be bypassed depending on the mode of operation, either alone or in combination with features previously described that allow inclusion of or bypassing of the first amplifier (3820) and the second amplifier (3850). Alternative embodiments comprise two, four, or more amplifiers. Such alternative embodiments may be configured to allow including or bypassing one or more of the amplifiers depending on operation of one or more corresponding switches. A person skilled in the art will not require further explanation or diagrams to understand such embodiments.

Figure 39:
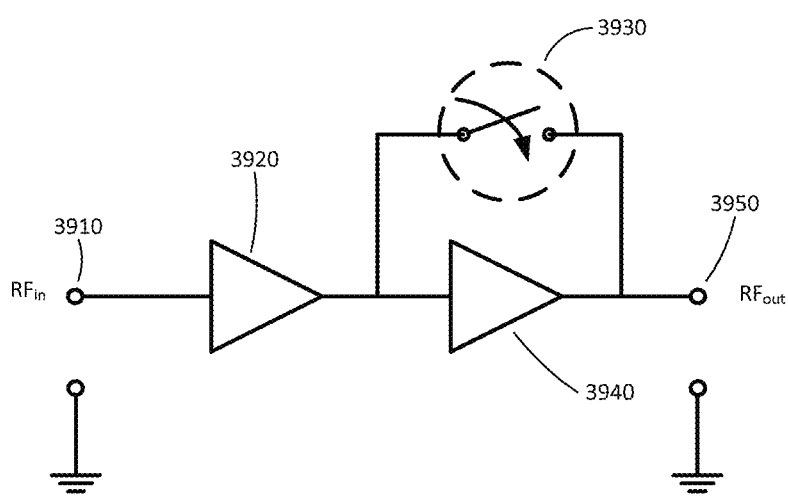
FIG. 39 shows an embodiment according to the present disclosure with an input terminal, a first amplifier, a second amplifier, a path with a switch, and an output terminal.

FIG. 39 shows another embodiment that can be used to configure an operation of an amplifier between ET mode and non-ET mode. In particular, FIG. 39 shows an input terminal (3910), a first amplifier (3920), a second amplifier (3940), a path with a switch (3930), and an output terminal (3950). Either or both amplifiers (3920, 3940) can be envelope tracking amplifiers. For the ET mode, the switch (3930) can be opened to include the second amplifier (3940) in a signal amplification path between the input terminal (3910) and the output terminal (3950). For the non-ET mode, the switch (3930) can be closed to omit the second amplifier (3940) from the signal amplification path between the input terminal (3910) and the output terminal (3950). In addition to the aforementioned switch operation, for the non-ET mode, the second amplifier (3940) can be disabled (e.g. by switching off its power supply or by adjusting bias circuits to put the circuit in a low power standby mode).

Figure 40:
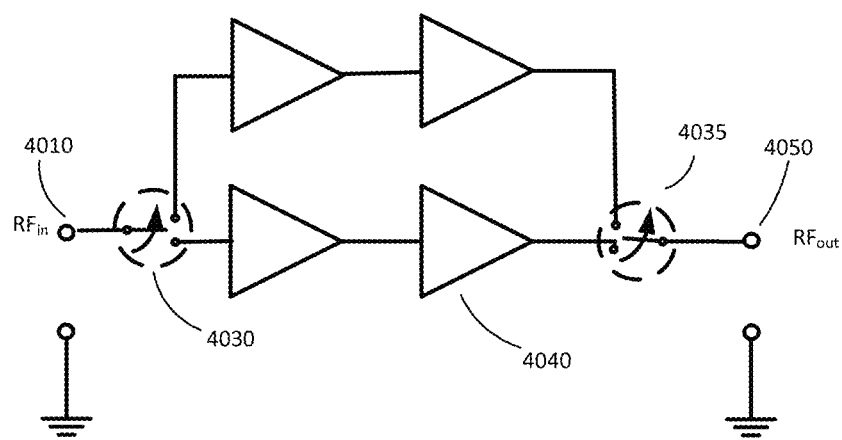
FIG. 40 shows an alternative embodiment of FIG. 39, where a switch can enable one of two different paths comprising amplifiers, each path having different amplification.

Furthermore, FIG. 40 shows an alternative embodiment to the embodiment seen in FIG. 39 comprising input terminal (4010), an output terminal (4050), a first switch (4030) and a second switch (4035) can be used to select between two possible paths wherein the two possible paths comprise one or more amplifiers (4040). The plurality amplifiers (4040) can be envelope tracking amplifiers. For ET mode (including modes such as envelope following and polar) or non-ET mode (e.g. linear operation), the first and second switches (4030, 4035) would be used to select one of the two paths, where one path could be configured for ET mode and the other path configured for non-ET mode by tuning the parameters of the one or more amplifiers belonging to a particular path. Selection of a particular path would configure the overall embodiment according to the desired mode of operation (ET or non-ET mode). In some embodiments this selection can be made based on certain operating parameters, such as input and/or desired output power level. For example, the ET path can be used at high output power levels (Pmax to Pmax−10 dB, for example), and the linear or non-ET path can be used at the lower power levels. Additionally, an input tunable matching network and/or an output tunable matching network (not shown) could be provided for one or both possible paths shown in FIG. 40. Such arrangements could be implemented in a similar manner as shown in the embodiment of FIG. 35.

Returning to FIG. 39, the path with the switch (3930) can be configured to pass a signal unaltered when the switch (3930) is closed, enabling an input signal (e.g. an RF signal) applied to the input terminal (3910) to be amplified only by the first amplifier (3920) when the switch (3930) is closed and the second amplifier (3940) is disabled. Alternatively, the path with the switch (3930) can be placed parallel to the first amplifier (3920) in order to selectively utilize or bypass the first amplifier (3920) for operation in the ET mode or the non-ET mode, respectively, together with appropriately enabling or disabling the first amplifier (3920) as previously discussed with respect to the second amplifier (3940). Other embodiments may comprise three or more amplifiers with one or more paths with switches to selectively include or omit, from a signal amplification path, one or more amplifiers in correspondence of the one or more paths with switches depending on whether the ET mode or the non-ET mode of operation is desired. Such an example of other embodiments can be seen in FIG. 40.

When switching between ET mode and the non-ET mode, a resistance value and/or a capacitance value present at a gate of any FET in a stack of FETs used in constructing an envelope tracking amplifier, except a first FET (e.g. the first FET (115) in FIG. 1) to which an input signal (e.g. an RF signal) is applied, can be configured as a function of a desired mode of operation (ET mode or non-ET mode). Numerous embodiments that operate by adjusting a resistance value and/or a capacitance value present at a gate of any FET in a stack of FETs used in constructing an envelope tracking amplifier are possible, two of which are discussed below. Also, as previously mentioned, the concept of switching between ET mode and non-ET mode can also be extended to other modes, such as polar, envelope following or other.

Figure 41:
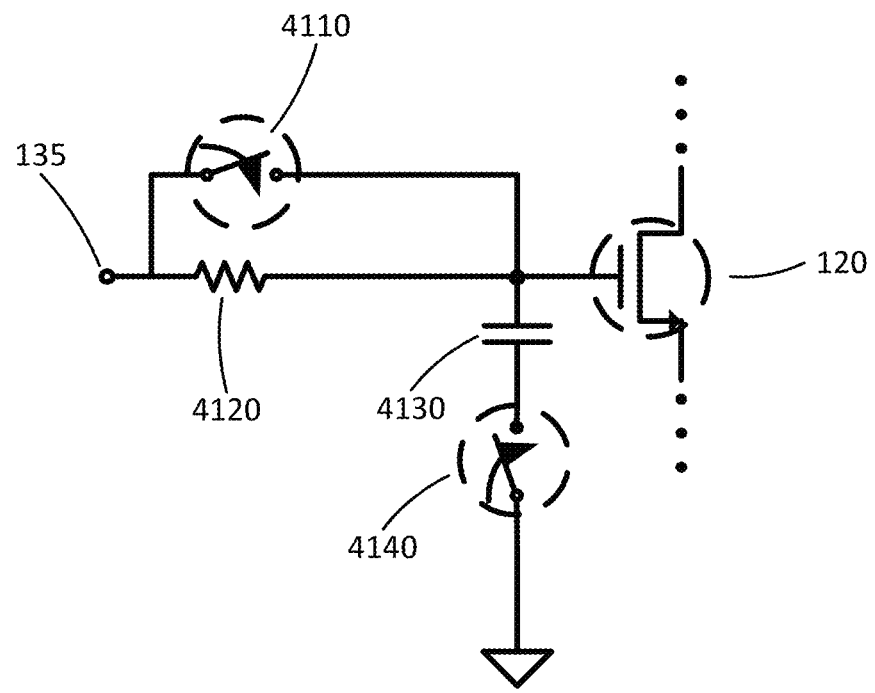
FIG. 41 shows an embodiment according to the present disclosure of a switchable gate bias network that can be connected, for example, to the second FET shown in FIG. 1.

FIG. 41 shows an embodiment according to the present disclosure of a switchable gate bias network that can be connected, for example, to the second FET (120) or the third FET (155) shown in the embodiment of FIG. 1. In the embodiment shown in FIG. 41, the switchable gate bias network comprises a gate resistor switch (4110), a gate resistor (4120), a gate capacitor (4130), and a gate capacitor switch (4140). Operation of the gate resistor switch (4110) can effectively include or omit the gate resistor (4120) in a path between the second gate bias terminal (135) and the gate of the second FET (120) of FIG. 1. Similarly, operation of the gate capacitor switch (4140) can effectively include or omit the gate capacitor (4130) in a path between the gate of the second FET (120) of FIG. 1 and ground. Operation of the gate resistor switch (4110) and the gate capacitor switch (4140) may be determined by whether the ET mode or the non-ET mode of operation of the envelope tracking amplifier (100) of FIG. 1, for example, is desired.

For the ET mode operation, as seen in FIG. 41, the gate resistor switch (4110) can be closed, thereby providing a low resistance path that bypasses the gate resistor (4120), effectively removing the gate resistor (4120) from the path between the second gate bias terminal (135) and the gate of the second FET (120) of FIG. 1. For the non-ET mode operation, the gate resistor switch (4110) can be opened, effectively including the gate resistor (4120) in the path between the gate bias terminal (135) and the gate of the second FET (120) of FIG. 1. For the non-ET mode operation, the gate capacitor switch (4140) can be closed, effectively including the gate capacitor (4130) in the path between the gate of the second FET (120) and ground of FIG. 1. For the ET mode operation, the gate capacitor switch (4140) can be opened, effectively removing the gate capacitor (4130) from the path between the gate of the second FET (120) and ground of FIG. 1. The above description provides a number of ways to provide a particular bias to the gate of the second FET (120) for the purpose of configuring the particular FET so as to have the overall envelope-tracking amplifier operate in ET or non-ET mode. Similar arrangements and behaviors for the gate resistor switch and the gate capacitor switch can be included for all FETs except for the first FET, which is biased in a different way as described later.

With reference to the embodiment shown in FIG. 41, either or both of the gate resistor switch (4110) and the gate capacitor switch (4140) can be a stacked switch (e.g. a switch comprising stacked transistors) in order to allow power handling capability greater than a power handling capability of a switch comprising a single transistor because a voltage present at the gate of the second FET (120) or a higher FET of FIG. 1 may be sufficiently high that a switch comprising a single transistor would not be appropriate. Other alternative embodiments that may include the gate resistor switch (4110) and the gate capacitor switch (4140) can implement those switches as stacked switches for similar reasons. Reference can be made for example to U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

Figure 42:
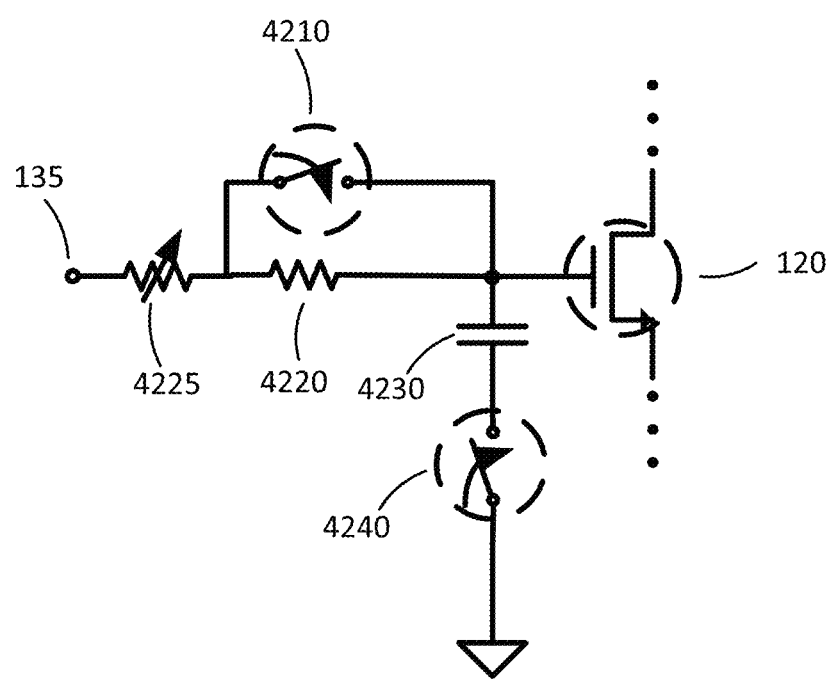
FIG. 42 shows the embodiment of FIG. 41 with the additional feature of an adjustable resistance.

Another alternative can be seen in FIG. 42 where an additional resistor (4225) is included to the embodiment seen in FIG. 41. The additional resistor (4225) can be tunable as well. The purpose of resistor (4225) is to ensure that if gate resistor switch (4210) is closed (thereby bypassing the gate resistor (4220)), the embodiment as seen in FIG. 42 will still provide a resistance (through the additional resistor (4225)) at the gate of the FET (120) of FIG. 1. In the event that the gate resistor switch (4210) is open, the additional resistor (4225) can be tuned to have a 0 value thereby producing an effectively similar arrangement as seen in FIG. 41.

Figure 43:
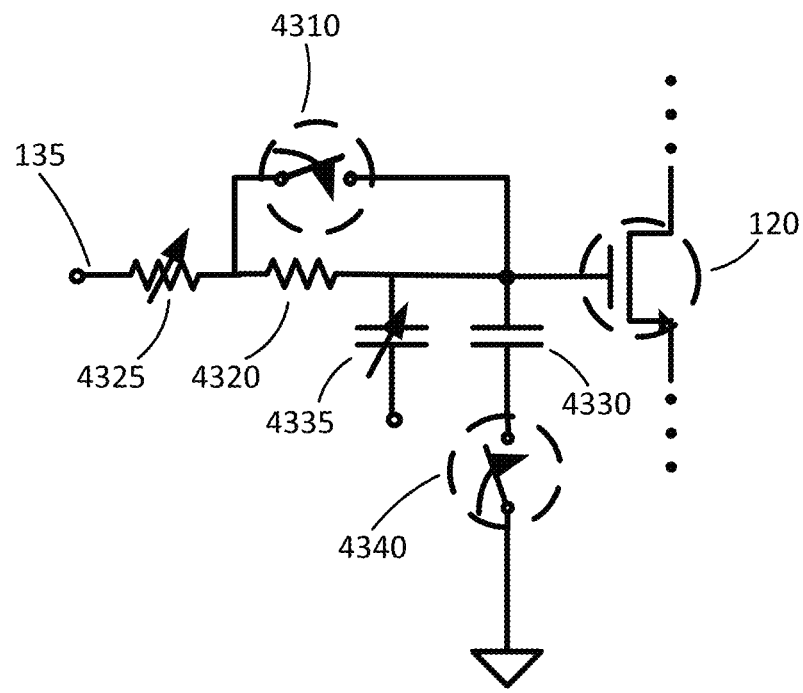
FIG. 43 shows the embodiment of FIG. 41 with the additional features of adjustable resistance and capacitance.

Furthermore, FIG. 43 provides another alternative where an additional capacitor (4335), which can also be tunable, is provided. Similar to the additional resistor (4225) in FIG. 42, the additional capacitor (4335) seen in FIG. 43 can be used to ensure that there will always be a capacitance available even if the gate capacitor switch (4340) is open. Further details regarding tunable reactive elements, including tunable capacitors and tunable inductors, may be found, for example, in International Publication No. WO2009/108391, entitled "Method and Apparatus for Use in Digitally Tuning a Capacitor in an Integrated Circuit Device," and in Published U.S. Application number 2013/0222075A1 entitled "Method and Apparatus for Use in Tuning Reactance in an Integrated Circuit Device", both incorporated herein by reference in their entirety.

Figure 44:
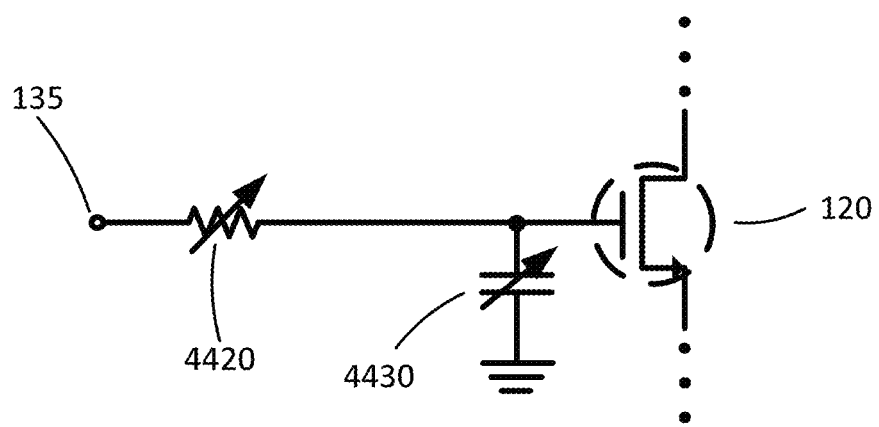
FIG. 44 shows an embodiment according to the present disclosure of a tunable gate bias network that can be connected, for example, to the second FET or the third FET shown in FIG. 1 or 8.

FIG. 44 shows an embodiment according to the present disclosure of a tunable gate bias network that can be connected to the second FET (120) or the third FET (155) shown in FIG. 1. This embodiment, as seen in FIG. 44, is an alternative where switches and accompanying passive elements (gate resistor and/or capacitor) can be replaced with tunable elements that have values that can be controlled. In the embodiment shown in FIG. 44, the tunable gate bias network comprises a tunable gate resistor (4420) connected between the second gate bias terminal (135) and the gate of the second FET (120) in addition to a tunable gate capacitor (4430) connected between the gate of the second FET (120) of FIG. 1 and ground or other suitable reference voltage. For the ET mode operation, the tunable gate resistor (4420) can be set to a low value, whereas for operation in the non-ET mode, the tunable gate resistor (4420) can be set to a high value. For the non-ET mode operation, the tunable gate capacitor (4430) can be set to a high value, whereas for operation in the ET mode, the tunable gate capacitor (4430) can be set to a low value (e.g. corresponding to a high signal impedance, where the term "signal impedance" can refer to an impedance presented to a time varying signal). These tunable gate resistors and capacitors can be used to alternatively bias a FET to configure the envelope tracking amplifier, where the configuring of the envelope tracking amplifier is thereby able to adapt its operation as the mode of operation of the embodiment changes between ET and non ET mode.

Alternately, the embodiments shown in FIGS. 41, 42, 43 and 44 can be combined in various ways to create other embodiments. By way of example, and not of limitation, the gate resistor switch (4110) of FIG. 41 can be added to the embodiment shown in FIG. 44, connected in a manner similar to the embodiment shown in FIG. 41. Alternatively, the tunable gate capacitor switch (4140) of FIG. 41 can be added to the embodiment shown in FIG. 44. Similar alteration or replacement of both the tunable gate resistor (4420) and the tunable gate capacitor (4430) can result in yet other embodiments.

Figure 45:
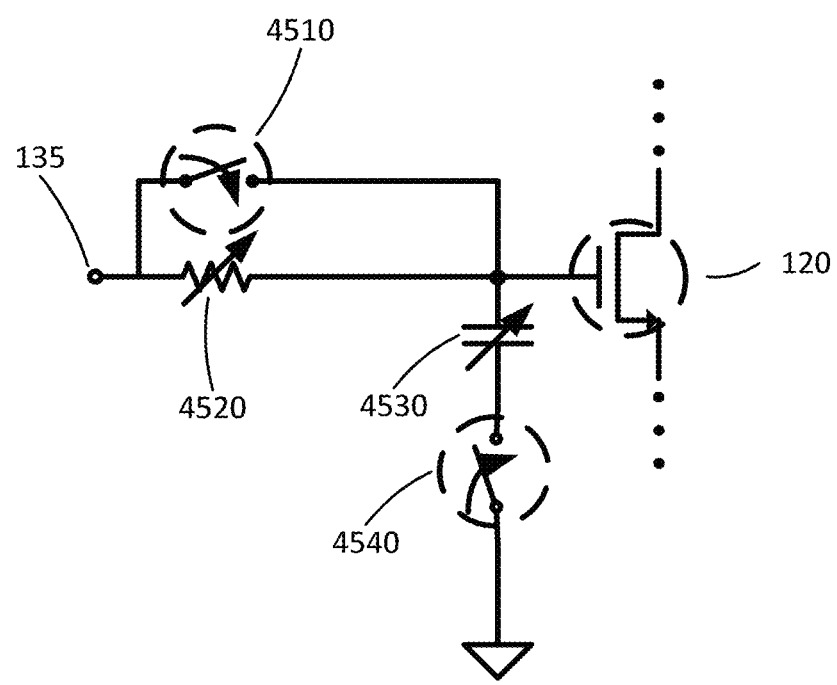
FIG. 45 shows an embodiment according to the present disclosure with the tunable gate resistor, the gate resistor switch, the tunable gate capacitor, and the gate capacitor switch that are shown in FIGS. 40-44.

FIG. 45 shows an embodiment according to the present disclosure comprising the tunable gate resistor (4520), the gate resistor switch (4510), the tunable gate capacitor (4530), and the gate capacitor switch (4540). A person skilled in the art will not require further explanation or diagrams to understand such embodiments as presented in the preceding two paragraphs.

The embodiment shown in FIGS. 44 and 45, as well as alternatives that have been explained above but not shown in figures, may also be applied to the third FET (155) in FIG. 1 or 8 as well as any FET among stacked FETs used to build an envelope tracking amplifier except for a first FET (e.g. the first FET (115) in FIG. 1) to which an input signal (e.g. an RF signal) is applied. Either or both of the gate resistor switch (4510) and the gate capacitor switch (4540) of FIG. 45, for example, can be a stacked switch in order to allow power handling capability greater than the power handling capability of a switch comprising a single transistor because a voltage present at the gate of the second FET (120) or a higher FET may be sufficiently high that a switch comprising a single transistor would not be appropriate.

Figure 46:
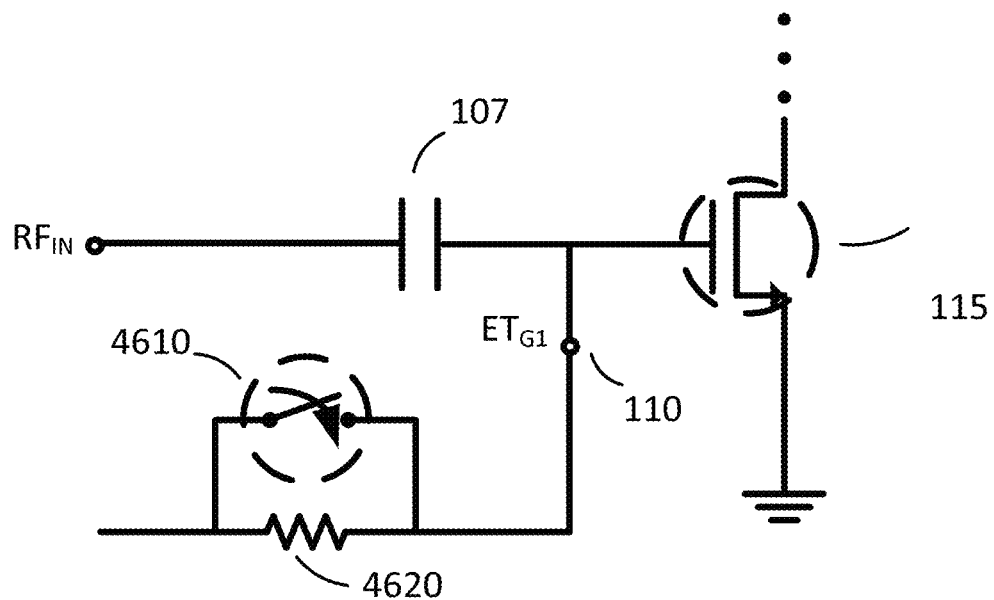
FIG. 46 shows an embodiment according to the present disclosure of a switchable gate network that can be connected to any FET, including a first FET of an envelope tracking amplifier (e.g. the first FET of the envelope tracking amplifier shown in FIG. 1) to which an input signal (e.g. an RF signal) is applied.

FIG. 46 shows an embodiment according to the present disclosure of a switchable gate network that can be connected the first FET (e.g. the first FET (115) in FIG. 1) to which an input signal (e.g. an RF signal, $RF_{IN}$) is applied. The embodiment shown in FIG. 46 comprises a gate resistor (4620) similar to the gate resistor (4120) shown in FIG. 41 and a gate resistor switch (4610) similar to the gate resistor switch (4110) shown in FIG. 41 that can be connected in a path between the input signal and a gate of the first FET to which the input signal is applied (110), while omitting a gate capacitor similar to the gate capacitor (4130) and a gate switch similar to the gate switch (4140) of FIG. 41. In the embodiments where the gate resistor (4620) and the gate resistor switch (4610) are applied to FETs other than a first FET (e.g. the first FET (115) in FIG. 1 or FIG. 34) to which an input signal (e.g. an RF signal) is applied, the gate resistor switch (4610) can be a stacked switch (e.g. a switch comprising stacked transistors) in order to allow power handling capability greater than a power handling capability of a switch comprising a single transistor because a voltage present at the gate of the second FET (120) or a higher FET may be sufficiently high that a switch comprising a single transistor would not be appropriate. Other alternative embodiments that include the gate resistor switch (4610) can implement the gate resistor switch (4610) as a stacked switch for similar reasons.

Figure 47:
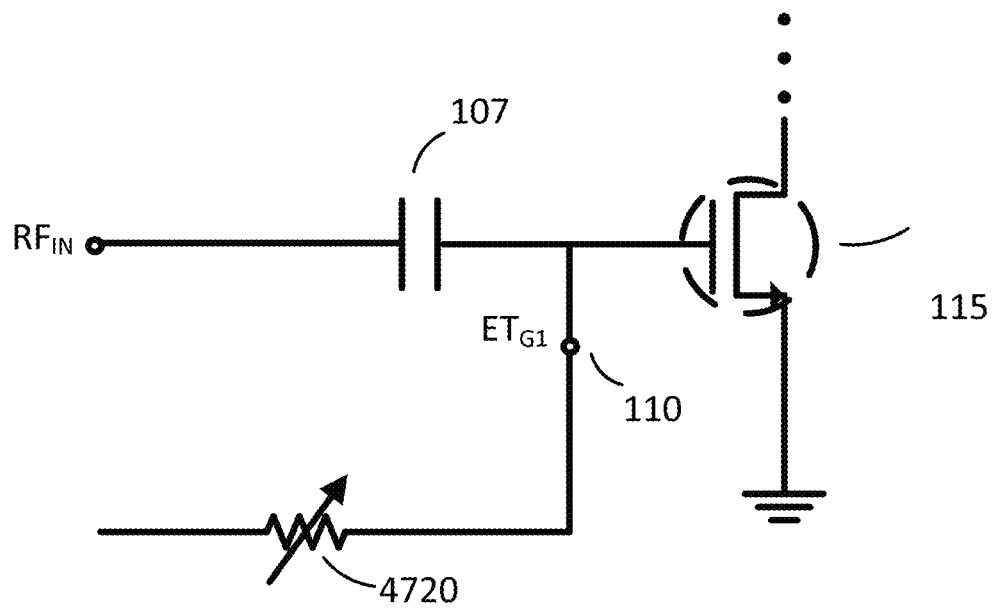
FIG. 47 shows an embodiment according to the present disclosure of a tunable gate network that can be connected to any FET, including a first FET to which an input signal (e.g. an RF signal) is applied (e.g. the first FET in FIG. 1 or 8).

FIG. 47 shows an embodiment according to the present disclosure of a tunable gate network that can be connected to the first FET (e.g. the first FET (115) in FIGS. 1, 3, 4, 6 and 8) to which an input signal (e.g. an RF signal) is applied. The tunable gate network can comprise a tunable gate resistor (4720) that can be connected in a path between the input signal and a gate of the first FET to which the input signal is applied (110), while omitting a tunable gate capacitor similar to the tunable gate capacitor (4530) of FIG. 45. For the ET mode operation, the tunable gate resistor (4720) of FIG. 47 can be set to a low value, whereas for operation in the non-ET mode, the tunable gate resistor (4720) of FIG. 47 can be set to a high value.

Figure 48:
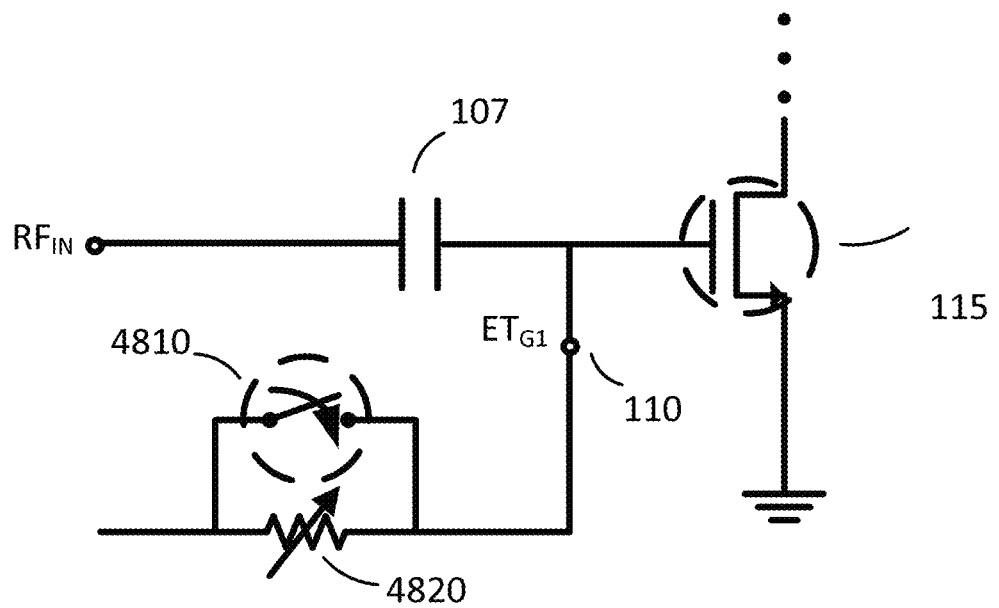
FIG. 48 shows an embodiment according to the present disclosure with the gate resistor switch and the tunable gate resistor that are shown individually in FIGS. 46 and 47, respectively.

Alternatively, the gate resistor switch (4610) of the embodiment shown in FIG. 46 can be added to the embodiment shown in FIG. 47 and connected in a manner similar to the embodiment shown in FIG. 46. FIG. 48 shows an embodiment according to the present disclosure comprising the gate resistor switch (4810) and the tunable gate resistor (4820). In the previous embodiments the gate resistor and the gate resistor switch were applied to FETs other than a first FET (e.g. the first FET (115) in FIG. 1). FIG. 48 shows the gate resistor (4820) and the gate resistor switch (4810) applied to the first FET (e.g. the first FET (115) in FIG. 1) to which an input signal (e.g. an RF signal) is applied. The gate resistor switch (4810) can be a stacked switch (e.g. a switch comprising stacked transistors) in order to allow voltage handling capability greater than the voltage handling capability of a switch comprising a single transistor because a voltage present at the gate of the second FET (120), for example of FIG. 1, or a higher FET may be sufficiently high that a switch comprising a single transistor would not be appropriate. A person skilled in the art will not require further diagrams or explanation to understand the embodiments presented in FIG. 46-48, and will also understand the advantage the embodiment of FIG. 47 has over the other two, mainly due to the practicality of the implementation.

Generally speaking, when switching between the ET mode and the non-ET mode, an effective number of FETs in a stack of FETs used to construct an envelope tracking amplifier can be configured based on the selected mode of operation. By way of example, and not of limitation, if the ET mode of operation is desired and higher amplification is needed (e.g. a higher output power from the variable power supply across the stack of FETs), an effective number of FETs in the stack of FETs used to construct an envelope tracking amplifier can be increased. Conversely, if the non-ET mode of operation is desired, the effective number of FETs in the stack of FETs used to construct an envelope tracking amplifier can be decreased. Selection of a desired number of FETs to be active can be provided based on a particular biasing of individual FETs of the stack of FETs. Numerous embodiments that operate by changing the effective number of FETs in the stack of FETs used to construct the envelope tracking amplifier are possible, two of which are presented in the following paragraphs.

Figure 49:
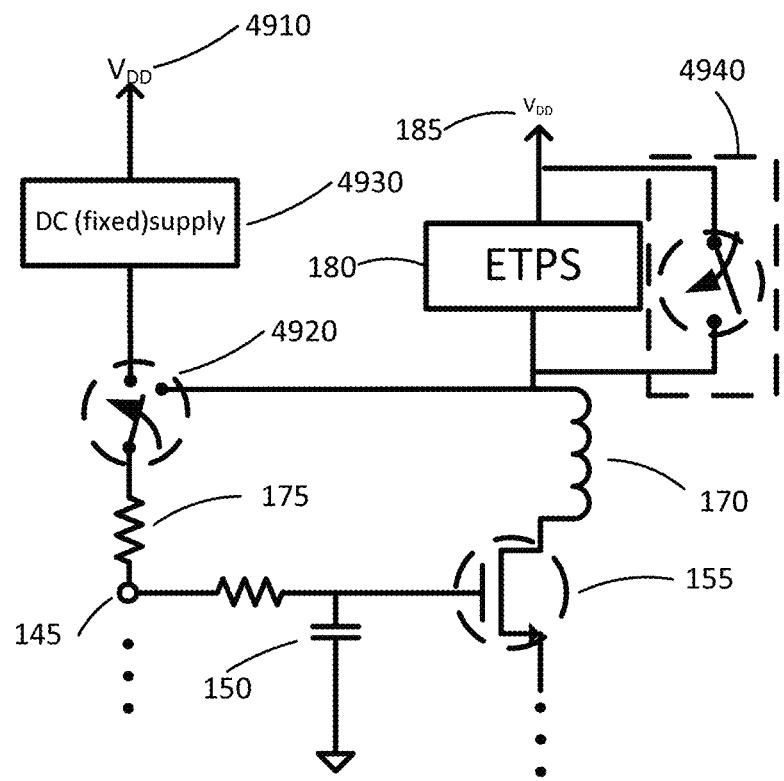
FIG. 49 shows an embodiment according to the present disclosure of an alternative biasing arrangement for the third FET shown in FIG. 1.

FIG. 49 shows an embodiment according to the present disclosure of an alternative biasing arrangement for the third FET (155) as shown in FIG. 1. In the embodiment shown in FIG. 49, an upper terminal of the third resistor (175) is connected to a supply switch (4920). The supply switch (4920) can be operated to connect the upper terminal of the third resistor (175) to either the ETPS (180) or to a fixed DC supply (4930), both of which can be connected to draw power from a voltage source $V_{DD}$ (185, 4910). If the ET mode of operation is desired, the upper terminal of the third resistor (175) can be connected to the ETPS (180). If the non-ET mode of operation is desired, the upper terminal of the third resistor (175) can be connected to the fixed DC supply (4930), which supplies a high DC bias voltage (constant power supply) to the gate of the third FET (155) that can bias the third FET (155) to operate in the triode region. Operation of the third FET (155) results in the third FET acting as a resistor rather than an amplifier. Additionally, fixed power is supplied to the drain of the stack of three FETs in non-ET mode. This can be achieved either by providing a direct connection from the DC supply (4930) to the stack of three FETs. Alternatively, a bypass circuit (4940) can be implemented with the ETPS (180) such that a bypass mode can be enabled allowing the voltage supply $V_{DD}$ (185) to be supplied to the stack of three FETs effectively providing a constant power for non-ET mode and removing the ETPS (180) from the arrangement. FIG. 49 thus presents two distinct embodiments of the present disclosure. First, a method to switch the device (155) to triode region of operation and thus to effectively remove it from the amplification stage. Second, a method to switch between ET mode and non-ET mode by switching the path to the gate of the cascode.

Biasing the third FET (155) to operate in the triode region (and thus having the third FET (155) act as a resistor rather than an amplifier) reduces the effective number of FETs in the stack of FETs used to construct the envelope tracking amplifier (100) of FIG. 1. In general, an n-channel FET with an applied gate to source voltage that is higher than a drain to source voltage of the n-channel FET by an amount greater than or equal to a threshold voltage of the n-channel FET can function as a resistor (triode) with a value that is a function of the applied gate to source voltage.

Modifications similar to the embodiment shown in FIG. 49 can also be made, for example, to the second FET (120) of FIG. 1 as well as any FET in a stack that is used to construct an envelope tracking amplifier, except for a first FET (e.g. the first FET (115) in FIG. 1) to which an input signal (e.g. an RF signal) is applied. The embodiment shown in FIG. 49 can also be applied to the envelope tracking amplifier (800) shown in FIG. 8A by omitting the third resistor (175) of FIG. 1 and configuring the arrangement such that the switch (4920) of FIG. 49 selects, as a bias voltage to be applied to the third gate bias terminal (145), between a high bias voltage (e.g. supplied by the fixed DC supply (4930)) that can bias the third FET (155) to operate in the triode region and a dynamic bias voltage that is supplied either by the ETPS (180) of FIG. 1 or a separate controller (not shown).

Figure 50:
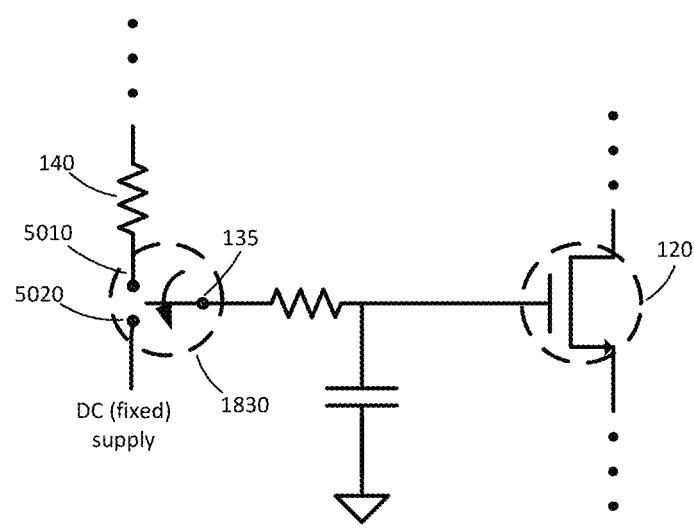
FIG. 50 shows an embodiment according to the present disclosure of a switchable biasing arrangement applied to the second FET of FIG. 1.

FIG. 50 shows an embodiment according to the present disclosure of a switchable biasing arrangement similar to the embodiment shown in FIG. 49 applied to the third FET (155) that is applied instead to the second FET (120). A supply switch (5030) can be operated to connect the second gate bias terminal (135) to an ET mode select terminal (5010) that further connects to the second resistor (140) of the bias network shown in FIG. 1 for the ET mode. Alternatively, for the non-ET mode, the supply switch (5030) can be operated to connect the gate bias terminal (135) to a high bias voltage terminal (5020), where such terminal (5020) is at a fixed bias voltage (e.g. supplied by a fixed voltage source) that when applied to the gate of the second FET (120) is adapted to bias the second FET (120) in the triode region, thus causing the second FET (120) to function as a resistor instead of an amplifier. Similar to the discussion of the embodiment shown in FIG. 49, biasing the second FET (120) to function as a resistor instead of an amplifier reduces the effective number of FETs in the stack of FETs used to construct the envelope tracking amplifier (100) of FIG. 1. Alternatively, the embodiment shown in FIG. 50 can also be used in conjunction with the envelope tracking amplifier (800) shown in FIG. 8A by omitting the second resistor (1840) of FIG. 50 and configuring the arrangement such that the supply switch (5030) selects, as a bias voltage to be applied to the second gate bias terminal (135), between a high bias voltage that can bias the second FET (120) to operate in the triode region and a dynamic bias voltage that is supplied either by the ETPS (180) of FIG. 1 or a separate controller (not shown).

Figure 51:
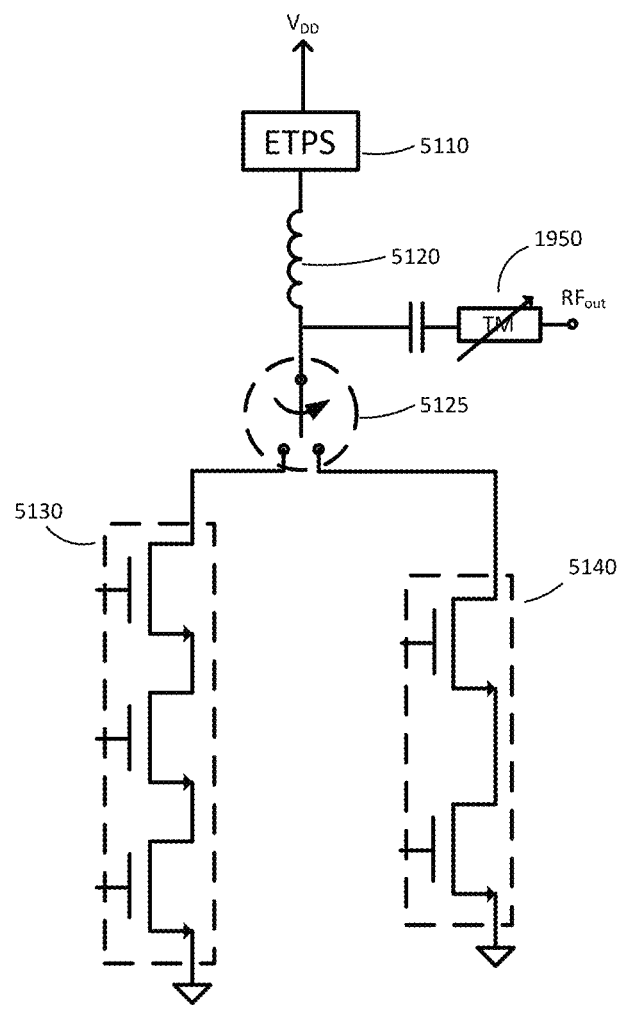
FIG. 51 shows an embodiment according to the present disclosure of an arrangement comprising a first stack of three FETs, a second stack of two FETs, a switch that can be operated to select one of the two stacks, an inductor, and an Envelope Tracking Power Supply (ETPS) that is connected to a voltage supply $V_{DD}$, where the inductor serves as an RF choke and is placed in a path between the ETPS converter and whichever stack is selected.

With the above two embodiments, biasing a gate voltage of the FET is used to reduce the stack height. Alternatively, embodiments could be provided where amplifier arrangements of different stack heights are chosen directly. For example, FIG. 51 shows an embodiment according to the present disclosure of an amplifier arrangement comprising a first stack (5130) comprising three FETs, a second stack (5140) comprising two FETs, a stack switch (5125) that can be operated to physically select one of the two stacks (5130, 5140), an inductor (5120), and a ETPS (5110) that is connected to a voltage supply $V_{DD}$, where the inductor serves as an RF choke and is placed in a path between the ETPS (5110) and whichever stack is selected. For the ET mode, the stack switch (5125) can be operated to select the first stack (5130), because the ET mode may require a higher DC voltage across the stack of FETs than the non-ET mode. For the non-ET mode, the stack switch (5125) can be operated to select the second stack (5140). In some embodiments, the first stack (5130) further comprises elements (e.g. as described previously) appropriate to the envelope tracking amplifier (100) shown in FIG. 1, the envelope tracking amplifier (800) shown in FIG. 8A, or other envelope tracking amplifiers that comprise stacked transistors. Alternatively, the first stack (5130) may comprise four or more transistors, while the second stack (5140) can comprise any number of transistors that is fewer than a number of transistors in the first stack (5130). By way of further example, and not of limitation, the first stack (5130) may comprise two transistors, while the second stack (5140) can be reduced to a single transistor (e.g. no longer a stack).

As seen in FIG. 51, both the first stack (5130) and the second stack (5140) utilize one tunable matching network (1950) prior to an output of the amplifier arrangement. Although use of a single shared tunable matching network (1950) can save space during implementation, this embodiment may make the tunable matching network more challenging. This is because the choke (5120) would be common to both stacks and possibly not optimized for either. As a result, the tunable matching network (1950) may have to cover a wider tuning range.

Figure 52:
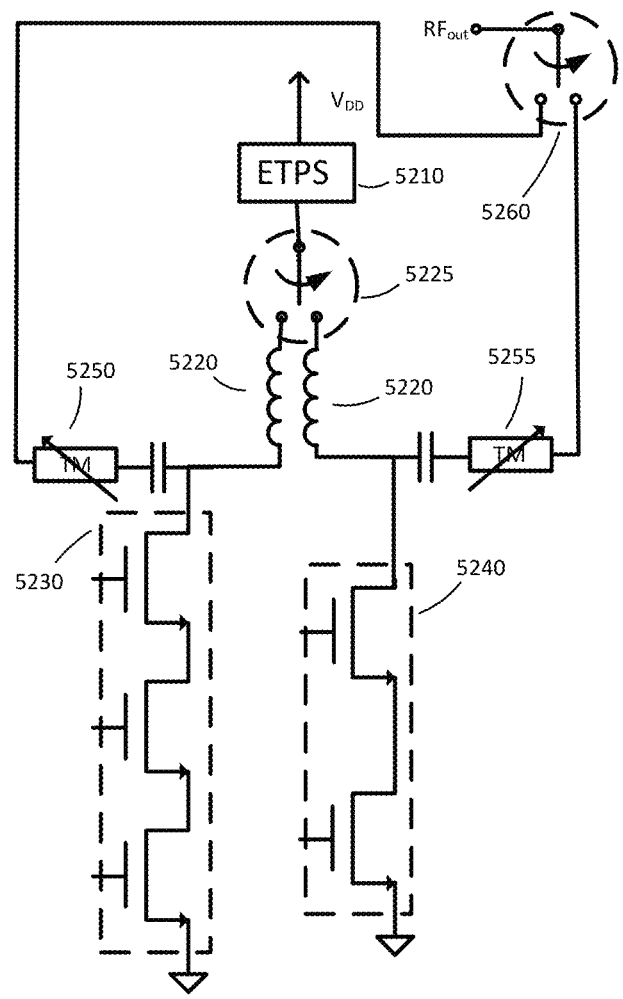
FIG. 52 shows an embodiment similar to FIG. 51, except that the switch used to select one of the two stacks is placed prior to the RF choke (thereby requiring separate RF chokes for each stack).

FIG. 52 shows an embodiment similar to FIG. 51 except that the stack switch (5125) of FIG. 51 is now directly connected to the ETPS (5110) of FIG. 51. The inductor (5220) is no longer in direct connection with the ETPS (5210) but rather is part of the first stack and second stack of FETs (5230, 5240). The re-arrangement of the inductor (5120; 5220) and the stack switch (5125; 5225) influences matching for the embodiment seen in FIGS. 51 and 52. For example, as stated above in FIG. 51, given the location of the inductor (5120) and the stack switch (5125), a shared matching can be provided for the first stack (5130) and the second stack (5140). However, as seen in FIG. 52, because the stack switch (5225) and the inductor (5220) is now swapped with respect to the relationship seen in FIG. 51, the first stack (5230) and the second stack (5240) may have separate tunable matching networks (5250, 5255).

As discussed above in FIG. 51, the first stack (5130) and the second stack (5140) may each desire a different output match. However, the embodiment uses a single sharable tunable matching network (1950) which may not be able to provide a desired matching for both stacks. On the other hand, the embodiment in FIG. 52 allows for the use of separate tunable matching networks (5250, 5255) for the first stack (5230) and the second stack (5240). Although such an embodiment could use more space during implementation compared to the embodiment of FIG. 51, the embodiment of FIG. 52 would allow a desired matching to be provided to both the first stack (5230) and the second stack (5240). An ability to provide the desired matching to both the first stack (5230) and the second stack (5240) is a further advantage the embodiment of FIG. 52 has over the embodiment of FIG. 51. However, FIG. 52 has a lot more complexity and thus cost. These factors need to be considered in the selection of the implementation strategy.

Given that the embodiment of FIG. 52 has two tunable matching networks (5250, 5255) for each of the two stacks (5230, 5240), an output switch (5260) has been added to select an appropriate output based on which stack the stack switch (5225) selects. The selected output by the output switch (5260) would be provided to a load (e.g. an antenna) or any additional circuitry to which the embodiment of FIG. 52 may be connected to.

For all of the embodiments previously discussed in the present disclosure in relation to switching an amplifier operation mode between ET and non-ET, control of switches and/or tuning of tunable elements can be performed by control signals that are provided by a transceiver, a microprocessor (e.g. a control unit of a cell phone or wireless device), a control circuit corresponding to any amplifier within a given embodiment, or some other unit that is configured to provide appropriate control signals, whether implemented in hardware (e.g. simple/complex digital logic, analog), software and/or a combination thereof. Any and all parts of these various embodiments can be monolithically integrated for better overall performance as well as reduced manufacturing cost, assembly cost, testing cost and form factor.

Going back to FIG. 1, a person skilled in the art will recognize that due to the high output power requirement of a cascode amplifier stage, the drain voltage supplied to transistor (155) should be of high current capability, whereas corresponding gate bias voltages (i.e. $ET_{G1}$, $ET_{G2}$, $ET_{G3}$) need not. In a practical sense, this high current requirement for the drain voltage imposes close proximity of the corresponding generation circuitry to the cascode stage. In most embodiments generation of the drain voltage is performed within the ETPS.

Furthermore and as discussed in prior embodiments, in order to optimize operation (e.g. linearity, efficiency, ACLR) of the amplifier (100) in the envelope tracking mode, each of the bias voltages $ET_{G1}$, $ET_{G2}$, $ET_{G3}$ can independently be scaled, amplitude shifted, phase shifted, inverted, and/or subject to any mathematical operation (e.g. implemented by an op-amp circuit or lookup table) with relation to the bias voltage supplied to the inductor (170) prior to being applied to gate bias nodes (110, 135, 145). In some embodiments, the bias voltage $ET_{G1}$ may be held fixed while the other two bias voltages $ET_{G2}$ and $ET_{G3}$ vary as a function of the control voltage connected to the input terminal (190) of the ETPS (180), but with differing gains and/or phases. In yet another embodiment, $ET_{G3}$ may be set to a high voltage to put transistor (155) strongly in the triode region when the envelope voltage on its drain (through inductor 170) goes very low and thus removing transistor (155) from the cascode configuration, while decreasing $ET_{G2}$ to follow the envelope and maintain the cascode effect. These techniques can be applied to any or all of the gates in a stack and the stack can be anywhere from a stack of 1 to a stack of n (n>1, e.g. n=3, 4, 7, ... ).

This added flexibility of independently and dynamically controlling the various gate bias voltages provides for better control of the response of the ET amplifier as compared to the traditional ET implementation, wherein only the drain voltage is controlled using an envelope signal. For example, knowing the operational characteristics of the ET amplifier with respect to its drain input voltage, one can further optimize using any one or combination of the controlling gate biases and create lookup tables to provide corrections to the gate biases based on the input voltage to the drain.

Corrections can be made to optimize response of the ET amplifier for one or multiple of linearity, efficiency, output power and adjacent channel leakage ratio (ACLR) and using various strategies (e.g. keep one gate constant and correct for other two). These lookup tables can subsequently be used by some circuitry (e.g. waveform generation) to generate corrections during operation (e.g. increase output power request by a base station). Although these types of corrections can be completely predicted by the drain input or corresponding control signal, other type of corrections can be generated as well. For example:

Thermal memory effect, which affects the response of the amplifier due to accumulation of internal heat generated in response to the RF input signal level (amplifier hitting peak currents and voltages as a function of the RF input signal and the envelope) and frequency content can be predicted based on the RF input (e.g. integration of the envelope signal, running power average of the RF input signal, etc. . . . ) and thus can be compensated.

Heat generated within the amplifier as a consequence of the output power requirement and/or environmental conditions, which also affects the response of the amplifier, can be monitored (e.g. thermo-coupler, FIG. 74) and corrections be generated as a consequence.

Figure 74:
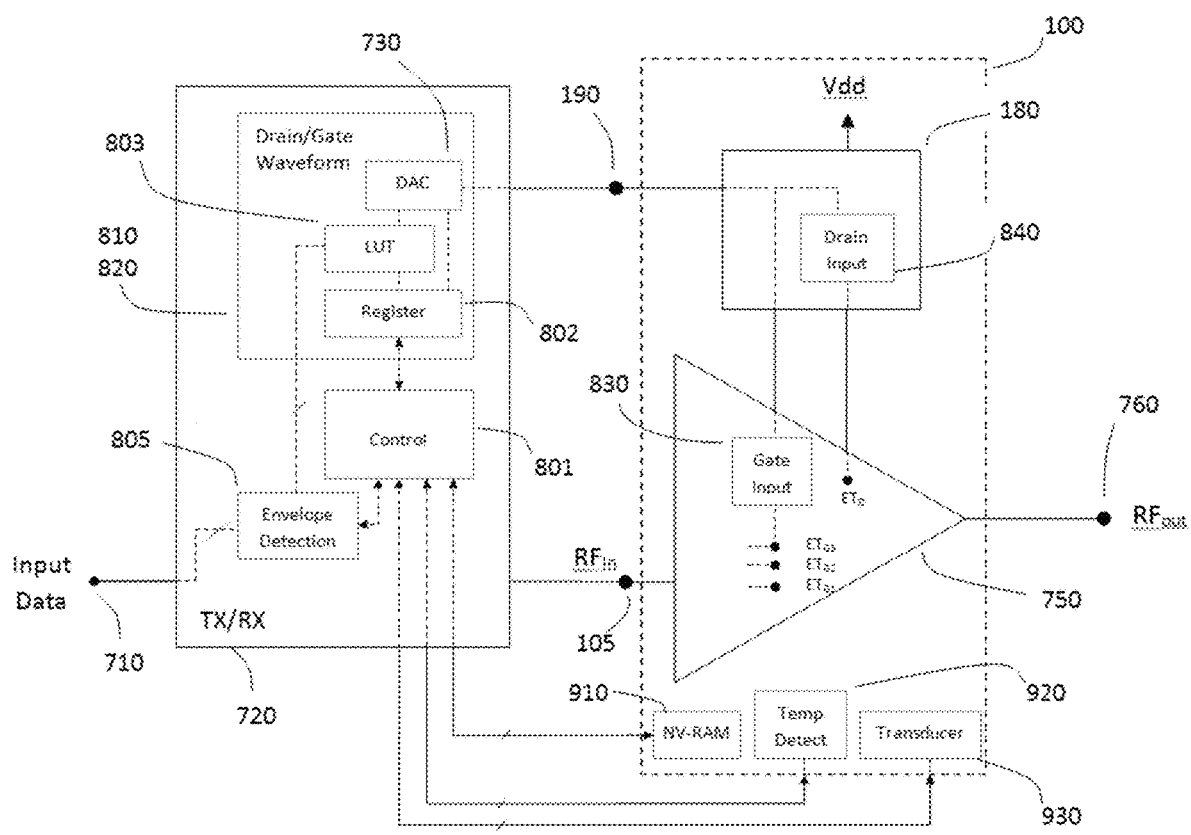
FIG. 74 shows an example embodiment according to the present disclosure wherein the ET amplifier further comprises Non-Volatile RAM (NV-RAM), temperature detector and other transducers used to report operating characteristics of the amplifier.

In such cases, the lookup tables described above may include additional dimensions to describe corrections based on the real time and/or estimated operating temperature of the amplifier. The person skilled in the art will see that same correction/compensation method can be used with respect to other parameters which may affect operation of the amplifier. FIG. 74 (further described later) shows the case where a temperature detection module (920) is used to monitor the real time operating temperature of the amplifier and feed this information back to a control unit (801) within a controller (720) (e.g. Transceiver unit) which in turn uses this information to control operation of a waveform generation module (810, 820). Latter waveform generation module in turn generates a control signal for the ETPS (180) supplying the amplifier (750). In a same manner and concurrently, transducer (930) may be used to correct/compensate for the parameter it is monitoring. This parameter may be any measurable within the amplifier, such as various threshold voltages, bias currents, bias voltages and other measurable parameters associated to the various components within the IC. The person skilled in the art will know about the batch to batch variability in IC manufacturing process and thus will appreciate the added value of the presented embodiment.

Going back to FIG. 1, the person skilled in the art will understand that this figure does not depict all the features described above and that additional circuitry may be used to accommodate for said features.

The envelope tracking amplifier (100) shown in FIG. 1 can be used as a driver, a final, or any other type of amplifier. The person skilled in the art will understand that the stack may comprise any number of FETs, as the embodiment shown in FIG. 1 uses three FETs merely as an example.

Figure 53:
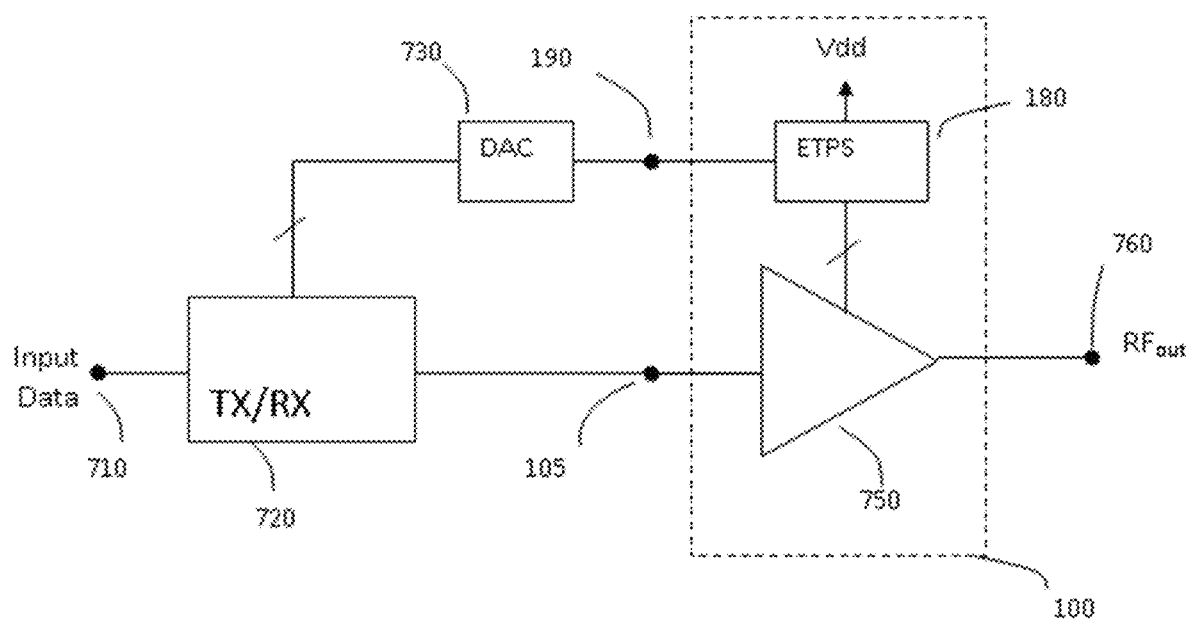
FIG. 53 shows an exemplary embodiment of the present disclosure wherein a DAC unit is used to generate controlling signals.

FIG. 53 shows an embodiment according to the present disclosure where the control signal (190) of FIG. 1 is explained in additional detail. Shown in FIG. 53 are an input node (710), a transceiver (720) whose input is connected to the input node (710), a digital to analog converter (DAC) (730) that is controlled by the transceiver (720), the envelope tracking amplifier (100) of FIG. 1, and an output node (760) that corresponds to an output of the envelope tracking amplifier (100).

For the sake of simplicity, the transceiver (720) of FIG. 53 is depicted in a transmit mode, wherein the Input Data presented to its input terminal (710) is processed within the transceiver to generate the analog output data signal RFin which is usually modulated in one of many transmission schemes, and fed to the input terminal (105) of the amplifier (100), wherein the RFin signal is further processed prior to final transmission. The input to the transceiver can be in analog or digital form. The analog signal will typically be in I&Q or Cartesian format. The envelope of the signal can be computed within the transceiver as $SQRT(I^2+Q^2)$ which is_the magnitude of the vector represented by (I, Q) components. If the data to the transceiver (720) is input in a digital form, the envelope can be computed within the transceiver (720) digitally or with analog techniques after the digital information is converted to analog in the RF modulation process. The person skilled in the art will understand that by virtue of its internal processing capability the transceiver (720) has other functions and connections besides what depicted in FIG. 53. It should also be noted that similar to the manner in which the transceiver (720) performs the task of converting the input data to the output analog stream RFin, if enabled by some design changes it can perform additional operations based on the input data and/or the RFin. In turn this generates additional output signals with known relationships with respect to these two signals. For example, if enabled by some design changes, the transceiver (720) can generate and output:

Analog waveforms with known phase and amplitude relationships with respect to RFin.

Analog waveforms with known phase and amplitude relationships with respect to the dynamic envelope of RFin.

Completely arbitrary analog waveforms.

Digital representation of any of the above, which can be derived either from RFin, directly from the input digital data or neither (case of arbitrary waveform).

In the embodiment shown in FIG. 53, the transceiver (720) is modified to output a digital representation of the envelope amplitude of RFin along with the control signals, which are fed to the external DAC unit (730). The DAC (730) uses its input digital signals, comprised of data and control signals, to generate an analog signal representing the envelope amplitude of the input RFin, which in turn is fed to the ETPS (180) input control terminal (190). The ETPS (180) uses the analog signal fed to its control terminal (190) as a means to control the various supply and biasing voltages fed to the amplifier (750) with the overall goal to optimize dynamic operation of the amplifier. For example, referring to FIG. 1, the ETPS (180) uses input (190) to generate a dynamic voltage with high current capability to feed transistor (155) drain terminal via inductor (170) and uses the same input (190) to generate a dynamic voltage with lower current capability to feed the gate terminals of transistors (120) and (155) via resistor (175). It is to be noted that the DAC unit (180) can also include a filter element at its output stage, so to filter out any undesired artifacts introduced by the digital-to-analog conversion process as well as to match input signal requirements to the ETPS (180).

Figure 54:
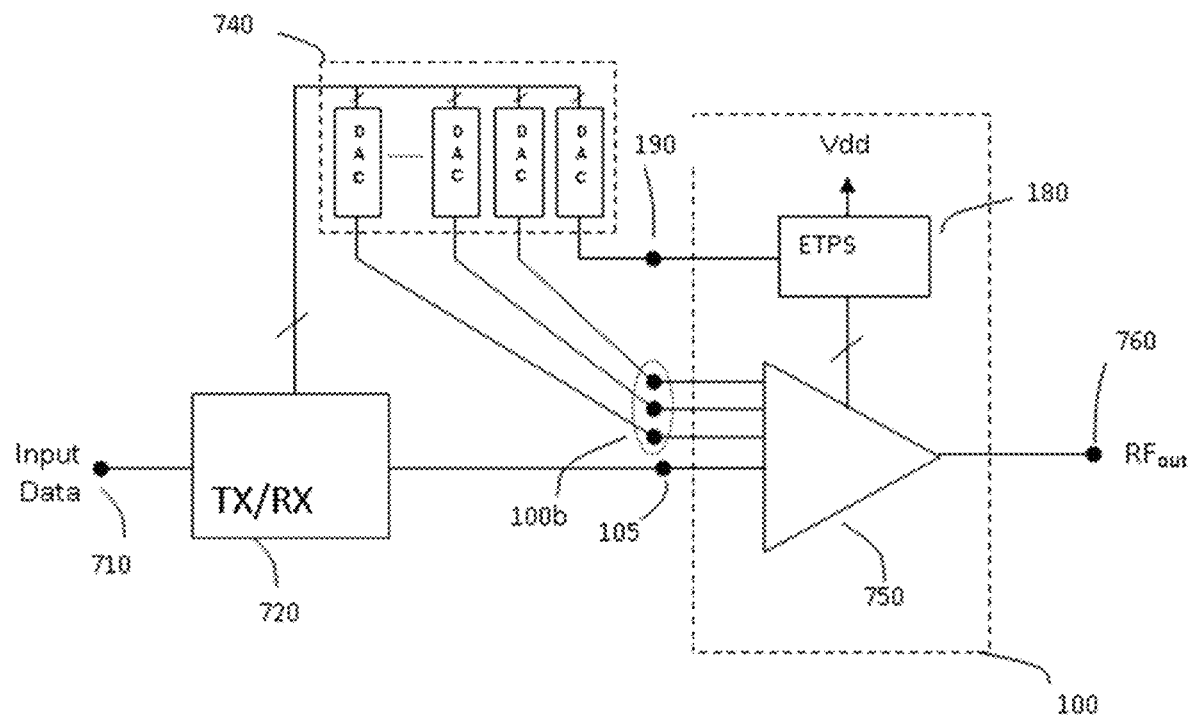
FIG. 54 shows an exemplary embodiment of the present disclosure wherein several DAC units are used to generate bias control signals.

FIG. 54 shows another embodiment according to the present disclosure wherein the DAC unit (730) of FIG. 53 is now replaced with module (740). Module (740) is connected at its input to the transceiver (720) and is connected at its output to input terminals (190) and (100b) of the envelope tracking amplifier (100). Module (740) is comprised of a plurality of DAC units, each similar in function to DAC (730) and each with a different set of input digital signals, comprised of data and control signals, generated by the transceiver (720).

Similar to the embodiment of FIG. 53, each of the DAC units comprised within the module (740), uses its input digital signals to generate an analog signal representing the envelope amplitude of the input RFin, which in turn is fed to one of the plurality of input nodes within input terminals (190) and (100b), thus providing the envelope tracking amplifier (100) with a plurality of analog control voltages internally used to set various supply and biasing voltages for optimal dynamic response of the amplifier. Compared to the embodiment of FIG. 53, this approach has the flexibility to generate analog control voltages with varying amplitude and phase relationships with respect to each other and with respect to the recovered envelope signal. Similar to the DAC unit (730) of FIG. 53, each of the DACs within module (740) can also include a filter element at its output stage, and which can be different for each DAC unit.

In one embodiment of FIG. 54 and with reference back to FIG. 8A, terminal (190) is used to feed (low current) control voltage to dedicated circuitry within the ETPS unit wherein high current drain voltage for transistor (155) is generated, whereas terminal (100b) is used to directly feed the various gate bias voltages of the cascode transistors as depicted by FIG. 8A. Note that in this configuration, resistors (130), (140) and (175) previously shown in FIG. 1 are not present, as usage of these resistors may be dictated by the driving requirements of the driving circuitry. In another embodiment of FIG. 54, control voltage at (190) is used to generate gate and drain bias voltages within the ETPS unit (180) while control voltages at (100b) are used to provide incremental corrections to gate bias voltages (e.g. FIG. 9) via summing resistors connected to $ET_{G1}$, $ET_{G2}$ and $ET_{G3}$.

It should also be noted that the ETPS, as used throughout the present disclosure, needs to have sufficient bandwidth to accommodate the bandwidth of the amplitude component of the modulation, which is typically 5-10 times wider than the modulation bandwidth. The ETPS must have minimal distortion (amplitude and phase) over this bandwidth. It is common for the ETPS to be built using a DC-DC converter to provide the low frequency portion of the amplitude path and an analog amplifier for the high frequency portion, along with some analog control circuitry to control overall operation of the unit. The DC-DC converter has a higher efficiency than the analog amplifier, but suffers from challenges in bandwidth as well as spurs due to the switching nature of the DC-DC. The analog amplifier covers the DC-DC converter's shortfalls. Noise, in addition to the spurs, must also be considered. A faster DC-DC converter will improve the overall efficiency of the ETPS by requiring less help from the analog amplifier. In the limit case, the ETPS consists of solely of a DC-DC converter. Using a semiconductor process such as silicon on sapphire (SOS), or even silicon on insulator (SOI), reduces the parasitic capacitances and offers several device advantages that result in faster DC-DC converters.

Figure 55:
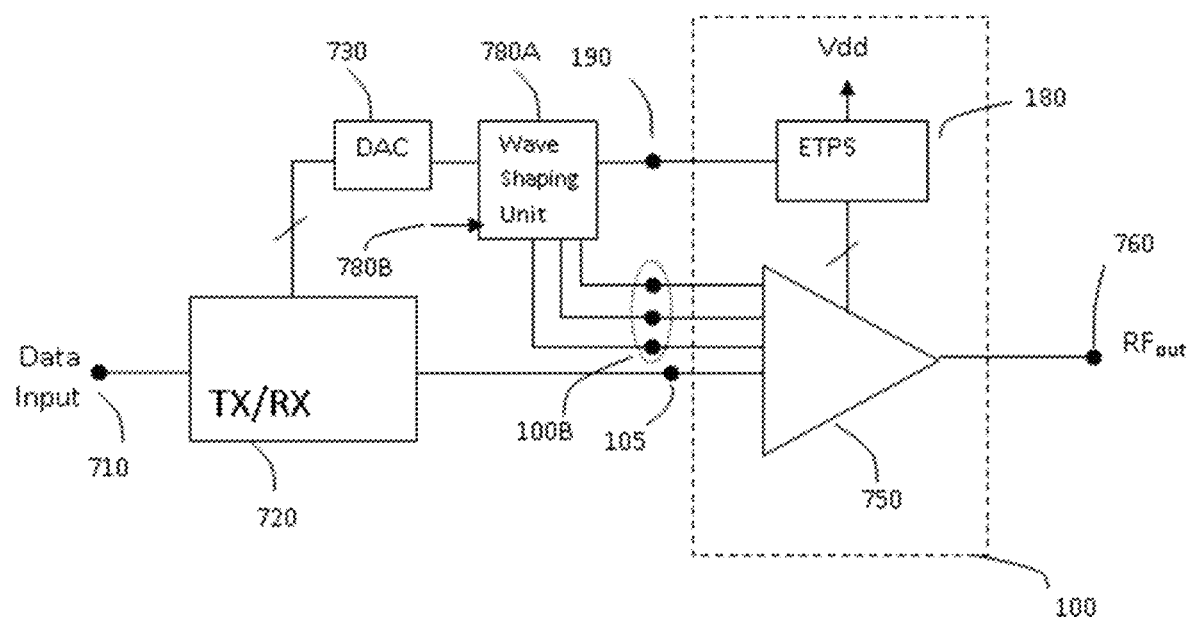
FIG. 55 shows an exemplary embodiment of the present disclosure wherein a wave shaping unit is used to generate bias control signals.

FIG. 55 shows another embodiment according to the present disclosure wherein a wave shaping unit is used to further generate independent analog control signals which are in turn used to feed various bias and supply voltages within the envelope tracking amplifier (100). In this embodiment, the DAC (730) output is connected to the input of the wave shaping unit (780A) which in turn through its plurality of outputs is connected to the envelope tracking amplifier (100) input terminals (190) and (100b), the latter input terminal being comprised of a plurality of input nodes. The wave shaping unit receives a single input voltage from the DAC unit (730), which is typically representative of the envelope amplitude of the RFin signal fed to the amplifier (100) at terminal (105), and it is programmed to generate using its internal waveform processing capability (e.g. analogue/digital signal processing, lookup tables), a set of independent output voltages based on the input voltage, with varying amplitude and phase relationships. These relationships, designed to further improve overall dynamic response of the amplifier (100) are either pre-programmed within the wave shaping unit or can be defined dynamically through a control input terminal (780B) to the wave shaping unit. Control data fed to the input terminal (780B) may originate from transceiver unit (720) or a separate control unit and may include information such mode/configuration selection and adjustments to the waveform processing such as offsets, gain and phase.

As it was the case in the embodiment depicted by FIG. 54, control voltages fed to terminals (190) and (100b) of the embodiment depicted by FIG. 55 can be internally used by the envelope tracking amplifier (100) in different ways and as supported by the internal electrical configuration of the amplifier (i.e. FIGS. 8A and 9).

The examples set forth above are provided to give those of ordinary skill in the art an overview of various control systems and methods related to the implementation of the envelope tracking method as related to the present disclosure. As mentioned before, these are only implementation examples and not limiting the scope of what the inventors regard as their disclosure.

Based on these examples, one can derive the following set of functional units and system functions to be implemented therein through some dedicated circuitry, which together implement the envelope tracking method. Any combination of these functional units may be integrated in one IC and/or module.

Functional Units:
   Transceiver (Tx/Rx)
   ET power supply (ETPS)
   Power Amplifier (PA)
   Waveform shaping unit (WS)

System Functions:
   Envelope detection:
      Generates a representation of the envelope signal in either digital or analog form based on the analog or digital Data input or the RFin signal.
   Gate waveform generation:
      Generates a representation of the Gate bias control signal in either digital or analog form. This is generally based on the envelope signal and a set of ET amplifier operating characteristics.
   Drain waveform generation:
      Generates a representation of the Drain bias control signal in either digital or analog form. This is generally based on the envelope signal and a set of ET amplifier operating characteristics.
   PA gate input generation:
      Generates the actual analog gate bias voltage to be fed to each of the gates of the cascode amplifier. This is generally based on the gate waveform generated by the gate waveform generation function and adapted to match input requirements to the various gates.
   PA drain input generation:
      Generates the actual analog drain bias voltage to be fed to the cascode amplifier. This is generally based on the drain waveform generated by the drain waveform generation function and adapted to match input requirements to the drain.

The person skilled in the art will understand that known design techniques are available for implementation of the presented system functions. For example:

Envelope detection=SQRT(I^2+Q^2) or diode envelope detector.

Figure 71:
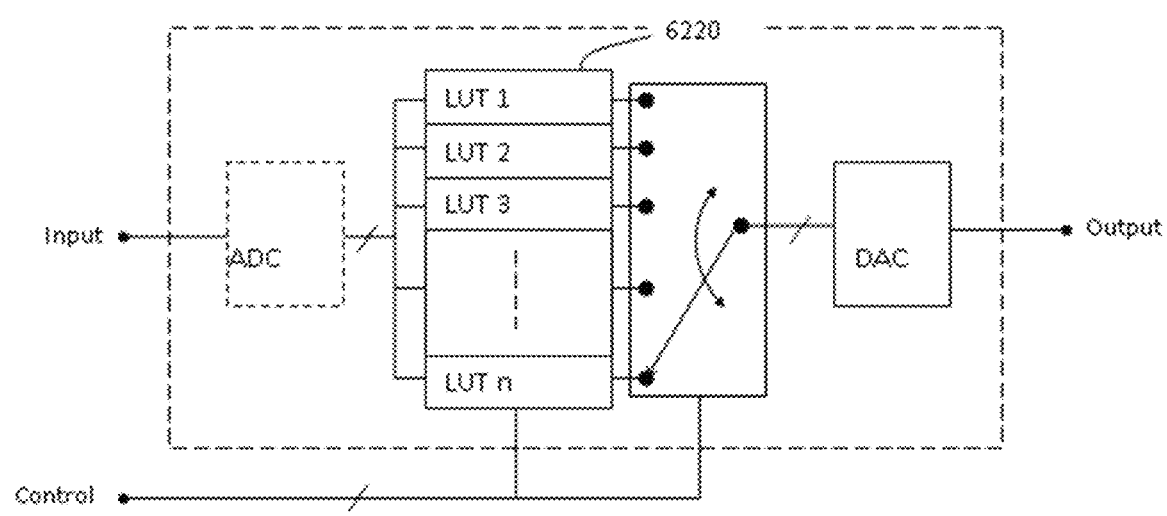
FIG. 71 shows an example embodiment of a waveform generator module wherein one of many lookup tables is selected to generate the output waveform.
Figure 72:
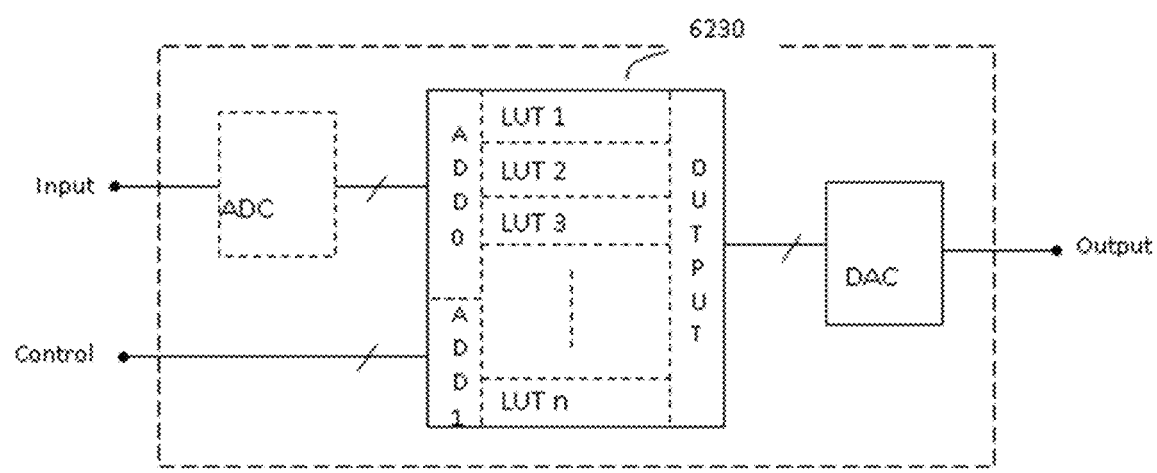
FIG. 72 shows an example embodiment of a waveform generator module wherein a partitioned ROM is used to store the waveform data.
Figure 73:
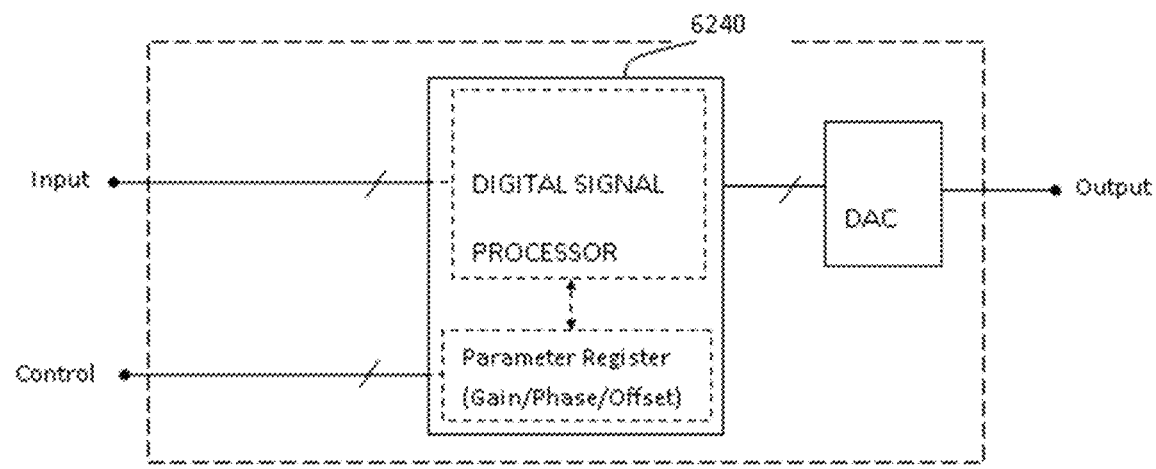
FIG. 73 shows an example embodiment of a waveform generator module using a Digital Signal Processor.

Waveform generation=lookup table (FIGS. 71, 72), digital processing using DSP (FIG. 73) or analog processing such as op-amp circuits to adjust gain, DC offsets, etc. . . .

Input generation=D/A converter if needed plus buffer amplifiers to present appropriate impedance/drive strength.

and as previously mentioned, due to its high current requirement, it is desirable to keep the drain voltage supply generation close to the PA unit and within the ETPS, since latter is designed for high currents and good heat dissipation. This in turn limits the PA input configuration for its drain bias to an analog input, in contrast to a possible digital input for the gates biases, whereby internal D/A conversion units can generate the analog gate bias voltages.

Given the above, Table 1 is a proposed embodiment of design and integration constraints for the system functions. It defines possible functional integrations for each of the system functions.

TABLE 1

|  | Functional Unit | Input Source | I/O Signal Type |
| --- | --- | --- | --- |
| Envelope detection | Tx/Rx, ETPS, PA, WS | RFin/Analog Data/ Digital data | Analog/Digital |
| Gate waveform generation | Tx/Rx, ETPS, PA, WS | Envelope Detection | Analog/Digital |
| Drain waveform generation | Tx/Rx, ETPS, PA, WS | Envelope detection | Analog/Digital |
| PA Drain input generation | ETPS | Drain waveform generation | Analog/Digital Input Analog Output |
| PA Gate input generation | Tx/Rx, ETPS, PA, WS | Gate waveform generation | Analog/Digital Input Analog Output |

The various examples set forth above represent some possible implementations of the envelope tracking method by placing such system functions in newly defined modules (i.e. 730, 740, 780A) and/or in specific functional units. As such, the input/output configurations of said units reflect the chosen implementation. For example, input to the PA unit (750) is modified in order to adapt to each of the configurations of FIGS. 53-55. To allow direct input to each of the gate bias voltages, ladder resistors used in FIG. 1 to provide (combined) gate biasing, is removed as depicted in FIG. 8A. On the other hand, and as depicted in FIG. 9, to allow incremental corrections to each of the gate bias voltages, input summing resistors were added to the PA. In another example, the transceiver unit (720) in FIG. 53 outputs one set of digital data to the DAC unit (730), whereas the transceiver unit (720) in FIG. 54 has to adapt to the plurality of DAC units within (740) and thus outputs several set of digital data.

Furthermore, a person of ordinary skill will understand that any of such system functions can be implemented within a plurality of functional units given some design modification to said unit. For example, the transceiver can be made to perform envelope detection based on its input data at terminal (710), but so can the PA unit based on the input RFin signal at terminal (105), or the waveform shaping unit (780A) of FIG. 55 based on its input from DAC (730). One can also envision a transceiver unit performing envelope detection and gate/drain generation, or an ETPS performing these same system functions.

This apparent flexibility of mixing and matching system functions within functional units, and adapting I/O's accordingly, is however limited by the choice of good and sound design principles and integration. For example, any integration of waveform generation into the PA is beneficial because monolithic integration means the waveform signals will be matched and the amplitude/phase response will be well controlled. In contrast, splitting the gate and drain waveform generation across multiple ICs and packages introduces potential amplitude, phase and delay issues subject to PCB design and part variation. In another example As per Table 1, the following constraints are defined:

Envelope detection can be performed within any of the functional units and corresponding module is required to have one of RFin, Analog input data or Digital input data as input. Its input and output can be in either analog or digital form.

Gate waveform generation can be performed within any of the functional units and corresponding module is required to be connected to the functional unit performing the envelope detection. Input and output signals can be analog or digital.

Drain waveform generation can be performed within any of the functional units and corresponding module is required to be connected to the functional unit performing the envelope detection. Input and output signals can be analog or digital.

PA Drain input generation is required to be performed within ETPS unit which is required to be connected to the Drain waveform generation module. Input signal to corresponding module can be analog or digital, and output signal is analog.

PA Gate input generation can be performed within any of the functional units and corresponding module is required to be connected to the Gate waveform generation module. Input signal to corresponding module can be analog or digital, and output signal is analog.

Figure 56:
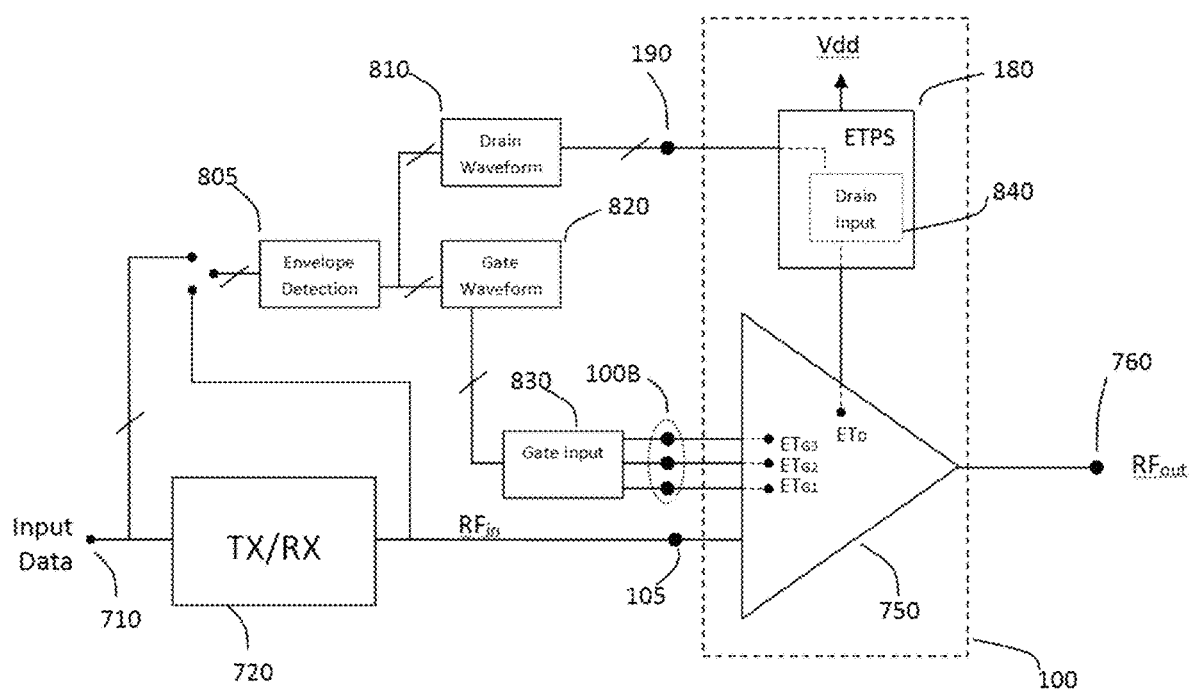
FIG. 56 shows an exemplary embodiment of various control modules of the present disclosure.

FIG. 56 breaks down the controlling elements for the envelope tracking system. Herewith new modules (805, 810, 820, 830, 840) are introduced which implement the system functions previously mentioned and are depicted accounting for restrictions presented in table 1. So for example, as per table 1, the Drain Input generation module (840) is placed within the ETPS unit (180), has a single output signal (uncrossed output line) which feeds the $ET_D$ input of the power amplifier (750) and its input is connected to the Drain Waveform generation module (810) via several signal lines (so could be several digital input signals or single analog input signal).

Modules presented in FIG. 56 are drawn individually and not assigned to any of the functional units at this point.

Exception to this being the Drain Input generation module (840) which is integrated within ETPS unit (840) as per table 1. Furthermore, the ETPS can be subdivided into an analog control part, a DC-DC and an analog amplifier or error amplifier. These pieces can be broken apart and combined with various blocks as well.

In FIG. 56 the envelope detection module (805) takes its input from either the Input Data at input terminal (710) which feeds the transceiver unit (720), or the modulated analog RFin signal generated by the transceiver unit and fed to the input terminal (105) of the amplifier unit (750). Therefore, the envelope detection module (805) may have one (analog RFin) or several (Input Data) signal lines at its input port. In turn the envelope detection module (805) provides an analog or digital representation of the envelope signal to the Drain Waveform (810) and Gate Waveform (820) generation modules, so again, these modules may have one analog or several digital input signal lines. The Drain Waveform generation module (810) in turn feeds the Drain Input generation module (840), placed within the ETPS unit (180), via input terminal (190). Finally Drain Input generation module (840) feeds the drain of the amplifier (750) at node $ET_D$ through inductor (170) with an analog voltage. Concurrently and in a similar fashion, biasing analog voltages for gates to $ET_{G1}$, $ET_{G2}$ and $ET_{G3}$ are generated within Gate Input module (830) and routed to amplifier (750) via input terminal (100*b***). It should be noted that the usage of the term "gate input" should not be seen as a limitation of the present embodiment, or other embodiments of this disclosure, to only FET devices, as the skilled person will know how to apply these teachings to other type of devices (e.g. replace "gate input" with "base input" for the case of a bipolar device configuration).

FIG. 56 therefore represents the envelope tracking system, which include the functional units; transceiver (720), ETPS (180) and amplifier (750), and the enabling system functions each represented by a dedicated system module wherein the circuitry to generate the specific function resides. Any of the FIGS. 53-55 can be represented using these system modules and functional units, wherein as previously mentioned, Input/Output configuration of each module is tailored to the specific configuration.

Figure 57:
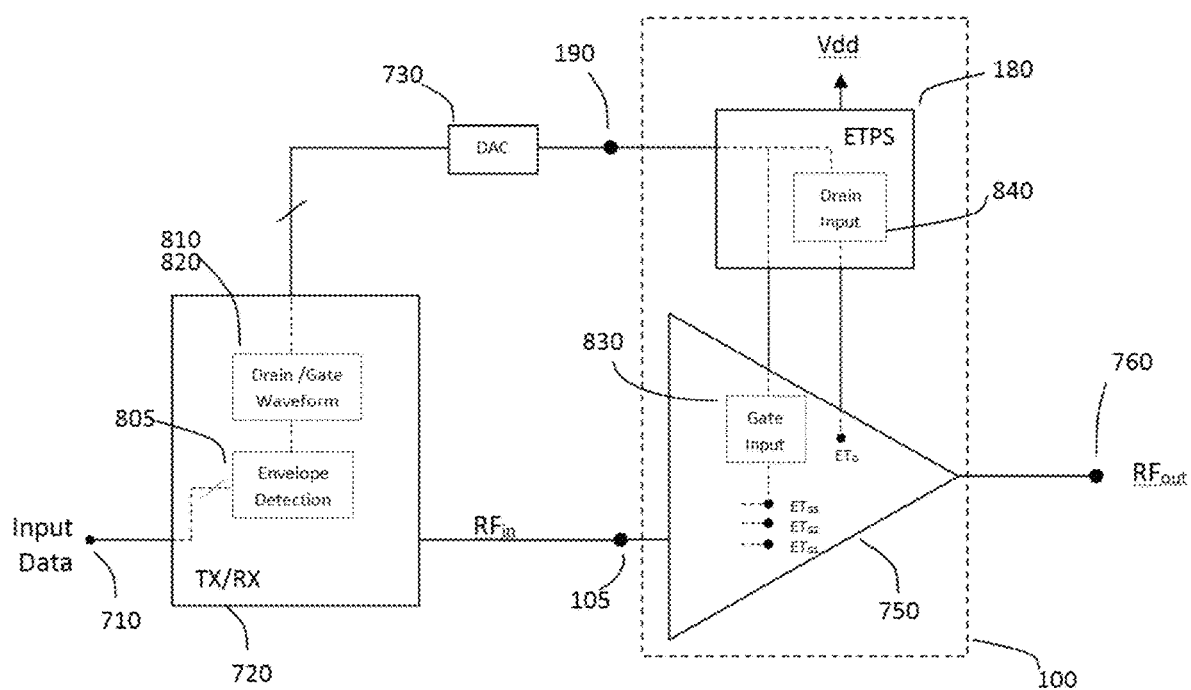
FIG. 57 is a representation of embodiment of FIG. 53 highlighting the various system functions.
Figure 60:
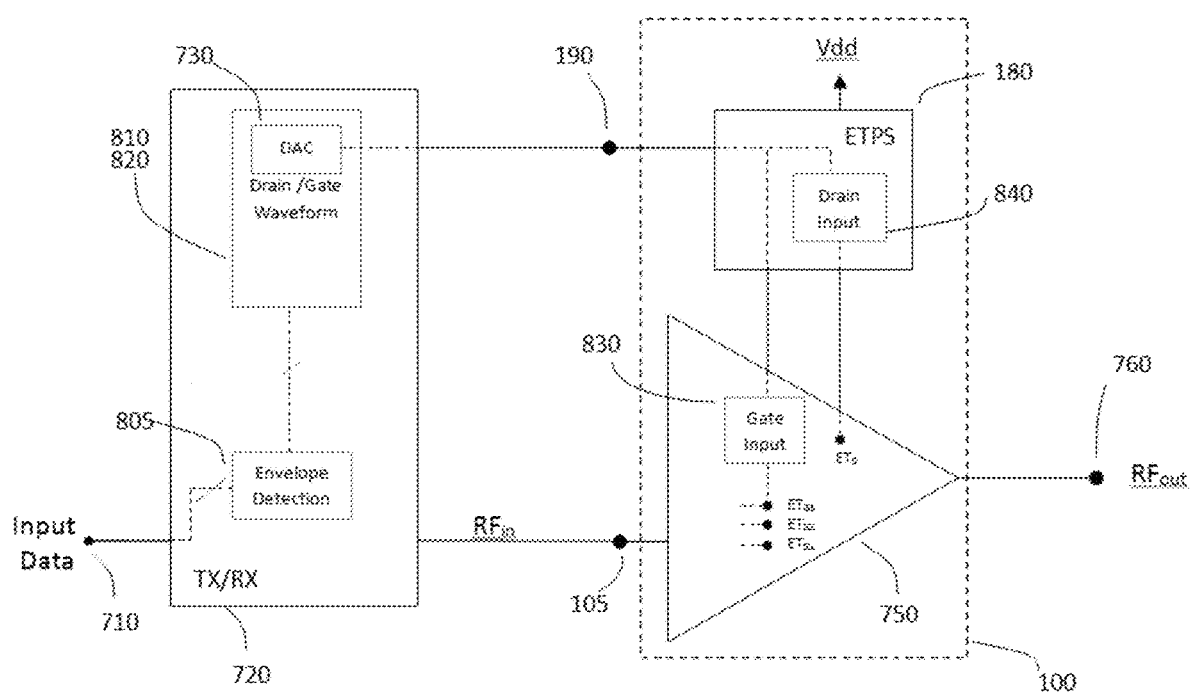
FIGS. 60 and 61 show equivalent system representations according to embodiment of FIGS. 53 and 57.

For example, FIG. 57 is a representation of embodiment of FIG. 53 highlighting the system functions. The envelope detection module (805) and the Drain/Gate Waveform generation modules (810, 820) reside within the transceiver unit (720), and Drain/Gate Input generation modules (840, 830) reside within ETPS (180) and amplifier (750) respectively. Internal amplifier (750) configuration is as depicted by FIG. 1, wherein gate biases are derived via single input voltage from Gate Input generator (830) fed to a ladder network comprised of resistors (130, 140, 175). DAC unit (730) is used to translate digital envelope data from Drain/Gate waveform generator module into analog form prior to feeding to the Drain/Gate input generator modules residing within ETPS unit (180) and amplifier (750). To be noted that in this embodiment, a single waveform is generated for both drain and gate control, thereby reducing Drain/Gate waveform generation to a single module. Input to the envelope detection (805) is the Input Data at input terminal (710), but could also be the RFin signal generated within the transceiver unit (720). A person of ordinary skill in the art will understand that FIG. 60 embodies the same envelope tracking method as depicted by FIG. 53 and thus FIG. 57. In FIG. 60 functionality of the DAC unit (730) is moved to the transceiver unit (720) and merged with the Drain/Gate generation module becoming the output stage of the module.

Figure 61:
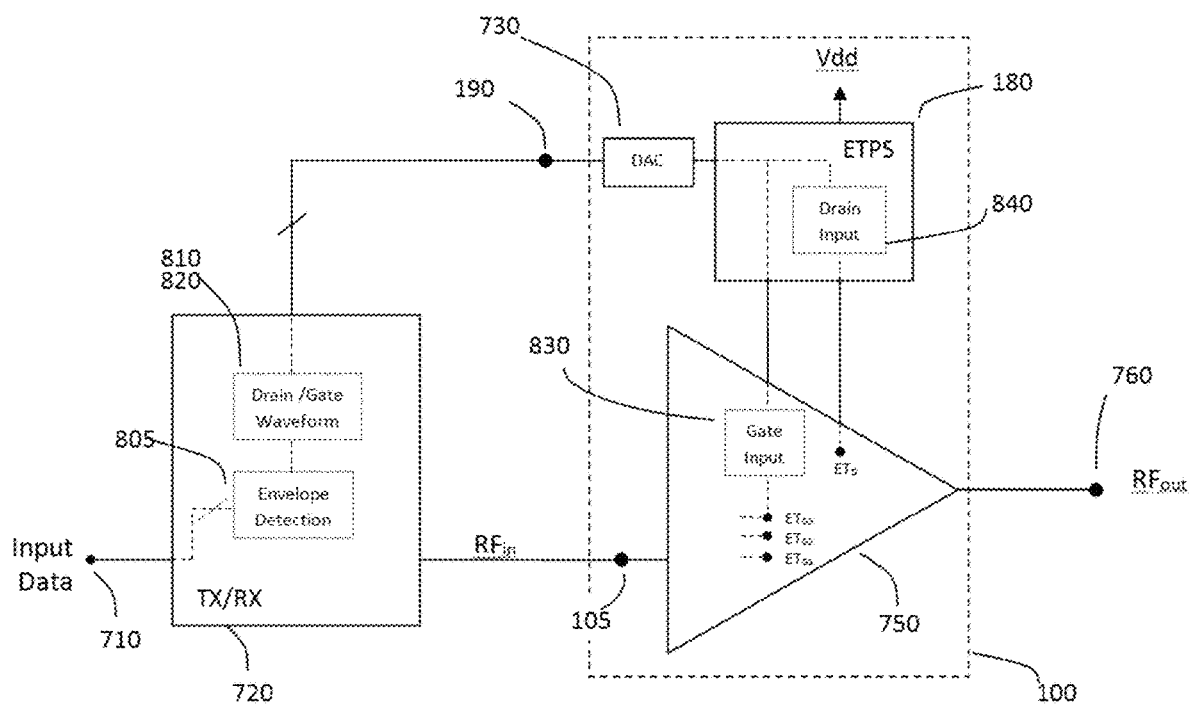
Figure 62:
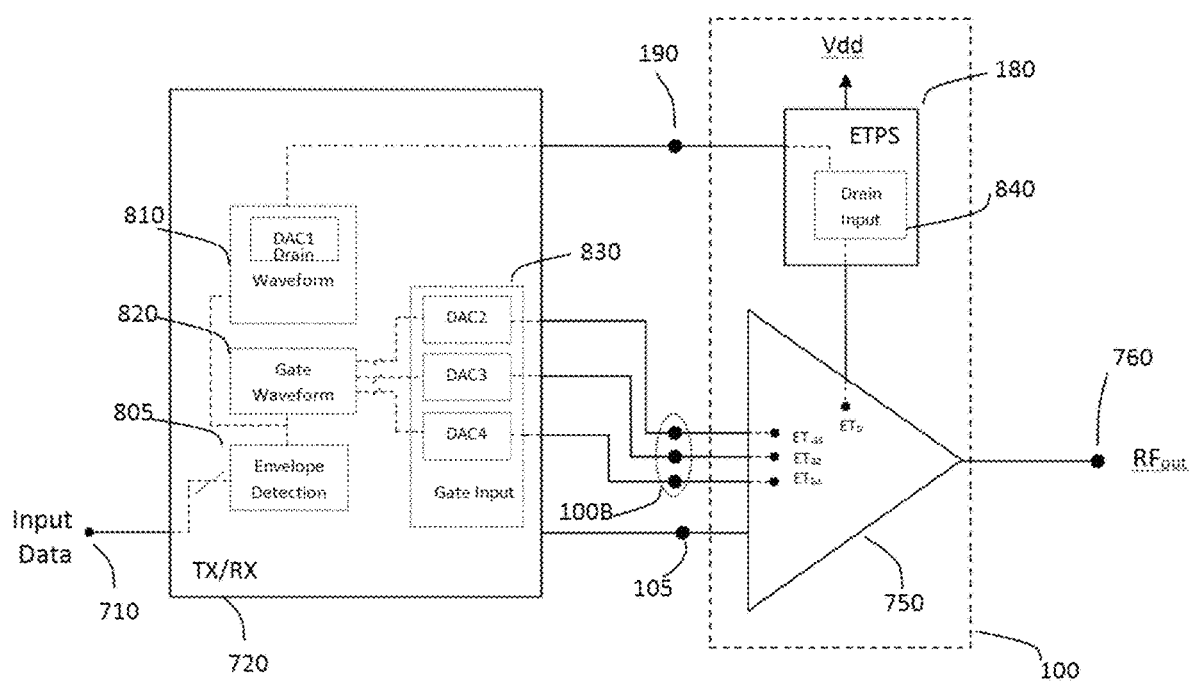
FIGS. 62, 63 and 64 show equivalent system representations according to embodiment of FIGS. 54 and 58.

Therefore FIG. 60 represents same embodiment as depicted in FIG. 53 but using the defined functional units and modules while maintaining overall system functionality. Alternatively, the DAC unit (730) may be placed within ETPS (180) or within the envelope tracking unit (100), as depicted in FIG. 61, in which case the input terminal (190) is modified to adapt to the multiple input signals required to interface with the DAC unit (730).

Figure 58:
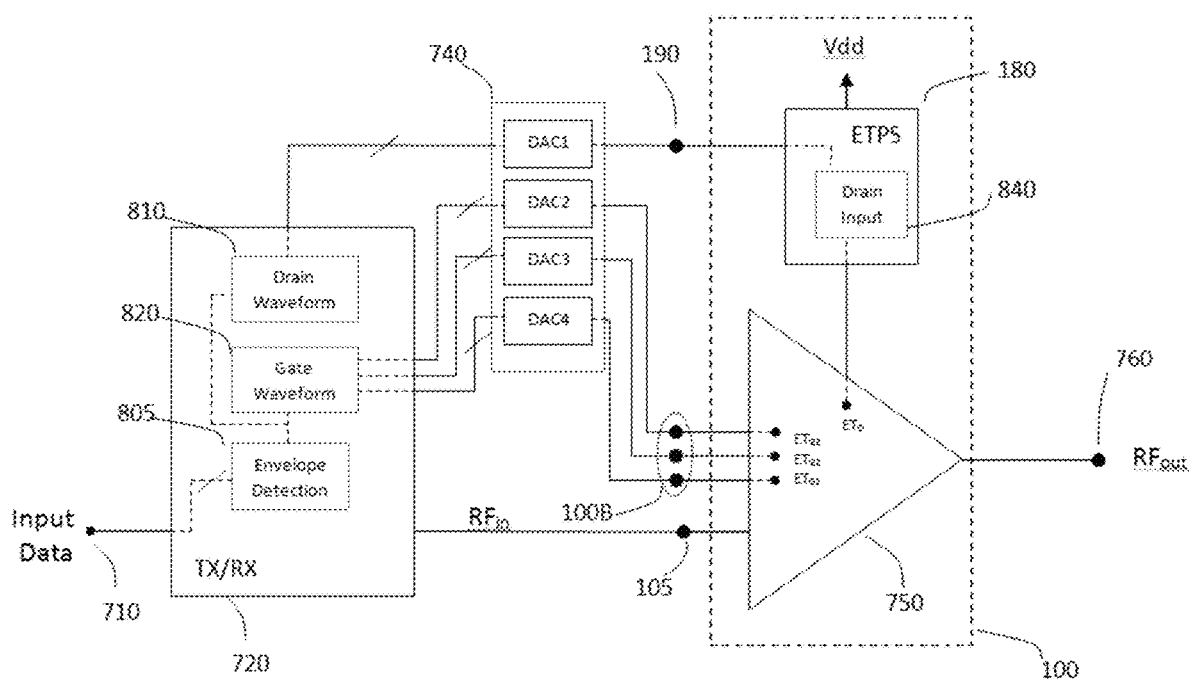
FIG. 58 is a representation of embodiment of FIG. 54 highlighting the various system functions.
Figure 63:
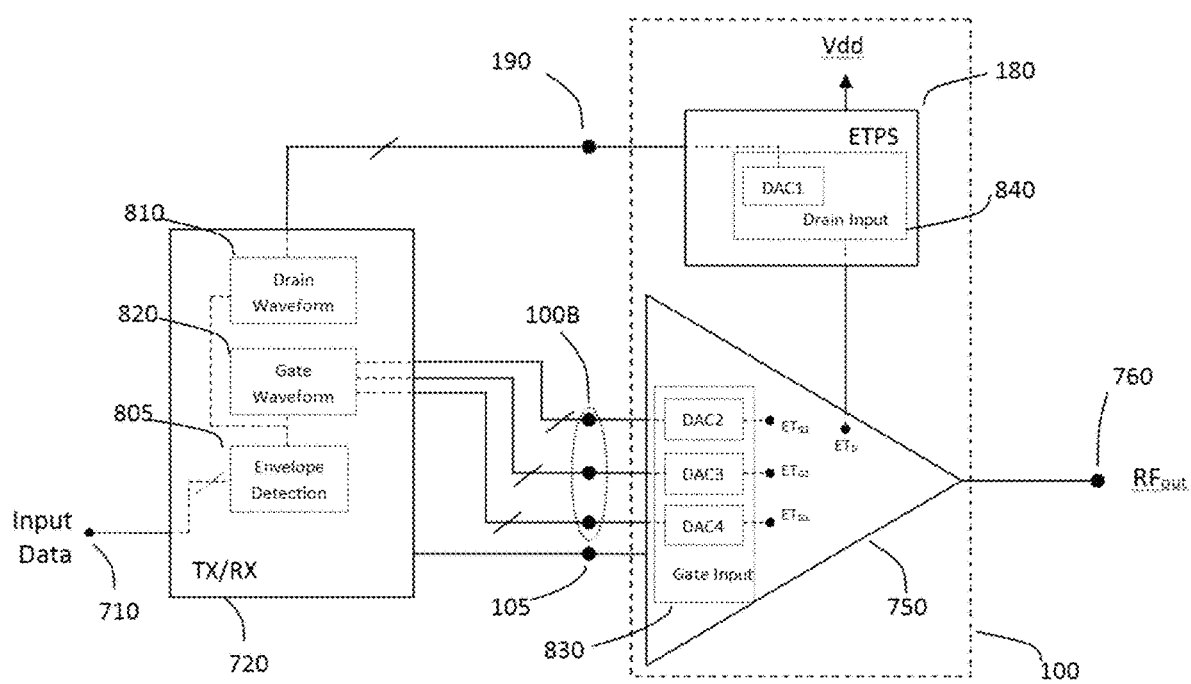
Figure 64:
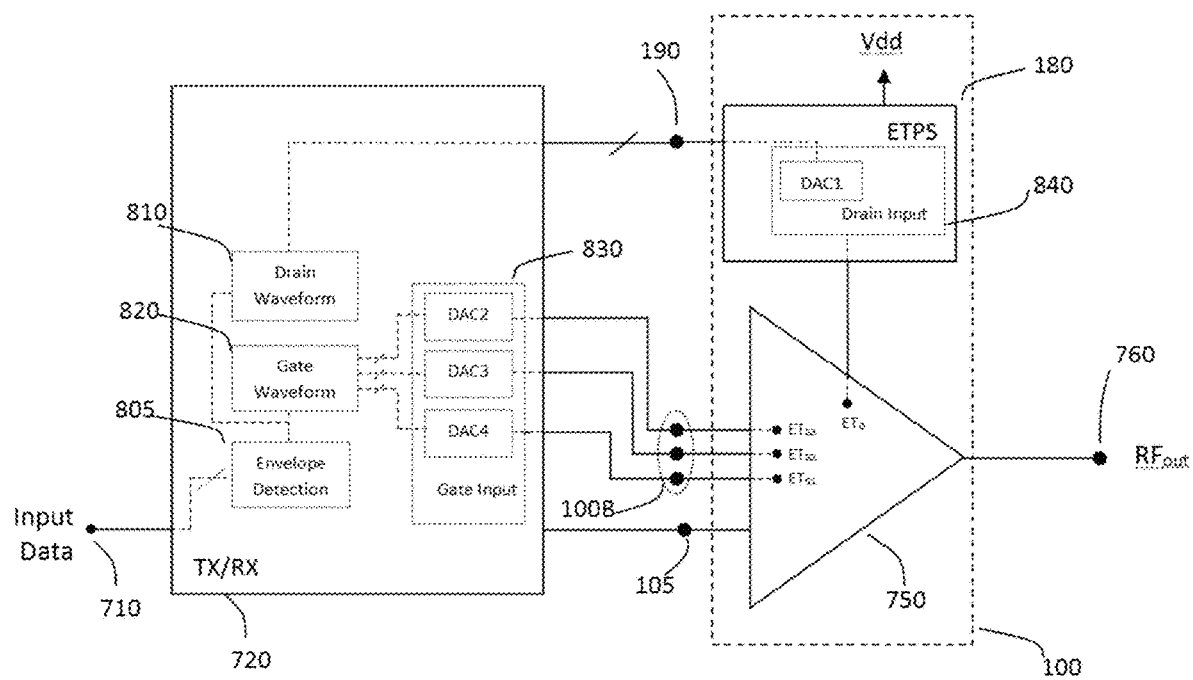

Equivalently, FIG. 58 represents same embodiment as FIG. 54 wherein the system functions are highlighted. Drain/Gate Waveform generation is performed within transceiver unit (720), but in this case using two distinct system modules, one dedicated to the Drain Waveform generation (810) outputting a single digital data set to DAC1, and the other dedicated to the Gate Waveforms generation (820) outputting different digital data sets to each of the dedicated gate DACs (DAC2-4). In this embodiment Drain Input generation (840) remains within ETPS unit (180) whereas the task of Gate Input generation is performed by DAC2-4, which through input terminal (100*b*) respectively feed biasing gates voltages to $ET_{G1}$, $ET_{G2}$ and $ET_{G3}$. Going one step further, FIG. 62 represents again same embodiment as FIG. 54 using only the functional units and modules. This is done by repartitioning functionality within module (740) into system modules and then mapping these into functional units. As such, DAC1 becomes the output stage of Drain Waveform generation module (810) which is moved within transceiver unit (720) and DAC2-4 become the Gate Input generation module placed within the transceiver. In this implementation all envelope tracking related control signals between transceiver unit (720) and envelope tracking amplifier (100) are in analog form. On the other hand, and as depicted by FIG. 63, by shifting module (740) functionality entirely within ETPS (180) and amplifier (750), tracking related control signals between the same two units become all digital. Finally, (740) functionality can be split between transceiver unit (720) and ETPS (180) as depicted in FIG. 64 to obtain a hybrid configuration whereby a mix of analog and digital tracking related control signals exist between transceiver unit (720) and envelope tracking amplifier (100**). Of course for each of these cases, I/O configuration for the functional units adapt to the required interface type.

Figure 59:
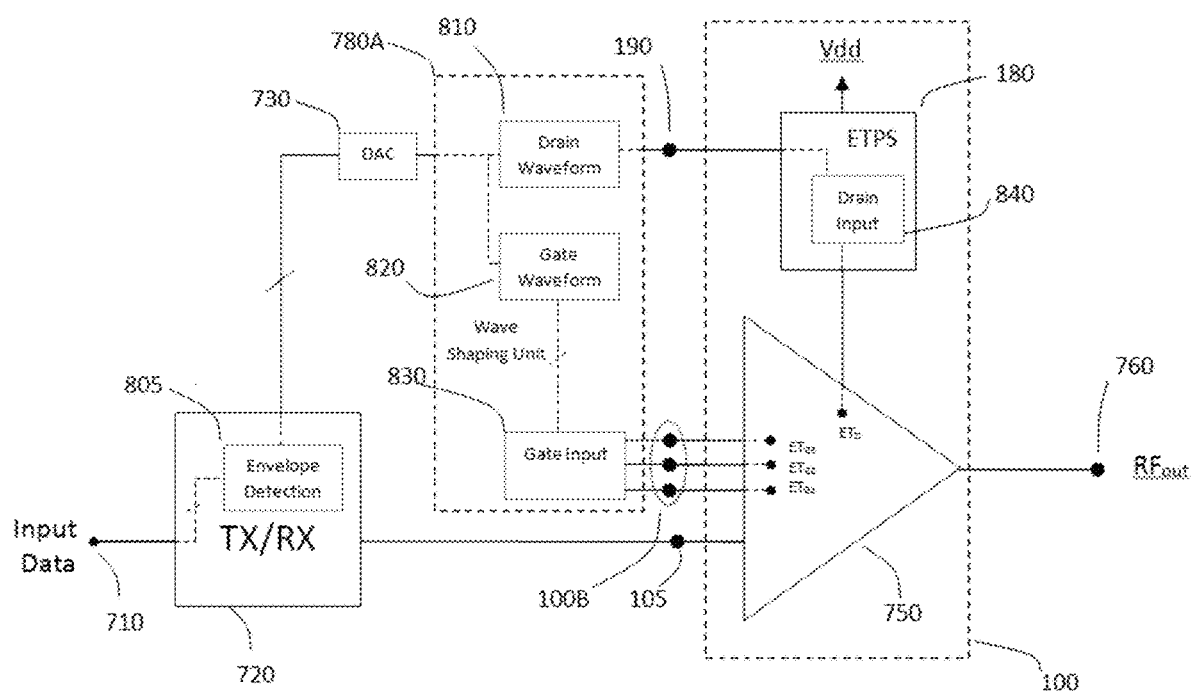
FIG. 59 is a representation of embodiment of FIG. 55 highlighting the various system functions.
Figure 65:
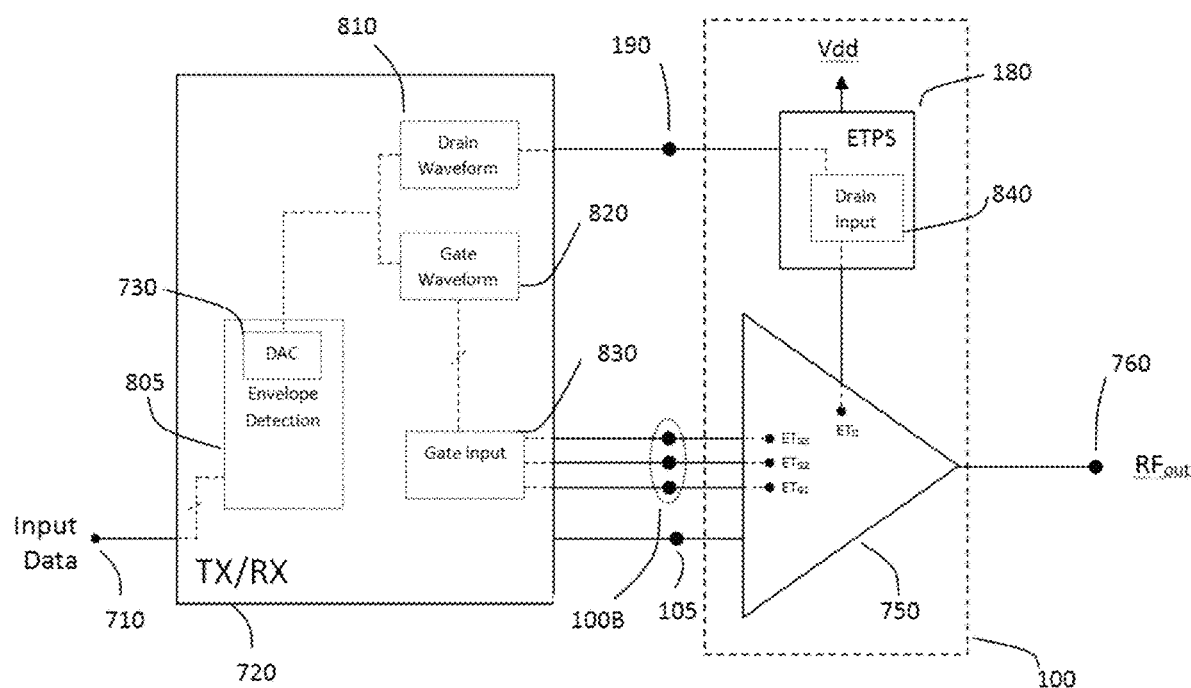
FIGS. 65, 66 and 67 show equivalent system representations according to embodiment of FIGS. 55 and 59.
Figure 66:
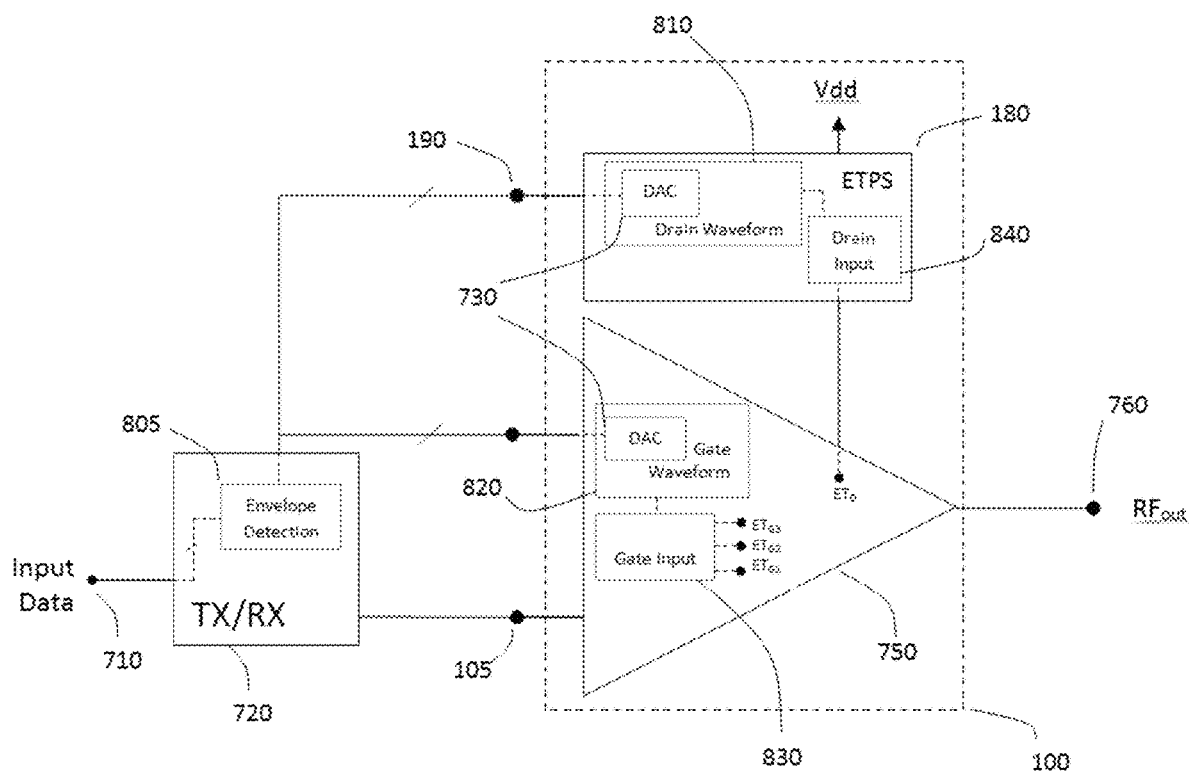
Figure 67:
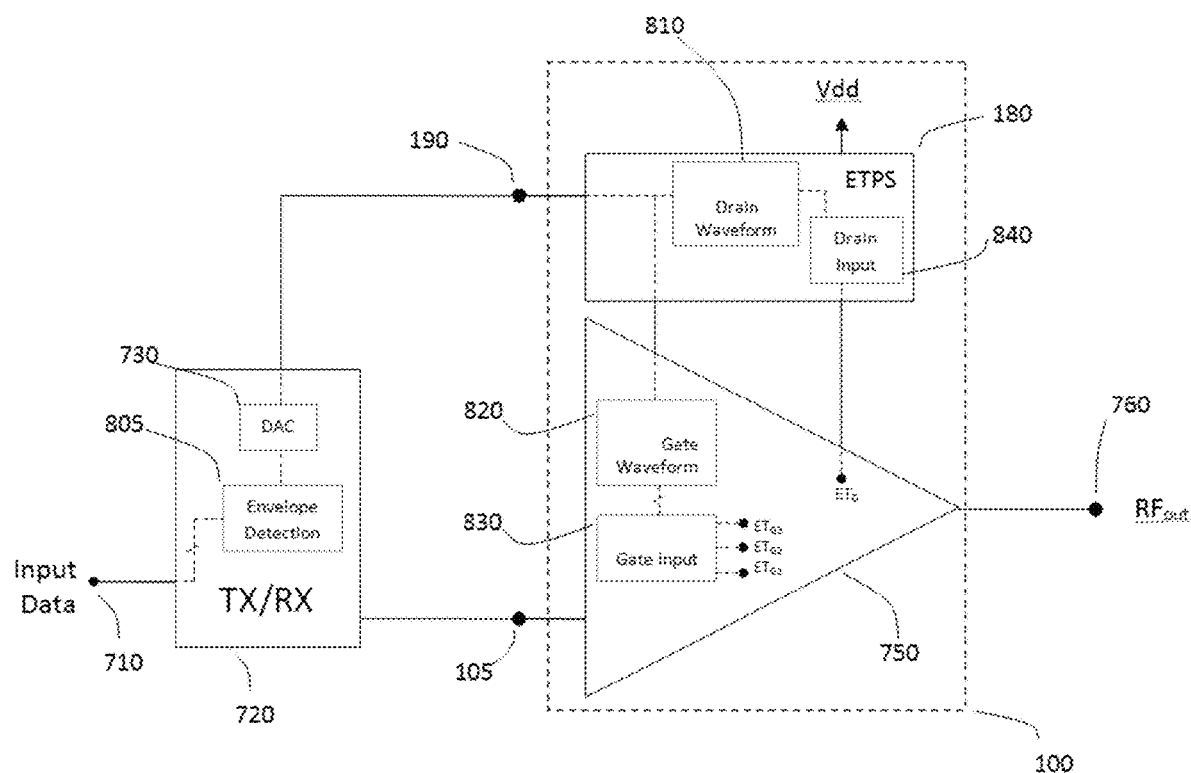

System functions of embodiment presented in FIG. 55 are highlighted in FIG. 59. Wave Shaping unit (780A) contains Drain and Gate Waveform generation modules (810, 820) which have a common input from DAC unit (730), as well as the Gate Input generation module (830) which feeds the gate bias voltages via input terminal (100*b*) to $ET_{G1}$, $ET_{G2}$ and $ET_{G3}$. Drain Waveform generation module (810) feeds via input terminal (190) the gate control signal to the Drain Input module (840) within ETPS (180). This configuration can be further reduced to contain only functional units by mapping functionalities within the Wave Shaping unit (780A) and the DAC unit (730) into the functional units. As seen in prior examples, this can be performed in various ways, all yielding to same overall system functionality and each imposing some type of I/O interface adaptation for each functional unit. By mapping all said functionalities into the transceiver unit (720), the system configuration of FIG. 65 is obtained, wherein envelope tracking controls from transceiver (720) to envelope tracking amplifier (100) are in analog form. By mapping all said functionalities into the envelope tracking amplifier (100), then the controls are in digital form as depicted by FIG. 66. Finally, by partitioning said functionalities and mapping into both the transceiver unit (720) and the envelope tracking amplifier (100), then system configuration of FIG. 67 is obtained, wherein a single analog control line is transmitted from the transceiver unit (720) and the envelope tracking amplifier (100**).

As a summary, in the previous paragraphs, various system level embodiments for controls and methods implementation of the envelope tracking amplifier using some functional units; the transceiver unit (720), the ETPS unit (180) and the amplifier unit (750), surrounded by some external enabling modules (730, 740, 780A) were presented. Subsequently a set of enabling system functions required to generate the presented embodiments as well as associated design constraints were defined which together allowed to define a generic system configuration for the envelope tracking method and controls thereof (FIG. 56). Latter configuration was used to create specific configurations reflecting each of the embodiments presented in the first section using only functional units and system modules. In the course of this exercise it was demonstrated that for a given proposed embodiment, several such configurations exist and presented some, but not all, as these are well within the reach of the person skilled in the art. Although at the system level these configurations are equivalent, in practice each may pose different issues as far as manufacturing, performance and reliability of the finished product. These issues are of course outside the scope of the present disclosure and as such shall not be discussed herewith in too much detail.

Figure 68:
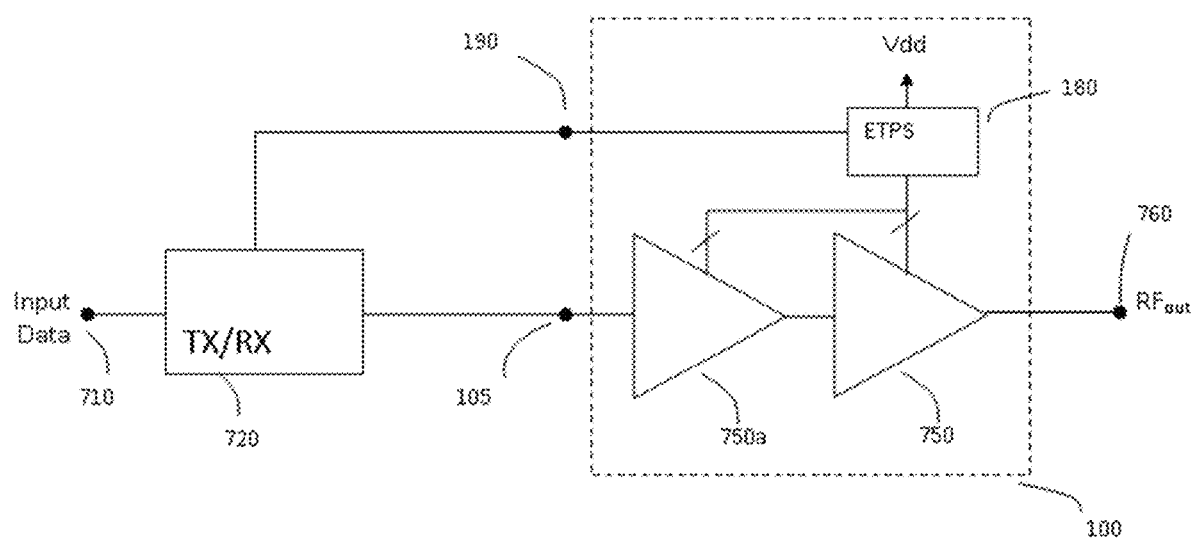
FIG. 68 shows an example embodiment according to the present disclosure of a driver ET amplifier feeding the final ET amplifier, wherein a single output form an ETPS unit provides the supply to both ET amplifiers.

FIG. 68 shows a practical implementation of the current embodiment wherein a driver ET amplifier (750*a*) is used to drive the final stage (750). In this embodiment a single ETPS (180) feeds biasing supplies (e.g. drains and gates) to both amplifiers. In this configuration both amplifiers may be of types depicted in FIGS. 8A and 9, with system configuration for each of the ET amplifiers further depicted by FIG. 60. The person skilled in the art will notice limitation associated with the configuration of FIG. 68, wherein by virtue of a shared supply connection to both amplifiers, RF interference/coupling may arise between the two amplifiers, thus degrading overall system performance (e.g. ACLR, linearity, efficiency), as well as possibly induce oscillation. This shortcoming is addressed in FIG. 69A, wherein according to the presented embodiment, the ETPS (180) is modified to comprise two decoupled and isolated output supplies, each dedicated to one of the ET amplifiers.

It should be noted that in the case of an ET implementation, traditional filtering of the supply input to the amplifier via a large bypass capacitor to reduce feedback between the various amplification stages, and thus possible oscillation, is not possible, since such a capacitor would distort the supply envelope modulation and thus the RF output, as well as reduce any efficiency improvement obtainable from the ET design. FIG. 69B shows one possible embodiment for decoupling the two outputs of the ETPS (as discussed in the prior paragraph), thus minimizing said performance issues and possible oscillation. The filter (755) is designed to pass DC and the envelope modulation frequency and stop higher frequencies which can cause the combination of driver and final stage to oscillate. The filter components L1 and C1 break the oscillation loop while allowing ET to function. Given the teachings of this embodiment, the skilled person will find other possible filtering implementations, not necessarily reduced to the filter as depicted by FIG. 69B, which thus should not be considered a design limitation.

Figure 69A:
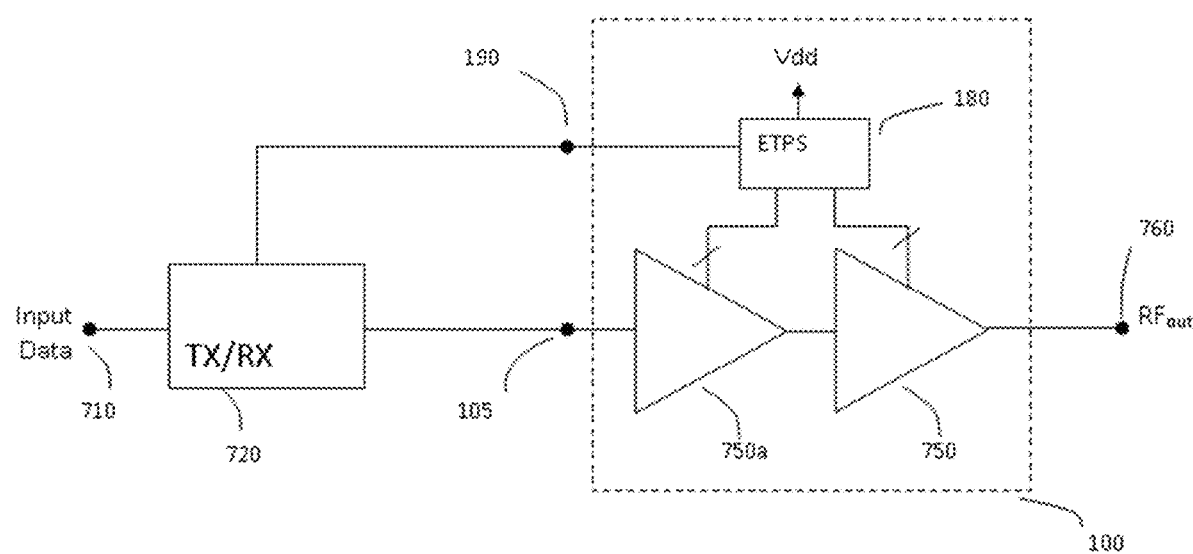
FIG. 69A shows an example embodiment according to the present disclosure of a driver ET amplifier feeding the final ET amplifier, wherein two decoupled outputs from a single ETPS unit are used to each provide the supply to each ET amplifier.
Figure 70A:
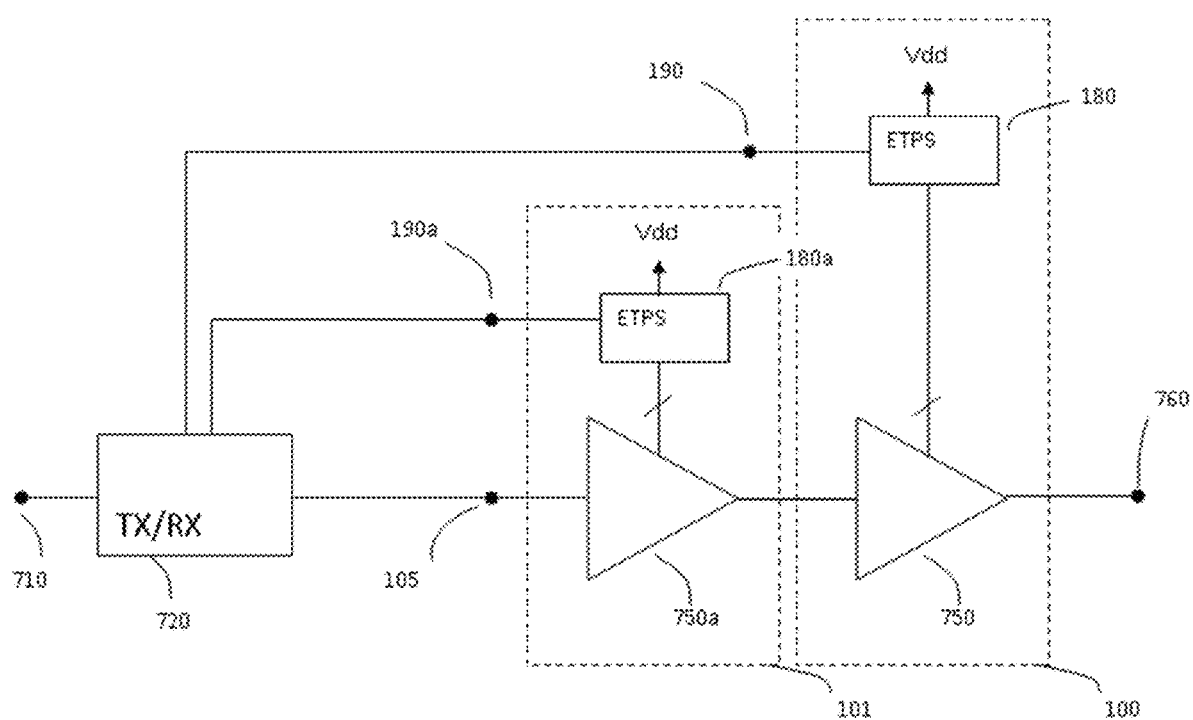
FIG. 70A shows an example embodiment according to the present disclosure of a driver ET amplifier feeding the final ET amplifier, wherein the supply to each ET amplifier is provided via a dedicated ETPS unit.
Figure 70B:
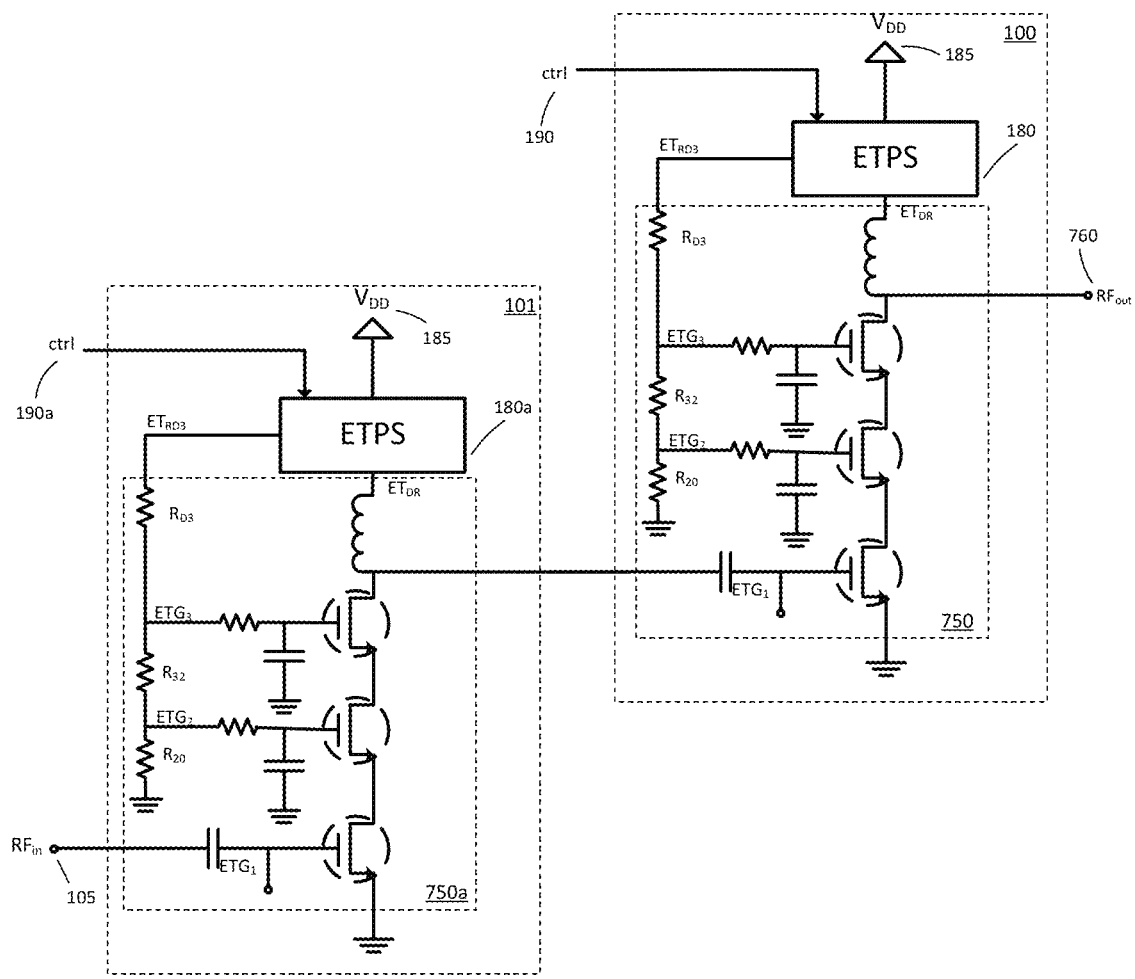
FIG. 70B is an equivalent representation of the embodiment of FIG. 70A, wherein each amplifier is depicted in more details.
Figure 70C:
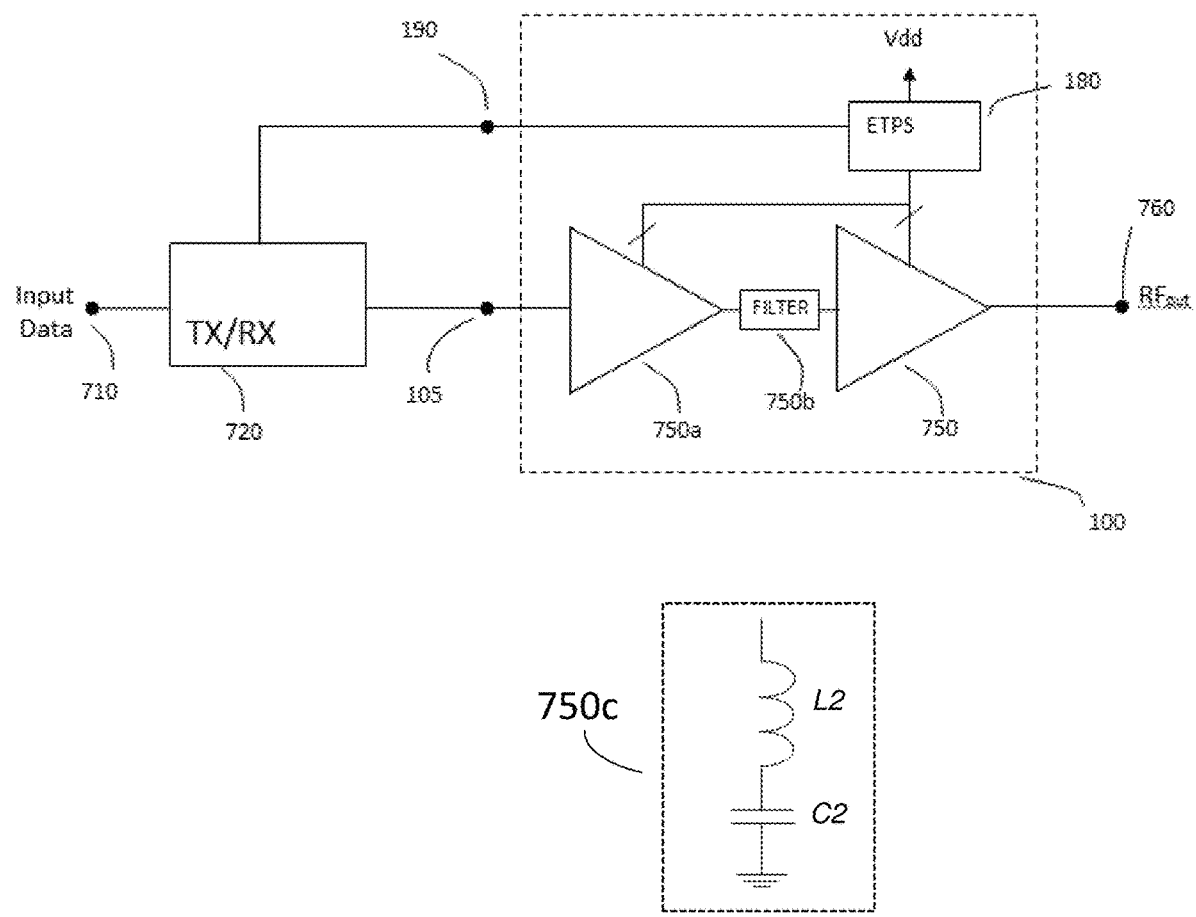
FIG. 70C shows an example embodiment according to the present disclosure of an amplifier configuration adapted to remove undesirable coupling between the various gain stages.

The person skilled in the art will now notice that the embodiments presented in FIGS. 68 and 69A provide a single control to the ETPS (180), thus limits the flexibility to independently control operation of each ET amplifier (750, 750*a*). This shortcoming is addressed in FIG. 70A, wherein according to the presented embodiment two dedicated and independent ETPS (180, 180*a*) are used to each supply ET amplifiers (750, 750*a*) respectively. By virtue of their independent controls provided at (190, 190*a*), each ETPS can be independently controlled and thus independently affect operation of the corresponding ET amplifier for better overall system performance. Although these embodiments presented in conjunction of an ET pair (driver/final) have used a base system configuration depicted by FIG. 60, the person skilled in the art will know how to use other system embodiments disclosed herewith for the case where two or more cascaded amplifiers are used. FIG. 70B is one example embodiment of the embodiment presented in FIG. 70A, where amplifiers (750, 750*a*) are shown in detail.

Embodiments as depicted by FIGS. 68-70A can provide undesirable coupling issues between the two amplification stages (driver, final). Specifically, when the envelope modulation signal of the driver amplifier supply (generated by ETPS (180)) is coupled to the input of the final stage amplifier (750), distortion of the output RF signal can be observed. Traditional circuit layout techniques such as physical separation of components and electrical isolation via ground shielding may not suffice to reduce the unwanted coupling, as the unwanted signal may be coupled via the conduction coupling path between the output of the drive and the input of the final amplifier which conducts the RF signal (conduction path between output of (750*a*) and input of (750)). As per further embodiment of the present disclosure and as depicted by FIG. 70C, such unwanted coupling within the said conduction coupling is reduced by adding a frequency selective filter (750*b*) within the conduction coupling path that will remove the envelope modulation signal, and thus reduce distortion of the output RF signal. It should be noted that such a technique is possible since the (lower frequency) envelope signal spectrum resides outside the RF signal spectrum. In an alternative embodiment, the frequency selective filter (750*b*) may be replaced by the notch filter (750*c*), specifically designed to notch out the envelope modulation signal present in the conduction path.

As described earlier, close proximity of the ETPS unit to the amplifier unit is desirable, such as to reduce any phase/amplitude degradation of the envelope supply to the amplifier unit, as the supply directly affects the output of the amplifier. As such, monolithic integration of these two units, using for example Silicon on Insulator technology, which allows for high transistor stacks (e.g. 3, 4 or greater) and higher breakdown voltages, is disclosed. This integration also allows for better stability when feedback is used around the amplifier as all the components affecting the output may be integrated.

FIG. 74 shows a system configuration according to the present disclosure wherein various optimization modules are embedded within the amplifier unit (100). Although the amplifier unit is depicted containing a single ET amplifier, as discussed earlier, several cascaded amplifiers with or without dedicated ETPS may also be used. Furthermore, ETPS and ET amplifiers may be monolithically integrated (e.g. Silicon on Insulator) for better overall performance, or integrated into a heterogeneous technology (such as a ceramic module) to allow for a combination of the best-performance and/or lowest-cost materials. The integration would allow easier interfacing of numerous dynamically biased nodes, far more than if the components were not integrated due to the large number of I/O. For example, a 2-stage amplifier (e.g. driver and final) that contains a stack of 3 devices could have 6 different gate voltages plus 2 different drain voltages to generate and interconnect. Routing of these 8 signals would be difficult without integration. Integration also greatly benefits the integrity of these interface signals. Keeping the signals on chip preserves the interface conditions and minimizes parasitic effects that can load down the signal, shift the phase of the signal, and introduce cross-talk or signal isolation concerns.

The presented optimization modules may be used in different context and for optimizing different parameters at different stages of operation. For example, the temperature detector module (920), may be used during amplifier transmission and provide feedback to main controller of operating temperature, which may prompt the controller to modify controls (supplies or other amplifier configuration related) to the amplifier. Such controls may cause for example selection of different waveforms for the ETPS unit to shift biasing or supply of the amplifier in a manner to maintain a specific response characteristic (e.g. ACLR, linearity, efficiency, power output, etc. . . . ). If lookup tables are used in the waveform generation module, controls may result in selection of a different lookup table in response to a temperature shift detected by the temperature detection module. In other cases, controls may prompt injection of a compensation error component (e.g. offset, gain) into the waveform generation module. Other parameters can be monitored and used to drive the configuration and control loop. Examples include detecting threshold voltages of devices in the PA IC or ETPS or other related circuits, detecting voltage and current levels, input or output power, and the status/health of circuits and devices. Monitoring information such as this can be used to drive a configuration setting (slow changes, for example at power up) or in a real-time closed loop system.

Another optimization module, the Non-Volatile RAM module (910), may be used in different manners. For example, during the manufacturing stage of the amplifier unit (100), module (910) may be programmed to contain characteristic data specific to the amplifier unit, not only vis-à-vis biasing and supply variation, but also with respect to temperature and other parameters. In turn, during final integration of the amplifier unit into a target device (e.g. cellular phone), NV-RAM content is used to expedite calibration, testing and troubleshooting of the target device. Availability of data within module (910) not only expedites calibration/testing/troubleshooting of the target device, possibly allowing bypass of certain steps required in the absence of the data provided by the NV-RAM, but also guarantees that the final device is "optimized" for operation with respect to the specific amplifier unit, thus rendering issues associated with batch to batch manufacturing variability moot. During operation of the device, the NV-RAM content can also be used to provide correction factors based on operating conditions (e.g. temperature and other). The person skilled in the art will understand the flexibility of providing such a programmed NV-RAM coupled with a temperature detector or some other type of transducer (930), and will be able to use teaching from the present disclosure to adapt to various conditions and requirements. In some embodiments, this calibration can be done at factory test of the PA, the ETPS, the PA+ETPS if integrated, factory test of the radio system, or in-situ by detectors in the radio system. The calibration can also be based on characterization. Typical parameters that would be monitored during the calibration process include output power, gain, AM-AM, AM-PM, ACLR, EVM, receive band noise, efficiency, and voltage levels.

Although throughout the present disclosure envelope tracking was used as an amplification method in the various embodiments, it should be noted that the techniques for stacking, mode switching optimization, and system partitioning used in said embodiments apply to envelope tracking as well as envelope following, polar amplifiers/systems, and average power tracking described in the early sections of this disclosure. These techniques can be further applied in conjunction with other amplifier efficiency improvement and performance techniques such as analog pre-distortion, digital pre-distortion, Doherty amplifiers, LINC or outphasing amplifiers, switching amplifiers such as Class S and Class M, and also distributed amplifiers, among others. The skilled person will thus appreciate the flexibility and adaptability of the various embodiments of this disclosure to other known configurations and techniques.

Finally, as integration is usually synonymous to reduced cost and reduced form factor, it is envisioned, as another embodiment of the current disclosure, that the entirety of the components of FIGS. 53-74 be monolithically integrated (e.g. Silicon on Insulator), with various intermediary stages, wherein partial integration of the components is performed.

The examples set forth above are provided to give those of ordinary skill in the art a complete disclosure and description of how to make and use the embodiments of the amplifier dynamic bias adjustment for envelope tracking of the disclosure, and are not intended to limit the scope of what the inventors regard as their disclosure. Such embodiments may be, for example, used within mobile handsets for current communication systems (e.g. WCMDA, LTE, etc. . . . ) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
  i) an amplifier comprising:
    stacked transistors having a plurality of bias terminals comprising a plurality of gate terminals of the stacked transistors and a drain terminal of an output transistor of the stacked transistors;

an input port coupled to an input transistor of the stacked transistors;

an output port coupled to the drain terminal of the output transistor; and a reference terminal coupling the input transistor to a reference potential, wherein:
the stacked transistors comprise two subsets of transistors arranged in series, a first subset comprising the input transistor connected between the reference potential at the reference terminal and a second subset, the second subset comprising a plurality of transistors connected in series with each other, a last transistor of the plurality of transistors being the output transistor and a first transistor of the plurality of transistors connected in series with the input transistor, the second subset connected between the first subset and a variable supply voltage provided to the output transistor;

ii) a gate bias circuit,
wherein:
for a varying voltage of the variable supply voltage, the gate bias circuit provides:
a) a substantially fixed bias voltage to a gate of the first transistor so to maintain a substantially constant drain voltage of the input transistor, and
b) a respective variable bias voltage, that is a function of the variable supply voltage, to a gate of each transistor of the second subset except the first transistor, and iii) a plurality of gate capacitors connected between gate terminals of respective transistors of the plurality of transistors and the reference potential,
wherein each gate capacitor of the plurality of gate capacitors is configured to allow a voltage at a gate terminal of a respective transistor to vary along with a radio frequency (RF) voltage at a drain of the respective transistor.

2. The circuital arrangement according to claim 1, wherein the respective variable bias voltage controls a drain-to-source voltage of the each transistor of the second subset to be substantially equal to a drain-to-source voltage of any other transistor of the second subset.

3. The circuital arrangement according to claim 1, wherein the respective variable bias voltage of the each transistor of the second subset provides a substantially equal distribution of a difference between the varying voltage of the variable supply voltage and the substantially constant drain voltage of the input transistor across drain-to-source voltages of transistors of the second subset.

4. The circuital arrangement according to claim 1, wherein the respective variable bias voltage is a linear function of the variable supply voltage.

5. The circuital arrangement according to claim 1, wherein the respective variable bias voltage and the substantially fixed bias voltage coincide at a value of the varying voltage that is in a range of +/−10% of a value of the varying voltage for which the input transistor is at an edge of triode.

6. The circuital arrangement according to claim 1, wherein the respective variable bias voltage and the substantially fixed bias voltage coincide at a value of the varying voltage that is substantially equal to a value for which the input transistor is at an edge of triode.

7. The circuital arrangement according to claim 1, wherein the respective variable bias voltage is a linear function of the variable supply voltage in a range of values equal to or larger than a value for which the input transistor is at an edge of triode.

8. The circuital arrangement according to claim 1, wherein the respective variable bias voltage is generated via a circuit comprising two series-connected resistors that are coupled, at one end, to the variable supply voltage, and at another end, to a substantially fixed reference voltage.

9. The circuital arrangement according to claim 8, wherein the substantially fixed bias voltage is generated via a circuit comprising two series-connected resistors that are coupled, at one end, to the substantially fixed reference voltage, and at another end, to the reference potential.

10. The circuital arrangement according to claim 1, wherein the respective variable bias voltage is generated via a circuit comprising one or more of: a) a lookup table, b) a A/D converter, c) a D/A converter, and d) an operational amplifier.

11. The circuital arrangement according to claim 1, wherein the variable supply voltage varies in a range from 1 volt to 5 volts.

12. The circuital arrangement according to claim 1, wherein the variable supply voltage varies in a range from 2.5 volts to 4.8 volts.

13. The circuital arrangement according to claim 1, wherein transistors of the first and second subsets of transistors are metal-oxide-semiconductor (MOS) field effect transistors (FETs), or complementary metal-oxide-semiconductor (CMOS) field effect transistors (FETs).

14. The circuital arrangement according to claim 11, wherein said transistors are fabricated using one of: a) silicon-on-insulator (SOI) technology, and b) silicon-on-sapphire technology (SOS).

15. A circuital arrangement comprising:
an amplifier comprising an input transistor and a plurality of cascode transistors comprising a first cascode transistor coupled to the input transistor;
a biasing circuit configured to generate, based on a varying supply voltage to the amplifier, a fixed gate bias voltage for the first cascode transistor and a plurality of variable gate bias voltages for remaining transistors of the plurality of cascode transistors so to control the input transistor to maintain operation in saturation region while the plurality of cascode transistors operate with varying bias voltages, and
a plurality of gate capacitors connected between gate terminals of respective transistors of the plurality of cascode transistors and a reference potential,
a plurality of resistors connected between said gate terminals and the biasing circuit,
wherein each gate capacitor of the plurality of gate capacitors is configured to allow a voltage at a gate terminal of a respective transistor to vary along with a radio frequency (RF) voltage at a drain of the respective transistor, and
wherein the fixed gate bias voltage and the plurality of variable gate bias voltages are coupled to the first cascode and the remaining transistors through respective resistors of the plurality of resistors.

16. The circuital arrangement according to claim 15, wherein each of the plurality of variable gate bias voltages is a linear function of the varying supply voltage that coincides with the fixed gate bias voltage at a value of the varying supply voltage for which the input transistor is at an edge of triode.

17. A method for biasing an amplifier, the method comprising:
- providing an amplifier comprising an input transistor and a plurality of cascode transistors comprising a first cascode transistor coupled to the input transistor;
- connecting a plurality of gate capacitors between gate terminals of respective transistors of the plurality of cascode transistors and a reference potential, thereby allowing a voltage at a gate terminal of a respective transistor to vary along with a radio frequency (RF) voltage at a drain of the respective transistor;
- applying a variable supply voltage to the amplifier;
- based on the applying, providing a fixed bias voltage to a gate of the first cascode transistor so to maintain a substantially constant drain voltage of the input transistor; and
- based on the applying, providing a variable bias voltage, that is a function of the variable supply voltage, to a gate of each cascode transistor of the plurality of cascode transistors except the first cascode transistor.

18. The method according to claim 17, wherein the variable bias voltage is a linear function of the varying supply voltage that coincides with the fixed bias voltage at a value of the varying supply voltage for which the input transistor is at an edge of triode.

* * * * *